(12) United States Patent
Roberts et al.

(10) Patent No.: US 10,661,304 B2
(45) Date of Patent: May 26, 2020

(54) MICROFLUIDIC CONTROL SURFACES USING ORDERED NANOTUBE FABRICS

(71) Applicant: Nantero, Inc., Woburn, MA (US)

(72) Inventors: David A. Roberts, Woburn, MA (US); Hao-Yu Lin, Winchester, MA (US); Thomas Bengtson, Derry, NH (US); Thomas Rueckes, Byfield, MA (US); Karl Robinson, Herent (BE); H. Montgomery Manning, Eagle, ID (US); Rahul Sen, Lexington, MA (US); Michel P. Monteiro, Marlboro, MA (US)

(73) Assignee: Nantero, Inc., Woburn, MA (US)

( * ) Notice: Subject to any disclaimer, the term of this patent is extended or adjusted under 35 U.S.C. 154(b) by 0 days.

(21) Appl. No.: 15/648,868

(22) Filed: Jul. 13, 2017

(65) Prior Publication Data

US 2018/0001342 A1 Jan. 4, 2018

Related U.S. Application Data

(63) Continuation-in-part of application No. 15/241,495, filed on Aug. 19, 2016, now Pat. No. 10,124,367, (Continued)

(51) Int. Cl.
*B05D 1/40* (2006.01)
*C01B 32/168* (2017.01)
(Continued)

(52) U.S. Cl.
CPC .............. *B05D 1/40* (2013.01); *B05D 1/005* (2013.01); *B05D 1/02* (2013.01); *B05D 1/18* (2013.01);
(Continued)

(58) Field of Classification Search
CPC ........................................................ B05D 1/40
See application file for complete search history.

(56) References Cited

U.S. PATENT DOCUMENTS 6,057,637 A  5/2000 Zettl
6,277,318 B1  8/2001 Bower
(Continued)

FOREIGN PATENT DOCUMENTS

EP  1 612 586  1/2006
GB  2364933  2/2002
(Continued)

OTHER PUBLICATIONS

Ago, et al., "Workfunction of Purified and Oxidized Carbon Nanotubes," Synthetic Metals, vol. 103, 1999, pp. 2494-2495.
(Continued)

*Primary Examiner* — Larry W Thrower
(74) *Attorney, Agent, or Firm* — Nantero, Inc.

(57) ABSTRACT

A method for arranging nanotube elements within nanotube fabric layers and films is disclosed. A directional force is applied over a nanotube fabric layer to render the fabric layer into an ordered network of nanotube elements. That is, a network of nanotube elements drawn together along their sidewalls and substantially oriented in a uniform direction. In some embodiments this directional force is applied by rolling a cylindrical element over the fabric layer. In other embodiments this directional force is applied by passing a rubbing material over the surface of a nanotube fabric layer. In other embodiments this directional force is applied by running a polishing material over the nanotube fabric layer for a predetermined time. Exemplary rolling, rubbing, and polishing apparatuses are also disclosed.

15 Claims, 115 Drawing Sheets

Related U.S. Application Data which is a continuation of application No. 13/076,152, filed on Mar. 30, 2011, now Pat. No. 9,422,651, which is a continuation-in-part of application No. 12/945,501, filed on Nov. 12, 2010, now Pat. No. 9,574,290.

(60) Provisional application No. 61/449,784, filed on Mar. 7, 2011, provisional application No. 61/350,263, filed on Jun. 1, 2010, provisional application No. 61/319,034, filed on Mar. 30, 2010.

(51) Int. Cl.

| | |
|---|---|
| B05D 1/32 | (2006.01) |
| D04H 1/4391 | (2012.01) |
| B05D 1/28 | (2006.01) |
| B05D 1/18 | (2006.01) |
| D04H 1/74 | (2006.01) |
| D04H 1/4382 | (2012.01) |
| D04H 1/4242 | (2012.01) |
| B05D 1/00 | (2006.01) |
| B05D 1/02 | (2006.01) |
| B81B 1/00 | (2006.01) |
| B82Y 30/00 | (2011.01) |
| B82Y 40/00 | (2011.01) |
| B01L 3/00 | (2006.01) |

(52) U.S. Cl.
CPC ............ *B05D 1/28* (2013.01); *B05D 1/32* (2013.01); *B81B 1/00* (2013.01); *C01B 32/168* (2017.08); *D04H 1/4242* (2013.01); *D04H 1/4382* (2013.01); *D04H 1/4391* (2013.01); *D04H 1/74* (2013.01); *B01L 3/502707* (2013.01); *B82Y 30/00* (2013.01); *B82Y 40/00* (2013.01)

(56) References Cited

U.S. PATENT DOCUMENTS

| | | | |
|---|---|---|---|
| 6,319,102 | B1 | 11/2001 | Luo |
| 6,342,276 | B1 | 1/2002 | You |
| 6,409,567 | B1 | 6/2002 | Amey, Jr. et al. |
| 6,423,583 | B1 | 7/2002 | Avouris et al. |
| 6,495,116 | B1 | 12/2002 | Herman |
| 6,495,258 | B1 | 12/2002 | Chen et al. |
| 6,515,339 | B2 | 2/2003 | Shin et al. |
| 6,528,020 | B1 | 3/2003 | Dai et al. |
| 6,531,828 | B2 | 3/2003 | Yaniv et al. |
| 6,616,495 | B1 | 9/2003 | Tusboi |
| 6,630,772 | B1 | 10/2003 | Bower et al. |
| 6,645,628 | B2 | 11/2003 | Shiffler, Jr. et al. |
| 6,706,402 | B2 | 3/2004 | Rueckes et al. |
| 6,707,098 | B2 | 3/2004 | Hofmann et al. |
| 6,808,746 | B1 | 10/2004 | Dai et al. |
| 6,833,558 | B2 | 12/2004 | Lee et al. |
| 6,835,591 | B2 | 12/2004 | Rueckes et al. |
| 6,858,197 | B1 | 2/2005 | Delzeit |
| 6,863,942 | B2 | 3/2005 | Ren et al. |
| 6,888,773 | B2 | 5/2005 | Morimoto |
| 6,890,780 | B2 | 5/2005 | Lee |
| 6,893,328 | B2 | 5/2005 | So |
| 6,899,945 | B2 | 5/2005 | Smalley et al. |
| 6,905,892 | B2 | 6/2005 | Esmark |
| 6,918,284 | B2 | 7/2005 | Snow et al. |
| 6,919,592 | B2 | 7/2005 | Segal et al. |
| 6,919,740 | B2 | 7/2005 | Snider |
| 6,921,575 | B2 | 7/2005 | Horiuchi et al. |
| 6,924,538 | B2 | 8/2005 | Jaiprakash et al. |
| 6,946,410 | B2 | 9/2005 | French et al. |
| 7,057,402 | B2 | 6/2006 | Cole et al. |
| 7,065,857 | B2 | 6/2006 | Watanabe et al. |
| 7,067,328 | B2 | 6/2006 | Dubrow et al. |
| 7,259,410 | B2 | 8/2007 | Jaiprakash et al. |
| 7,290,667 | B1* | 11/2007 | Bakajin .......... B01D 39/06 210/500.22 |
| 7,335,395 | B2 | 2/2008 | Ward et al. |
| 7,365,632 | B2 | 4/2008 | Bertin et al. |
| 7,375,369 | B2 | 5/2008 | Sen et al. |
| 7,567,414 | B2 | 7/2009 | Berlin et al. |
| 7,641,885 | B2 | 1/2010 | Liu |
| 2001/0004979 | A1 | 6/2001 | Han et al. |
| 2002/0022429 | A1 | 2/2002 | Yaniv et al. |
| 2002/0160111 | A1 | 10/2002 | Sun et al. |
| 2002/0185770 | A1 | 12/2002 | McKague |
| 2003/0004058 | A1 | 1/2003 | Li et al. |
| 2003/1012211 | | 7/2003 | Glatkowski |
| 2003/0177450 | A1 | 9/2003 | Nugent |
| 2003/0200521 | A1 | 10/2003 | DeHon et al. |
| 2004/0007528 | A1 | 1/2004 | Bakajin et al. |
| 2004/1000572 | | 1/2004 | Empedocles et al. |
| 2004/0023253 | A1 | 2/2004 | Kunwar et al. |
| 2004/1003197 | | 2/2004 | Kern et al. |
| 2004/0041154 | A1 | 3/2004 | Watanabe et al. |
| 2004/0043527 | A1 | 3/2004 | Bradley et al. |
| 2004/0070326 | A1 | 4/2004 | Mao et al. |
| 2004/1007194 | | 4/2004 | Glatkowski et al. |
| 2004/0099438 | A1 | 5/2004 | Arthur et al. |
| 2004/0104129 | A1 | 6/2004 | Gu et al. |
| 2004/1013207 | | 7/2004 | Star et al. |
| 2004/1018163 | | 9/2004 | Jaiprakash et al. |
| 2004/0253167 | A1 | 12/2004 | Silva et al. |
| 2004/1026555 | | 12/2004 | Glatkowski et al. |
| 2004/1026610 | | 12/2004 | Lee |
| 2005/0053525 | A1 | 3/2005 | Segal et al. |
| 2005/1007965 | | 4/2005 | Duan et al. |
| 2005/0095938 | A1 | 5/2005 | Rosenberger et al. |
| 2005/0118639 | A1 | 6/2005 | Chen |
| 2005/0212014 | A1 | 9/2005 | Horibe et al. |
| 2006/1023753 | | 10/2006 | Empedocles |
| 2007/0004191 | A1 | 1/2007 | Gu et al. |
| 2008/1014390 | | 6/2008 | Allemand et al. |
| 2008/0234424 | A1 | 9/2008 | Lee |
| 2009/0052029 | A1 | 2/2009 | Dai et al. |
| 2010/0055385 | A1 | 3/2010 | Shim et al. |
| 2010/0104808 | A1 | 4/2010 | Fan et al. |
| 2010/1022715 | | 9/2010 | Bao et al. |
| 2011/0262772 | A1 | 10/2011 | Hauge et al. |
| 2011/0291315 | A1* | 12/2011 | Roberts ............ D04H 1/4382 264/108 |

FOREIGN PATENT DOCUMENTS

| | | |
|---|---|---|
| JP | 2001035362 | 7/1999 |
| JP | 2000203821 | 7/2000 |
| JP | 2004090208 | 3/2004 |
| JP | 2008166154 | 7/2008 |
| WO | WO-1998/39250 | 9/1998 |
| WO | WO-1999/65821 | 12/1999 |
| WO | WO-2001/03208 | 1/2001 |
| WO | WO-2002/45113 | 6/2002 |
| WO | WO-2002/48701 | 6/2002 |
| WO | WO-2003/016901 | 2/2003 |
| WO | WO-2003/034142 | 4/2003 |
| WO | WO-2008/054541 | 5/2008 |
| WO | WO-2010/014107 | 2/2010 |
| WO | WO-2010/095140 | 8/2010 |

OTHER PUBLICATIONS

Ajayan, et al., "Applications of Carbon Nanotubes," Topics Appl. Phys., vol. 80, 2001, pp. 391-425.

Amblard, G., "Development and characterization of carbon nanotube processes for NRAM technology," Proc. of SPIE 2011, vol. 7970, pp. 797017-1-797017-7.

Awano, Y., "Graphene for VLSI: FET and Interconnect Applications," IEDM 2009 Technical Digest, pp. 10.1.1-10.1.4.

Banerjee, et al., "Functionalization of Carbon Nanotubes with a Metal-Containing Molecular Complex," Nano Letters, vol. 2, No. 1, 2002, pp. 49-53.

(56) References Cited

OTHER PUBLICATIONS

Berhan, et al., "Mechanical Properties of Nanotube Sheets: Alterations in Joint Morphology and Achievable Moduli in Manufacturable Materials," J. Appl. Phys., vol. 95, No. 8, Apr. 2004, pp. 4335-4345.
Bonard, et al., "Monodisperse Multiwall Carbon Nanotubes Obtained with Ferritin as Catalyst," Nano Letters, vol. 2, No. 6, 2002, pp. 665-667.
Brock, et al., "Carbon Nanotube Memories and Fabrics in a Radiation Hard Semiconductor Foundry," 2005 IEEE Conference, 9 pgs.
Brown, K. M., "System in package "The Rebirth of SIP"," 2004 IEEE Custom Integrated Circuits, May 2004, 6 pgs.
Cassell, et al., "Large Scale CVD Synthesis of Single-Walled Carbon Nanotubes," J. Phys. Chem. B, vol. 103, 1999, pp. 6484-6492.
Chen, et al., "Heterogeneous Single-Walled Carbon Nanotube Catalyst Discovery and Optimization," Chem. Mater., vol. 14, 2002, pp. 1891-1896.
Cheng, H.M., "Large-Scale and Low-Cost Synthesis of Single-Walled Carbon Nanotubes by the Catalytic Pyrolysis of Hydrocarbons," Appl. Phys. Ltrs., vol. 72, No. 25, Jun. 1998, pp. 3282-3284.
Chiang, et al., "Purification and Characterization of Single-Wall Carbon Nanotubes (SWNTs) Obtained from the Gas-Phase Decomposition of CO (HiPco Process)," J. Phys. Chem. B, vol. 105, 2001, pp. 8297-8301.
Crowley, et al., "512 Mb PROM with 8 layers of antifuse/Diode cells," IEEE International Solid-State Circuits Conference, vol. XLVI, Feb. 2003, pp. 284-285.
Cui, et al., "Carbon Nanotube Memory Devices of High Charge," Applied Phys. Ltrs., vol. 81, No. 17, Oct. 2002, pp. 3260-3262.
Dai, et al., "Controlled Chemical Routes to Nanotube Architectures, Physics, and Devices," J. Phys. Chem. B, vol. 103, 1999, pp. 11246-11255.
de Heer, et al., "Aligned Carbon Nanotube Films: Production and Optical and Electronic Properties," Science, 286, 1995, pp. 845-847.
Delzeit, et al., "Multilayered Metal Catalysts for Controlling the Density of Single-Walled Carbon Nanotube Growth," Chem. Phys. Ltrs., vol. 348, 2001, pp. 368-374.
Desai, et al., "Freestanding Carbon Nanotube Specimen Fabrication," Proceeding 2005 $5^{th}$ IEEE Conference on Nanotechnology, Nagoya, Japan, Jul. 2005, 4 pgs.
Engel, et al., "Thin Film Nanotube Transistors Based on Self-Assembled, Aligned, Semiconducting Carbon Nanotube Arrays," ACS Nano, 2008, vol. 2, No. 12, pp. 2445-2452.
Engel, et al., "Supporting Information: Thin Film Nanotube Transistors Based on Self-Assembled, Aligned, Semiconducting Carbon Nanotube Arrays".
European Search Report, European Patent Application No. 11763387, dated Oct. 16, 2013, 2 pgs.
Franklin, et al., "An Enhanced CVD Approach to Extensive Nanotube Networks with Directionality," Adv. Mater., vol. 12, No. 12, 2000, pp. 890-894.
Fuhrer, et al., "High-Mobility Nanotube Transistor Memory," Nano Letters, vol. 2, No. 7, 2002, pp. 755-759.
Guo, et al., "Mechanical and Electrostatic Properties of Carbon Nanotubes Under Tensile Loading and Electric Field," Journal of Physics D: Applied Physics, 2003, 36, pp. 805-811.
Haddon, et al., "Purification and Separation of Carbon Nanotubes," MRS Bulletin, Apr. 2004, pp. 252-259 (www.mrs.org/publications/bulletins).
Hafner, et al., "Catalytic Growth of Single-Wall Carbon Nanotubes from Metal Particles," Chem. Phys. Ltrs., vol. 296, 1998, pp. 195-202.
Homma, et al., "Single-Walled Carbon Nanotube Growth on Silicon Substrates Using Nanoparticle Catalysts," JPN, J. Appl. Phys., vol. 41, 2002, pp. L89-L91.
Huai, Y., "Spin-Transfet Torque MRAM (STT-MTAM): Challenges and Prospects," AAPS Bulletin, vol. 18, No. 6, Dec. 2008; pp. 33-40.

International Search Report, International Patent Application No. PCT/US05/18467 dated Oct. 1, 2007, 5 pgs.
International Search Report, International Patent Application No. PCT/US05/18539 dated Sep. 18, 2006, 4 pgs.
International Search Report, International Patent Application No. PCT/US05/45316 dated Sep. 6, 2005, 2 pgs.
International Search Report, International Patent Application No. PCT/US11/030578 dated May 27, 2011, 2 pgs.
Jeong, et al., "A Purification Method of Single-Wall Carbon Nanotubes Using H2S and O2 Mixture Gas," Chem. Phys. Ltrs., vol. 344, Aug. 2001, pp. 18-22.
Jiang, et al., "Performance Breakthrough in 8nm Gate-All-Around Length Gate-All Around Nanowire Transistors using Metallic Nanowire Contacts," 2008 Symposium on VLSI Technology Digest of Technical Papers, pp. 34-35.
Joselevich, et al., "Vectorial Growth of Metallic and Semiconducting Single-Wall Carbon Nanotubes," Nano Letters, vol. 0, No. 0, A-E, 2002.
Kahn, et al., "Solubilization of Oxidized Single-Walled Carbon Nanotube in Organic and Aqueous Solvents through Organic Derivatization," Nano Letters, vol. 2, No. 11, 2002, pp. 1215-1218.
Kianian, et al., "A 3D Stackable Carbon Nanotube-based Nonvolatile Memory (NRAM)," ESSDERC, Nantero, Inc., Jun. 14, 2010, 4 pgs.
Kim et al., "Density Control of Self-Aligned Shortened Single-Wall Carbon Nanotubes on Polyelectrolyte-Coated Substrates," Colloids and Surfaces A, Physiochem. Eng. Aspects, 266, 2005, pp. 91-96.
Kim et al, "Highly Aligned Scalable Platinum-Decorated Single-Wall Carbon Nanotube Arrays for Nanoscale Electrical Interconnects," ACSNano, vol. 3, No. 9, 2009, pp. 2818-2826.
Kong, et al., "Chemical Vapor Deposition of Methane for Single-Walled Carbon Nanotubes," Chem. Phys. Ltrs., vol. 292, Aug. 1998, pp. 567-574.
Kong, et al., "Nanotube Molecular Wires as Chemical Sensors," Science, vol. 287, Jan. 2000, pp. 622-625.
Li, et al., "Carbon Nanotube Nanoelectrode Array for Ultrasensitive DNA Detection," Nano Letters, vol. 3, No. 5, 2003, pp. 597-602.
Li, et al., "Growth of Single-Walled Carbon Nanotubes from Discrete Catalytic Nanoparticles of Various Sizes," J. Phys. Chem. B, vol. 105, 2001, pp. 11424-11431.
Li, et al., "Preparation of Monodispersed Fe—Mo Nanoparticles as the Catalyst for CVD Synthesis of Carbon Nanotubes," Chem. Mater., vol. 13, 2001, pp. 1008-1014.
Ma, et al., "Alignment and Dispersion of Functionalized Carbon Nanotubes in Polymer Composites Induced by an Electric Field," Carbon 46, 4, 2008, pp. 706-710.
Merkulov, et al., "Alignment Mechanism of Carbon Nanotubes Produced by Plasma-Enhanced Chemical Vapor Deposition," App. Phys. Ltrs., vol. 79, No. 18, 2001, pp. 2970-2972.
Nerushev, et al., "Carbon Nanotube Films Obtained by Thermal Chemical Vapour Deposition," J. Mater. Chem., vol. 11, 2001, pp. 1122-1132.
Niu, et al., "High Power Electrochemical Capacitors Based on Carbon Nanotube Electrodes," Appl. Phys. Ltrs., vol. 70, No. 11, Mar. 1997, pp. 1480-1482.
Novak, et al., "Nerve Agent Using Networks of Single-Walled Carbon Nanotubes," Appl. Phys. Ltr, vol. 83, No. 19, Nov. 2003, pp. 4026-4028.
Onoa, et al., "Bulk Production of Singly Dispersed Carbon Nanotubes with Prescribed Lengths," Nanotechnology, vol. 16, 2005, pp. 2799-2803.
Padgett, et al., "Influence of Chemisorption on the Thermal Conductivity of Single-Wall Carbon Nanotubes," Nano Letters, 2004, vol. 4, No. 6, pp. 1051-1053.
Parikh, et al., "Flexible Vapour Sensors Using Single Walled Carbon Nanotubes," Sensors and Actuators B, vol. 113, 2006, pp. 55-63.
Peigney, et al., "A Study of the Formation of Single- and Double-Walled Carbon Nanotubes by a CVD Method," J. Phys. Chem, B, vol. 105, 2001, pp. 9699-9710.
Pint, et al., "Synthesis of High Aspect-Ratio Carbon Nanotube "Flying Carpets" from Nanostructured Flake Substrates," Nano Letters, 2008, vol. 8, No. 7, pp. 1879-1883.

(56) References Cited

OTHER PUBLICATIONS

Qi, et al., "Toward Large Arrays of Multiplex Functionalized Carbon Nanotube Sensors for Highly Sensitive and Selective Molecular Detection," Nano Letters, vol. 3, No. 3, 2003, pp. 347-351.
Rosendale, et al., "A 4 Megabit Carbon Nanotube-based Nonvolatile Memory (NRAM)," ESSCIRC 2010 Proceedings, pp. 478-481.
Rueckes, et al., "Carbon Nanotube-Based Nonvolatile Random Access Memory for Molecular Computing," Science, 2000, vol. 289, pp. 94-97.
Servalli, G., "A 45nm Generation Phase Change Memory Technology," IEDM 2009 Technical Digest, pp. 5.7.1-5.7.4.
Shelimov, et al., "Purification of Single-Wall Carbon Nanotubes by Electronically Assisted Filtration," Chem. Phys. Ltrs., vol. 282, 1998, pp. 429-434.
Smith, et al., "Contamination Control and Pilot Manufacturing of Commercial Grade Carbon Nanotube Colloidal Formulations," 2013 SEMI Advanced Semiconductor Manufacturing Conference (ASMC 2013), 5 pages.
Snow, et al., "Random Networks of Carbon Nanotubes as an Electronic Material," App. Phys. Ltrs., vol. 82, No. 13, Mar. 2003, pp. 2145-2147.
Sotiropoulou, et al., "Carbon Nanotube Array-Based Biosensor," Anal Bioanal Chem, vol. 375, 2003, pp. 103-105.
Star, et al., "Nanoelectronic Carbon Dioxide Sensors," Adv. Mater., vol. 16, No. 22, 2004, pp. 2049-2052.
Star, et al., "Nanotube Optoelectronic Memory Devices," Nano Letters, vol. 4, No. 9, 2004, pp. 1587-1591.
Tawfick, et al., "Flexible High-Conductivity Carbon Nanotube Interconnects Made by Rolling and Printing," Small (Weinheiman der Bergstrasse, Germany) 2009, pp. 1-7.
Valentini, et al., "Sensors for sub-ppm NO2 Gas Detection Based on Carbon Nanotube Thin Films," Appl. Phys. Ltrs., vol. 82, No. 6, Feb. 2003, pp. 961-963.
Ward, et al., "A Non-Volatile Nanoelectromechanical Memory Element Utilizing a Fabric of Carbon Nanotubes," IEEE 2004, pp. 34-38.
Wu, Yihong, "Effects of Localized Electric Field on the Growth of Carbon Nanowalls," Nano Letters, 2002, vol. 2, No. 4, pp. 355-359.
Zhang, et al., "Metal Coating on Suspended Carbon Nanotubes and its Implications to Metal-tube Interaction," Chem. Phys. Ltrs., vol. 331, 2000, pp. 35-41.
Zhang, et al., "Select Pathways to Carbon Nanotube Film Growth," Adv. Mater., vol. 13, No. 23, Dec. 2001, pp. 1767-1770.
Zhang, et al., "Formation of Metal Nanowires on Suspended Single-Walled Carbon Nanotubes," Appl. Phys. Ltrs., vol. 77, No. 19, Nov. 2000, pp. 3015-3017.
Zhao, et al., "Frequency-Dependent Electrical Transport in Carbon Nanotubes," Phys. Review B, vol. 64, 2001, pp. 201402-1-201402-4.
Zhou, et al., "p-Channel, n-Channel Thin Film Transistors and p-n Diodes Based on Single Wall Carbon Nanotube Networks," Nano Letters, vol. 4, No. 10, 2004, pp. 2031-2035.

\* cited by examiner

3901

MICROFLUIDIC CONTROL SURFACES USING ORDERED NANOTUBE FABRICS

CROSS-REFERENCE TO RELATED APPLICATION

This application is a continuation-in-part of and claims priority under 35 U.S.C § 120 to U.S. patent application Ser. No. 15/241,495, filed Aug. 19, 2016, entitled "Methods For Arranging Nanoscopic Elements Within Networks, Fabrics, And Films," which is a continuation of and claims priority under 35 U.S.C. § 120 to U.S. Pat. No. 9,422,651, entitled "Methods For Arranging Nanoscopic Elements Within Networks, Fabrics, And Films," the contents of which are incorporated herein in their entirety by reference, which is a continuation-in-part of and claims priority under 35 U.S.C. § 120 to U.S. Pat. No. 9,574,290, filed on Nov. 12, 2010, entitled "Methods for Arranging Nanotube Elements within Nanotube Fabrics and Films," the contents of which are incorporated herein in their entirety by reference, which claims priority under 35 U.S.C. § 119(e) to U.S. Provisional Patent Application Ser. No. 61/319,034, filed on Mar. 30, 2010, entitled "Methods for Reducing Gaps and Voids within Nanotube Layers and Films" and U.S. Provisional Patent Application Ser. No. 61/350,263, filed on Jun. 1, 2010, entitled "Methods for Reducing Gaps and Voids within Nanotube Layers and Films," the contents of which are incorporated herein in their entirety by reference.

This application further claims priority under 35 U.S.C. § 119(e) to the following provisional applications, the contents of which are incorporated herein in their entirety by reference:

U.S. Provisional Patent Application Ser. No. 61/449,784 filed on Mar. 7, 2011, entitled "Methods for Arranging Nanotube Elements within Nanotube Fabrics and Films;"

U.S. Provisional Patent Application Ser. No. 61/304,045, filed on Feb. 12, 2010, entitled METHODS FOR CONTROLLING DENSITY, POROSITY, AND/OR GAP SIZE WITHIN NANOTUBE FABRIC LAYERS AND FILMS;

U.S. Provisional Patent Application Ser. No. 61/350,263, filed on Jun. 1, 2010, entitled "Methods for Reducing Gaps and Voids within Nanotube Layers and Films;" and U.S. Provisional Patent Application Ser. No. 61/319,034, filed on Mar. 30, 2010, entitled "Methods for Reducing Gaps and Voids within Nanotube Layers and Films."

This application is related to the following U.S. patents, which are assigned to the assignee of the present application, and are hereby incorporated by reference in their entirety:

U.S. Pat. No. 6,835,591, filed on Apr. 23, 2002, entitled METHODS OF NANOTUBE FILMS AND ARTICLES;

U.S. Pat. No. 7,335,395, filed on Jan. 13, 2003, entitled Methods of Using Pre-Formed Nanotubes to Make Carbon Nanotube Films, Layers, Fabrics, Ribbons, Elements, and Articles;

U.S. Pat. No. 7,259,410, filed on Feb. 11, 2004, entitled Devices Having Horizontally-Disposed Nanofabric Articles and Methods of Making the Same;

U.S. Pat. No. 6,924,538, filed on Feb. 11, 2004, entitled Devices Having Vertically-Disposed Nanofabric Articles and Methods of Making Same;

U.S. Pat. No. 7,375,369, filed on Jun. 3, 2004, entitled Spin-Coatable Liquid for Formation of High Purity Nanotube Films;

U.S. Pat. No. 7,365,632, filed on Sep. 20, 2005, entitled RESISTIVE ELEMENTS USING CARBON NANOTUBES;

U.S. Pat. No. 7,567,414, filed on Nov. 2, 2005, entitled NANOTUBE ESD PROTECTIVE DEVICES AND CORRESPONDING NONVOLATILE AND VOLATILE NANOTUBE SWITCHE;

U.S. Pat. No. 7,566,478, filed on Jan. 13, 2003, entitled Methods of Making Carbon Nanotube Films, Layers, Fabrics, Ribbons, Elements, and Articles;

U.S. Pat. No. 7,858,185, filed on Jun. 3, 2004, entitled HIGH PURITY NANOTUBE FABRICS AND FILMS;

U.S. Pat. No. 7,666,382, filed on Dec. 15, 2005, entitled Aqueous Carbon Nanotube applicator Liquids and Methods for Producing Applicator Liquids Thereof; and U.S. Pat. No. 8,937,575, filed on Jul. 31, 2009, entitled Anisotropic Nanotube Fabric Layers and Films and Methods of Forming Same.

BACKGROUND

Technical Field

The present disclosure relates generally to nanotube fabric layers and films and, more specifically, to methods for arranging nanotube elements within nanotube fabric layers and films via the application of a directional force.

Discussion of Related Art

Any discussion of the related art throughout this specification should in no way be considered as an admission that such art is widely known or forms part of the common general knowledge in the field.

Nanotube fabric layers and films are used in a plurality of electronic structures, and devices. For example, U.S. patent application Ser. 11/835,856 to Bertin et al., incorporated herein by reference in its entirety, teaches methods of using nanotube fabric layers to realize nonvolatile devices such as, but not limited to, block switches, programmable resistive elements, and programmable logic devices. U.S. Pat. No. 7,365,632 to Bertin et al., incorporated herein by reference, teaches the use of such fabric layers and films within the fabrication of thin film nanotube based resistors. U.S. patent application Ser. 12/066,063 to Ward et al., incorporated herein by reference in its entirety, teaches the use of such nanotube fabrics and films to form heat transfer elements within electronic devices and systems.

Through a variety of previously known techniques (described in more detail within the incorporated references) nanotube elements can be rendered conducting, non-conducting, or semi-conducting before or after the formation of a nanotube fabric layer or film, allowing such nanotube fabric layers and films to serve a plurality of functions within an electronic device or system. Further, in some cases the electrical conductivity of a nanotube fabric layer or film can be adjusted between two or more non-volatile states as taught in U.S. patent application Ser. No. 11/280,786 to Bertin et al., incorporated herein by reference in its entirety, allowing for such nanotube fabric layers and films to be used as memory or logic elements within an electronic system.

U.S. Pat. No. 7,334,395 to Ward et al., incorporated herein by reference in its entirety, teaches a plurality of methods for forming nanotube fabric layers and films on a substrate element using preformed nanotubes. The methods include, but are not limited to, spin coating (wherein a solution of nanotubes is deposited on a substrate which is then spun to evenly distribute said solution across the surface of said substrate), spray coating (wherein a plurality of nanotube are suspended within an aerosol solution which is then dispersed over a substrate), and dip coating (wherein a plurality of nanotubes are suspended in a solution and a substrate element is lowered into the solution and then removed).

Further, U.S. Pat. No. 7,375,369 to Sen et al., incorporated herein by reference in its entirety, and U.S. patent application Ser. No. 11/304,315 to Ghenciu et al., incorporated herein by reference in its entirety, teach nanotube solutions well suited for forming a nanotube fabric layer over a substrate element via a spin coating process.

While there exist a number of previously known techniques for moving and orienting individual nanotube elements—atomic force microscopy probes, for example, the use of which is well known by those skilled in the art for adjusting the position of single nanotube elements in laboratory experiments and the like—there is a growing need within the current state of the art to arrange relatively large scale films and fabrics of nanotube elements for larger scale, commercial applications. For example, as the physical dimensions of nanotube fabric based electronic devices scale below twenty nanometers, there is a growing need to develop denser nanotube fabrics. That is, to form nanotube fabrics in such a way as to limit the size of—or, in some cases, substantially eliminate—gaps and voids between individual nanotube elements. In another example, within certain applications—such as, but not limited to, nanotube fabric based field effect devices, nanotube fabric based photovoltaic devices, and nanotube fabric based sensors—there is a need for nanotube fabric layers that exhibit relatively uniform physical and electrical properties. Within such applications the orientation of nanotube elements relative to each other within a film can significantly affect the overall electrical parameters of the film (such as, but not limited to, charge mobility, sheet resistance, and capacitance).

Small scale nanotube arrangement techniques (such as, but not limited to, atomic force microscopy) are typically limited to adjusting the position of a very small number of nanotubes at a time, and then typically only in the micron range. Further such laboratory based methods are not scalable or easily adapted to any large scale, commercial application. As such, such methods are not practical for the arrangement of nanotube elements in large scale films and fabrics.

A number of previously known techniques for orienting nanotube elements within a relatively large scale film involve subjecting a dispersion of nanotube elements to an electrical or mechanical field as the dispersion is deposited over a substrate layer. For example, Ma et al. ("Alignment and Dispersion of Functionalized Carbon Nanotubes in Polymer Composites Induced by an Electric Field," *Carbon* 46(4):706-710 (2008)) teaches an alignment process for nanotube elements which includes applying an electrical field to a quantity of functionalized multi-walled carbon nanotubes suspended in a polymeric composite. Under the effect of the field, the functionalized nanotube will oriented themselves within the polymeric composite into a substantially uniform orientation. In another example, Merkulov et al. ("Alignment Mechanism of Carbon Nanofibers Produced by Plasma-Enhanced Chemical Vapor Deposition," *Applied Physics Letters* 79:2970 (2001)) teaches a method for directing the growth of carbon nanofibers by applying an electric field during a CVD growth process. In this way, nanotube growth will tend to follow the electric field lines.

Some other previously known techniques for orienting nanotube elements within a film involve applying a mechanical force to compress vertically grown (within respect to the plane of an underlying substrate) nanotube elements into a film of substantially parallel nanotubes. For example, de Heer, et al. (Aligned Carbon Nanotube Films: Production and Optical and Electronic Properties" *Science* 268(5212):845-847 (1995)) teaches a method of using a Teflon or aluminum pad to compress a vertically oriented distribution of nanotube elements into a film of essentially aligned nanotube elements. Similarly, Tawfick et al. ("Flexible High-Conductivity Carbon-Nanotube Interconnects Made by Rolling and Printing" *Small* (Weinheiman der Bergstrasse, Germany) (2009)) teaches a method of using a roller element to pack down a distribution of vertically grown nanotube elements into a substantially aligned horizontal film.

While these related techniques do not require a mobilizing fluid vehicle (as in the methods taught by Ma and Merkulov), they do require a distribution of vertically grown nanotubes. The fabrication and use of such vertical films grown in situ can be limiting within certain applications. For example, the growth of vertical nanotube films typically requires special operation conditions (such as, but not limited to, high temperatures, certain regents, and high gas pressures), which can be undesirable or otherwise inconvenient within certain semiconductor manufacturing operations. Such conditions may be incompatible with certain substrate materials, for example. Further, the catalysts used to grow nanotubes are typically metals or metalloids, materials which can be difficult to remove within high purity applications. Further, in situ growth of films limit the ability to form blends of nanotube formulations—for example, combinations of semiconducting and metallic nanotubes, single walled and multi walled nanotubes, or nanotubes mixed with other materials like buckyballs, silica, or other material particles. Further still, the roughness of vertically grown films is dictated by the density and uniformity of the vertical tubes as grown without additional liquid processing to enhance tube association. Such limitations within the growth of vertical nanotube films reduce their effectiveness and limit their applicability in large scale, commercial applications.

While these and other similar previously known methods provide some means of aligning or otherwise orienting nanotube elements, they are limited in that they require either wet suspensions of nanotube elements or nanotube elements grown in vertical orientations. Within many applications, these limitations will substantially limit the effectiveness of these techniques in commercial applications. Further, these previously known techniques will tend to limit the orientation of the aligned nanotube elements along a single direction. As such, there is a need for an efficient and relatively uncomplicated method of arranging nanotube elements within a dry nanotube fabric (for example, a nanotube fabric formed by spin coating a nanotube application solution over a substrate). Further, there is a need for a method of arranging nanotube elements within a nanotube fabric according to a preselected orientation (which may include nanotube arrangement along multiple directions).

SUMMARY

The current disclosure relates to methods for arranging nanotube elements within nanotube fabric layers and films via the application of a directional force.

In particular, the present disclosure provides a method for arranging nanoscopic elements within a network. The method comprises first providing a network of nanoscopic elements disposed over a material layer. The method further comprises applying a directional force to at least a portion of the network of nanoscopic elements to arrange at least a portion of the nanoscopic elements into an ordered network.

According to one aspect of the present disclosure a networks of nanoscopic elemenets include nanotube fabrics.

According to another aspect of the present disclosure nanoscopic elemenets include carbon nanotubes, nanowires, and mixtures thereof.

According to another aspect of the present disclosure a lubricating medium is deposited over a network of nanoscopic elements prior to the application of a directional force.

According to another aspect of the present disclosure, a method for forming a nanotube fabric layer comprises forming an unordered nanotube fabric layer over a material surface and applying a directional force over said unordered nanotube fabric layer to render at least a portion of said unordered nanotube fabric layer into an ordered network of nanotube elements.

According to another aspect of the present disclosure a puncture resistant material comprises a supporting structure and an ordered nanotube fabric element, said ordered nanotube fabric element comprising at least one ordered nanotube fabric layer, wherein said ordered nanotube fabric element is affixed to said supporting structure such that said ordered nanotube fabric element covers to a least a portion of said supporting structure material.

According to another aspect of the present disclosure an ordered nanotube fabric layer comprises a network of nanotube elements wherein groupings of said nanotube elements are arranged in a substantially uniform manner such that said groupings of nanotube elements are positioned essentially parallel to adjacent nanotube elements.

According to another aspect of the present disclosure an ordered nanotube fabric layer comprises a network of nanotube elements densely packed together, substantially minimizing gaps within said ordered nanotube fabric layer.

According to another aspect of the present disclosure an ordered nanotube fabric layer comprises a network of nanotube elements wherein the individual nanotube elements are separated from adjacent nanotube elements by gaps on the order of 1-2 nm.

According to another aspect of the present disclosure an ordered nanotube fabric layer comprises a network of nanotube elements wherein the individual nanotube elements are separated from adjacent nanotube elements by gaps on the order of 10 nm.

According to another aspect of the present disclosure an ordered nanotube fabric layer comprises a network of nanotube elements wherein the individual nanotube elements are separated from adjacent nanotube elements by gaps on the order of 50 nm.

According to another aspect of the present disclosure an ordered nanotube fabric layer comprises a network of functionalized nanotube elements, said functionalized elements coated with moieties such as to electrically insulate the sidewalls of individual nanotube elements from the sidewalls of adjacent nanotube elements.

According to another aspect of the present disclosure a nanotube fabric layer comprises an ordered network of nanotube elements, wherein substantially all of the nanotube elements are parallel to and in contact with a plurality of other nanotube elements along the long axis of the nanotube elements.

According to another aspect of the present disclosure a nanotube fabric layer comprises an ordered network of nanotube elements, wherein the nanotube fabric is impermeable to micron-sized particles.

According to another aspect of the present disclosure a nanotube fabric layer comprises an ordered network of nanotube elements, wherein the nanotube fabric is impermeable to nano-sized particles.

According to another aspect of the present disclosure an unordered nanotube fabric layer is formed via at least one spin coating operation.

Under another aspect of the present disclosure an unordered nanotube fabric layer is formed via at least one spray coating operation.

Under another aspect of the present disclosure an unordered nanotube fabric layer is formed via at least one dip coating operation.

Under another aspect of the present disclosure an unordered nanotube fabric layer is formed via a silk screen printing process.

Under another aspect of the present disclosure an unordered nanotube fabric layer is formed via a gravure or other large format film printing process.

Under another aspect of the present disclosure a rolling force is applied to an unordered nanotube fabric layer by rolling a cylindrical element over said unordered nanotube fabric layer.

Under another aspect of the present disclosure a rubbing force is applied to an unordered nanotube fabric layer by sliding the unordered nanotube fabric layer over a material surface.

Under another aspect of the present disclosure a directional force is applied to an unordered nanotube fabric layer by positioning a pliant film onto the CNT surface and then impinging a pressurized gas, a jet of frozen gas, or a jet of other particles or liquids over the surface of the intervening pliant layer Under another aspect of the present disclosure a polishing force is applied to an unordered nanotube fabric layer by passing a polishing material over the surface of the unordered nanotube fabric layer.

Under another aspect of the present disclosure a polishing force is applied to an unordered nanotube fabric layer by applying a rotating polishing material to the surface of the unordered nanotube fabric layer.

Other features and advantages of the present invention will become apparent from the following description of the invention which is provided below in relation to the accompanying drawings.

DETAILED DESCRIPTION

Figure 1:
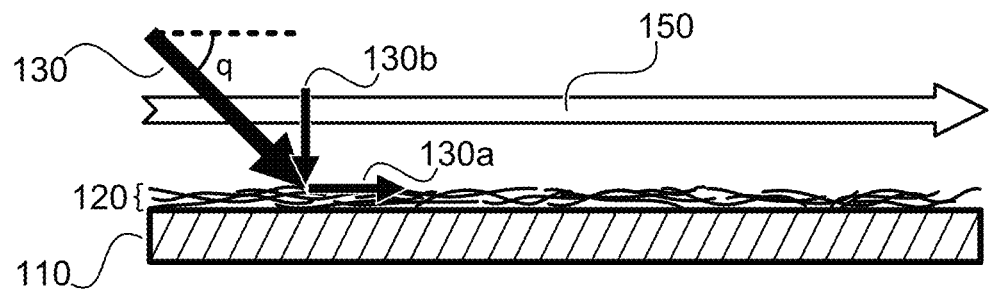
FIG. 1 is force diagram illustrating the translation of a directional force over a nanotube fabric.

The present disclosure teaches methods to arrange nanotube elements within nanotube fabric layers and films through the application of a directional force applied over such layers and films. These approaches can be employed to render regions, within a deposited nanotube fabric layer, into one or more networks of substantially ordered nanotube elements—that is, regions wherein the nanotube elements are oriented in a substantially uniform arrangement such that they group together along their sidewalls. In this manner, for example, nanotube fabrics may be created which are highly dense. In certain applications, such ordered nanotube fabric layers would be essentially free of gaps and voids between nanotube elements. Or, in another example, ordered nanotube fabrics may be created which are essentially free of gaps and voids greater than a certain dimension. Further, in another example, such methods may be used to realize nanotube fabrics wherein the number of gaps and voids within the fabric is significantly reduced. In still another example, an ordered nanotube fabric layer, arranged according to the methods of the present disclosure, includes a plurality of nanotube elements oriented in substantially the same direction.

It should be noted that within the present disclosure the term "network" is used to describe an arrangement of nanotube elements dispersed over the surface of a substrate. In certain applications networks of nanotube elements are relatively dense, with nanotube elements packed tightly together and, in some cases, entwined with adjacent nanotube elements. In other applications network of nanotube elements are relatively sparse, with gaps and spaces between individual nanotube elements. Within certain applications, individual nanotube elements with sparse networks might be separated by gaps on the order of 1-2 nm. Within other applications such gaps might be on the order of 10 nm. Within still other applications such gaps might be on the order of 50 nm.

A fabric of nanotubes as referred to herein for the present disclosure includes a layer of multiple, interconnected carbon nanotubes. A fabric of nanotubes (or nanofabric), in the present disclosure, e.g., a non-woven carbon nanotube (CNT) fabric, may, for example, have a structure of multiple entangled nanotubes that are irregularly arranged relative to one another. Alternatively, or in addition, for example, the fabric of nanotubes for the present disclosure may possess some degree of positional regularity of the nanotubes, e.g., some degree of parallelism along their long axes. Such positional regularity may be found, for example, on a relatively small scale wherein flat arrays of nanotubes are arranged together along their long axes in rafts on the order of one nanotube long and ten to twenty nanotubes wide. In other examples, such positional regularity maybe found on a larger scale, with regions of ordered nanotubes, in some cases, extended over substantially the entire fabric layer. Such larger scale positional regularity is of particular interest to the present disclosure.

The fabrics of nanotubes retain desirable physical properties of the nanotubes from which they are formed. For example, in some electrical applications the fabric preferably has a sufficient amount of nanotubes in contact so that at least one ohmic (metallic) or semi-conductive pathway exists from a given point within the fabric to another point within the fabric. Single walled nanotubes may typically have a diameter of about 1-3 nm, and multi walled nanotubes may typically have a diameter of about 3-30 nm. Nanotubes may have lengths ranging from about 0.2 microns to about 200 microns, for example. The nanotubes may curve and occasionally cross one another. Gaps in the fabric, i.e., between nanotubes either laterally or vertically, may exist. Such fabrics may include single-walled nanotubes, multi-walled nanotubes, or both. The fabric may have small areas of discontinuity with no tubes present. The fabric may be prepared as a layer or as multiple fabric layers, one formed over another. The thickness of the fabric can be chosen as thin as substantially a monolayer of nanotubes or can be chosen much thicker, e.g., tens of nanometers to hundreds of microns in thickness. The porosity of the fabrics can vary from low density fabrics with high porosity to high density fabrics with low porosity. Such fabrics can be prepared by growing nanotubes using chemical vapor deposition (CVD) processes in conjunction with various catalysts, for example. Other methods for generating such fabrics may involve using spin-coating techniques and spray-coating techniques with preformed nanotubes suspended in a suitable solvent, silk screen printing, gravure printing, and electrostatic spray coating. Nanoparticles of other materials can be mixed with suspensions of nanotubes in such solvents and deposited by spin coating and spray coating to form fabrics with nanoparticles dispersed among the nanotubes. Such exemplary methods are described in more detail in the related art cited in the Background section of this disclosure.

It should be noted that while much of the present disclosure discusses methods for the arrangement of nanotube elements within a nanotube fabric, the methods of the present disclosure are not limited in this regard. Indeed, the methods of the present disclosure can be used to arrange high aspect ratio nanoscopic elements (that is, nanoscopic "tube like" structures with length to width ratios on the order of 4 to 1 wherein at least one of those dimensions—length or width—is less than 100 nm) within a plurality of fabrics or networks. Such nanoscopic elements include, but are not limited to, single wall nanotubes, multiwalled nanotubes, nanowires, and mixtures thereof. Nanowires as mentioned herein is meant to mean single nanowires, aggregates of non-woven nanowires, nanoclusters, nanowires entangled with nanotubes comprising a nanofabric, mattes of nanowires, etc. Examples of nanowire (nanorod) materials are alumina, bismuth, cadmium, selenide, gallium nitride, gold, gallium phosphide, germanium, silicon, indium phosphide, magnesium oxide, manganese oxide, nickel, palladium, silicon carbide, titanium, zinc oxide and additional mixed nanowires such as silicon germanium or other types which are coated. Further, within the present disclosure networks of nanoscopic elements are described as arrangements of such freely formed and deposited nanoscopic elements in a substantially planer configuration. Exemplary networks of nanoscopic elements include, but are not limited to, nanotube fabric layers as described within the present disclosure and arrangements of nanowires dispersed over a material surface.

As described within U.S. Pat. No. 7,375,369 to Sen et al. and U.S. patent application Ser. No. 11/304,315 to Ghenciu et al., both incorporated herein by reference in their entirety, nanotube fabrics and films can be formed by applying a nanotube application solution (for example, but not limited to, a plurality of nanotube elements suspended within an aqueous solution) over a substrate element. A spin coating process, for example, can be used to evenly distribute the nanotube elements over the substrate element, creating a substantially uniform layer of nanotube elements. In other cases, other processes (such as, but not limited to, spray coating processes, dip coating processes, silk screen printing processes, and gravure printing processes) can be used to apply and distribute the nanotube elements over the substrate element. In other cases, CVD growth of nanotubes on a material surface may be used to realize an unordered nanotube fabric layer. Further, U.S. patent application Ser. No. 61/304,045 to Sen et al., incorporated herein by reference in its entirety, teaches methods of adjusting certain parameters (for example, the nanotube density or the concentrations of certain ionic species) within nanotube application solutions to either promote or discourage rafting—that is, the tendency for nanotube elements to group together along their sidewalls and form dense, raft-like structures—within a nanotube fabric layer formed with such a solution. By increasing the incidence of rafting within nanotube fabric layers, the density of such fabric layers can be increased, reducing both the number and size of voids and gaps within such fabric layers.

It should be noted that nanotube elements used and referenced within the embodiments of the present disclosure may be single-walled nanotubes, multi-walled nanotubes, or mixtures thereof and may be of varying lengths. Further, the nanotubes may be conductive, semiconductive, or combinations thereof. Further, the nanotubes may be functionalized (for example, by oxidation with nitric acid resulting in alcohol, aldehydic, ketonic, or carboxylic moieties attached to the nanotubes), or they may be non-functionalized.

It should be noted that the methods of the present disclosure are well suited for arranging functionalized nanotube elements within a nanotube fabric layer. Nanotube elements may be functionalized for a plurality of reasons. For example, certain moieties may be formed on the sidewalls of nanotube elements to add in the dispersion of those elements within an application solution. In another example, certain moieties formed on the sidewalls of nanotube elements can aid in the efficient formation of a nanotube fabric. In a further example, nanotube elements can be functionalized with certain moieties such as to electrically insulate the sidewalls of the nanotube elements. Nanotube elements can be functionalized by attaching organic, silica, or metallic moieties (or some combination thereof) to the sidewalls of the nanotube elements. Such moieties can interact with nanotube elements covalently or remain affixed through $\pi$-$\pi$ bonding.

The reduction or substantial elimination of gaps and voids within a nanotube fabric layer is particularly useful for devices with extremely small circuit sizes in which a uniform dispersion of nanotubes is desired. For example, when a fabric with very few—or only very small—gaps and voids is patterned and etched, the remaining nanotube article is effectively assured of containing nanotubes as opposed to lacking nanotubes as a result of a large void in the fabric. As the feature sizes decrease along with currently practiced lithography techniques, minimizing gaps and voids within nanotube fabric layers becomes more important to ensure a higher yield of functional circuit elements as the fabric is being etched.

For example, within some applications advancing lithography techniques may determine a minimum feature size (e.g., on the order of 20 nm). Voids and gaps within a nanotube fabric layer larger than some fraction of such a feature size (e.g., larger than about 10 nm) may result in nonfunctioning or ineffective circuit elements. By minimizing—or otherwise substantially eliminating—gaps and voids within a nanotube fabric layer, the incidence of such nonfunctioning or ineffective circuit elements can be significantly reduced.

In some applications by minimizing or substantially eliminating gaps and voids within a nanotube fabric layer, the density of an array of nanotube switching devices fabricated from that layer may be increased. U.S. patent application Ser. No. 11/280,786 to Bertin et al., incorporated herein by reference in its entirety, teaches a nonvolatile two terminal nanotube switch structure having (in at least one embodiment) a nanotube fabric article deposited between two electrically isolated electrode elements. As Bertin teaches, by placing different voltages across said electrode elements, the resistive state of the nanotube fabric article can be switched between a plurality of nonvolatile states. That is, in some embodiments the nanotube fabric article can be repeatedly switched between a relatively high resistive state (resulting in, essentially, an open circuit between the two electrode elements) and a relatively low resistive state (resulting in, essentially, a short circuit between the two electrode elements).

In other applications, relatively low density ordered nanotube fabrics—in some cases, on the order of a single nanotube thick—can be highly beneficial. Certain logic applications, for example, make use of relatively thin nanotube fabric layers as charge conducting planes. Such applications require that conduction paths through the nanotube fabric layer be substantially uniform. Within such applications, a thin and/or low density nanotube fabric layer can be arranged into an ordered network of nanotube elements oriented in a uniform direction, wherein the individual nanotube elements tend not to overlap or contact adjacent nanotube elements.

The fabrication of an array of such nanotube switching devices can include patterning of a nanotube fabric layer to realize a plurality of these nanotube fabric articles. The number and the size of the gaps and voids within a nanotube fabric layer can limit the feature size to which these nanotube fabric articles within such an array can be patterned. For example, within a nanotube switching device array wherein the individual nanotube switching devices are on the order of 20 nm square (that is, the nanotube fabric article within each device is essentially 20 nm by 20 nm), gaps within the nanotube fabric layer larger than about 10 nm, for example, may result in nonfunctioning or ineffective nanotube switching devices. For example, a typical unordered nanotube fabric layer may exhibit gaps over approximately 25% of its surface, and a typical ordered nanotube fabric layer may exhibit gaps over approximately 2% of its surface. By minimizing the number of gaps within the fabric layer—or limiting the size of these gaps—prior to the formation of the array of nanotube switching elements, the incidence of these nonfunctioning or ineffective nanotube switching devices can be significantly reduced or—in some applications—essentially eliminated.

Within the methods of the present disclosure, nanotube fabrics are typically formed over other material layers (through, for example, one or more spin coating operations). In some applications this material layer may be a silicon wafer. In other applications, this material layer may be a conductive material, such as, but not limited to, tungsten, aluminum, copper, nickel, palladium, titanium nitride, and tungsten nitride. In still other applications, this material layer may be a semiconducting material such as, but not limited to, silicon and gallium arsenide. In other applications, this material layer may be a dielectric material such as, but not limited to, silicon oxide and aluminum oxide. In still other applications, this material layer may be an organic semiconducting material such as, but not limited to, polyfluorene polythiophenes, polyacetylenes, polypyrroles, polyanilines, poly(p-phenylene sulfide), and poly(p-phenylene vinylene)s.

In some applications this material layer may be formed of a rigid material, such as, but not limited to, metal (e.g., steel or aluminum), ceramic, or glass. In other applications it may be formed of a flexible material such as a plastic film or sheet—e.g., polyethylene terephthalate (PET), polymethylmethacrylate, polyamides, polysulfones, and polycyclic olefins. In other applications a desired interface material (such as, but not limited to, silicon oxide) may be formed over a rigid material (such as, but not limited to, steel) to form a rigid structural composite which provides a substrate with the desired interface properties of a first material with the structural properties of a second material.

Dependant on the needs of an application, such material layers may be formed from materials such as, but not limited to, elemental silicon, silicon oxide, silicon nitride, silicon carbides, PTFE, organic polymer (including, but not limited to, polyesters, pvc, styrenes, polyvinyl alcohol, and polyvinyl acetate), hydrocarbon polymers (including, but not limited to, poly ethylene, polly propylene, and polycellosics), inorganic backbone polymers (including, but not limited to, siloxanes, polyphophazenes), boron nitride, gallium arsenide, group III/V compounds, group II/VI compounds, wood, metals—including metal alloys and metal oxides (including, but not limited to, steel, aluminum, nickel, iron, manganese, titanium, copper, zinc, and tin), ceramics (including, but not limited to, aluminum oxide, cerium oxide, magnesium oxide, titanium oxide, tin oxides, zinc oxides), and glass (including, but not limited to, silicate glass, boron silicate glass, and sodium silicate glass).

In certain embodiments of the present disclosure, nanotube fabric layers (rendered into ordered networks of nanotube elements by the methods of the present disclosure) may be separated from a material layer to realize standalone nanotube fabric layers.

In other applications an ordered nanotube fabric layer—wherein, for example, the majority of nanotube elements are oriented in substantially the same direction—can be used to provide a nanotube fabric which exhibits a relatively uniform electrical or physical properties (such as, but not limited to, sheet resistance, uniformity of charge carriers, and heat transfer). Such ordered nanotube fabric can be useful in the fabrication of electronic devices and components, such as, but not limited to, non-volatile switching elements, nanotube fabric based logic devices, and heat transfer structures.

In other applications an ordered nanotube fabric layer substantially free of gaps and voids can be used to form a protective barrier layer over or around an adjacent material layer. For example, a thin nanotube fabric layer comprised of an ordered network of nanotube elements may be formed over a thicker unordered nanotube fabric layer. In this way, the thin ordered nanotube fabric layer—essentially free of gaps and voids—provides a barrier layer between the thicker unordered nanotube layer and any material layer (e.g., a conductive contact layer such as tungsten) deposited over the two nanotube fabric layers in subsequent process steps. In another example, an ordered nanotube fabric layer—with minimal gaps and voids—can be used to protect an underlying material layer from external contaminants (e.g., water, catalytic metals, and amorphous carbon). Such an ordered nanotube fabric layer may be used, for example, to form a substantially hydrophobic protective layer for OLED (organic light emitting diode) displays or photovoltaic cells. In another example, such ordered nanotube fabric layers may be used to realize protective packaging for shipping materials. In still another example such an ordered nanotube fabric layer may be used to form an anticorrosion layer over the body panel of a vehicle.

In other applications an ordered nanotube fabric layer can be used to provide a low or otherwise reduced frictional coating over a material layer. In certain applications an ordered nanotube fabric layer (wherein the nanotube elements have been oriented in a substantially uniform direction via the methods of the present disclosure) will exhibit a low coefficient of friction. Such ordered nanotube fabric layers can be used to reduce the friction between moving pieces within mechanical systems (such as, but not limited to, engine cylinders, pistons, and moving elements within MEMS devices). Such ordered nanotube fabric layers can also be used to provide low friction coatings over certain objects (such as, but not limited to, cookware and skis).

FIG. 1 is a force diagram illustrating the translation of an exemplary directional force over a nanotube fabric 120. As depicted in FIG. 1, an applied force 130 is delivered to the surface of a nanotube fabric 120 at angle θ (within this example, the nanotube fabric 120 has been formed over a material layer 110). The vertical 130b and horizontal 130a components of this applied force 130 act upon nanotube fabric layer 120 as the applied force 130 is moved across the nanotube fabric layer 120 along direction 150. The horizontal component 130a of applied force 130 works across the nanotube fabric 120 within the plane of the nanotube fabric 120, creating a directional force across the nanotube fabric layer. In some embodiments of the present disclosure—those embodiments wherein the horizontal component 130a of the applied force 130 is essentially a frictional force—the magnitude vertical component 130b of the applied force 130 can be used to modulate the magnitude horizontal component, and thus, the magnitude of the directional force. As will be shown within the present disclosure, the translation of such a directional force across a nanotube fabric will tend to arrange the nanotube elements within the nanotube fabric into an ordered network oriented substantially along the path of the directional force. The work done by translating a directional force across a nanotube fabric imparts energy into the nanotube fabric, which is used to arrange the individual nanotube elements. In certain embodiments of the present disclosure, multiple iterations of a directional force (that is, multiple passes of a directional force across the nanotube fabric) will impart such energy as to render more and more of the nanotube elements into an ordered arrangement with each successive pass.

The present disclosure teaches multiple apparatus for translating a directional force over a nanotube fabric in one or more directions. In some embodiments a directional force is applied once over a nanotube fabric. In other embodiments a directional force is applied multiple times, with each iteration of the applied directional force following substantially the same path (either moving back and forth over this path, or returning to a starting position for each iteration such that the directional force is only applied in a single direction) across the nanotube fabric. In some embodiments a substantially uniform directional force (in terms of magnitude and direction) will be applied over an entire nanotube fabric in order to orient the nanotube elements within the fabric along a single direction. In other embodiments the magnitude and direction of a directional force will be selected for different regions of a nanotube fabric such as to orient the nanotube elements within a fabric into a preselected pattern. It should be noted that, in the preferred embodiment of the present disclosure, an applied force (130 in FIG. 1) is applied at a non-perpendicular angle (that is θ is not equal to 90 degrees) and applied for multiple iterations. Further, it is preferable to use more iterations than fewer.

By applying a directional force over an essentially unordered network of nanotube elements, the nanotube elements may be rendered into an essentially ordered network, significantly limiting—or, in some applications, substantially eliminating—the number of gaps and voids between nanotube elements and orienting the nanotube elements into one or more substantially uniform directions. It should be noted that while the diagram of FIG. 1 depicts the application of a linear directional force applied directly to a nanotube fabric, the methods of the present disclosure are not limited in this regard. According to the methods of the present disclosure this directional force can be directly applied (wherein, for example, an apparatus applies a directional force directly to nanotube elements within a fabric layer) or transferred (wherein, for example, a directional force is applied through an another material). Further, in certain applications a directional force applied directly to one or more nanotube elements in a nanotube fabric layer can be transferred through those elements to other nanotube elements within the fabric layer. Exemplary directional forces include, but are not limited to, rolling, rubbing, polishing, and cryokinetic impingement. Such forces can be applied linearly (that is, across the surface of a fabric layer along a straight line), in an arc, or rotationally.

As previously discussed, it should be noted that a directional force as described above can be applied over a freely formed, fixed nanotube fabric. That is, over a substantially dry, fully formed nanotube fabric (that is, a nanotube fabric substantially free of any suspension medium which allows the nanotubes a range of motion) and formed from a plurality of free nanotube elements. That is, nanotube elements produced and harvested in an independent operation, such that the nanotube elements may be purified, sorted, and selected as desired by the needs of a specific application. In certain applications, this will allow the method for arranging nanotube elements within a nanotube fabric to essentially decouple from the method of forming that fabric. In this way, the methods of the present disclosure can be used to arrange nanotube fabric layers formed through a plurality of deposition and formation techniques (such as, but not limited to, spin coating, spray coating, dip coating, silk screen printing, and gravure printing) at a desired or preselected density, geometry, and configuration.

Further, the methods of the present disclosure do not require vertically grown films. As previously discussed, such vertically grown films (as well as the previously known methods for flatting them into a substantially aligned arrangement) can be limiting in many applications. For example, the previously known methods for flattening vertical films are limited in that they cannot rearrange nanotube elements once they have been flattened. As will be shown, in certain embodiments the methods of the present disclosure can be used to arrange a freely formed fixed nanotube fabric multiple times and in multiple directions. Vertically grown films can also be limited in applications where a nanotube film is formed over a non-flat material layer. Growing from a deposited catalyst layer, vertically grown nanotubes in such applications will tend to follow the topography of an underlying material layer. In such applications, however, a freely formed, fixed nanotube fabric can deposited in relatively thick layers (via, for example, a spin coating operation) such as to provide a substantially planar top surface. The methods of the present disclosure can then be used to arrange part or all of this freely formed, fixed nanotube fabric into a dense, ordered network of nanotube elements.

It should also be noted that while vertically grown nanotube films are limited in the type and quality of nanotube elements grown, a freely formed fixed nanotube fabric layer can be comprised of independently selected (and in some cases, purified and/or functionalized) nanotube elements. As such, the methods of the present disclosure may be used to arrange nanotube elements within a nanotube fabric formed with a preselected configuration. For example, the methods of the present disclosure can be used to arrange nanotube elements within nanotube fabrics made up of metallic nanotubes, semiconducting nanotubes, or some combination thereof. Similarly, the methods of the present disclosure can be used to arrange nanotube elements within nanotube fabrics made up of single walled nanotubes, multi walled nanotubes, or some combination thereof. Further, the methods of the present disclosure can be used to arrange nanotube elements within nanotube fabrics which are composites of nanotubes and other materials (such as, but not limited to, buckyballs, silica particles, amorphous carbon, silver nanotubes, quantum dots, colloidal silver, and monodisperse polystyrene beads). Further still, the methods of the present disclosure can be used to arrange nanotube elements within nanotube fabrics made up of nanotube elements which have been functionalized to have specific electrical properties or to react with certain physical or chemical conditions in a desired way.

In some embodiments of the present disclosure a directional force is applied over a nanotube fabric by moving a material surface across the nanotube fabric. In other embodiments a directional force is applied by moving a nanotube fabric (affixed to some substrate element, for example) across a fixed material surface. Further, the methods of the present disclosure can be used to arrange nanotube fabrics that include mixtures of nanotube elements and other materials. Such materials can include, but are not limited to, buckyballs, amorphous carbon, silver nanotubes, quantum dots (on the order of 2-10 nm), colloidal silver (on the order of 20 nm), monodisperse polystyrene beads (on the order of 200 nm), and silica particles (up to 600 nm). The methods of the present disclosure can be used to arrange nanotube elements within nanotube fabrics comprised of single wall nanotubes or multi wall nanotubes (or some combination, thereof). The methods of the present disclosure can also be used to arrange nanotube elements within nanotube fabrics comprised of metallic nanotubes or semiconducting nanotubes (or some combination, thereof).

In certain applications it may be desirable to arrange only a portion of a nanotube fabric into an ordered network of nanotube elements. Such applications might require a fabric to have certain regions ordered and other regions unordered or might require that the overall porosity of a nanotube fabric be reduced by a preselected value, such as would be achieved by only partially ordering a nanotube fabric. The methods of the present disclosure are well suited to such applications (as compared with previously known methods for adjusting the positions of nanotube elements within a nanotube film) as the degree to which a nanotube fabric is ordered is easily controlled by modulation of the magnitude of a directional force and the number of times that directional force is translated across the nanotube fabric (that is, the number of iterations). The use of such parameters within the present disclosure to partially order a nanotube fabric layer (or to arrange only nanotubes within preselected regions of a nanotube fabric) are shown and described in detail in the discussion of the subsequent figures.

Figure 2A:
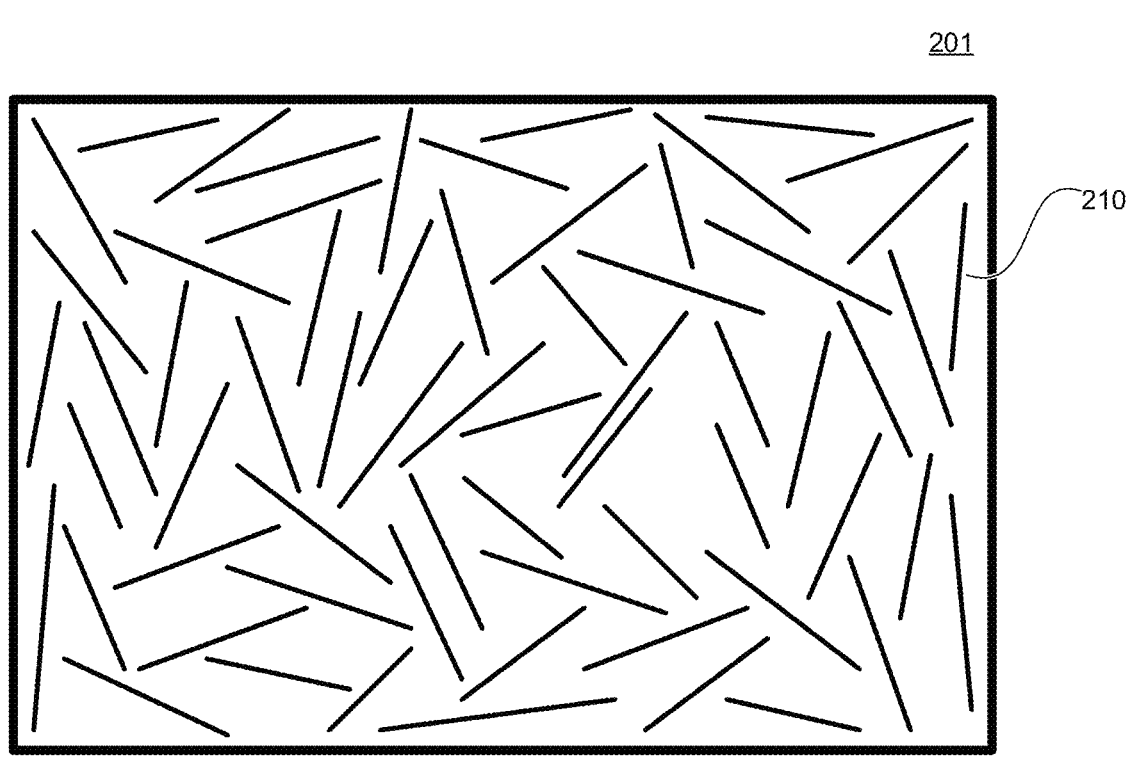
FIG. 2A is an illustration of an exemplary nanotube fabric layer comprised of a substantially unordered network of nanotube elements.
Figure 2B:
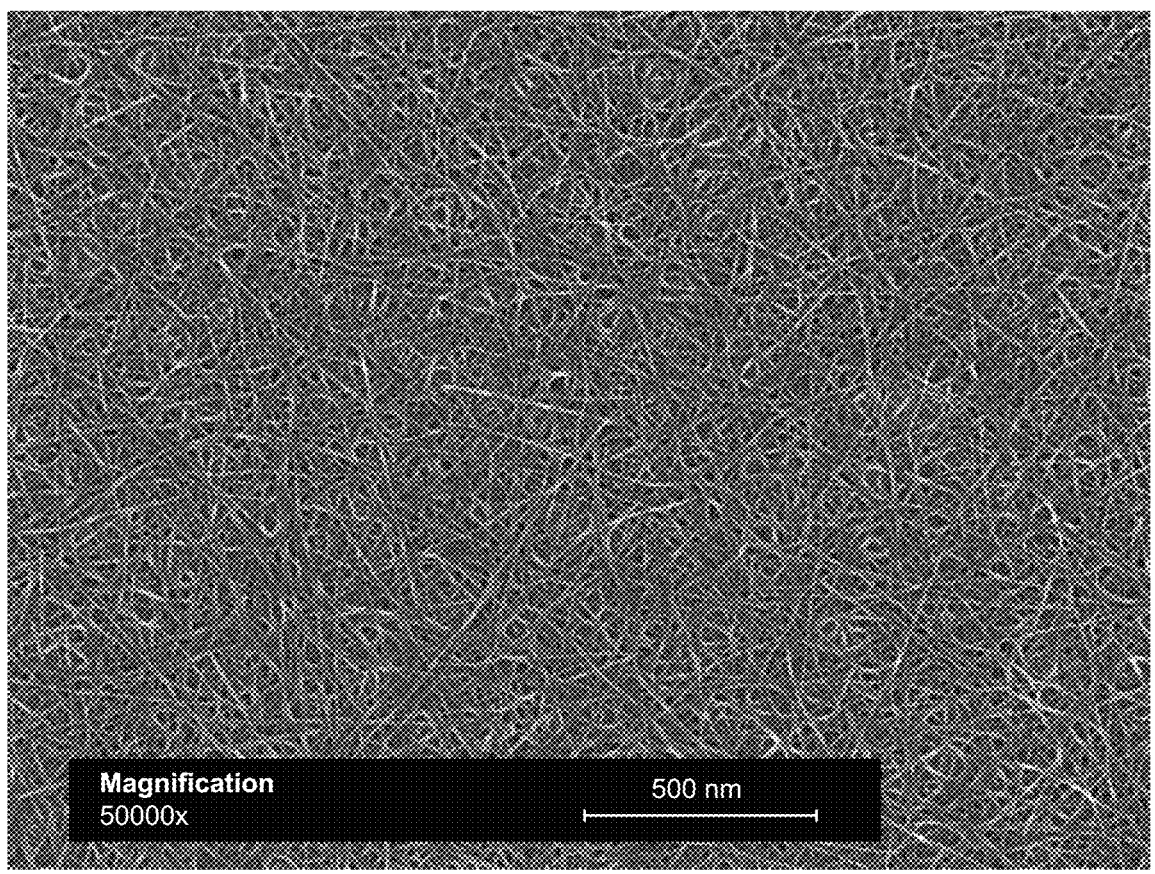
FIG. 2B is an SEM image of an exemplary nanotube fabric layer comprised of a substantially unordered network of nanotube elements.

FIG. 2A depicts a substantially unordered nanotube fabric layer 201 comprising a plurality of nanotube elements 210 deposited in a plurality of orientations with respect to each other. Within such a nanotube fabric layer 201, gaps and voids between the nanotube elements 210 are evident throughout the fabric layer 201. Taken another way, the nanotube fabric layer 201 depicted in FIG. 2A might be considered to have a low density of nanotube elements 210, with a relatively low number of nanotube elements 210 per unit of cross-sectional area. FIG. 2B is an SEM image depicting a nanotube fabric layer 202 analogous to the unordered nanotube fabric layer 201 depicted in FIG. 2A.

Figure 2C:
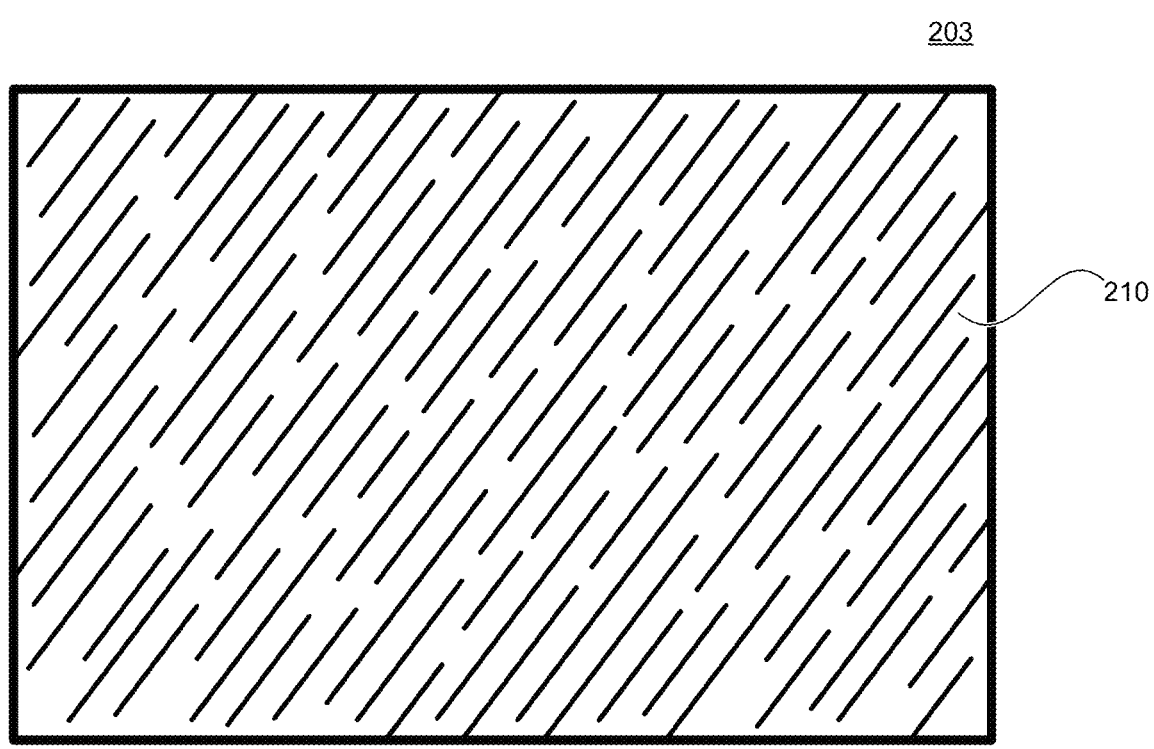
FIG. 2C is an illustration of an exemplary nanotube fabric layer comprised of a highly ordered network of nanotube elements.
Figure 2D:
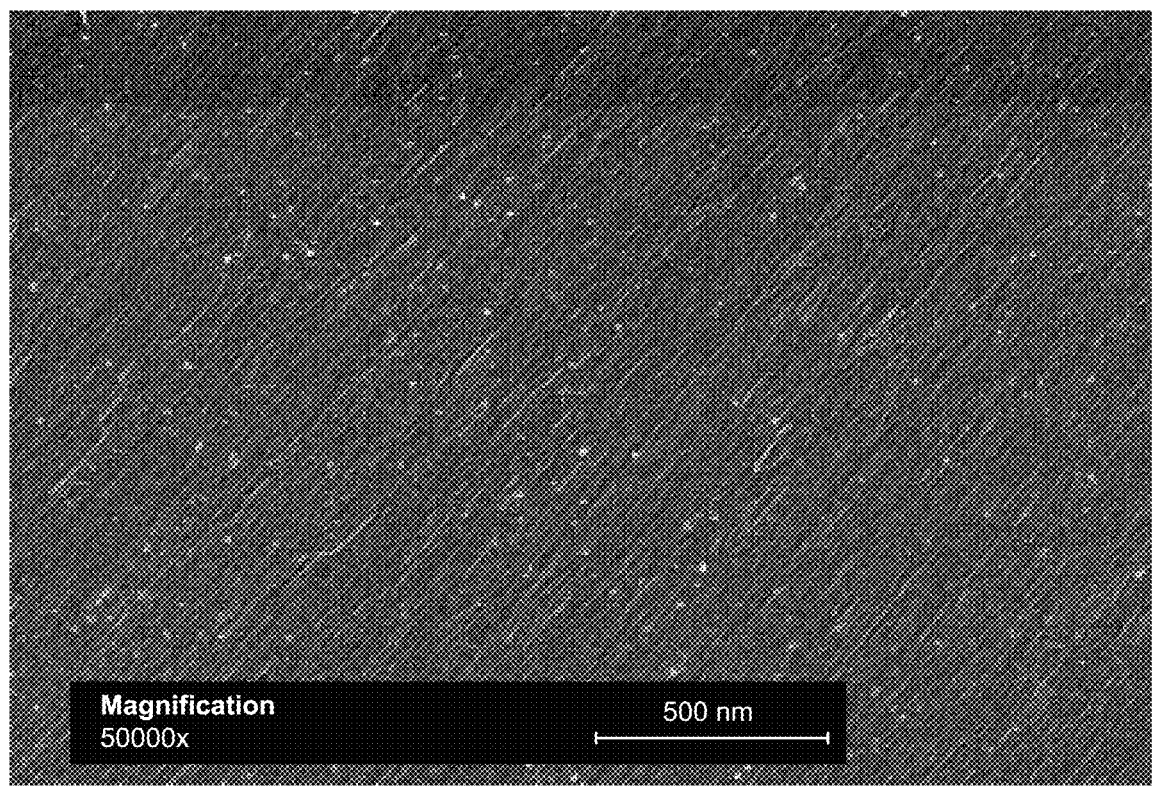
FIG. 2D is an SEM image of an exemplary nanotube fabric layer comprised of a highly ordered network of nanotube elements.

FIG. 2C depicts a nanotube fabric layer 203 comprising a network of substantially ordered nanotube elements 210. That is, the nanotube elements 210 within nanotube fabric layer 203 are arranged in a substantially uniform arrangement such that adjacent nanotube elements 203 group together along their sidewalls, substantially eliminating gaps between nanotube elements. Taken another way, the ordered nanotube fabric layer 203 depicted in FIG. 2C might be considered to have a high density of nanotube elements 210, with a relatively high number of nanotube elements 210 per unit of cross-sectional area. FIG. 2D is an SEM image depicting a nanotube fabric layer 204 analogous to the ordered nanotube fabric layer 203 depicted in FIG. 2C.

It should be noted that the illustrations within FIGS. 2A and 2C have been provided simply to illustrate the methods of the present disclosure and have been rendered in such a way as to aid in the explanation of these methods. In particular, the relative sizes, positions, and density of the nanotube elements 210 depicted within FIGS. 2A and 2C have been designed such as to logically illustrate the relative orientation change between an unordered (FIG. 2A) and an ordered (FIG. 2C) nanotube fabric layer and have not been drawn to a uniform scale. Indeed, as will be clear to those skilled in the art, within both exemplary nanotube fabric layers 201 and 203, nanotube elements 210 would be packed much closer together with substantial overlapping and contact between adjacent nanotube elements 210. Further, gap sizes between individual nanotube elements 210 would be much smaller relative to the size of nanotube elements 210. FIGS. 2B and 2D (actual SEM images of unordered and ordered nanotube fabrics, respectively) have been included to provide realistic images of such fabrics to complement the essentially schematic representations depicted in FIGS. 2A and 2C.

FIGS. 3A-3F illustrate an exemplary process for rendering a substantially unordered nanotube fabric layer (such as the nanotube fabric layers 201 and 202 depicted in FIGS. 2A and 2B) into an ordered network of nanotube elements (such as in the nanotube fabric layers 203 and 204 depicted in FIGS. 2C and 2B). The exemplary process detailed in FIGS. 3A-3F has been intended to introduce and facilitate the discussion (on a relatively high level) of the methods of the present disclosure, specifically the use of a directional force to render an unordered nanotube fabric layer into an ordered network of nanotube elements. As such, while the exemplary process detailed in FIGS. 3A-3F initially introduces the use of a rolling process to apply a directional force for purposes of this overview, such a process will be discussed in greater detail within the discussion of FIGS. 7A-7C. Further, the present disclosure will also detail (in subsequent figures) a plurality of other processes for applying such a directional force to a nanotube fabric layer, including rolling, rubbing, polishing, and cryokinetic impingement.

Within the exemplary process illustrated in FIGS. 3A-3F, a substantially unordered nanotube fabric layer is first formed via three deposition operations. That is, three deposition operations—for example, three spin coating operations—are performed to realize an unordered nanotube fabric layer formed via three separately deposited layers of nanotube elements, each subsequent layer formed over the previously formed layer. As previously discussed, such unordered nanotube fabric layers can be realized through a plurality of deposition methods such as, but not limited to, spin coating, spray coating, dip coating, silk screen printing, and gravure printing. Further, within some applications CVD growth of nanotubes on a material surface may be used to realize an unordered nanotube fabric layer. The thickness of the individually deposited layers can be selected through a plurality of factors, including, but not limited to, the concentration of the nanotube application solution or the rotary speed of the substrate used in a spin coating operation. Further, while the exemplary process illustrated in FIGS. 3A-3F depicts specifically three deposition operations, the formation of a nanotube fabric layer is not limited in this way. Indeed, dependent on the needs of a specific application, such a nanotube fabric layer might be formed within a single deposition operation or within several deposition operations.

As will be detailed in the discussion of FIGS. 3A-3F below, a roller apparatus is used to apply a directional force over the unordered nanotube fabric layer. Within this exemplary process, this directional force is translated across the unordered nanotube fabric layer along a linear path, adjusting the underlying nanotube elements into a substantially uniform orientation parallel to this linear path. Within some applications, the individually deposited layers will also compress into each other under the applied directional force, reducing the thickness of the overall layer as a result. In this way, a region of an unordered nanotube fabric layer is rendered into an ordered network of nanotube elements.

Within the exemplary process depicted in FIGS. 3A-3F, a force normal to the plane of the nanotube fabric layer is used to apply the roller apparatus against the nanotube fabric layer, resulting in a downward pressure over the nanotube fabric layer as the roller apparatus is translated across. In some embodiments this pressure is relatively small (for example, substantially only the result of weight of the roller element itself—e.g., on the order of ten Pascals—as it is translated across the nanotube fabric layer). In other embodiments this force is larger (for example, on the order of two hundred Pascals). This increased pressure (provided by the applied normal force) between the roller apparatus and the nanotube fabric layer and increases the directional force translated across the nanotube fabric layer. As mentioned above, such a rolling operation (as well as the use of a normal force to apply increased pressure between a roller apparatus and a nanotube fabric layer) will be discussed in greater detail in the discussion of FIGS. 7A-7C.

Figure 3A:
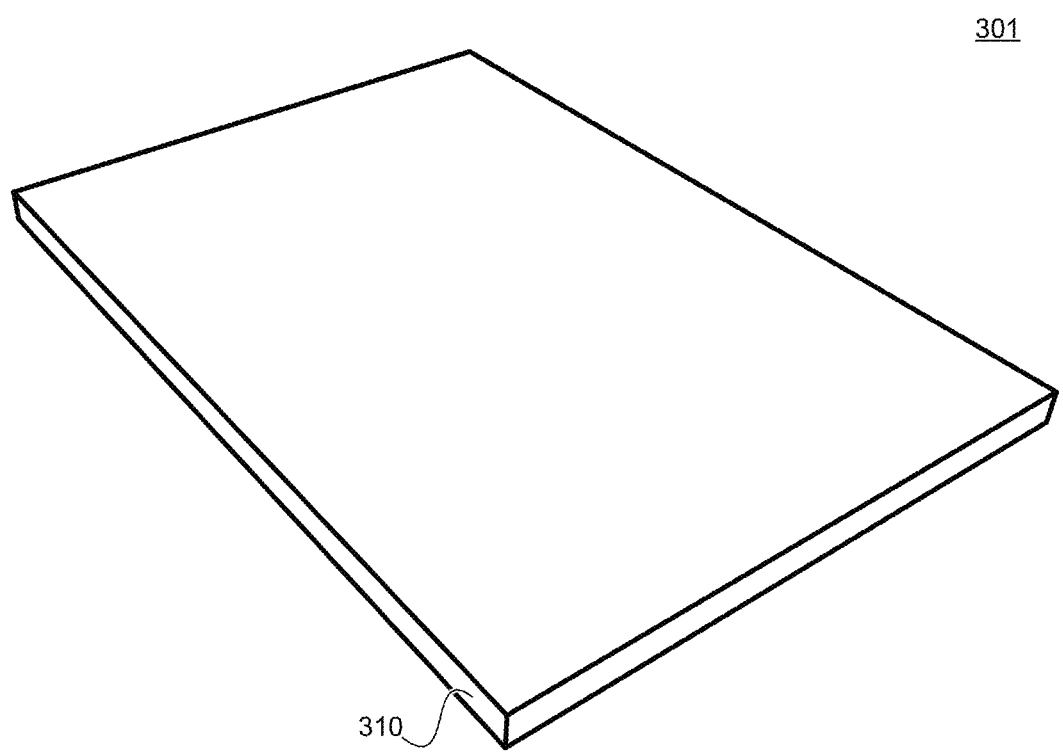
FIGS. 3A-3F are perspective drawings illustrating an exemplary process according to the methods of the present disclosure for rendering a substantially unordered nanotube fabric layer into an ordered network of nanotube elements via a directional force.

Referring now to FIG. 3A, in a first process step 301 a substrate element 310 is provided. This substrate element 310 can be formed from a plurality of materials as best fits the needs of a specific application. For example, in some applications substrate element 310 may be a silicon wafer. In other applications, substrate element 310 may be a layer of conductive material, such as, but not limited to, tungsten, aluminum, copper, nickel, palladium, titanium nitride, and tungsten nitride. In still other applications, substrate element 310 may be a layer of semiconducting material such as, but not limited to, silicon and gallium arsenide. In other applications, substrate element 310 may be a layer of dielectric material such as, but not limited to, silicon oxide and aluminum oxide. In other applications, substrate element 310 may be a layer of organic semiconducting material such as, but not limited to, polyfluorene polythiophenes, polyacetylenes, polypyrroles, polyanilines, poly(p-phenylene sulfide), and poly(p-phenylene vinylene)s. In some applications substrate element 310 may be formed of a rigid material, such as, but not limited to, metal (e.g., steel or aluminum), ceramic, or glass. In other applications it may be formed of a flexible material such as a plastic film or sheet—e.g., polyethylene terephthalate (PET), polymethylmethacrylate, polyamides, polysulfones, and polycyclic olefins.

Figure 3B:
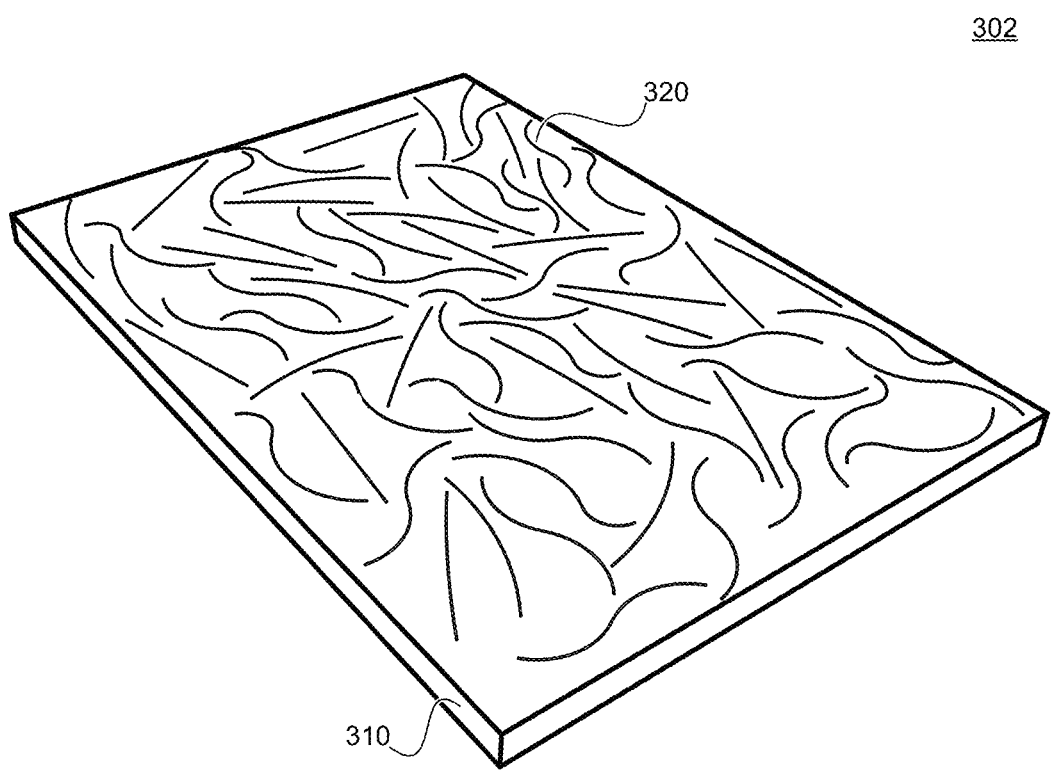
Figure 3C:
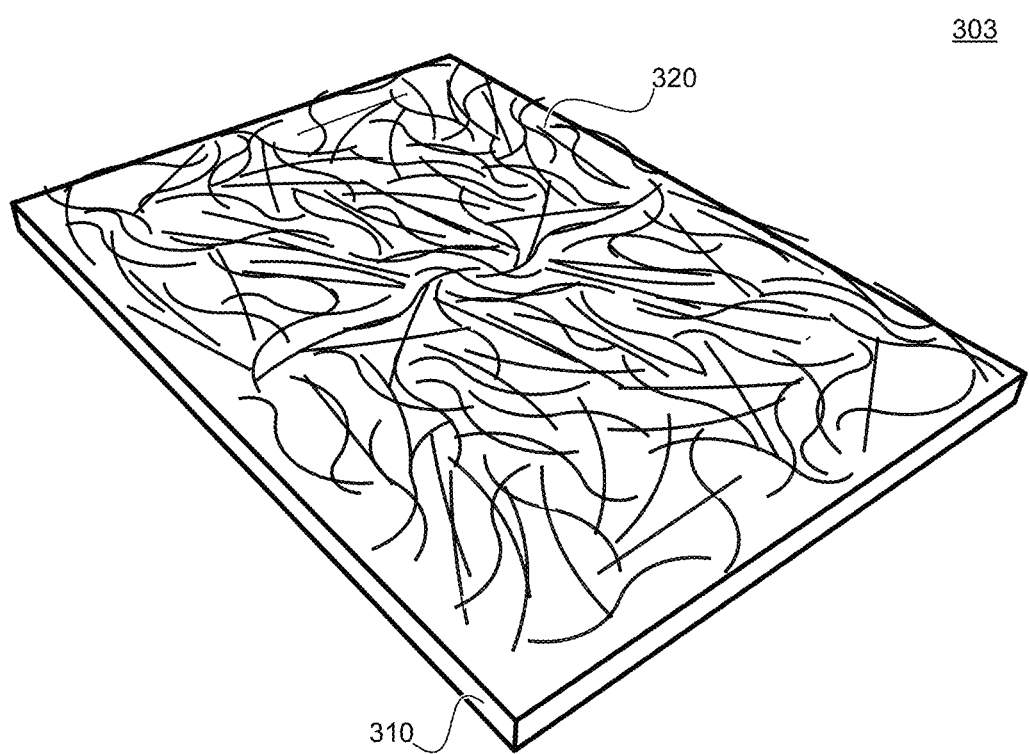
Figure 3D:
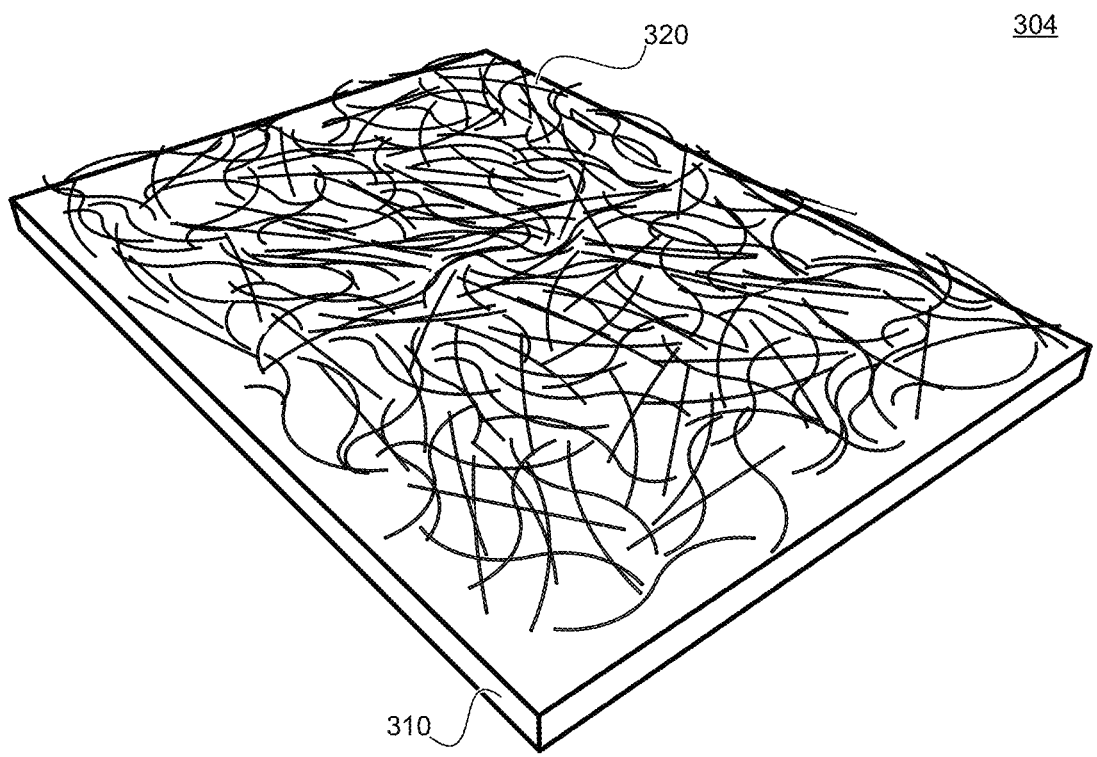

Referring now to FIG. 3B, in a next process step 302 a first layer of unordered nanotube elements 320 is formed over the substrate element 310. This first layer may be formed, for example, via a spin coating operation, a spray coating operation, a dip coating operation, a silk screen printing operation, and gravure printing operation as previously discussed. In some embodiments, such a layer may also be formed through CVD growth of nanotubes on a material surface. Referring now to FIG. 3C, in a next process step 303 a second layer of unordered nanotube elements 320 is formed over the first layer. Referring now to FIG. 3D, in a next process step 304 a third layer of unordered nanotube elements 320 is formed over the second layer. In this way, a nanotube fabric layer comprising essentially three individually deposited layers of substantially unordered nanotube networks is formed over substrate element 310.

Figure 3E:
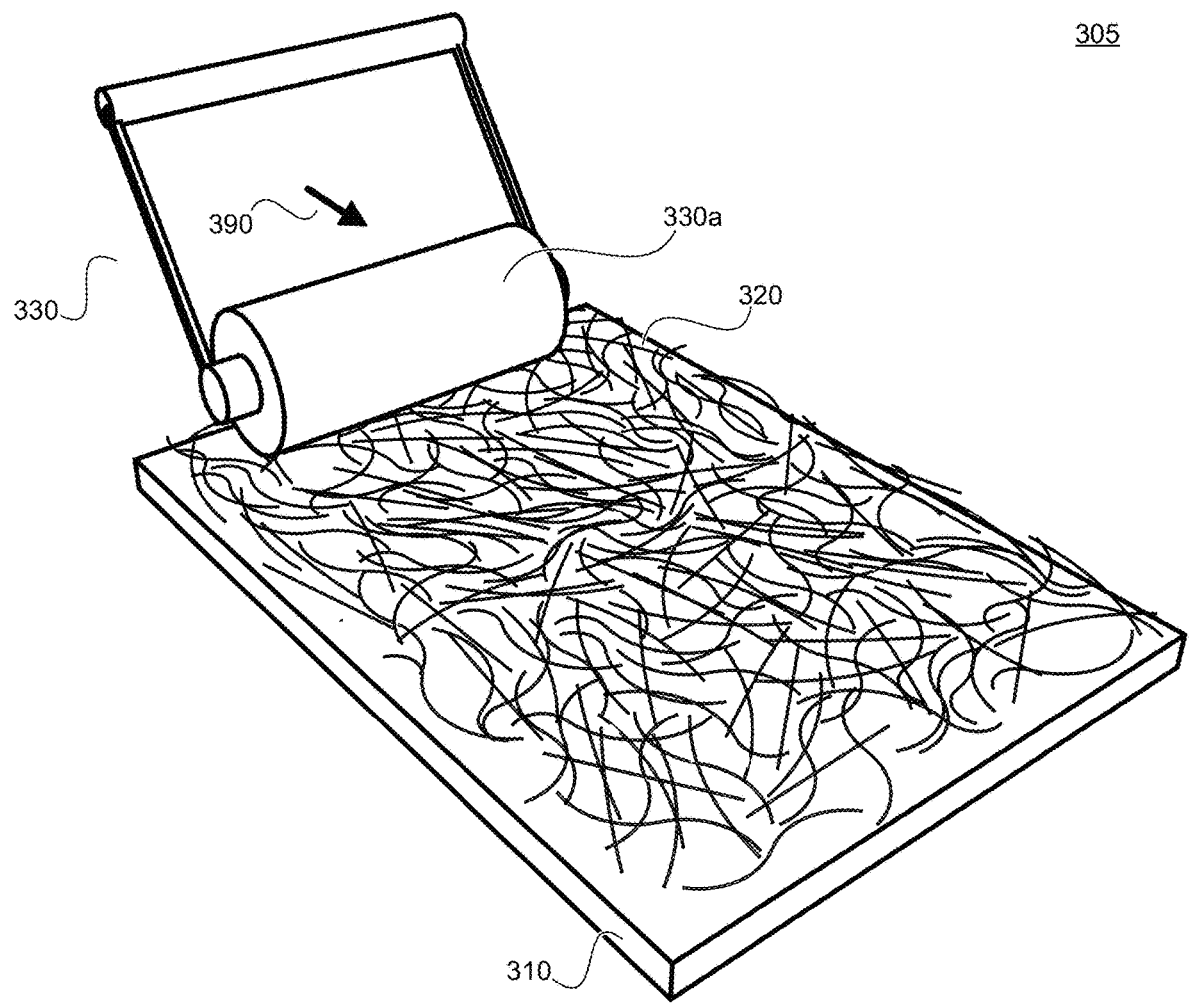

Referring now to FIG. 3E, in a next process step 305 a rolling apparatus 330 is used to apply a directional force over the deposited nanotube fabric layer. This applied directional force is translated over the surface of the unordered nanotube fabric layer along linear direction 390. The rolling apparatus 330 includes rolling element 330a and is passed over the deposited nanotube fabric layer in order to adjust the underlying nanotube elements into a substantially uniform orientation parallel to the rolling direction 390. In some applications the rolling apparatus 330 is passed over the deposited nanotube fabric layer once. In other applications the rolling apparatus 330 is passed over the deposited nanotube fabric layer multiple times (for example, on the order of 50 times or, in another example, on the order of 250 times) following substantially the same linear path with each pass. Though not illustrated in FIG. 3E, in some embodiments an intermediate barrier layer of pliable material (such as, but not limited to, a layer of PET) is situated over the deposited nanotube fabric layer prior to the application of rolling apparatus 330. Rolling element 330a can be formed from a plurality of materials, including, but not limited to, metal (such as, but not limited to, iron, cobalt, nickel, zinc, tungsten, chromium, manganese, magnesium, titanium, aluminum, and their alloys including family of steels), polymers including rubbers, plastics (including polystyrene), melamine, silicone, polycarbonate, polyethylene, porcelain, glasses (including silicon oxide and other crystalline solids), alumina, silicon carbide, and wood.

Figure 3F:
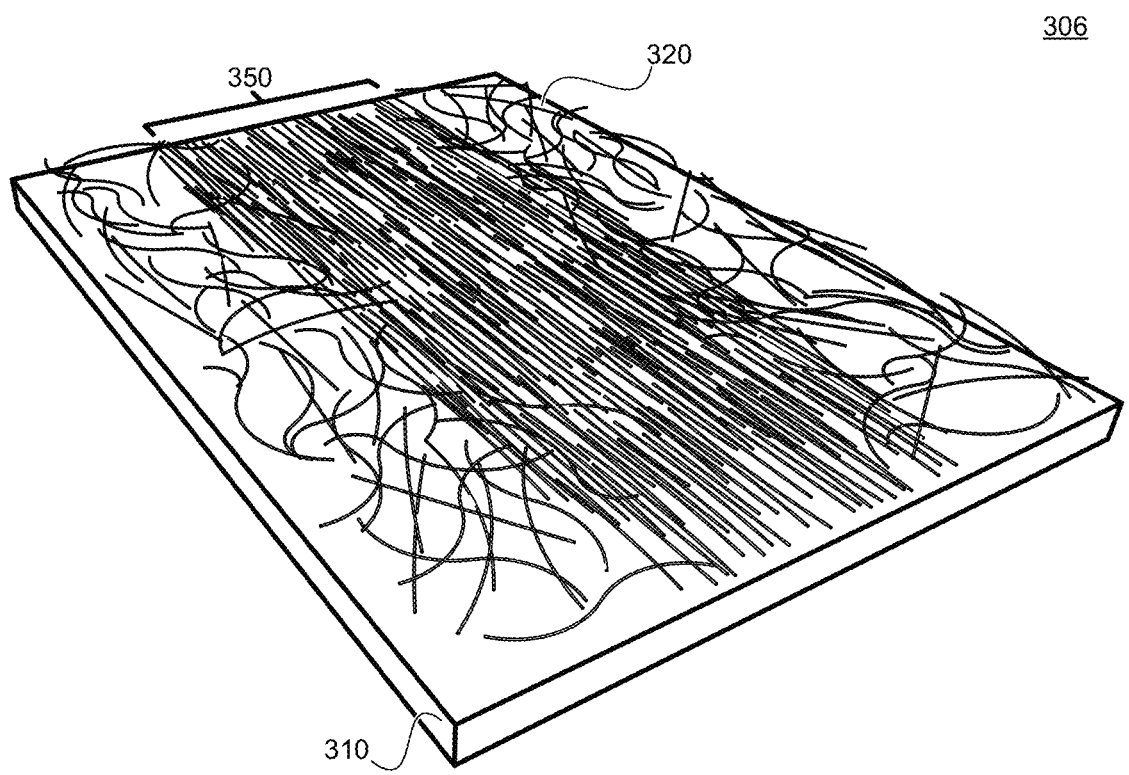

Referring now to FIG. 3F, the rolled region 350 of deposited nanotube fabric layer has been rendered into an ordered network of nanotube elements 320 (as depicted in structure 306). As depicted in FIG. 3F, this rolled region 350 exhibits essentially no gaps or voids between nanotube elements 320. In some embodiments, an additional process step might be used to provide a high temperature anneal process to the ordered network of nanotube elements 320—for example, baking the substrate element 310 and nanotube fabric layer within the range of 400° C. to 625° C. (as dependant on the needs of the specific application) for given time (for example, on the order of thirty minutes). This high temperature anneal process, in some embodiments, is helpful in preventing subsequent exposure to chemical and physical conditions during further processing of the fabric from disturbing the ordered nanotube fabric layer once it has been oriented. For example, in certain embodiments such a high temperature anneal process can render the ordered nanotube fabric into a substantially hydrophobic state, preventing the arranged nanotubes from reacting when exposed to water. However, it should be noted that in some embodiments a sensitivity to certain chemical or physical conditions can be beneficial to a specific application. For example, an ordered nanotube fabric that exhibits a localized change within the fabric when exposed to a specific chemical or physical condition would be useful in a sensor application or within an application for storing and/or recording information.

It should be noted that the illustrations within FIGS. 3A-3F have been provided simply to illustrate the methods of the present disclosure and have been rendered in such a way as to aid in the explanation of these methods. In particular, the relative sizes of the different structural elements within FIGS. 3A-3F have not been drawn to a uniform scale. Indeed, as will be clear to those skilled in the art, nanotube elements 320 would be much smaller than rolling apparatus 330, as would actual gap sizes between such elements 320.

Figure 4:
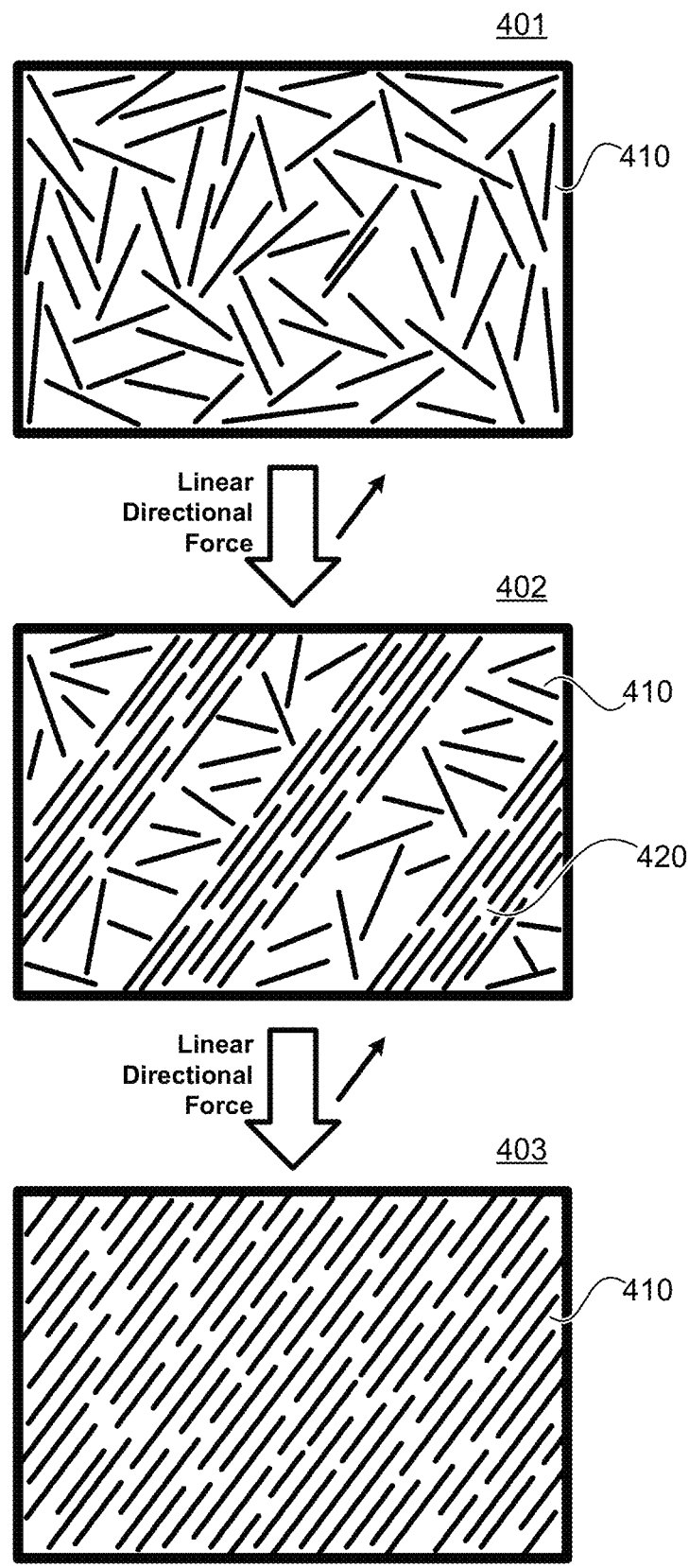
FIG. 4 is a process diagram illustrating a method of rendering a substantially unordered nanotube fabric layer into an ordered network of nanotube elements through the application of a linear directional force.
Figure 5:
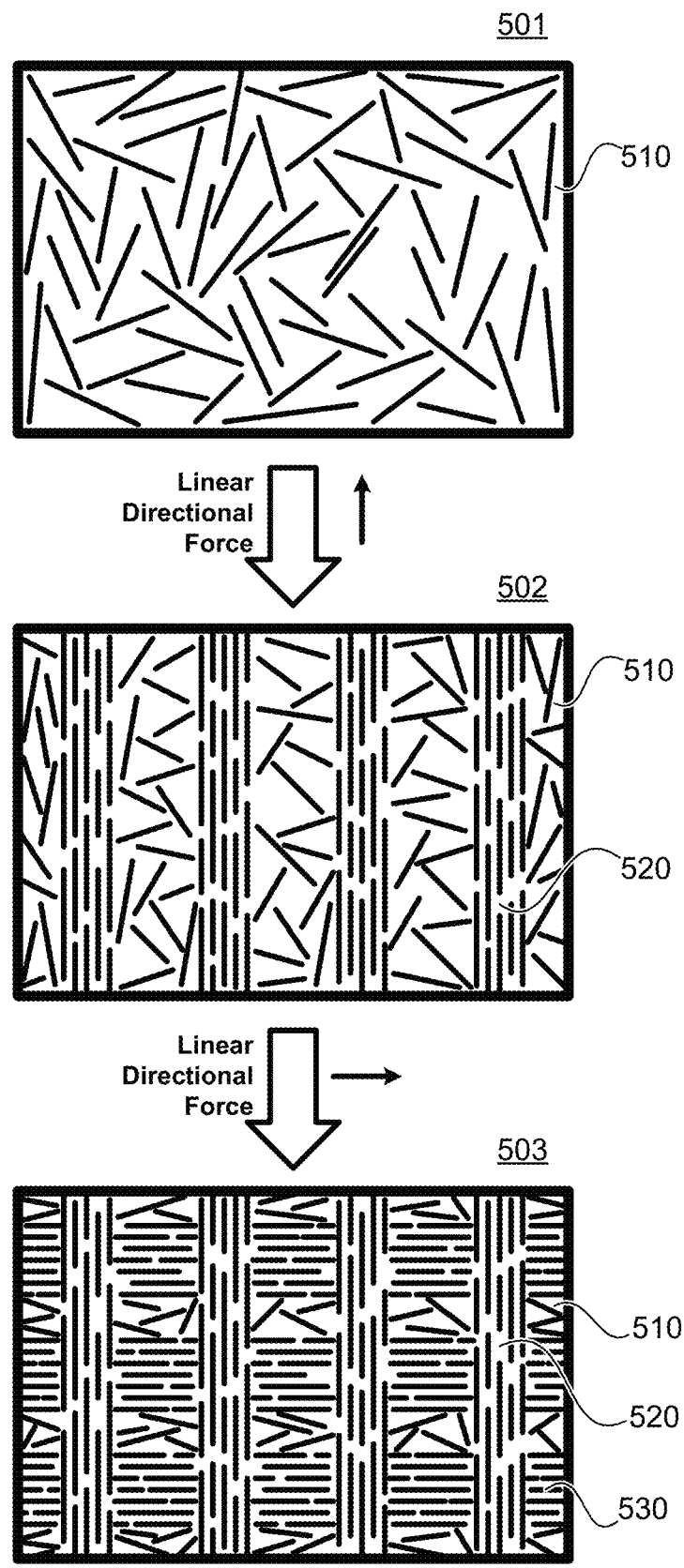
FIG. 5 is a process diagram illustrating a method of rendering a substantially unordered nanotube fabric layer into an ordered network of nanotube elements through the application of two linear directional forces, each force applied separately and in different directions.
Figure 6:
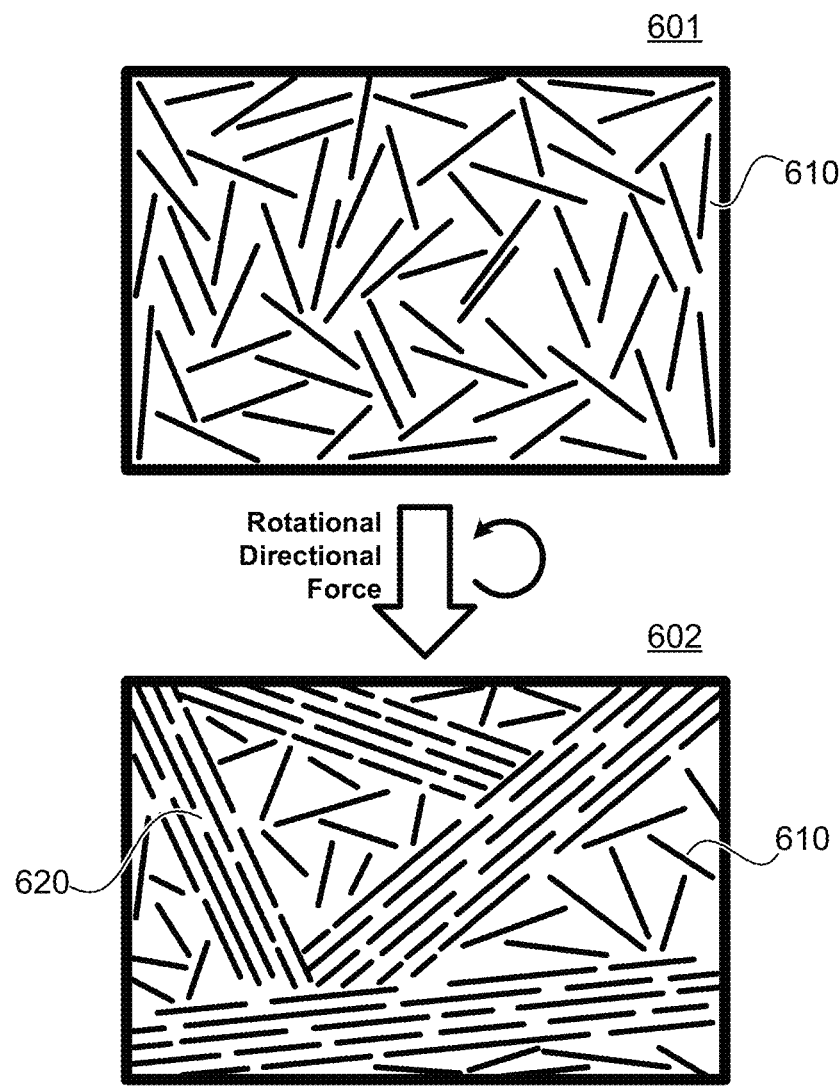
FIG. 6 is a process diagram illustrating a method of rendering a substantially unordered nanotube fabric layer into an ordered network of nanotube elements through the application of a rotational directional force.

While the exemplary process depicted in FIGS. 3A-3F applies a directional force along a single linear path in order to render a nanotube fabric layer into an ordered state, the methods of the present disclosure are not limited in this regard. Indeed, in some applications multiple directional forces may be applied sequentially in different directions to realize a plurality of regions within the nanotube fabric layer wherein the nanotube elements within adjacent ordered regions are oriented in different directions. In other applications, a rotational directional force may be applied over an unordered nanotube fabric layer to form regions of ordered nanotube elements within the nanotube fabric layer. FIGS. 4-6 illustrate the application of different directional forces in order to render nanotube fabrics into networks of ordered nanotube elements according to the methods of the present disclosure.

Referring now to FIG. 4, an exemplary process for rendering an unordered nanotube fabric layer into a network of ordered nanotube elements substantially oriented along a single direction through the use of an applied linear force is depicted. At the start of the exemplary process, an unordered nanotube fabric layer 401 comprising a plurality of nanotube elements 410 is provided. A linear directional force is then applied over the unordered nanotube fabric layer 401 (for example, a rolling force applied fifty times in the direction indicated in FIG. 4) to realize partially ordered nanotube fabric layer 402. Partially ordered nanotube fabric layer 402 exhibits regions of ordered nanotube elements 420 wherein nanotube elements have been oriented in the direction of the applied force. The nanotube elements in these regions 420 are grouped together along their sidewalls, resulting in essentially no gaps or voids within those regions 420. A linear directional force is then applied again along the same direction (for example, the same rolling force applied an additional fifty times) to realize ordered nanotube fabric layer 403. Within ordered nanotube fabric layer 403, essentially all of the nanotube elements 410 have been rendered into a substantially uniform orientation along the direction of the applied force. As depicted in FIG. 4, ordered nanotube fabric layer 403 is substantially free of gaps and voids.

Referring now to FIG. 5, an exemplary process for rendering an unordered nanotube fabric layer into a network of ordered nanotube elements substantially oriented in multiple directions through the use of linear force applied along multiple directions is depicted. At the start of the exemplary process, an unordered nanotube fabric layer 501 comprising a plurality of nanotube elements 510 is provided. A first linear directional force is then applied over the unordered nanotube fabric layer 501 in a first direction (as indicated n FIG. 5) to realize first partially ordered nanotube fabric layer 502. This first linear force may be, for example, a rubbing force applied twenty times. First partially ordered nanotube fabric layer 502 exhibits regions of ordered nanotube elements 520 wherein nanotube elements have been oriented in the direction of the first applied force. The nanotube elements in these regions 520 are grouped together along their sidewalls, resulting in essentially no gaps or voids within those regions 520. A second linear directional force is then applied along a second direction (as indicated in FIG. 5) to realize second partially ordered nanotube fabric layer 503. This second linear force may be, for example, another rubbing force applied twenty times in the second direction. Second partially ordered nanotube fabric layer 503 exhibits a plurality of regions 530 wherein the nanotube elements have been oriented in the direction of the second applied force.

It should be noted that the nanotube elements 510 within the ordered regions 520 (that is, those nanotube elements oriented by the application of the first linear force) are, in general, substantially unaffected by the application of the second linear directional force. That is, once a region of nanotube elements 510 has been sufficiently rendered into an ordered network substantially oriented along a first direction, the nanotube elements within that region will tend to remain in their ordered state, resisting a change in orientation significantly more so than unordered nanotube elements, even when subjected to a force applied in a second direction. It should be noted, however, that in some embodiments, a persistent application of the second linear directional force will reorder an ordered network of nanotubes along the direction of the second directional force.

As depicted in FIG. 5, second partially ordered nanotube fabric layer 503 includes regions 520 ordered along a first direction and regions 530 oriented along a second direction. Within both sets of regions (520 and 530), the nanotube elements 510 are grouped together along their sidewalls, resulting in those regions (520 and 530) being essentially free of gaps and voids. The remaining regions of unordered nanotube elements 510 within second partially ordered nanotube fabric layer 503 could be rendered into an ordered state through the application of an additional directional force.

Figure 11A:
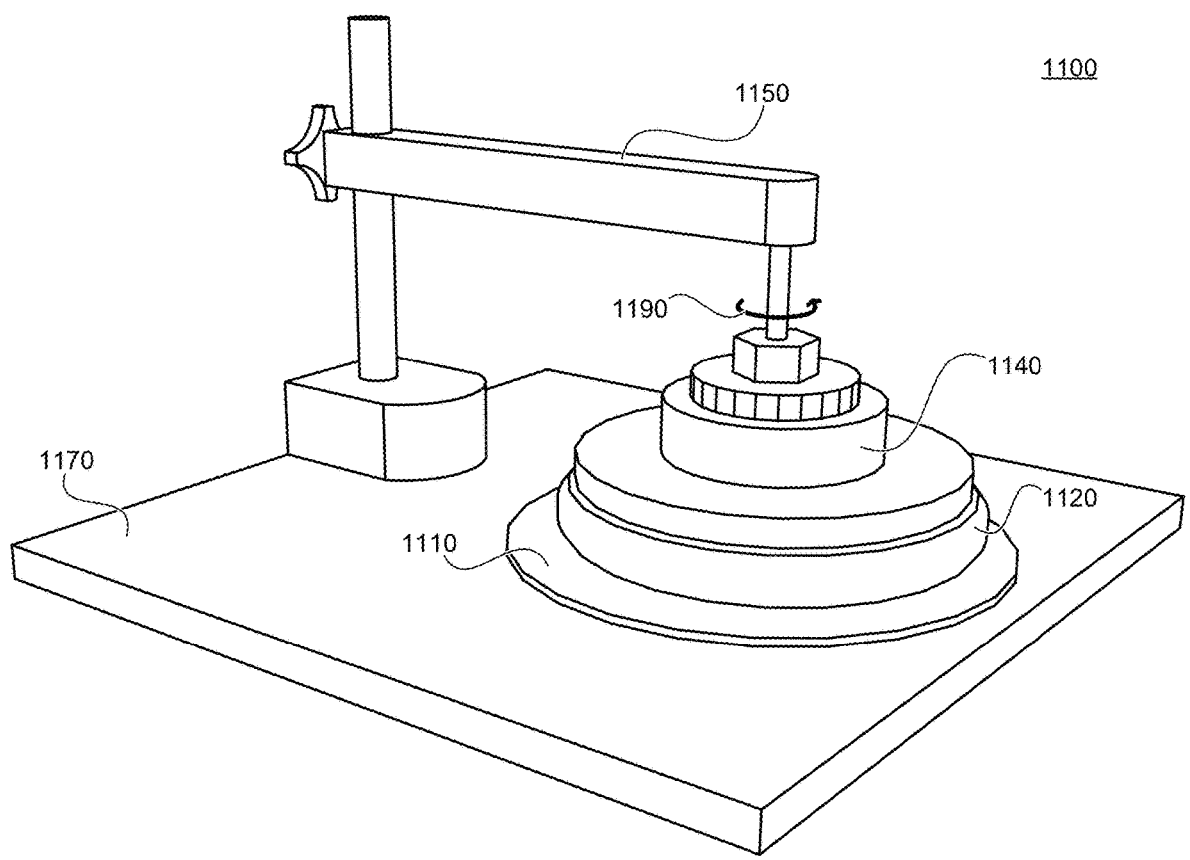
FIG. 11A is a perspective drawing depicting an exemplary polishing apparatus suitable for applying a rotational directional force over a nanotube fabric layer according to the methods of the present disclosure.
Figure 11B:
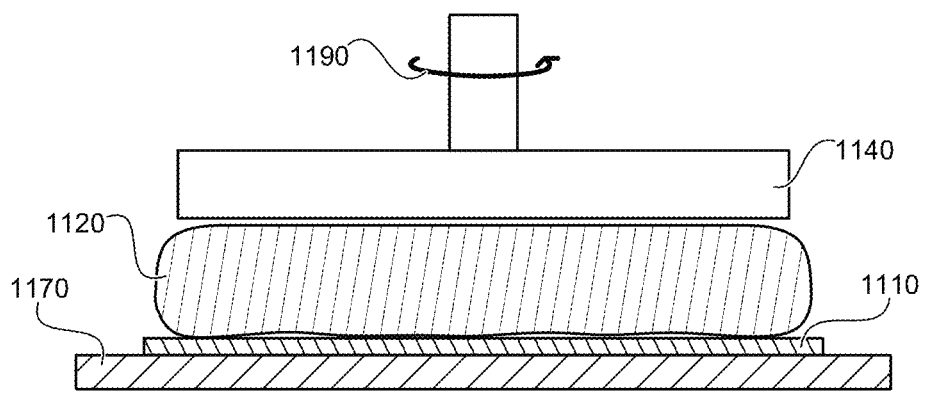
FIG. 11B is a diagram illustrating the operation of the exemplary polishing apparatus depicted in FIG. 11A.

Referring now to FIG. 6, an exemplary process for rendering an unordered nanotube fabric layer into a network of ordered nanotube elements (with different regions of the fabric layer substantially oriented in multiple directions) through the use of rotational directional force is depicted. At the start of the exemplary process, an unordered nanotube fabric layer 601 comprising a plurality of nanotube elements 610 is provided. A rotational directional force is then applied over the unordered nanotube fabric layer 601 to provide partially ordered nanotube fabric layer 602. Such a rotational directional force may be applied, for example, by rotating a wool polishing pad at approximately sixty rotations per minute for approximately ninety seconds (an apparatus suitable for applying such a rotational directional force is illustrated in FIGS. 11A and 11B and discussed in detail below). Partially ordered nanotube fabric layer 602 exhibits several regions of ordered nanotube elements 620 wherein nanotube elements have been grouped together along their sidewalls, resulting in essentially no gaps or voids within those regions 620. Due to the rotational directional force, these ordered regions 620 are oriented in different directions. The remaining regions of unordered nanotube elements 610 within partially ordered nanotube fabric layer 602 could be rendered into an ordered state through the application of an additional directional force.

It should be noted that the partially ordered nanotube fabric layers within the previous illustrations (that is, nanotube fabric layers 402, 502, and 602 in FIGS. 4, 5, and 6, respectively) depict nanotube fabric layers initially beginning to order themselves into relatively narrow bands responsive to an applied directional force. In this respect, it should be further noted, these illustrations are consistent with the partially ordered nanotube fabrics depicted within the exemplary SEM images of FIGS. 20A and 25B. Without wishing to be bound by theory, it is believed that within certain embodiments a certain number of nanotube elements within the unordered nanotube fabric will originally be oriented in the direction of the applied directional force. Responsive to the applied directional force, nanotube elements adjacent to these certain nanotube elements—but positioned in slightly different orientations—will tend to adjust their orientation to match that of the nanotube elements already oriented in the desired direction. Within these embodiments, it is believe that increased application (repetition) of a directional force will tend to adjust more and more of the unordered nanotube elements into an orientation consistent with these original nanotube elements until, ultimately, the entire nanotube fabric layer is adjusted into a substantially uniform orientation.

Figure 8A:
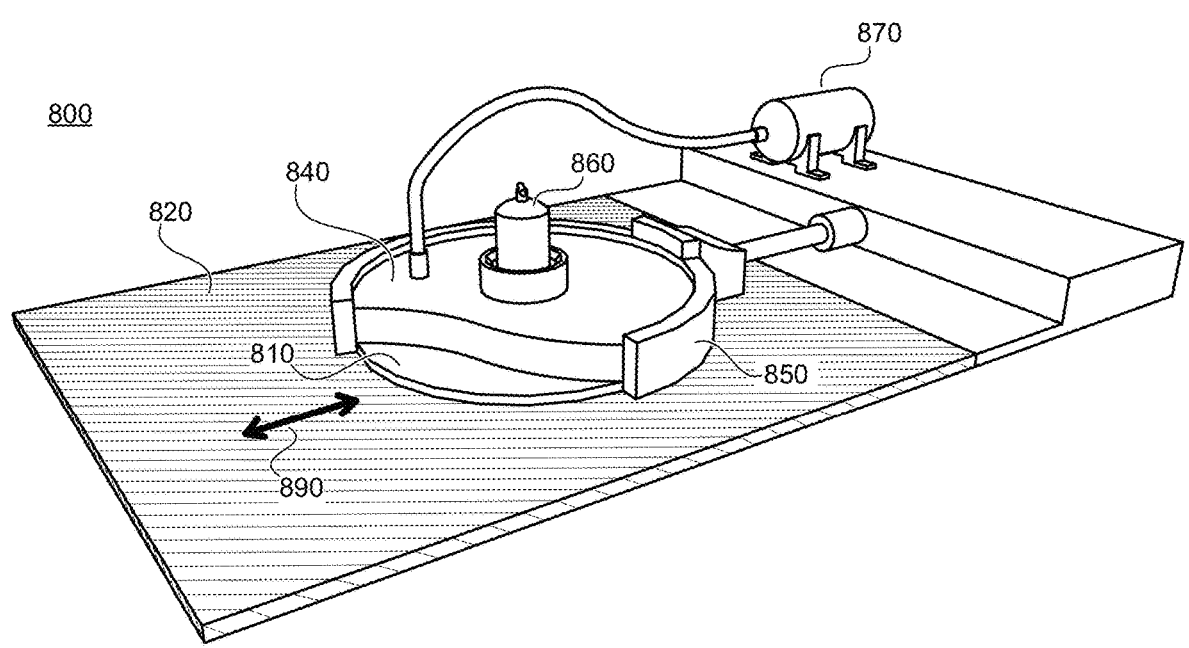
FIG. 8A is a perspective drawing depicting an exemplary rubbing apparatus suitable for applying a directional force over a nanotube fabric layer according to the methods of the present disclosure.
Figure 8B:
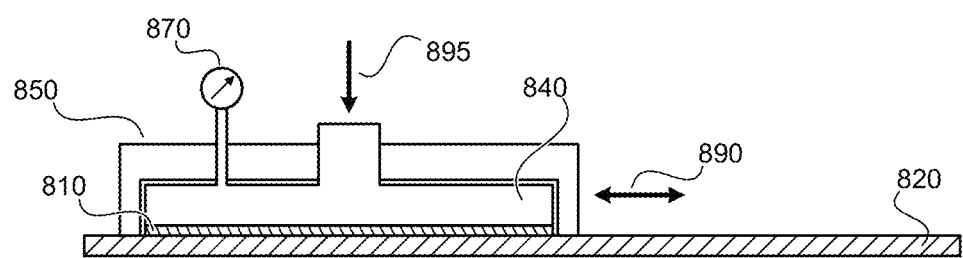
FIG. 8B is a diagram illustrating the operation of the exemplary rubbing apparatus depicted in FIG. 8A.
Figure 9A:
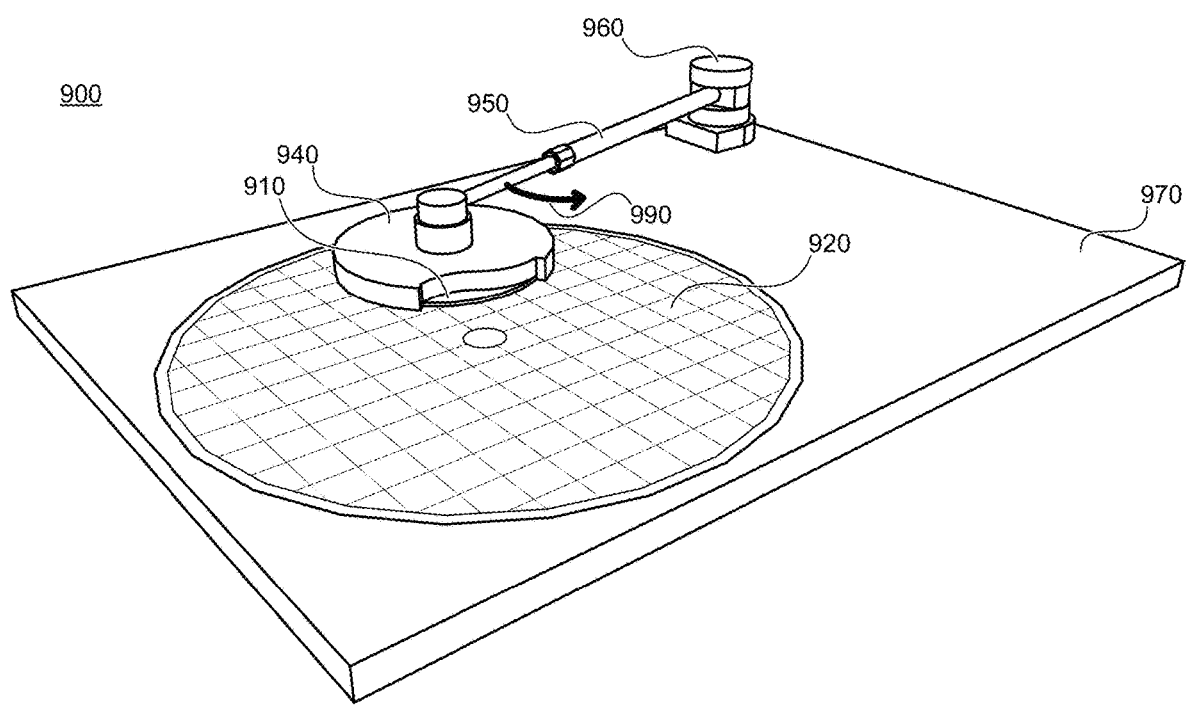
FIG. 9A is a perspective drawing depicting an exemplary rubbing apparatus suitable for applying a directional force in an arc over a nanotube fabric layer according to the methods of the present disclosure.
Figure 9B:
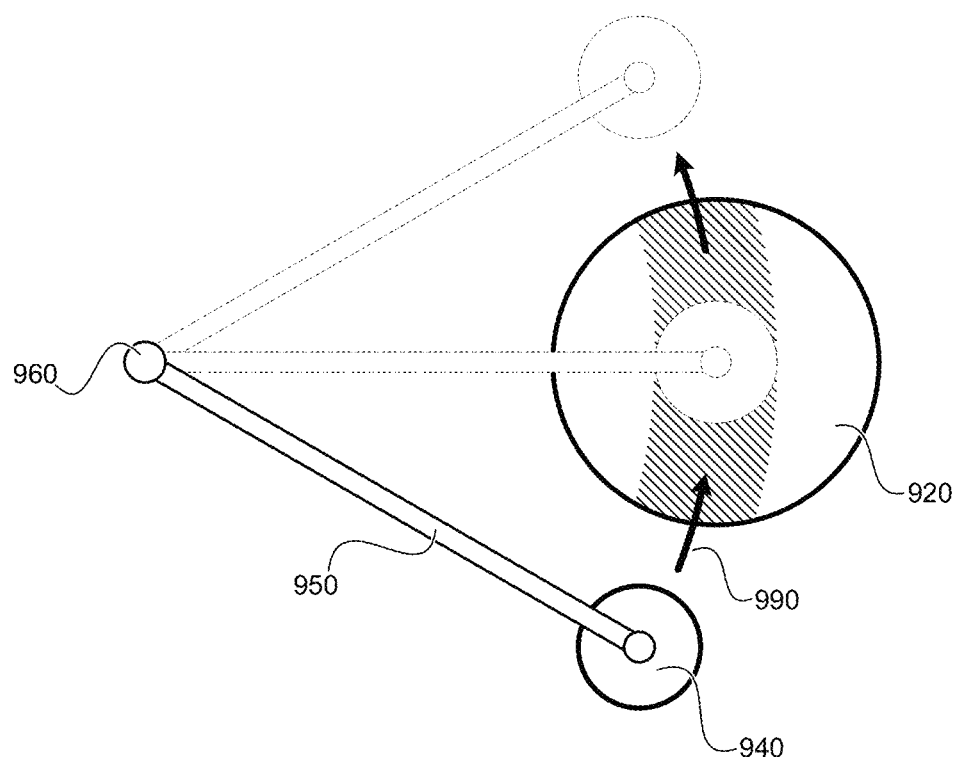
FIG. 9B is a diagram illustrating the operation of the exemplary rubbing apparatus depicted in FIG. 9A.
Figure 10A:
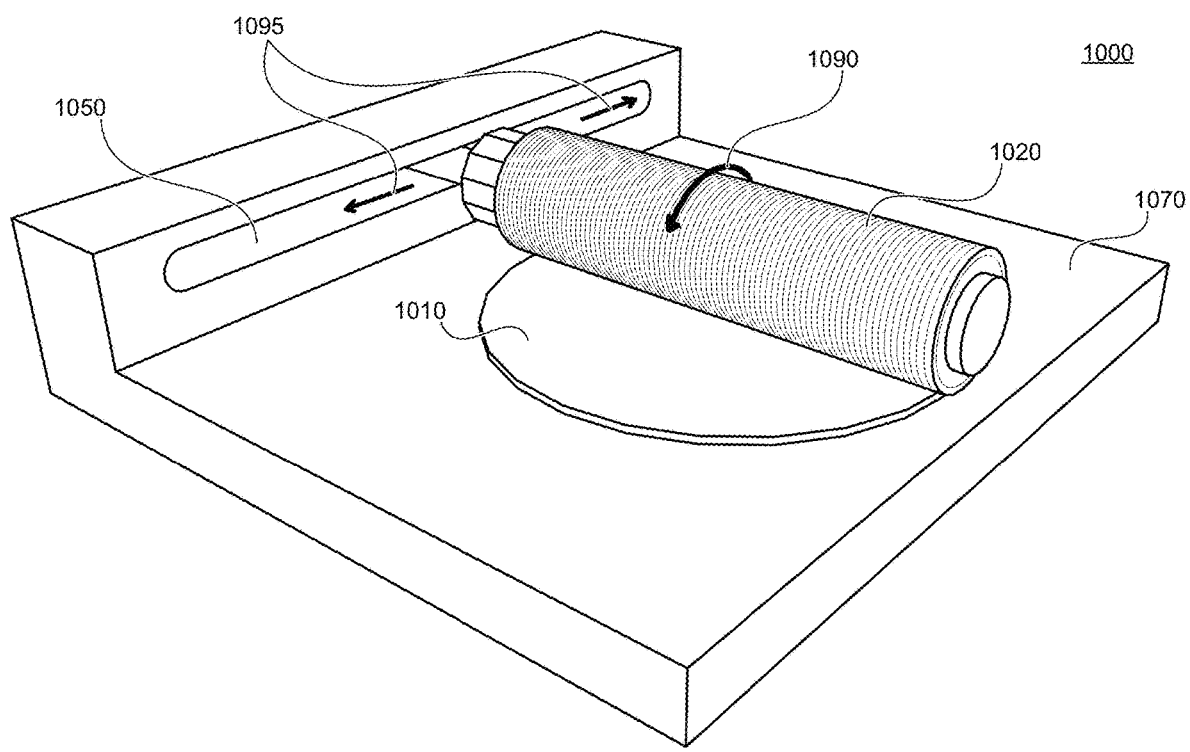
FIG. 10A is a perspective drawing depicting an exemplary polishing apparatus suitable for applying a linear directional force over a nanotube fabric layer according to the methods of the present disclosure.
Figure 10B:
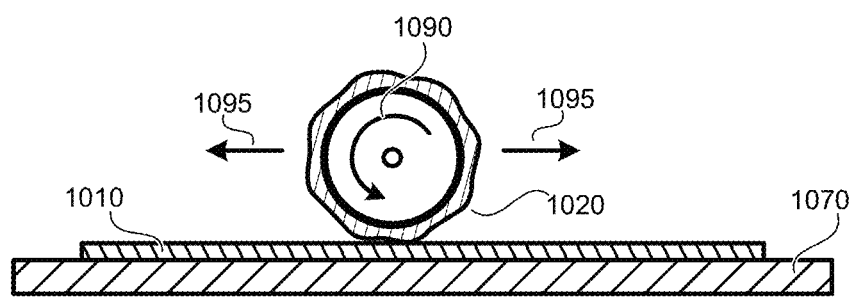
FIG. 10B is a diagram illustrating the operation of the exemplary polishing apparatus depicted in FIG. 10A.
Figure 12A:
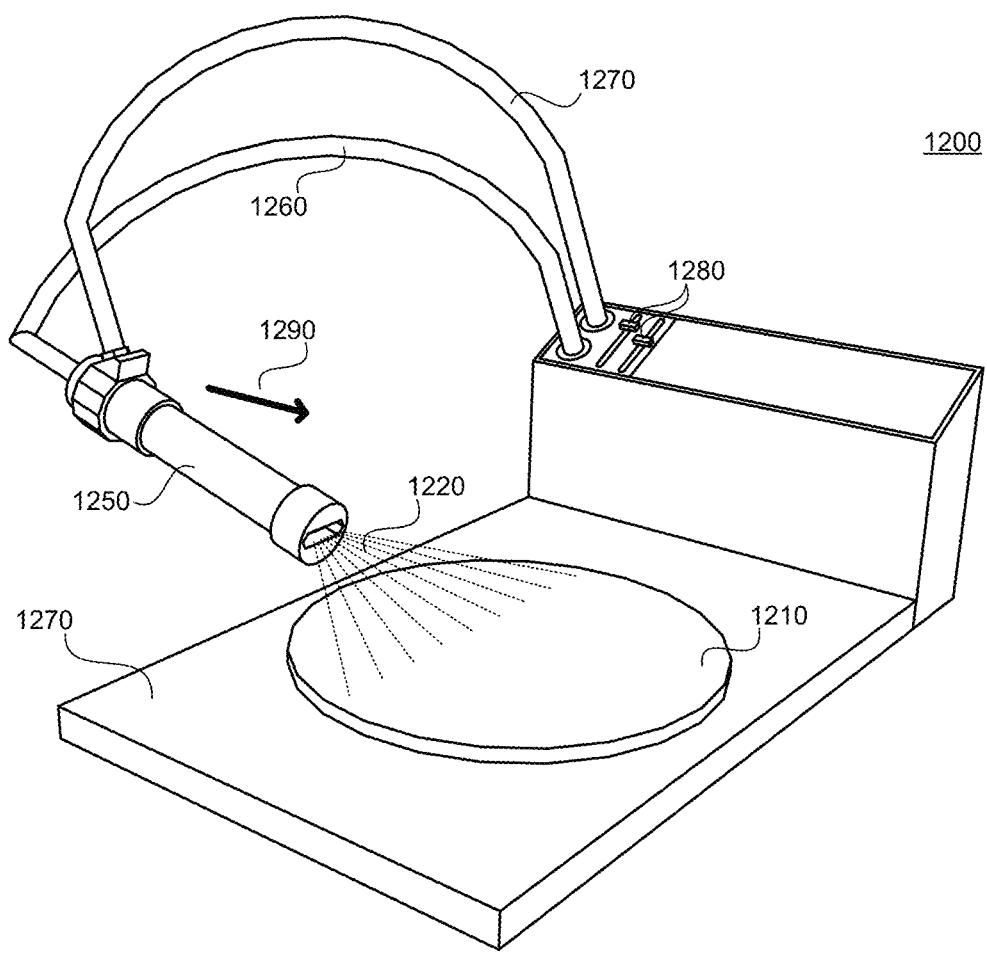
FIG. 12A is a perspective drawing depicting an exemplary cryokinetic impingement apparatus suitable for applying a directional force over a nanotube fabric layer according to the methods of the present disclosure.
Figure 12B:
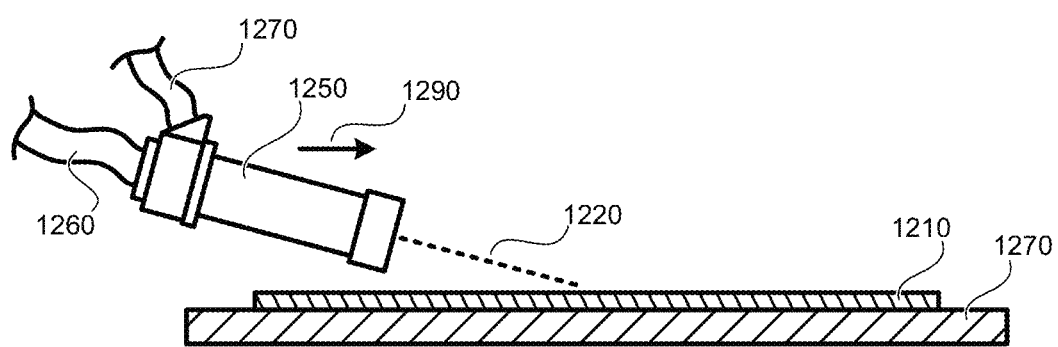
FIG. 12B is a diagram illustrating the operation of the exemplary cryokinetic impingement apparatus depicted in FIG. 12A.

Having introduced the methods of the present disclosure on a relatively high level—specifically the use of a directional force in one or more directions to arrange a substantially unordered (or, in some applications, a partially ordered) nanotube fabric layer into an ordered network of nanotube elements—the present disclosure will now discuss a plurality of methods for applying such a directional force in detail. Specifically, FIGS. 7A-7B detail the use of a rolling apparatus to apply a directional force. FIGS. 8A-8B detail the use of a rubbing apparatus to apply a directional force in a linear motion. FIGS. 9A-9B detail the use of a rubbing apparatus to apply a directional force in an arcing motion. FIGS. 10A-10B detail the use of a polishing apparatus to apply a directional force in a linear direction. FIGS. 11A-11B detail the use of a polishing apparatus to apply a rotational directional force. FIGS. 12A-12B detail the use of a cryokinetic impingement apparatus to apply a directional force. And, FIGS. 13A-13B detail the use of a roll-to-roll polishing apparatus to apply a rotational directional force on a large scale.

Figure 7A:
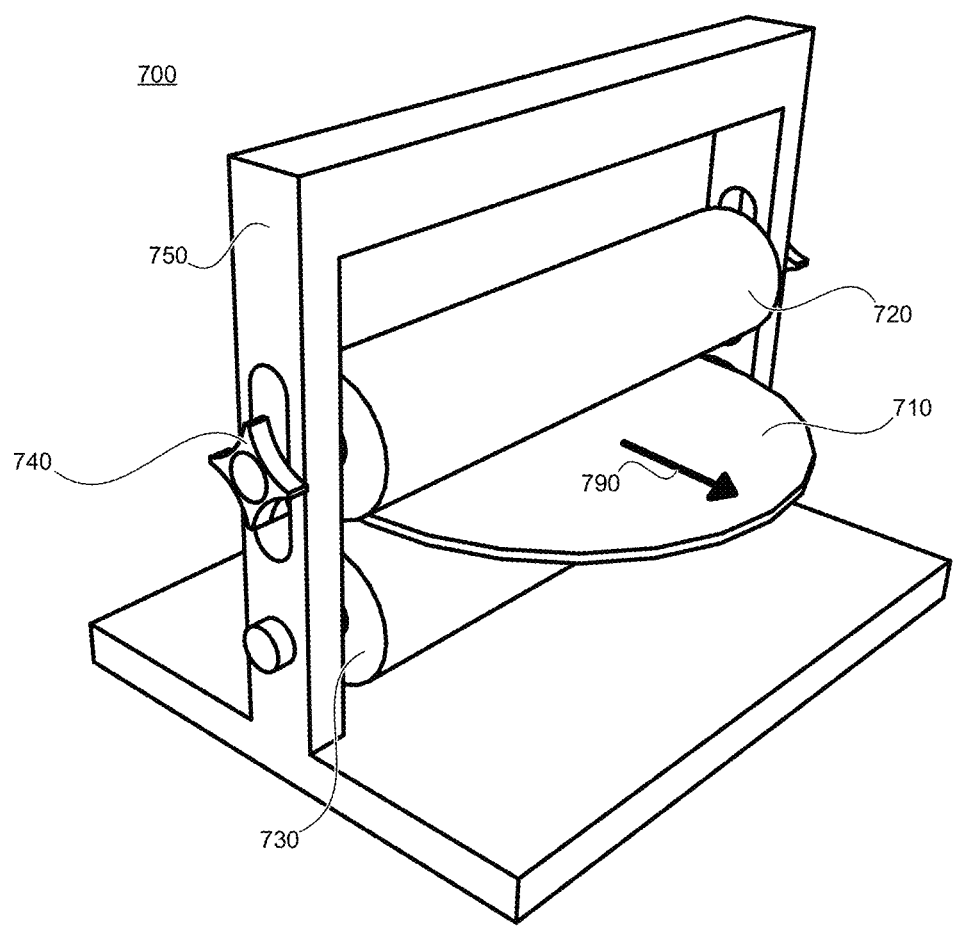
FIG. 7A is a perspective drawing depicting an exemplary rolling apparatus suitable for applying a directional force over a nanotube fabric layer according to the methods of the present disclosure.
Figure 7B:
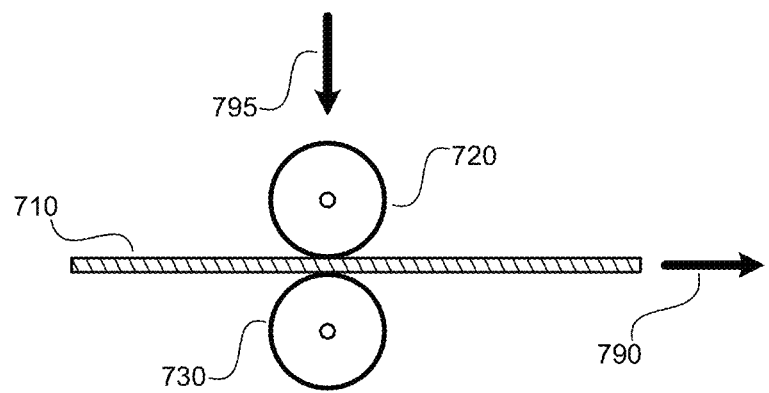
FIG. 7B is a diagram illustrating the operation of the exemplary rolling apparatus depicted in FIG. 7A.

Referring now to FIGS. 7A-7B, a rolling apparatus suitable for applying a linear directional force across a nanotube fabric layer is depicted. As described briefly in the exemplary process depicted in FIGS. 3A-3F, in some applications a directional rolling force can be applied by rolling a cylindrical element over a formed nanotube layer one or more times. This cylindrical element can be formed from a plurality of materials, including, but not limited to, metal (such as, but not limited to, iron, cobalt, nickel, zinc, tungsten, chromium, manganese, magnesium, titanium, aluminum, and their alloys including family of steels), polymers including rubbers, plastics (including polystyrene), melamine, silicone, polycarbonate, polyethylene, porcelain, glasses (including silicon oxide and other crystalline solids), alumina, silicon carbide, and wood. In some embodiments, this cylindrical element is applied directly to the nanotube fabric layer. In other embodiments, an intermediate layer—such as, but not limited to, a layer of polyethylene terephthalate (PET) film—is situated between the nanotube fabric layer and the surface of the cylindrical element. In some embodiments the cylindrical element is rolled over the formed nanotube layer once. In other embodiments the cylindrical element is rolled over the formed nanotube layer on the order of fifty times. In still other embodiments the cylindrical element is rolled over the formed nanotube layer on the order of two hundred and fifty times. In some embodiments, no additional downward force is applied to the cylindrical element as it is passed over the nanotube fabric layer—that is, substantially only the weight of the cylindrical element is responsible for the downward force applied (providing, for example, on the order of 500 Pascals of pressure over the nanotube fabric layer as the roller apparatus is translated across). In other embodiments an additional downward force (for example, on the order of fifty Newtons, or in another example on the order of five hundred Newtons) is applied to the cylindrical element—for example, through the use of a pressing mechanism or through the use of a rolling apparatus which passes a nanotube fabric coated substrate element through a pair of cylindrical rollers held apart a fixed distance. In such embodiments, this additional downward force provides significantly more pressure (for example, on the order of 20,000 Pascals) over the nanotube fabric layer as the roller apparatus is translated across.

Figure 19A:
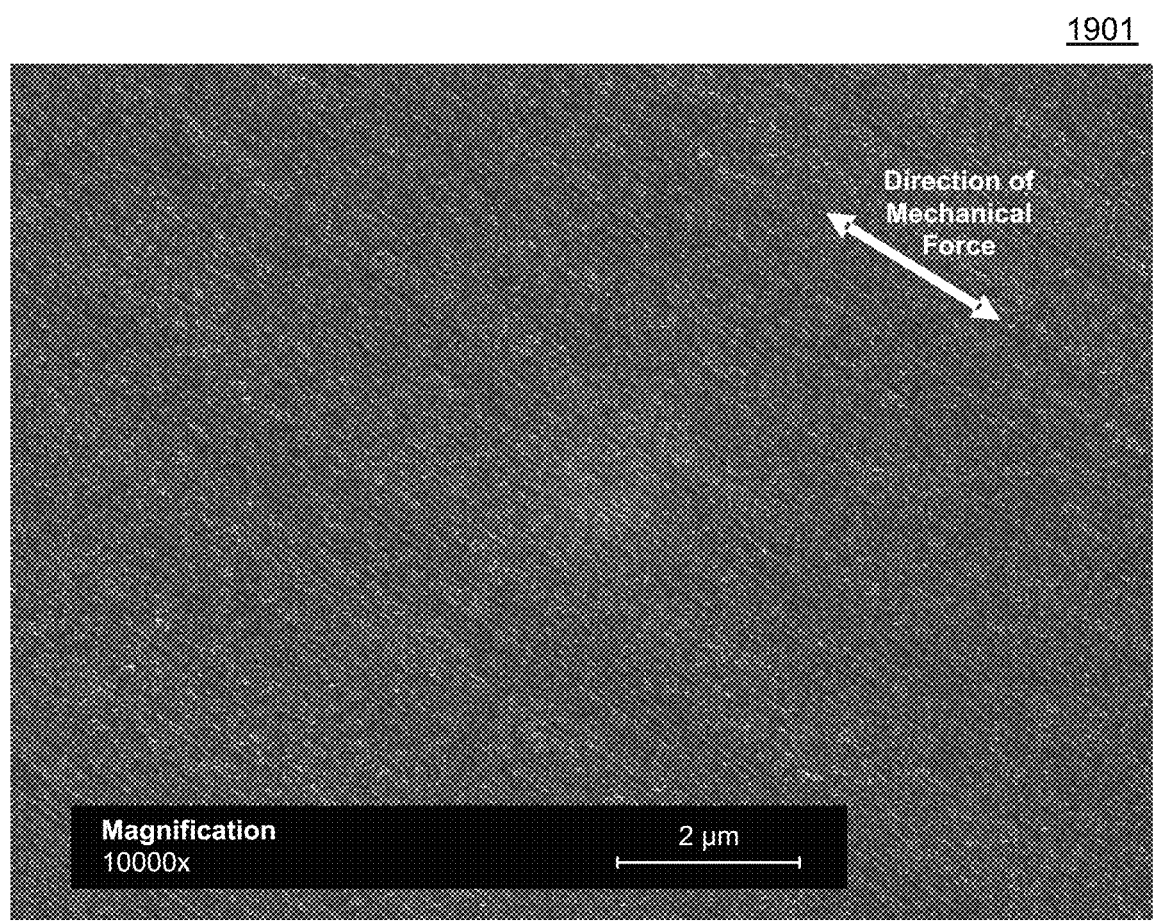
FIGS. 19A-19C are SEM images (at different magnifications) of an exemplary nanotube fabric layer comprising a network of nanotube elements rendered into an ordered arrangement through the application of a directional rolling force.
Figure 19B:
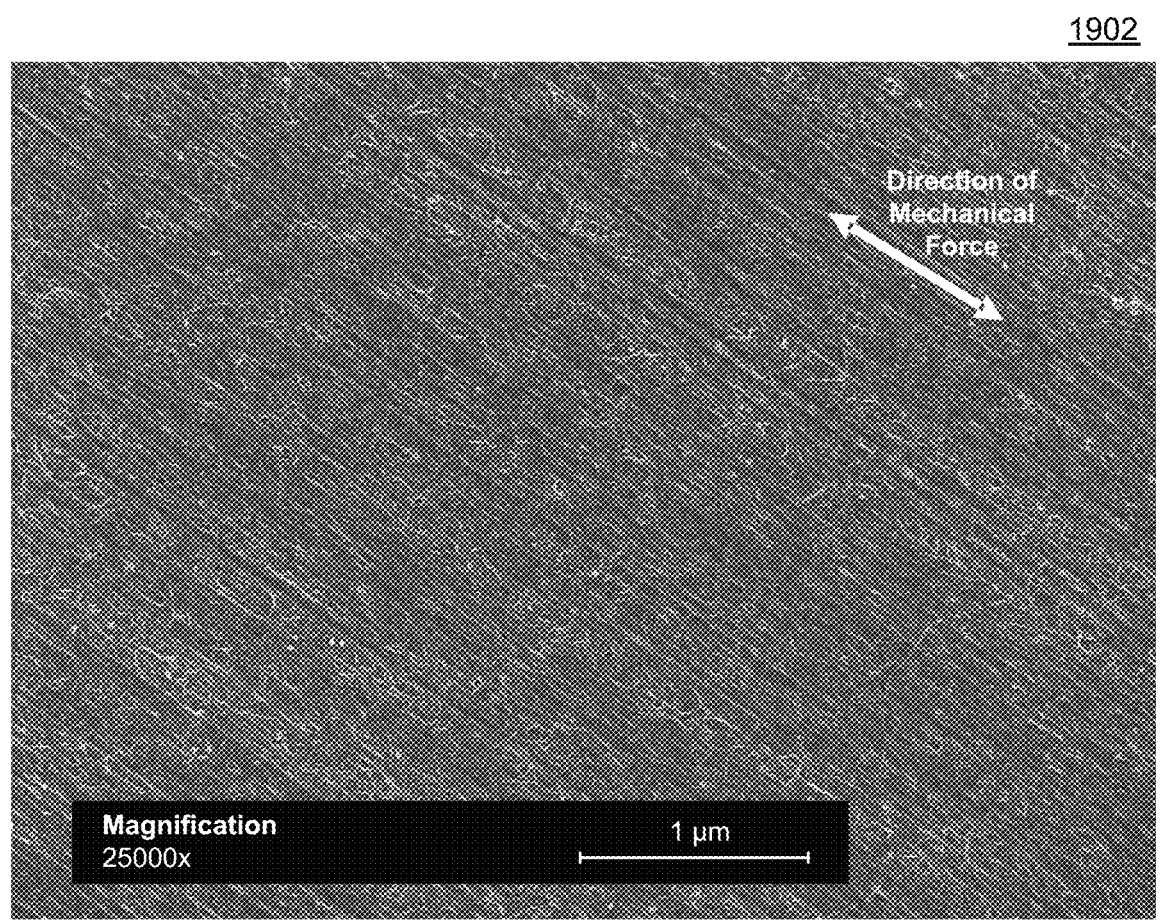
Figure 19C:
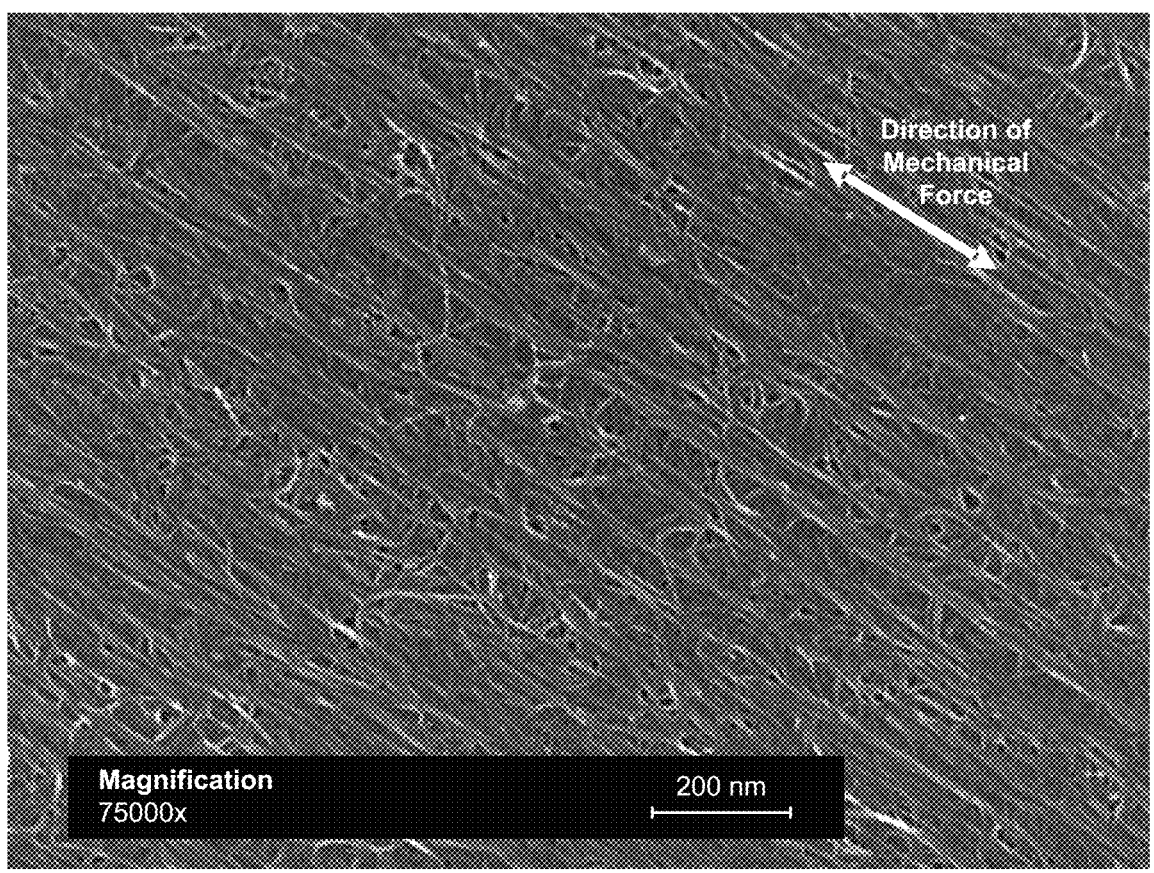

FIGS. 7A and 7B are a perspective drawing and an application diagram, respectively, depicting an exemplary rolling apparatus 700 suitable for applying a rolling force over a deposited nanotube fabric layer according to the methods of the present disclosure. A substrate element 710 coated with a nanotube fabric layer is passed between upper roller element 720 and lower roller element 730 along direction 790. Upper roller element 720 is adjustable within frame 750 through adjustment mechanism 740 such that a desired rolling force may be applied to the substrate element 710 along direction 795 and translated across a nanotube fabric layer deposited on the substrate element 710 along direction 790 as it is passed between upper and lower roller elements (720 and 730, respectively). In this way, a rolling force can be applied across a nanotube fabric layer one or more times, rendering the nanotube layer into a network of ordered nanotube elements. FIGS. 19A-19C (discussed in detail below) are SEM images depicting an exemplary nanotube fabric layer after the application of such a directional rolling force.

Referring now to FIGS. 8A-8B, a rubbing apparatus suitable for applying a linear directional force across a nanotube fabric layer is depicted. In some applications, a directional rubbing force can be applied to a nanotube fabric layer by first forming a nanotube fabric layer over a substrate layer and subsequently sliding that nanotube fabric layer across a rubbing surface (the nanotube fabric layer in direct contact with the rubbing surface) one or more times (as is depicted in the exemplary apparatus of FIGS. 8A-8B). In other applications, a rubbing surface can be moved over a formed nanotube fabric layer (that is, the nanotube fabric layer is fixed in place while a rubbing element is moved across—such as the exemplary apparatus illustrated in FIG. 21). Within the methods of the present disclosure, a rubbing element comprises a sheet of flat material which can provide a smooth interface to a nanotube fabric to minimize abrasion or scratching of the nanotube fabric. Such a rubbing surface or rubbing element can be formed from a plurality of materials, including, but not limited to, the smooth surface of an elemental silicon wafer, polytetrafluoroethylene (PTFE), cellulose acetate, cellulose (e.g., rayon), polyesters (e.g., polyethylene terephthalate and polybutyrate), polyamides (e.g., commercially available nylons), polymeric materials (in fibrous, foam, fabric, or film forms) including blends of the aforementioned polymer material types or natural materials (e.g., leather, cellulosic material as fiber or sheets), and semi-rigid slurries (such as, but not limited to, semi-rigid slurries of starch and water).

In some embodiments the nanotube fabric layer is passed over the rubbing surface once. In other embodiments the nanotube fabric layer is passed over the rubbing surface on the order of twenty times. In still other embodiments the nanotube fabric layer is passed over the rubbing surface on the order of two hundred times. In some embodiments the nanotube fabric layer is passed over the rubbing surface with a unidirectional movement (that is, only propelled forward against the rubbing surface a set distance from an initial position, then lifted from the rubbing surface and returned to this initial position for subsequent rubbing passes). In other embodiments the nanotube fabric layer is passed over the rubbing surface with a bidirectional movement (that is, propelled forward against the rubbing surface a set distance from an initial position and then pulled back against the rubbing surface to the initial position again).

In some embodiments a normal force (applied orthogonally with respect to the directional force) is applied either to the substrate element or to the rubbing surface (or both) such as to modulate the pressure between the two materials, and thus modulate the magnitude of the directional force as it is translated across the nanotube fabric layer. In some embodiments the pressure provided by this additional downward force is on the order of 300 to 800 Pascals. In other embodiments the pressure provided by this additional downward force may be greater than 1000 Pascals. In certain embodiments, such pressures may increase the speed or quality of ordering within the underlying nanotube fabric layer so long as such pressures do not damage or otherwise ablate the fabric layer.

FIGS. 8A and 8B are a perspective drawing and an application diagram, respectively, depicting an exemplary rubbing apparatus 800 well suited for applying a directional rubbing force over a nanotube fabric layer according to the methods of the present disclosure. Within this example, a nanotube fabric is formed on a substrate element 810, and the substrate element 810 is then moved across a fixed rubbing surface 820. The substrate element 810 (coated with a nanotube fabric layer) is secured against a vacuum plate 840 (using vacuum pump 870) and placed against rubbing surface 820 such that the nanotube fabric layer is against rubbing surface 820. A carrier mechanism 850 is secured around vacuum plate 850 and used to propel substrate element 810 across rubbing surface 820 along direction 890. A weighted element 860 is positioned atop vacuum plate 840 such as to increase the pressure applied between the nanotube fabric layer and the rubbing surface 820. The additional force provided by weighted element 860 in direction 895 is translated across the nanotube fabric layer in direction 890 as substrate element 810 is propelled across rubbing surface 820. In this way, a rubbing force can be applied across a nanotube fabric layer one or more times, rendering the nanotube layer into a network of ordered nanotube elements. FIGS. 20A-20C, 21A-21C, and 22A-22C (discussed in detail below) are SEM images depicting nanotube fabric layers after the application of such a directional rubbing force.

Referring now to FIGS. 9A-9B, a rubbing apparatus suitable for applying a directional force in an arcing motion across a nanotube fabric layer is depicted. In some applications a directional rubbing force can be applied to a nanotube fabric layer by passing a rubbing element over the surface of a formed nanotube fabric layer in an arcing motion. For example a chemical mechanical polishing (CMP) machine can be used to pass a rubbing pad back and forth in a shallow arc over a nanotube fabric layer deposited over a substrate element (the substrate held in a fixed position on a vacuum plate within the CMP machine). Such a rubbing pad might typically be formed of a polyurethane material, but may be comprised of other materials, including, but not limited to, polyester and polyamide microfibers, other forms of polyester (e.g., fibrous, foam, fabric, and film forms of polyester), polyamide and other polymers, styrene, polyvinylalcohol foam, cotton, wool, cellulose, and rayon.

Figure 23A:
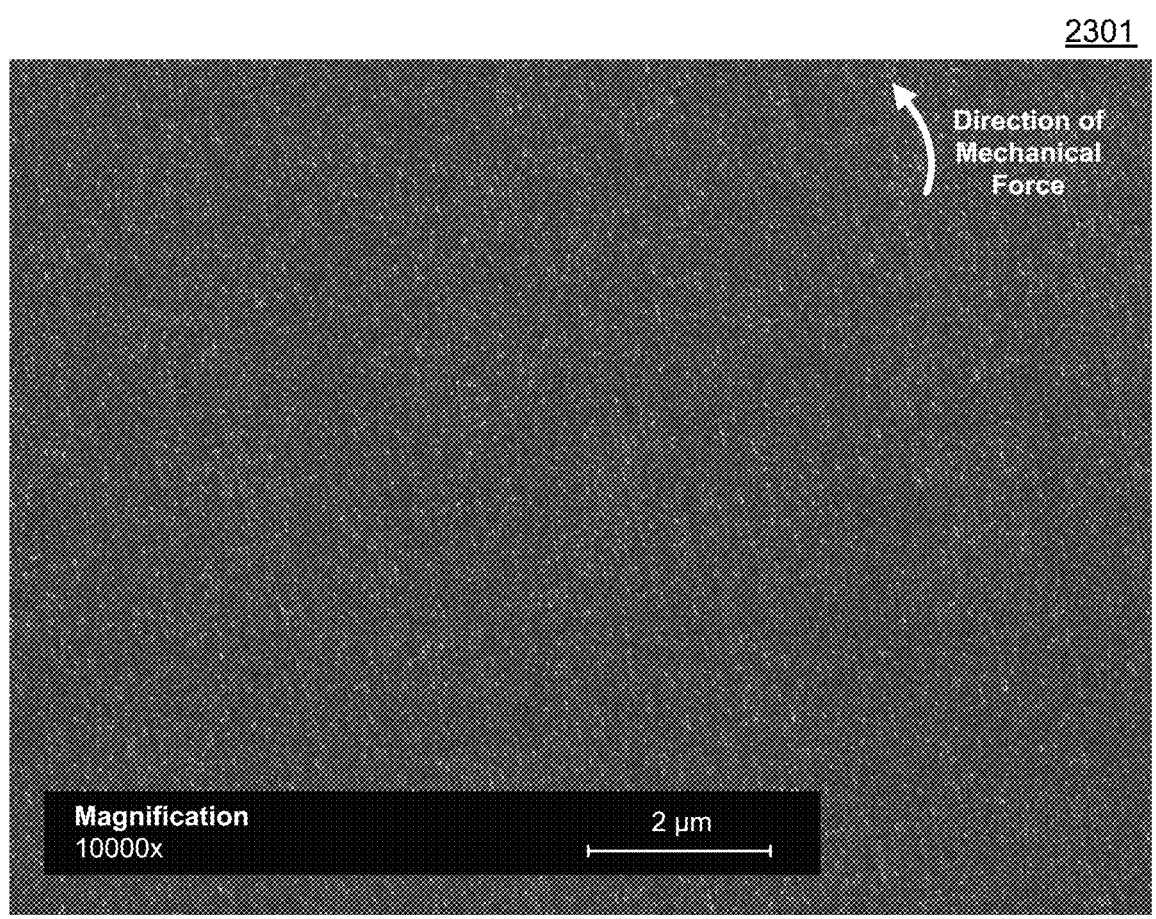
FIGS. 23A-23C are SEM images (at different magnifications) of an exemplary nanotube fabric layer comprising a network of nanotube elements rendered into an ordered arrangement after one hundred passes of a wool rubbing pad swept across the nanotube fabric layer in an arcing motion.
Figure 23B:
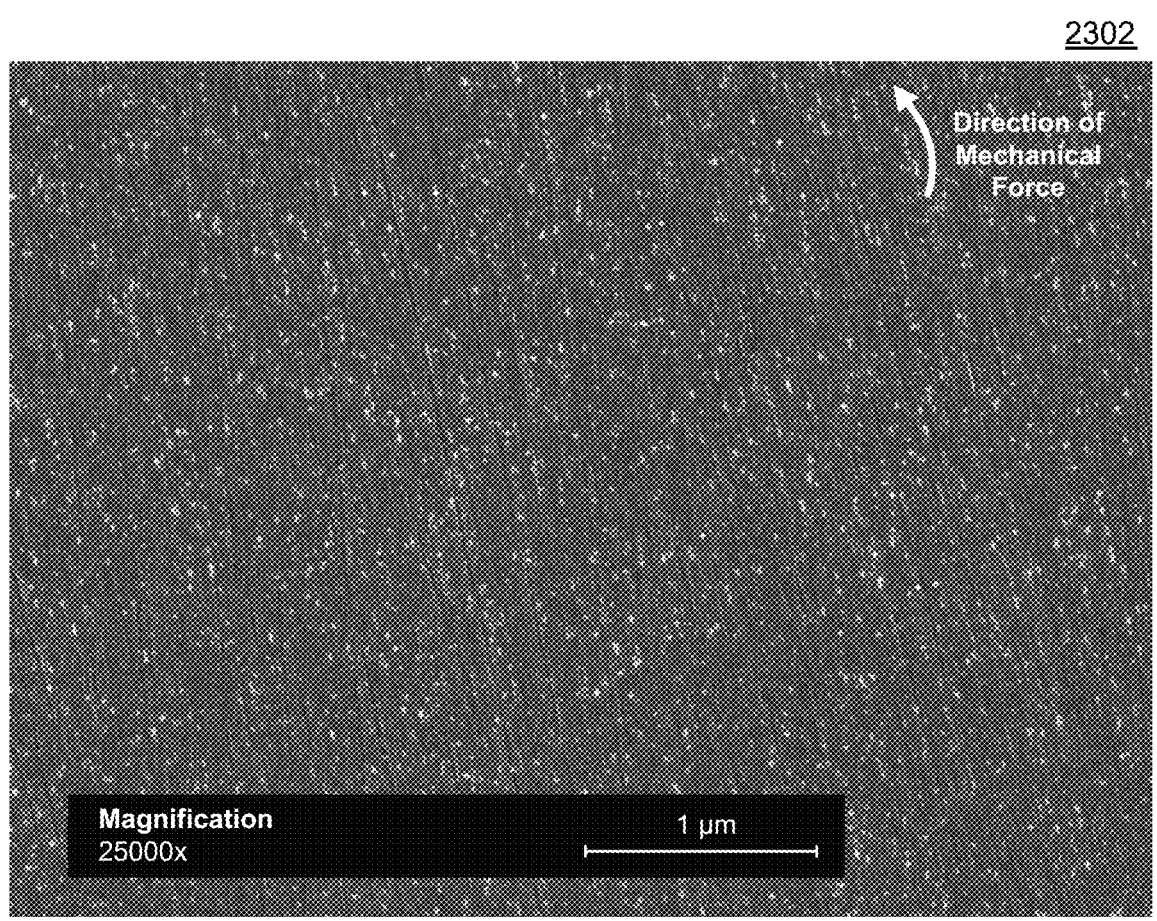
Figure 23C:
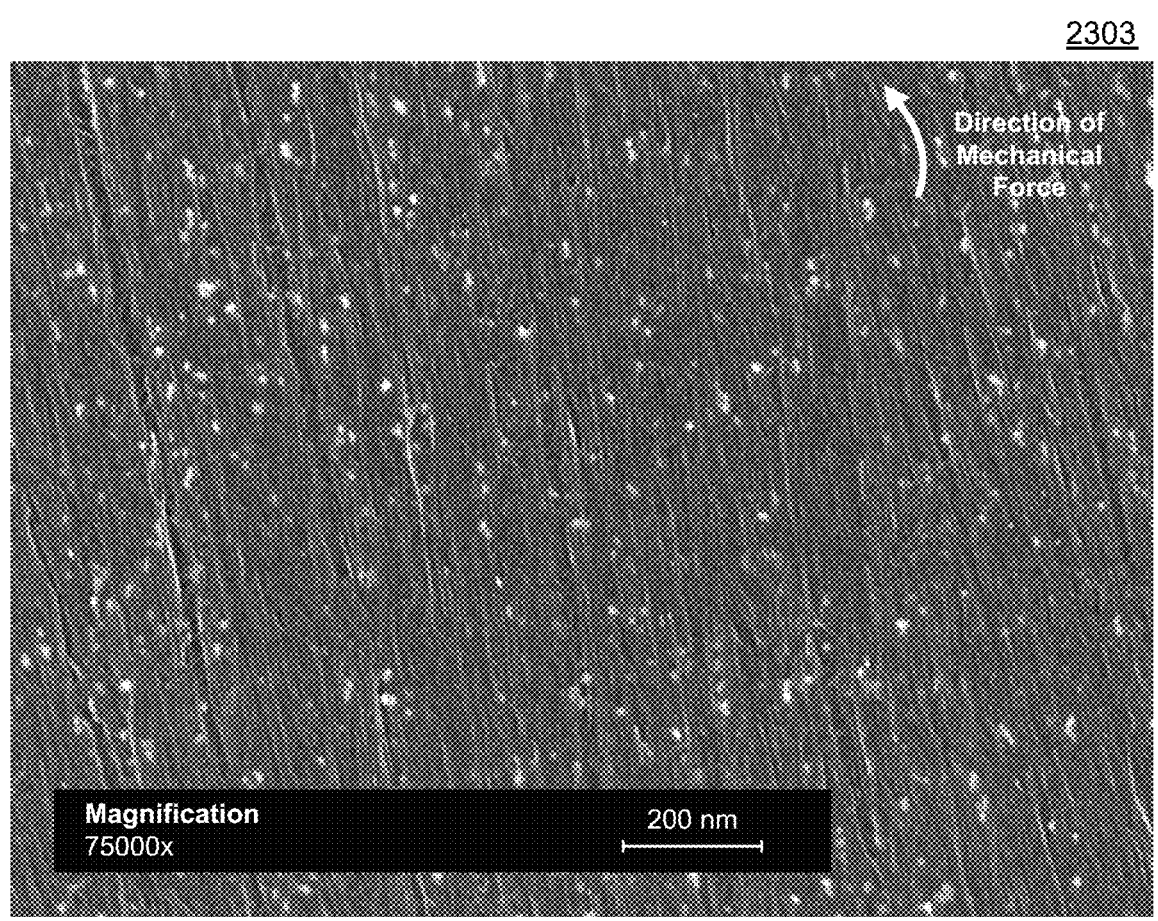

FIGS. 9A and 9B are a perspective drawing and an application diagram, respectively, depicting a first exemplary rubbing apparatus 900 suitable for applying a directional force over a deposited nanotube fabric layer in an arcing motion according to the methods of the present disclosure. A substrate element 910 coated with a nanotube fabric layer is placed within a carrier assembly 940. The carrier assembly 940 is moved by adjustable arm 950 rotating on pivot mechanism 960 in an arc across rubbing surface 920 (fixed in place within device surface 970) such that the nanotube fabric layer deposited on the surface of substrate element 910 is passed over rubbing surface 920 in direction 990. In this way, a rubbing directional force can be applied across a nanotube fabric layer one or more times, rendering the nanotube layer into a network of ordered nanotube elements. FIGS. 23A-23C (discussed in detail below) are SEM images depicting nanotube fabric layers after the application of such a directional rubbing force. It should be noted, that as show in FIGS. 23A-23C, a nanotube fabric ordered via a rubbing directional force applied in a wide arcing motion will tend to order in a substantially linear direction.

Referring now to FIGS. 10A-10B, a polishing apparatus suitable for applying a directional force in a linear motion across a nanotube fabric layer is depicted. A cylindrical polishing element—e.g., as a rigid cylinder coated with a soft polishing material (such as, but not limited to, wool and velour) and rotated about its long axis—can be rotated on the order of fifteen to twenty rotations per minute (RPM) as it is translated linearly over a region of the nanotube fabric layer (with the rotating cylinder in contact with the nanotube fabric layer) repeatedly for several minutes. Suitable polishing material may include, but is not limited to, polyester and polyamide microfibers, other forms of polyester (e.g., fibrous, foam, fabric, and film forms of polyester), polyamide and other polymers, styrene, polyvinylalcohol foam, cotton, wool, cellulose, and rayon. The force applied to the polishing material as it is translated across the nanotube fabric layer may be selected as to increase the pressure between the two materials. For example, in some embodiments the applied force is selected such as to compress the nap of the polishing material against the nanotube fabric layer by approximately fifty percent. In some embodiments it may be important to prevent this force from compressing the nap of the polishing material completely and allowing the backing of the polishing material to come into physical contact with the nanotube fabric layer. Within such embodiments, such contact may result in the backing layer scratching or otherwise damaging the nanotube fabric layer. As the polishing material is passed across the nanotube fabric layer, this additional force is translated across the nanotube fabric layer imparting a directional force over the fabric. In some embodiments this applied force may result in a pressure on the order of 5 to 100 Pascals across the nanotube fabric layer. In other embodiments this applied force may result in a pressure on the order of 500 Pascals.

Figure 24A:
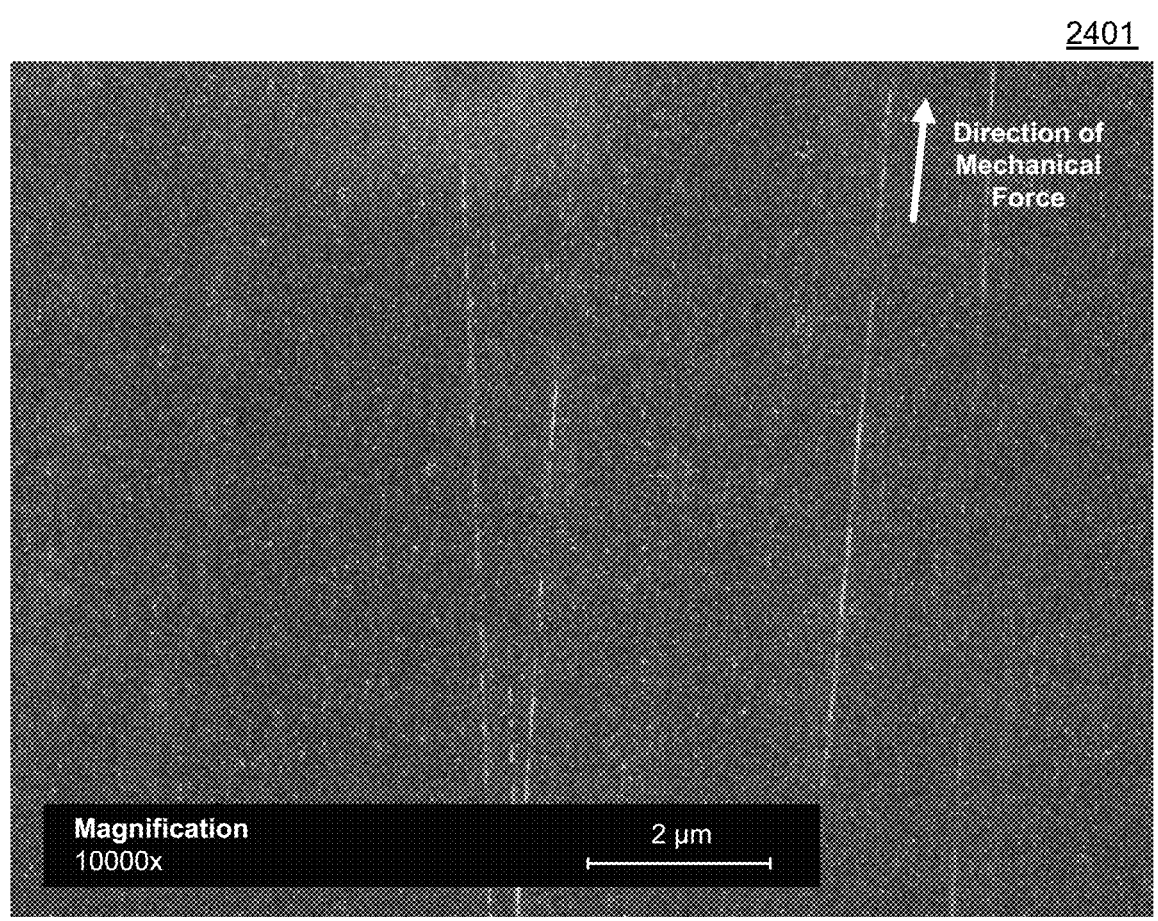
FIGS. 24A-24C are SEM images (at different magnifications) of an exemplary nanotube fabric layer comprising a network of nanotube elements rendered into an ordered arrangement after fifty passes of a velour polishing roller swept across the nanotube fabric layer in an linear motion.
Figure 24B:
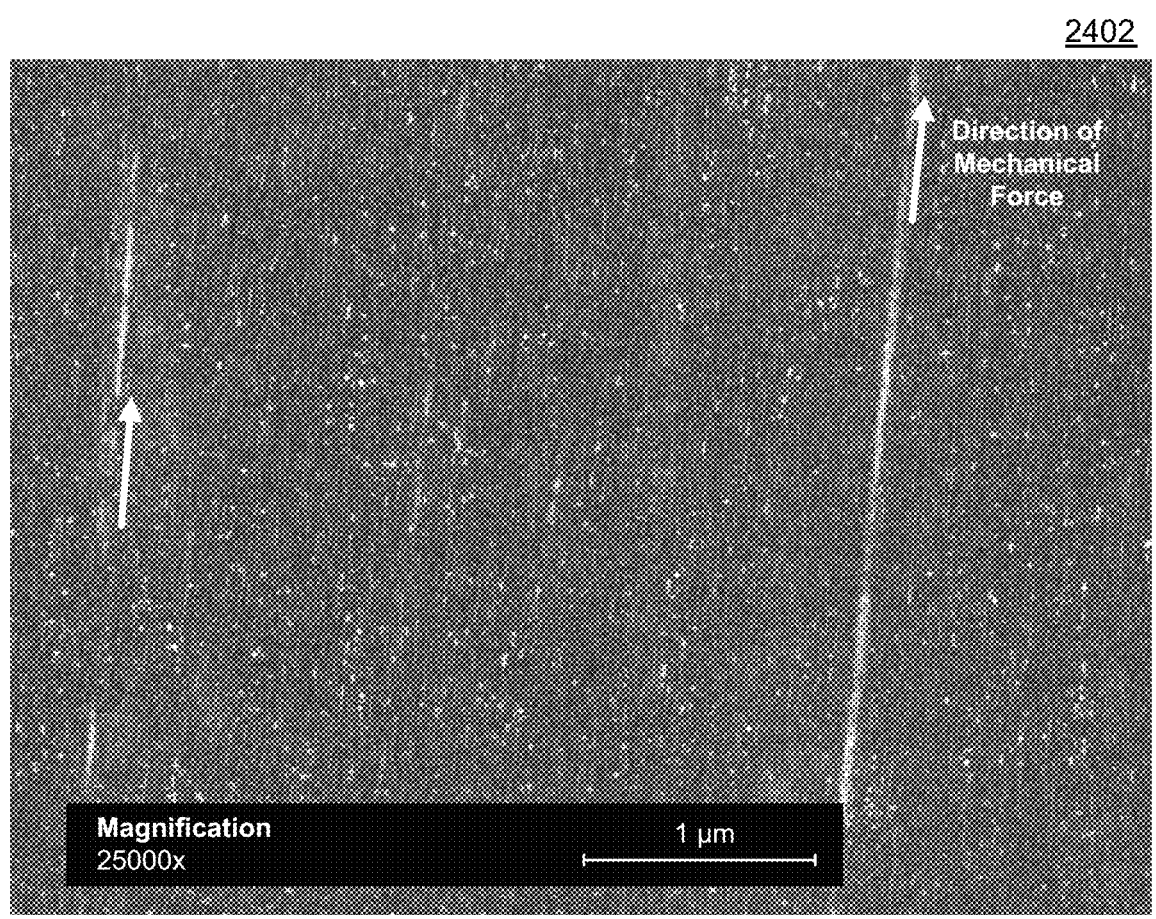
Figure 24C:
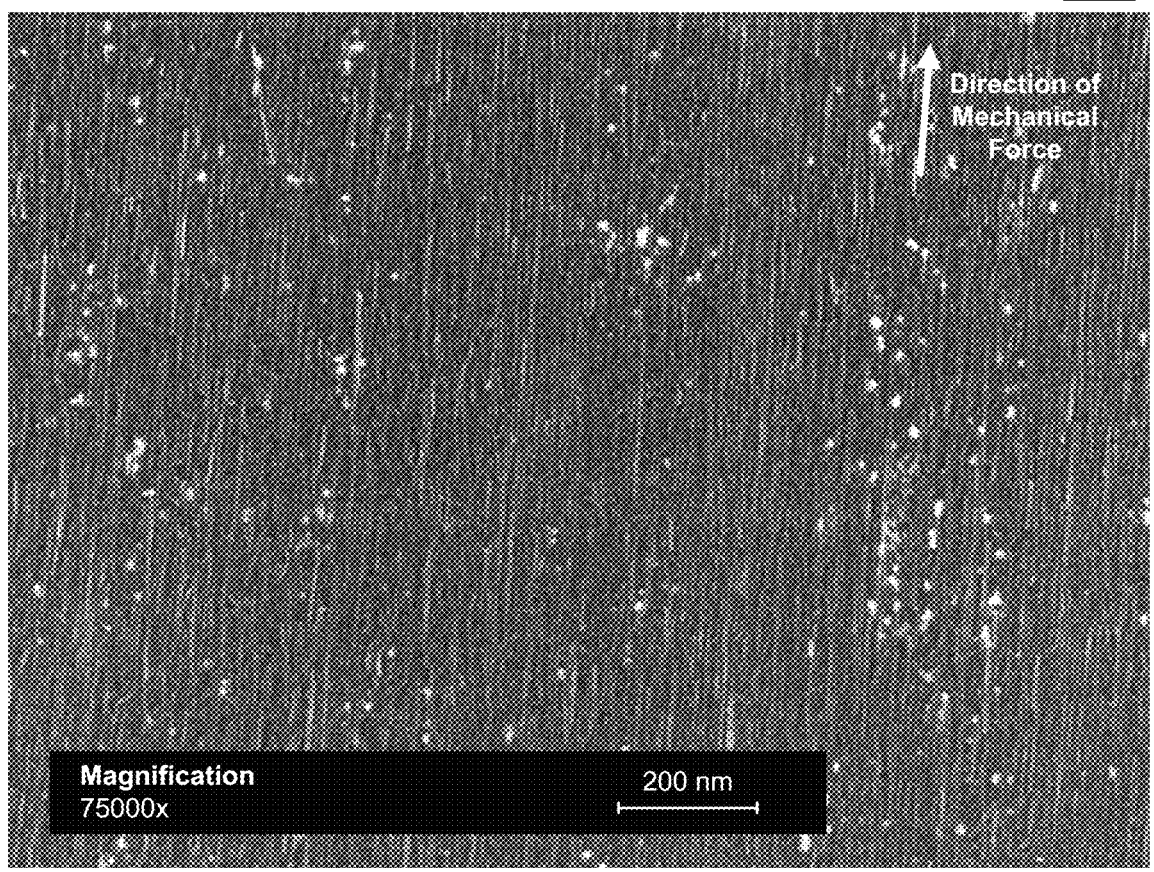

FIGS. 10A and 10B are a perspective drawing and an application diagram, respectively, depicting a second exemplary polishing apparatus 1000 suitable for applying a directional force over a deposited nanotube fabric layer according to the methods of the present disclosure. A substrate element 1010 coated with a nanotube fabric layer is secured in place on a vacuum table 1070. A cylindrical polishing element 1020 is positioned within track element 1050 such that the polishing material covering the surface of cylindrical polishing element 1020 is placed against the nanotube fabric layer deposited over substrate element 1010. Cylindrial roller 1020 is rotated in direction 1090 (for example, at 60 rpm) and then moved within track element 1050 such that the force applied by the cylindrical polishing element 1020 is translated across the nanotube fabric layer deposited on substrate element 1010. In this way, a polishing force can be applied across a nanotube fabric layer one or more times, rendering the nanotube layer into a network of ordered nanotube elements. FIGS. 24A-24C (discussed in detail below) are SEM images depicting nanotube fabric layers after the application of such a polishing directional force.

Referring now to FIGS. 11A-11B, a polishing apparatus suitable for applying a rotational directional force over a nanotube fabric layer is depicted. A rotational directional force can be applied to a nanotube fabric layer by rotating a polishing element over the surface of a formed nanotube fabric layer. For example a polishing pad can be placed over a nanotube fabric layer and rotated for a set time (for example, on the order of ninety seconds). Suitable material for the polishing element may include, but is not limited to, polyester and polyamide microfibers, other forms of polyester (e.g., fibrous, foam, fabric, and film forms of polyester), polyamide and other polymers, styrene, poly vinylalcohol foam, cotton, wool, cellulose, and rayon. In some embodiments, a polishing material may be selected according to a specific denier specification (denier being an attribute of textiles indicating the weight in grams of 9000 meters of a fiber). In some embodiments an additional force is applied to the polishing element as it is rotated over the nanotube fabric layer as to increase the pressure between the two materials. As the polishing element is rotated, this additional force is translated across the nanotube fabric layer. In some embodiments this applied force may result in a pressure on the order of two to five Pascals across the nanotube fabric layer. In other embodiments this applied force may result in a pressure on the order of 100 Pascals.

Figure 25A:
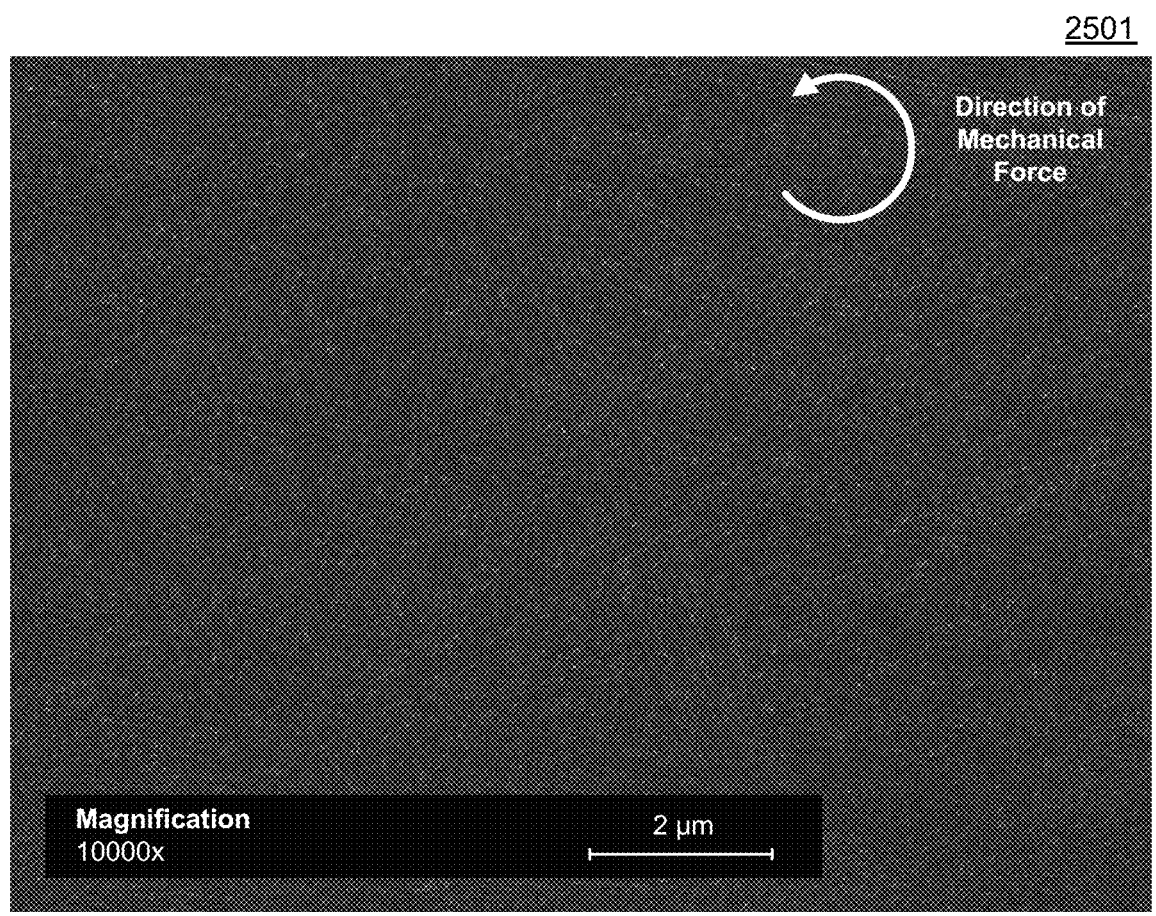
FIGS. 25A-25C are SEM images (at different magnifications) of an exemplary nanotube fabric layer comprising a network of nanotube elements rendered into an ordered arrangement after the application of a rotational directional force over the nanotube fabric layer via a rotating wool polishing pad rotated at sixty rpm for ninety seconds.
Figure 25B:
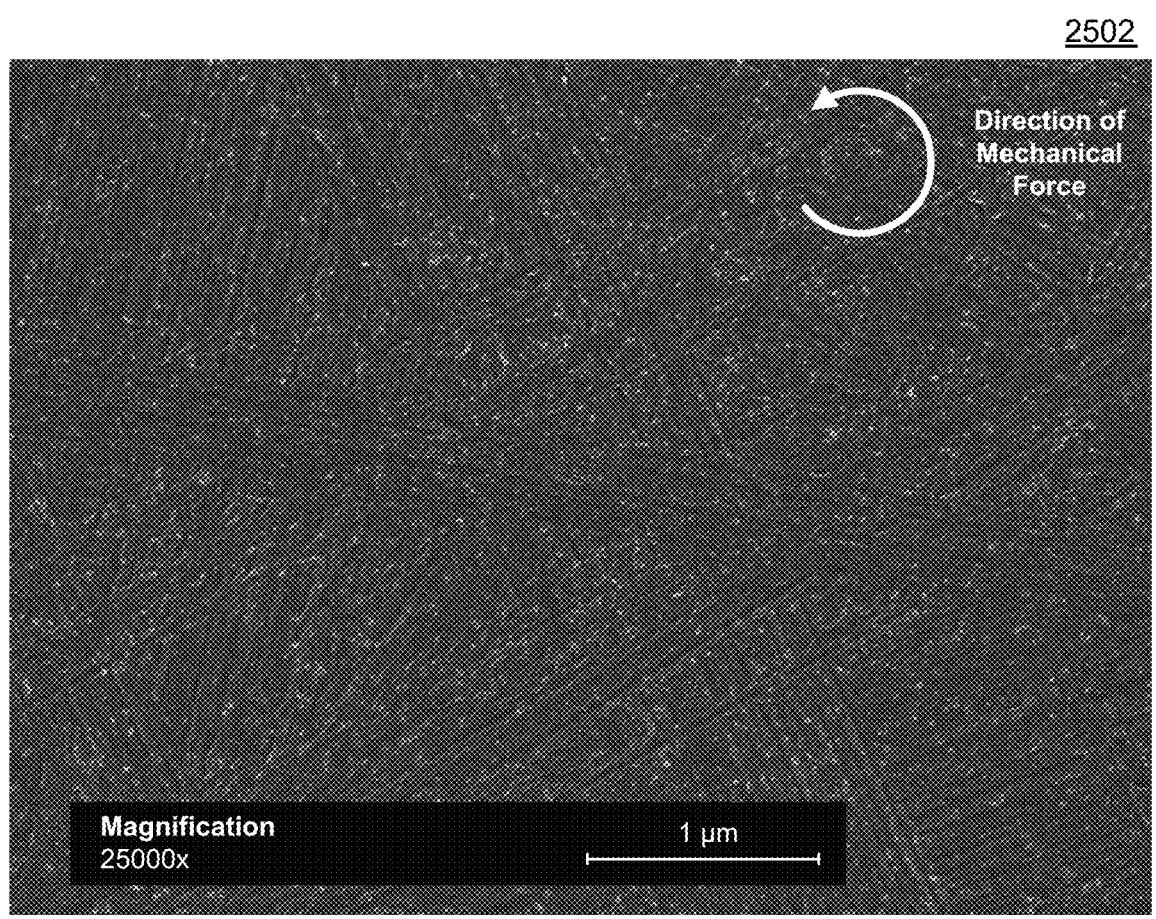
Figure 25C:
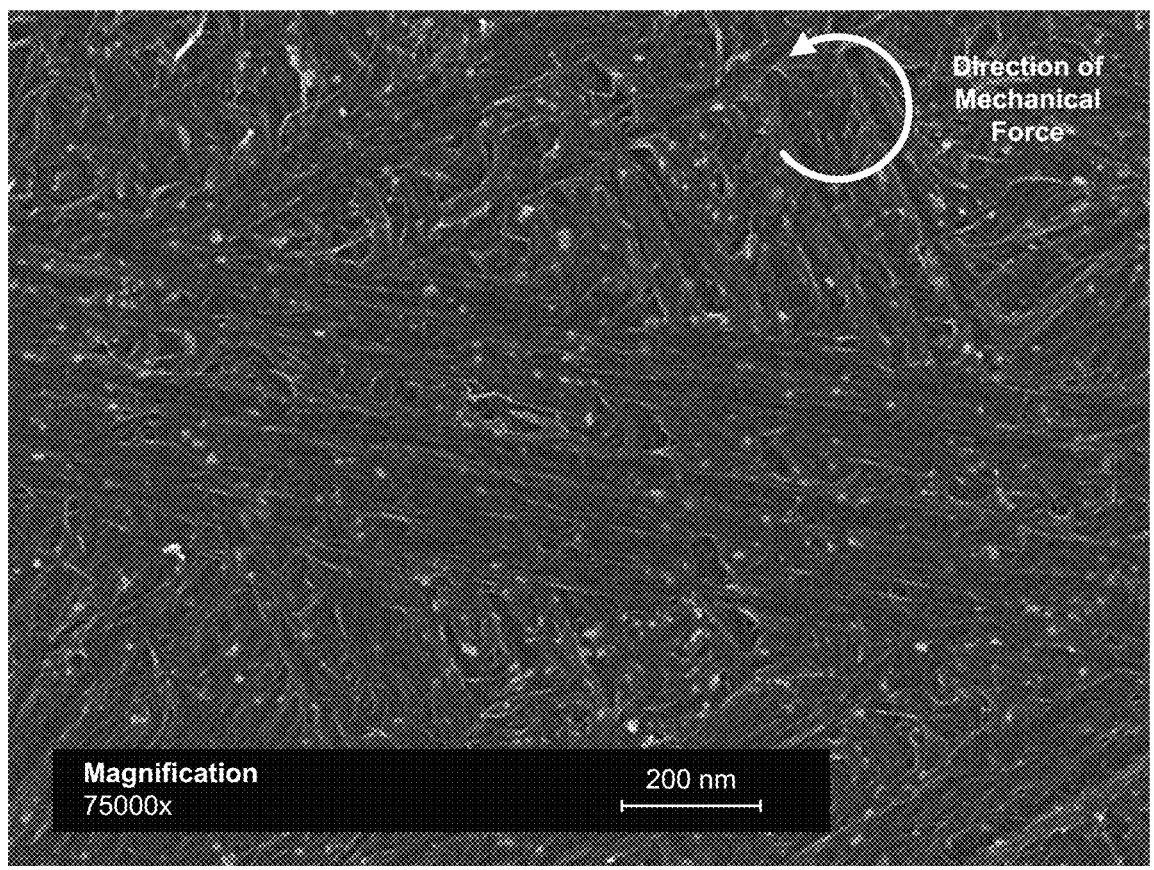

FIGS. 11A and 11B are a perspective drawing and an application diagram, respectively, depicting a exemplary apparatus 1100 suitable for applying a rotational polishing force over a deposited nanotube fabric layer according to the methods of the present disclosure. A substrate element 1110 coated with a nanotube fabric layer is secured in place on a vacuum table 1170. A polishing element 1120 is fixed within rotating assembly 1140 and positioned with adjustment arm 1150 such that the polishing element 1120 is placed against the nanotube fabric layer deposited over substrate element 1110. Polishing element 1120 is then rotated in place in direction 1190 (for example, at sixty rotation per minute for sixty seconds). In this way, a rotational polishing force can be applied across a nanotube fabric layer, rendering the nanotube layer into a network of ordered nanotube elements. FIGS. 25A-25C (discussed in detail below) are SEM images depicting nanotube fabric layers after the application of such a rotational polishing force.

Referring now to FIGS. 12A-12B, a cryokinetic impingement apparatus suitable for applying a directional force over a nanotube fabric layer is depicted. A directional polishing force can be applied to a nanotube fabric layer through the use of a cryokinetic process. FIGS. 12A-12B illustrate an exemplary cryokinetic impingement device well suited for use with the methods of the present disclosure. Within such a device, an application wand 1250 is used to direct a spray of frozen particles 1220 at a shallow angle (for example, on the order of 15 degrees with respect to the plane of the nanotube fabric layer) over a nanotube fabric layer 1210 at a relatively high velocity (for example, propelled with a pressure on the order of 60 PSIG). The impact of these frozen particles 1220 provides a directional force which is translated across the nanotube fabric layer 1210 as application wand 1250 is moved along direction 1290. Within such a system, frozen particles 1220 may be rice-sized particles (for example, on the order of 0.125 inches diameter) of a frozen gas such as, but not limited to, carbon dioxide ($CO_2$) or argon.

FIGS. 12A and 12B, a perspective drawing and an application diagram, respectively, of a cryokinetic impingement system are depicted. A nanotube fabric coated wafer 1210 is secured to vacuum plate 1230 such as to hold it in place during the polishing operation. An application wand 1250 is fed by an air hose 1270 and a pellet supply hose 1260 such as to direct a spray of frozen pellets 1220 across nanotube fabric coated wafer 1210. Controls 1280 on the pelletizer unit allow for control of the velocity and quantity of stream 1220. Within an exemplary polishing operation, application wand 1250 is positioned at a shallow angle and moved across nanotube fabric covered wafer 1210 along direction 1290.

Though not illustrated in FIGS. 12A and 12B, in some embodiments an intermediate barrier layer of pliable material—such as, but not limited to, a layer of PET, a plastic membrane (e.g., Saran wrap, based upon polyvinylidene chloride), or a thin foil film—is situated over the deposited nanotube fabric layer prior to the application of the cryokinetic spray 1220. Within such embodiments, this layer of pliable material may be used to protect the underlying nanotube fabric layer 1210 and guard against ablation of the individual nanotube elements under the high velocity spray 1220. In some embodiments this layer of pliable material may also be useful in efficiently transferring the force cryokinetic spray to the nanotube fabric. In this way, a polishing force can be applied across a nanotube fabric layer one or more times, rendering the nanotube layer into a network of ordered nanotube elements. FIGS. 28A-28D (discussed in detail below) are SEM images depicting nanotube fabric layers after the application of such a cryokinetic impingement force.

In other applications a similar (with respect to the above described cryokinetic impingement operation) ordering operation may be realized through the use of a jet of high pressure gas or liquid (e.g., an air gun). Within such a high pressure flow polishing operation, an air gun may be used to flow a gas (such as, but not limited to, nitrogen) over an unordered nanotube fabric layer to render that fabric layer into an ordered network of nanotube elements. As with the cryokinetic impingement operation, in some embodiments a high pressure flow operation might employ a pliable protective layer—such as, but not limited to, a layer of PET, a plastic membrane (e.g., Saran wrap, based upon polyvinylidene chloride), or a thin foil film—over the nanotube fabric layer during the air flow operation. An exemplary high pressure air flow polishing operation is depicted in FIGS. 32A-32D and described in detail below.

Figure 13A:
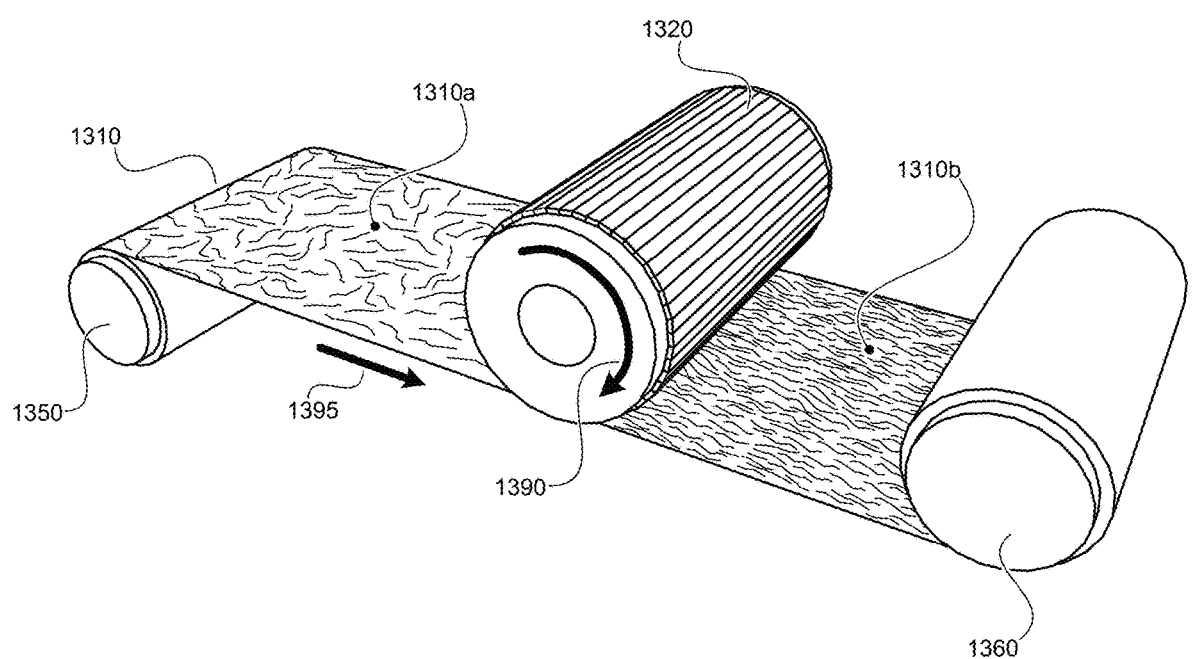
FIG. 13A is a perspective drawing depicting an exemplary roll-to-roll polishing apparatus suitable for applying a linear directional force over a nanotube fabric layer according to the methods of the present disclosure.
Figure 13B:
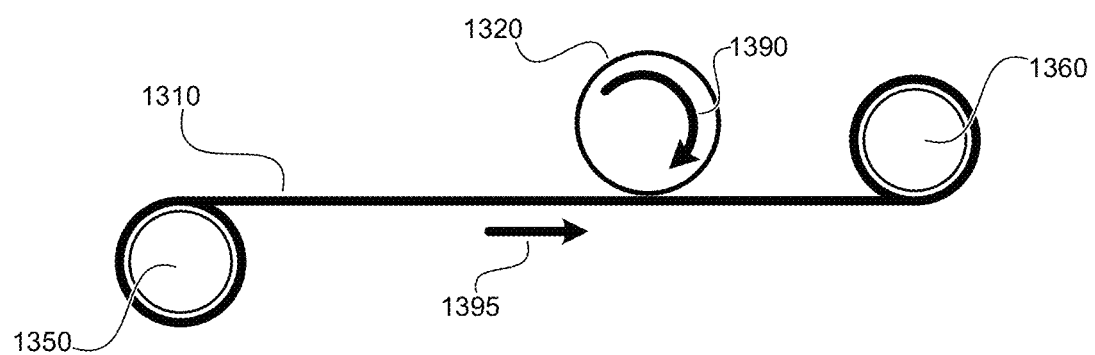
FIG. 13B is a diagram illustrating the operation of the exemplary roll-to-roll polishing apparatus depicted in FIG. 13A.

Referring now to FIGS. 13A-13B, a roll-to-roll polishing apparatus suitable for applying a directional force over a nanotube fabric layer is depicted. A flexible material 1310 (such as, but not limited to, paper, plastic, or metallic foil) coated with a substantially unordered nanotube fabric 1310a is transferred between a first roller 1350 and a second roller 1360 along direction 1395. Within the exemplary roll-to-roll polishing apparatus depicted in FIGS. 13A and 13B, a cylindrical polishing element 1320 is rotated along direction 1320 against the unordered nanotube fabric layer as it is linearly translated beneath it between the first and second rollers (1350 and 1360, respectively). The composition and use of such a cylindrical polishing element 1320 is depicted and described in detail within the discussion of FIGS. 10A and 10B above. The directional force applied by cylindrical polishing element 1320 arranges the nanotube elements within unordered nanotube fabric layer 1310a (deposited by applicator 1340) into a network of ordered nanotubes 1310b. In this way, a large scale nanotube fabric can be arranged into an ordered nanotube fabric layer.

It should be noted that while a cylindrical polishing element 1320 is depicted in FIGS. 13A and 13B, the methods of this aspect of the present disclosure are not limited in this regard. Indeed, any of the rolling, rubbing, and polishing methods described within the present disclosure may be used with a roll-to-roll system as depicted in FIGS. 13A and 13B. Further, in certain applications a roll-to-roll polishing apparatus such as is depicted in FIGS. 13A and 13B might further include an applicator mechanism and drying mechanism which can be used to deposit and dry a nanotube fabric over flexible material 1310 as it is transitioned between first roller 1350 and second roller 1360

In other applications a layer of piezoelectric material may be placed over an unordered nanotube fabric layer and used to apply a directional force to the fabric layer. Within such applications, the piezoelectric material will vibrate in response to certain electrical stimuli, effectively generating a rubbing force which is translated over the nanotube fabric layer. In some embodiments, a layer of piezoelectric material may be shaped such as to apply such a directional force only to one or more preselected regions within the nanotube fabric layer. Within such embodiments, those preselected regions may be rendered into ordered networks of nanotube elements, leaving the remaining regions substantially unordered. Such a selectively ordered nanotube fabric layer would be useful, for example, as a masking or imprinting device within a photolithography operation. An exemplary piezoelectric rubbing operation is depicted in FIGS. 30A-30D and described in detail below.

As previously discussed, a CMP machine—a polishing/planarizing apparatus typically readily available in semiconductor fabrication facilities—is a device well suited (within certain applications) for applying a directional force over a nanotube fabric. For example, a CMP machine can be used to pass a polishing element or a rubbing element over a nanotube fabric layer deposited over a silicon wafer in an arcing or a linear path (in an operation similar to that of the exemplary apparatus depicted in FIGS. 9A and 9B). In another example, a CMP machine can be used to rotate a polishing element or a rubbing element over a nanotube fabric deposited over a silicon wafer (in an operation similar to that of that of the exemplary apparatus depicted in FIGS. 11A and 11B).

Within certain applications a polishing element or a rubbing element can be applied to the nanotube fabric layer using a lubricating medium. Such lubricating media can include, but are not limited to, water, halocarbon (included, but not limited to, liquids including halogen containing alcohols, alkyl nitrites, alkanols, organic amines, fluorinated compounds and perfluorocarbons, perfluorohexane, perfluoroheptane chlorocarbons, perfluorinated or substantially fluorinated organic compounds including perfluorohexane, perfluoro(2-butyl-tetrahydrofurane, and perfluorinated polyether), liquefied gases (including, but not limited to, liquid carbon dioxide ($CO_2$) and liquid xenon), hydrocarbon liquids (including, but not limited to, $C_3$-$C_{12}$ alkanes, $C_8$-$C_{16}$ arylalkanes, $C_{10}$-$C_{25}$ arylcyloalkanes, $C_6$-$C_{12}$ aromatics, toluene, and Xylene), functionalized organic liquids (including, but not limited to, those containing ketone, aldehyde, ester, ether, amide, alcohol, $C_2$-$C_{12}$ ethers, DME, glymes, methanol, ethanol, propanol, butanol, acetone, and tetrahydrofuran), organo-siloxane based cyclics and linear liquids (including, but not limited to, groups of polydimethylsiloxanes cylic and linear liquids and polyphenylsiloxane cyclic and linear liquids), and solids (including, but not limited to, molybdenum disulfide, boron nitride, graphite, and styrene beads).

Within such applications a lubricating medium may facilitate the application of a directional force by limiting drag between a polishing (or rubbing) element and the surface of the nanotube fabric. For example, within an ordering operation wherein a rubbing element is applied with relatively high pressure, a lubricating medium can be used to ensure that the resulting directional force is applied evenly over the entire surface of the nanotube fabric.

In some applications a lubricating medium can be applied to a polishing/rubbing pad prior to an ordering operations (for example, a polishing/rubbing pad being dampened with water). In other applications a lubricating medium can be deposited over a nanotube fabric prior to the application of a polishing/rubbing pad. Within such applications, the lubrication medium is selected and/or applied in such a way as to not result in any substantial re-suspension of nanotube elements within the nanotube fabric into the applied lubrication medium.

It should be noted that while the use of a lubricating medium is beneficial in certain applications (as described above) in other applications it may be problematic within an ordering operation. In certain applications, for example, the application of a lubricating medium can fully dislodge nanotube elements from a substrate surface. In another example, a lubricating medium (within certain applications) may react (physically or chemically) with the nanotube elements damaging or otherwise adversely affecting the unordered nanotube fabric layer.

It should also be noted that the arrangement of nanotube elements within nanotube fabric layers via the methods of the present disclosure also provides nanotube fabrics which are highly smooth as compared to unordered nanotube fabric layers. Within some applications, these smoother fabric layers provide optimized surfaces for the deposition of subsequent material layers. For example, such ordered nanotube fabric layers may be expected to have a substantially uniform thickness across the entire layer, reducing the likelihood of thin areas in the fabric which may, in some application, allow a subsequently deposited layer to penetrate through the nanotube fabric layer.

Figure 14A:
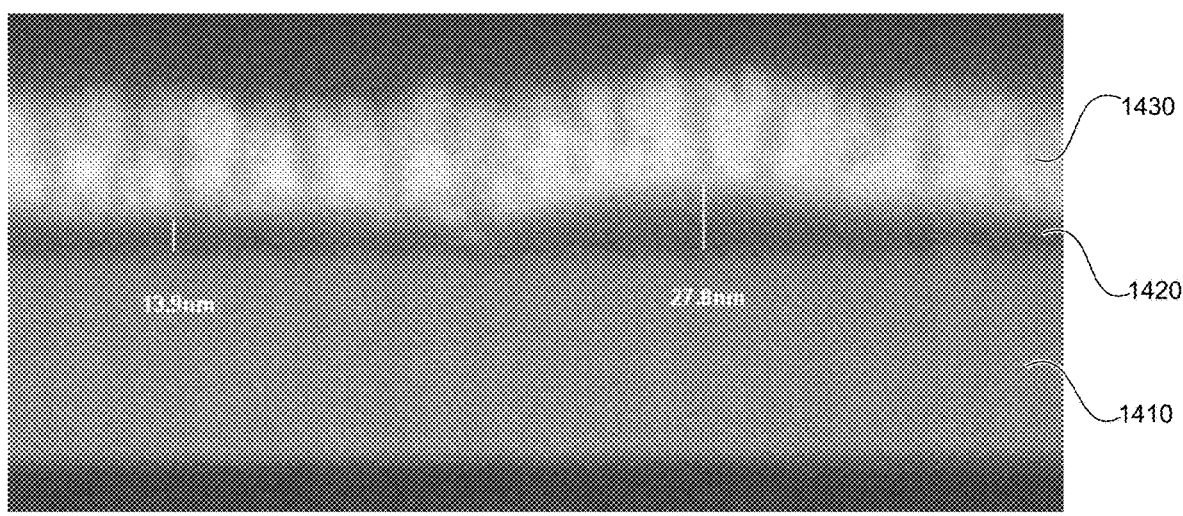
FIGS. 14A-14B are cross sectional images of a three-layer structure including a substantially unordered nanotube fabric layer.
Figure 14B:
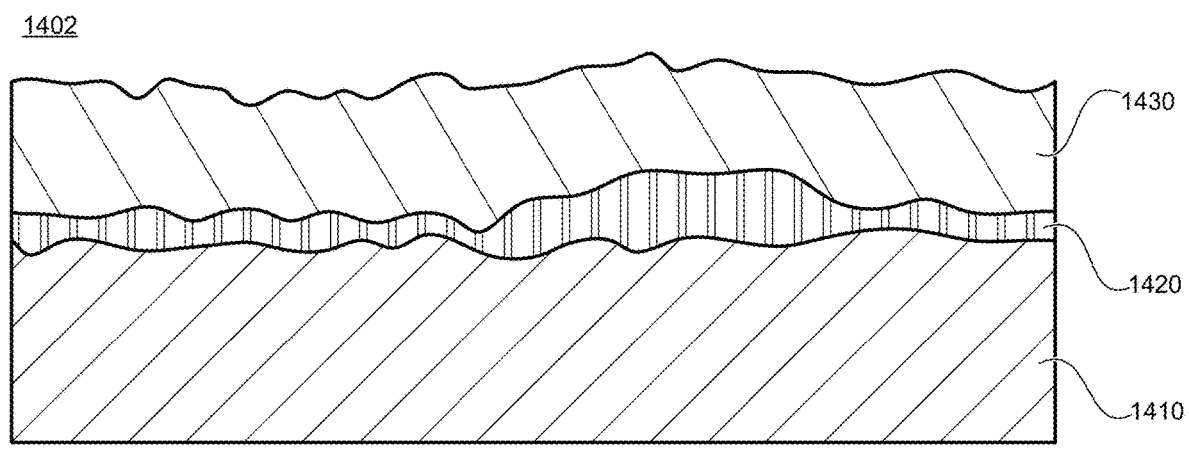

To this end, FIGS. 14A and 14B depict a cross section view of a substantially unordered nanotube fabric layer 1420 deposited over a substrate layer 1410. A top layer of material 1430 has been further deposited over the unordered nanotube fabric layer 1420 to create a three-layer structure. FIG. 14A is an SEM image 1401 of this three-layer structure, while FIG. 14B is a line drawing of the same structure. As can be observed in the two images (1401 and 1402), substantially unordered nanotube fabric layer 1420 exhibits a non-uniform thickness, providing a number of "thin spots" between substrate layer 1410 and top material layer 1430.

Figure 15A:
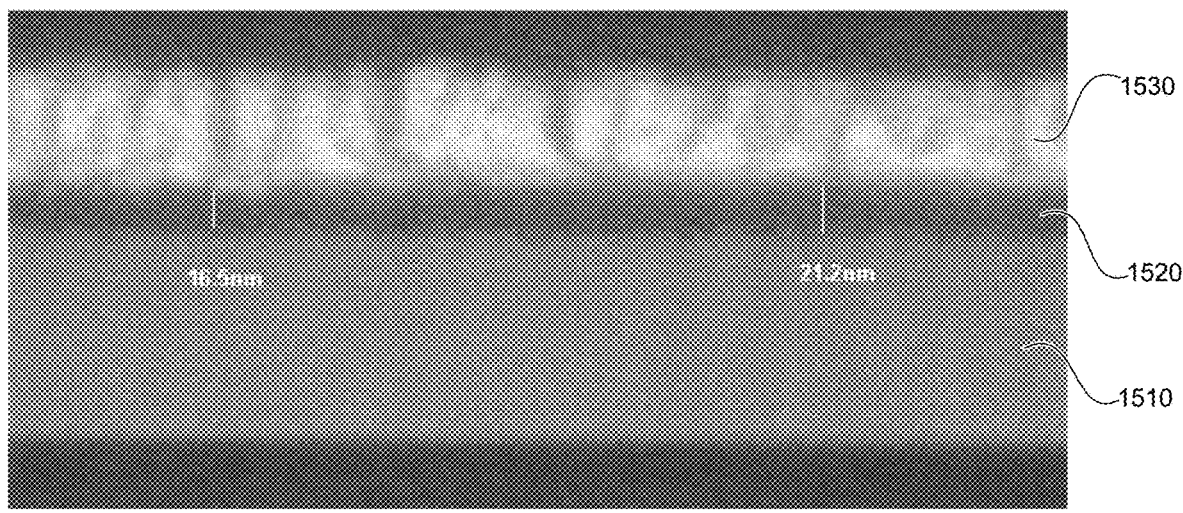
FIGS. 15A-15B are cross sectional images of a three-layer structure including an ordered nanotube fabric layer.
Figure 15B:
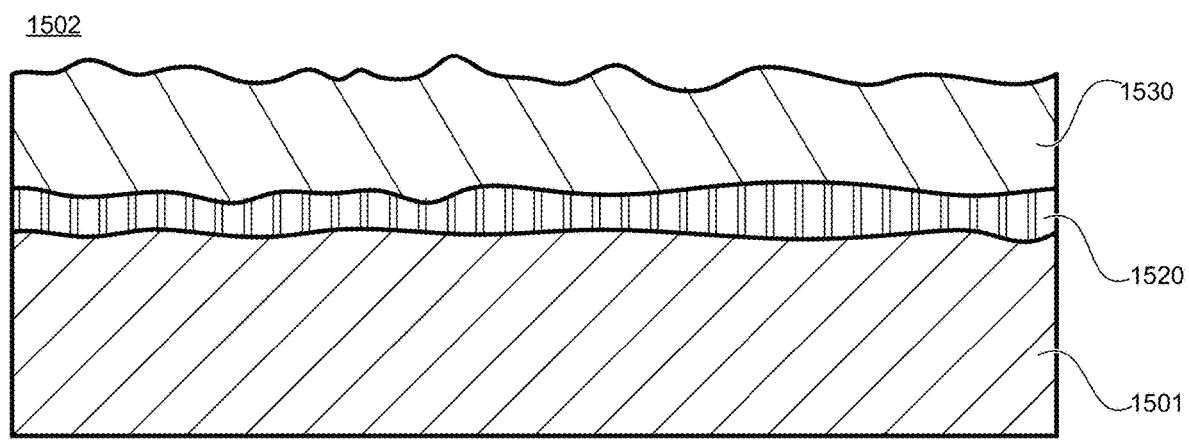

Conversely, FIGS. 15A and 15B depict a cross section view of an ordered nanotube fabric layer 1520 deposited over a substrate layer 1510. As with the previous structure of FIGS. 14A and 14B, a top layer of material 1530 has been further deposited over the ordered nanotube fabric layer 1520 to create a three-layer structure. FIG. 15A is an SEM image 1501 of this three-layer structure, while FIG. 15B is a line drawing of the same structure. As can be observed in the two images (1501 and 1502), unordered nanotube fabric layer 1520 exhibits a significantly improved uniformity in thickness (as compared with unordered nanotube fabric layer 1420 in FIGS. 14A and 14B), providing a more uniform separation distance between substrate layer 1510 and top material layer 1530.

It should also be noted that within certain embodiments an ordered nanotube fabric layer would possess a decreased coefficient of friction (as compared with an unordered nanotube fabric layer) and would be useful in the fabrication of low friction coatings. For example, a layer of nanotube fabric may be formed over the inner surface of a cylinder within an internal combustion engine and then rendered into an ordered state. Such an ordered fabric could then be used to reduce the coefficient of friction of a piston moving within the cylinder. In another example, ordered nanotube fabric layers may be formed over the mating surfaces of gears, bearings, shafts, and other mechanical components within a mechanized system. Such coating would reduce the friction between the mating surfaces of these components, reducing wear and extending the life of the individual components and, by extension, the system itself In another example, such ordered nanotube fabric layers may be used to provide nanoscale low friction surfaces and coatings within microelectromechanical systems (MEMS).

Figure 16:
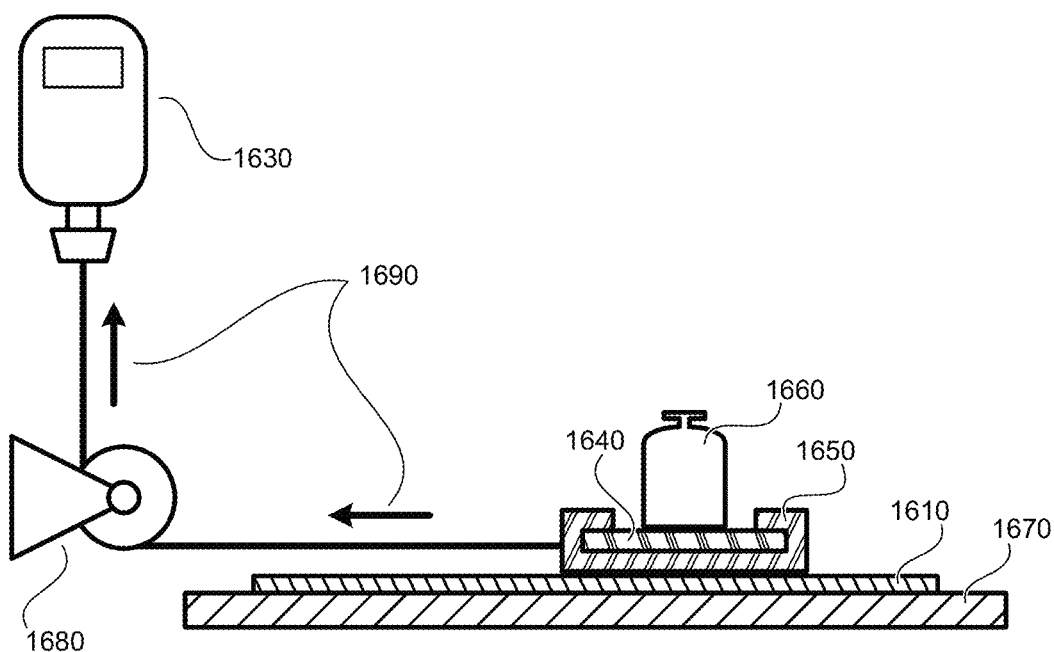
FIG. 16 is a diagram illustrating an apparatus used to determine the frictional observed over a partially ordered nanotube fabric layer.
Figure 17:
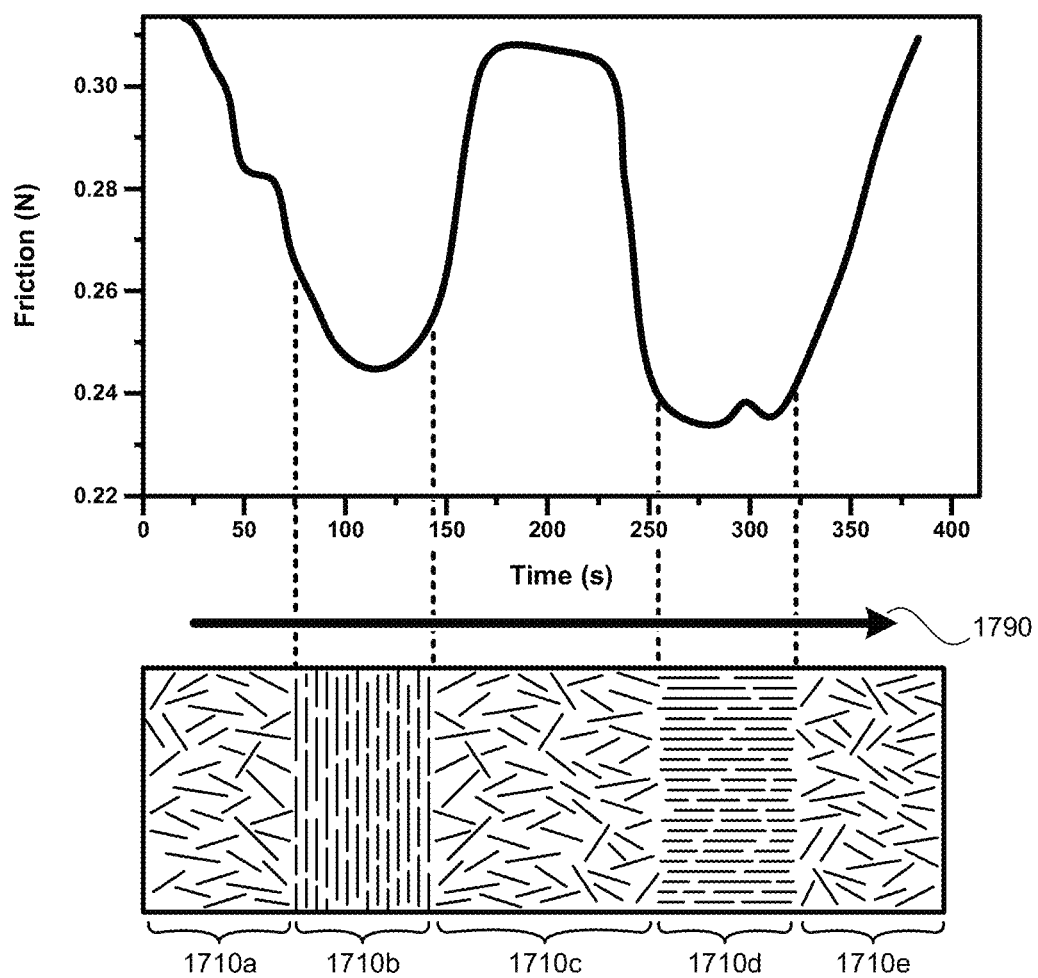
FIG. 17 is a plot of the frictional forces observed with the apparatus of FIG. 16 over a partially ordered nanotube fabric layer.

FIGS. 16 and 17 illustrate an experiment performed on a partially ordered nanotube fabric layer to demonstrate the reduced coefficient of friction of an ordered nanotube fabric layer as compared with an unordered nanotube fabric layer. A nanotube fabric layer 1610 was formed over a silicon substrate 1670 and cut into a strip approximately 4 cm wide and 20 cm long. The nanotube fabric layer 1610 was then selectively rendered into an ordered state such as to realize five regions (1710a-1710e) along the length of the strip, as depicted in FIG. 17. A polishing pad 1650 was then wrapped over and secured to a cleaved $SiO_2$ wafer 1640 (approximately 4 cm by 4 cm in dimension) such as to form a rigid rubbing element and placed over the selectively ordered nanotube fabric layer 1610. A weighted element 1660 (approximately 75 g) was placed over this rigid rubbing element (formed by polishing material 1650 and wafer piece 1640) to provide a downward force as the rubbing element was pulled along the length of nanotube fabric layer 1610. A force gage 1630 was then used with pulley element 1680 to slide the polishing material 1650 across the length of nanotube fabric layer 1610 along direction 1690.

Referring now specifically to FIG. 17, the frictional force observed using the force gage (1630 in FIG. 16) has been plotted and mapped to the physical location of rigid rubbing element as it was pulled across the nanotube fabric layer along direction 1790, which corresponds to direction 1690 in FIG. 16. As discussed above, the nanotube fabric layer strip (1610 in FIG. 16) has been rendered into five regions. Regions 1710*a*, 1710*c*, and 1710*e* have been left substantially unordered to act as control regions for the experiment. Region 1710*b* has been rendered into an ordered network of nanotube elements oriented in a direction perpendicular to direction 1790 (that is, perpendicular to the path of the rubbing element). Region 1710*d* has been rendered into an ordered network of nanotube elements oriented in a direction parallel to direction 1790 (that is, parallel to the path of the rubbing element).

As is evident within the plot of FIG. 17, as the rigid rubbing element was passed over the unordered nanotube fabric layer of region 1710*c*, the frictional force observed was approximately 0.310 N. As the rigid rubbing element was passed over the perpendicularly oriented nanotube fabric layer (with respect to the direction of the frictional force) of region 1710*b*, the frictional force observed was approximately 0.245 N, approximately a 21% reduction in friction with respect to control regions 1710*a*, 1710*c*, and 1710*e*. As the rigid rubbing element was passed over the parallelly oriented nanotube fabric layer (with respect to the direction of the frictional force) of region 1710*d*, the frictional force observed was approximately 0.235 N, approximately a 24% reduction in friction with respect to control regions 1710*a*, 1710*c*, and 1710*d*.

It should also be noted that while much of the present disclosure describes processes of rendering ordered networks of nanotube elements from substantially unordered nanotube fabrics, the methods of the present disclosure are not limited in this regard. Indeed, the methods of the present disclosure may also be employed to render a partially ordered nanotube fabric layer into more highly ordered nanotube fabric layer. For example, a rafted nanotube fabric layer (formed, for example, via the methods taught in U.S. Pat. App. No. 61/304,045 to Sen et al.) may be rendered into a fully ordered nanotube fabric layer through the application of a directional force as previously described in the various embodiments of the present disclosure.

Within certain applications a directional force may be applied over a relatively thick nanotube fabric layer. Within such applications, even the repeated application of a directional force may only render those nanotubes near the surface of the thick nanotube fabric layer into an ordered network of nanotube elements. That is, the resulting structure may be described as a thin ordered nanotube fabric layer formed adjacent to a thicker unordered nanotube fabric layer. Such a structure may be used to realize an ordered nanotube fabric layer formed over a substrate element comprising an unordered nanotube fabric layer. Within some embodiments, such a structure—an ordered nanotube fabric layer formed over an unordered nanotube fabric layer— could be further adjusted by applying a directional force to the opposing surface of the unordered nanotube layer, rendering that opposing surface into a network of ordered nanotube elements. Within certain applications of such embodiments, the originally deposited thick nanotube fabric layer is deposited over a sacrificial substrate element, which is removed or otherwise volatized to allow the application of such a force to the opposing surface of the unordered nanotube fabric layer. In some aspects of such embodiments the resulting structure might be described as two thin ordered nanotube fabric layers formed with a thicker layer of unordered nanotube elements situated between them.

It should be noted that while a number of the figures and examples within the present disclosure depict and describe processes specifically related to semiconducting manufacturing, the methods of the present disclosure are not limited in this regard. Indeed, nanotube fabrics comprised of ordered nanotube fabric layers can be used within a plurality of systems and devices. For example, within certain embodiments such a nanotube fabric would be substantially gas impermeable and useful within the fabrication of gas containers (such as, but not limited to, oxygen tanks and flotation devices). Within other embodiments such a nanotube fabric layer would be substantially hydrophobic and be useful as moisture resistant coatings (for example, on solar panels) or as corrosion resistant coatings. Within other embodiments such a nanotube fabric layer would be substantially impermeable to certain particulate contaminants and be useful within the fabrication of protective barrier layers. Within other embodiments such a nanotube fabric layer would be substantially impermeable to certain biohazardous materials (e.g., bacteria) and would be useful in the fabrication of bio-filters and the like. Within other embodiments, such a nanotube fabric could be useful as a transparent or translucent protective coating which could be applied over other materials (for example over the chassis of vehicles to prevent paint scratches or as the binding agent within safety glass. Within other embodiments, such a nanotube fabric would be highly resistant to stress and wear (yet remain relatively thin) and would be useful in the fabrication highly stressed mechanical parts (e.g., piston cylinders within internal combustion engines).

Within other embodiments, such a nanotube fabric would be highly resistant to penetration and useful within the fabrication of puncture resistant material such as would be useful armor plating for vehicles or person protective equipment. For example, a relatively thin ordered nanotube fabric layer may be used in conjunction with a padding material to realize a lightweight bulletproof vest. In another example, a nanotube fabric may be formed over a material surface and then rendered into an ordered network through the methods of the present disclosure to realize a relatively lightweight substantially bulletproof panel which could be used to armor plate a tank or car.

Figure 18:
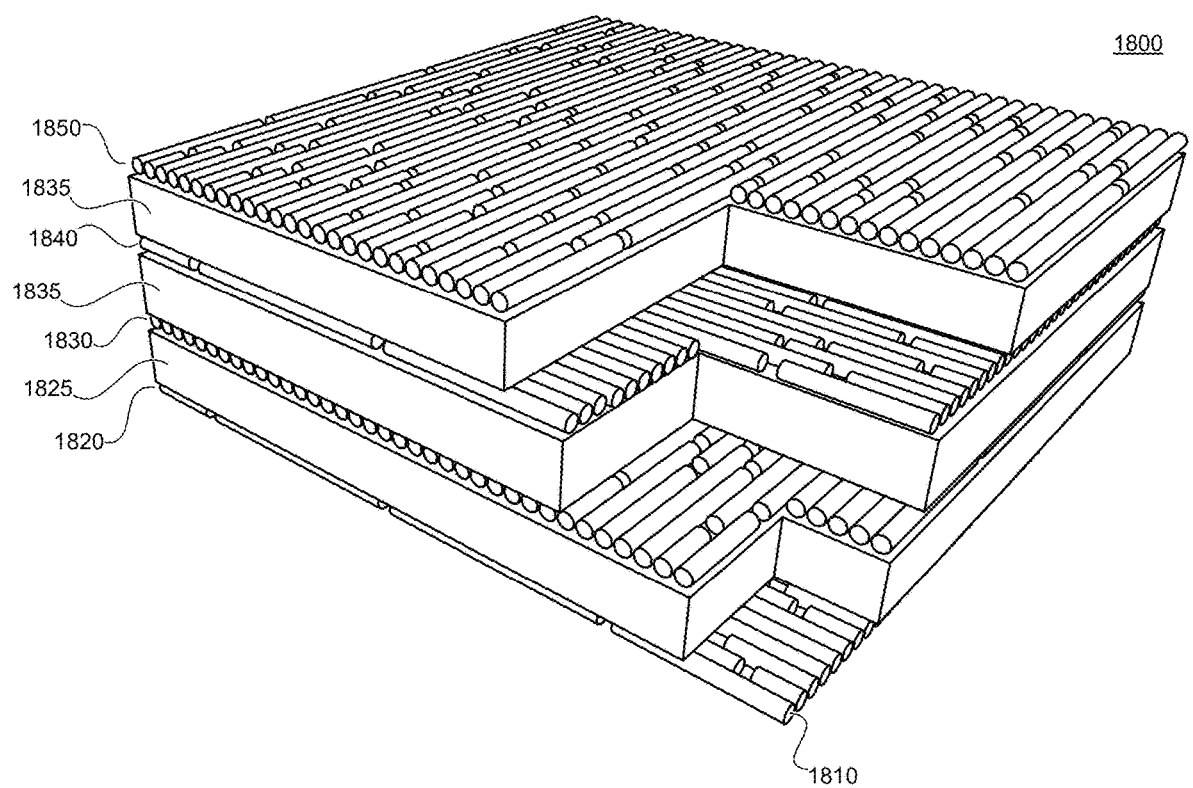
FIG. 18 is an illustration drawing depicting a multi-layer nanotube fabric element comprised of multiple layers of ordered nanotube elements wherein each layer comprises nanotube elements oriented in a direction different from those in adjacent layers.

To this end, FIG. 18 is a perspective drawing of a multilayer nanotube fabric element 1800 comprising four individual ordered nanotube fabric layers (1820, 1830, 1840, and 1850) and three unordered nanotube fabric layers (1825, 1835, and 1845). Each of the four ordered nanotube fabric layers (1820, 1830, 1840, and 1850) was deposited separately and rendered into an ordered network of nanotube elements before a subsequent nanotube fabric layer was deposited. Further, each of the ordered nanotube fabric layers (1820, 1830, 1840, and 1850) was rendered into an ordered state along a different orientation as compared with adjacent layers. That is, the first ordered nanotube fabric layer 1820 was rendered into an ordered state through the use of a linear force applied in a first direction, and the second ordered nanotube fabric layer 1830 was rendered into an ordered state through the use of a linear force applied in a second direction, and so on. As previously discussed, within certain embodiments of the present disclosure, a directional force applied over a relatively thick nanotube fabric layer will tend to render only those nanotube near the surface of that layer into an ordered network. As such, the nanotube fabric element 1800 includes layers of unordered nanotube elements (1825, 1835, and 1845) remaining from the ordering processes used. In this way, a multilevel nanotube fabric element 1800 is formed comprising a plurality of independently ordered nanotube fabric layers (1820, 1830, 1840, and 1850).

It should be noted that while the multilayer nanotube fabric element 1800 (as depicted in FIG. 18) includes layers of unordered nanotube elements (1825, 1835, and 1845) between the ordered nanotube fabric layers (1820, 1830, 1840, and 1850), the methods of the present disclosure are not limited in this regard. Indeed, within the methods of the present disclosure each individually formed layer can be rendered into a thick ordered nanotube fabric layer (as opposed to only the surface of the layer being ordered) prior to the formation of a subsequent layer, essentially eliminating unordered layers (1825, 1835, and 1845). That is, a fabric layer comprised of an ordered network of nanotube elements over its entire thickness. In some embodiments of the present disclosure, each individually formed layer could be kept thin enough as to ensure that the nanotube fabric layer was ordered from top to bottom during the application of a directional force prior to the formation of a subsequent layer. In other embodiments, each individually formed layer could be subjected to sufficient iterations of a directional force such as to ensure that the nanotube fabric layer was ordered from top to bottom prior to the formation of a subsequent layer.

The following examples describe the rendering of several unordered nanotube fabric layers into ordered networks of individual nanotube elements according to the methods of the present disclosure.

Within each example a purified nanotube application solution was first realized through the following method. Fifty grams of raw (that is, unfunctionalized) carbon nanotubes (CNTs) were refluxed in microelectronics grade nitric acid. Supplies of raw nanotubes (such as were used in the following examples) may be purchased commercially from a number of vendors (e.g., Thomas Swan). The concentration of the nitric acid, the reflux time, and temperature were optimized based on the starting CNT material. For example, CNTs were refluxed in concentrated nitric acid (70%) at 120° C. for 24-30 hours. After the nitric acid reflux step, the CNT suspension in acid was diluted in 0.35 to 3% nitric acid solution (8-16 L) and taken through several passes of cross-flow filtration (CFF). First few passes of CFF (hereinafter called CFF1) may remove the acid and soluble metal salts in the suspension. The pH of the suspension during the CFF1 steps was maintained at 1+/−0.3 by recovering the material in 0.35-3% nitric acid after each step. Typically five to eleven CFF1 steps were performed. After the CFF1 steps, the retentate was collected in DI water and the pH of the nanotube:DI water suspension was increased to 8+/−0.2 with ammonium hydroxide (concentration 29%) and sonicated. This liquid was taken through another set of CFF passes (hereinafter referred as CFF2). CFF2 may remove the amorphous carbon impurities in the solution. After the CFF2 process, the retentate was collected in DI water and the pH of the nanotube:DI water liquid was adjusted to pH 8+/−0.2 and the solution was sonicated for 120 minutes in a chilled sonicator bath (4-5 oC).

At this step of the process a desired concentration or optical density of the CNT formulation can be achieved by controlling the volume of the DI water used to recover the retentate from the CFF2 membrane. For example if the optical density of the CNT formulation before the last CFF2 step is 2 and the volume is 2 L, then a recovery volume of 1 L can lead to an optical density close to 4 assuming there is negligible loss in optical density through the permeate at this point. Similarly, if the optical density of the CNT formulation before the last CFF2 step is 2 and the volume is 16 L, then a recovery volume of 1 L can lead to a CNT formulation of optical density 32. The concentration of the CNT formulation (optical density) that can be practically achieved is dependent on, but is not limited to, the starting CNT charge used in the reaction, the reaction conditions, number of CFF steps, CFF membrane pore size, CFF membrane surface area, and pH.

Finally, the solution was centrifuged two or three times at about 70000-100000 g for about 20-30 min each. In certain cases, the pH of the solution was adjusted to 8+/−0.2 in between the centrifugation passes which may remove residual metal or carbon nanoparticles in the liquid by sedimentation. After the centrifugation step, the supernatant was collected and used as the final purified nanotube application solution. The concentration of the final nanotube application solution depends on the centrifugation conditions used. Typically for a spin coat application CNT solutions with an optical density projected to be approximately 20+/−5 and a pH of 7+/−0.5 were used.

Further, within each of the following examples, this purified nanotube application solution was then spun coat over a substrate layer to form an unordered nanotube fabric layer. Specifically, three spin coating operations were performed to form the nanotube fabric layers of examples 1, 2, 3, 5, 7, 9, 10, 11, 12, 13, 14, 16, 17, 18, 19, and 20, four spin coating operation were performed to form the nanotube fabric layers of examples 4 and 8, one spin coating operation was performed to form the nanotube fabric layer of example 6, and five spin coating operations were performed to form the nanotube fabric layer of example 15. The nanotube fabric layer of examples 1, 2, 3, 4, 5, 6, 7, 8, 9, 11, 13, 16, 17, 17, 19, and 20 were formed over a silicon dioxide substrate. The nanotube fabric layer of example 10 was formed over a 1018 low carbon steel substrate. The nanotube fabric layer of example 12 was formed over a polyethylene terephthalate (PET) substrate. The nanotube fabric layer of example 14 was formed over a 2024 aluminum alloy substrate. The nanotube fabric layer of example 15 was formed over a titanium nitride (TiN) substrate.

For all examples, the spin coating operations were as follows. A raw wafer was pre-baked on a 300° C. hot plate for five minutes. Approximately 3 ml of the adjusted solution was dispensed onto the wafer via a plastic pipette while the wafer was rotated at 60 rpm. After thirty seconds, the spin speed was increased to 500 rpm for two seconds, then subsequently reduced to fifty rpm for 180 seconds, and finally increased to 2000 rpm for twenty seconds. For examples 1-14, the wafer was placed on a 300° C. hot plate for two minutes between each spin coating operation. For example 15, the wafer was placed in a 500° C. environment for five minutes between each spin coating operation. After a cool down cycle, the entire process was repeated again twice such as to apply the desired number of coats of the application solution over the wafer.

Once an unordered nanotube fabric layer was formed over the surface of a wafer, a directional force was applied over the surface of the fabric layer (as detailed in each of the following examples) in order to render at least a portion of the nanotube fabric layer into an ordered network of nanotube elements. Within an example 20 an additional layer of silicon nanowires was applied over the surface of the nanotube fabric layer (via a spin coating operation, as described below) prior to the application of a directional force. Finally an anneal process (625° C. for thirty minutes) was performed.

EXAMPLE 1

FIGS. 19A-19C are SEM images of an exemplary nanotube fabric layer at different magnifications (1901, 1902, and 1903 respectively) first formed via three spin coating operations of a purified nanotube application solution (as described above) and then rendered into an ordered network of nanotube elements through the application of a directional rolling force along the direction indicated within each SEM image. The rolling force was applied via a steel hand roller, rolled directly against the nanotube fabric layer fifty times with light pressure (approximately two Newtons). As is evident in FIG. 19A (the 10,000× magnification image), the resulting nanotube fabric layer was rendered into an ordered state oriented along the direction of the applied rolling force.

EXAMPLE 2

Figure 20A:
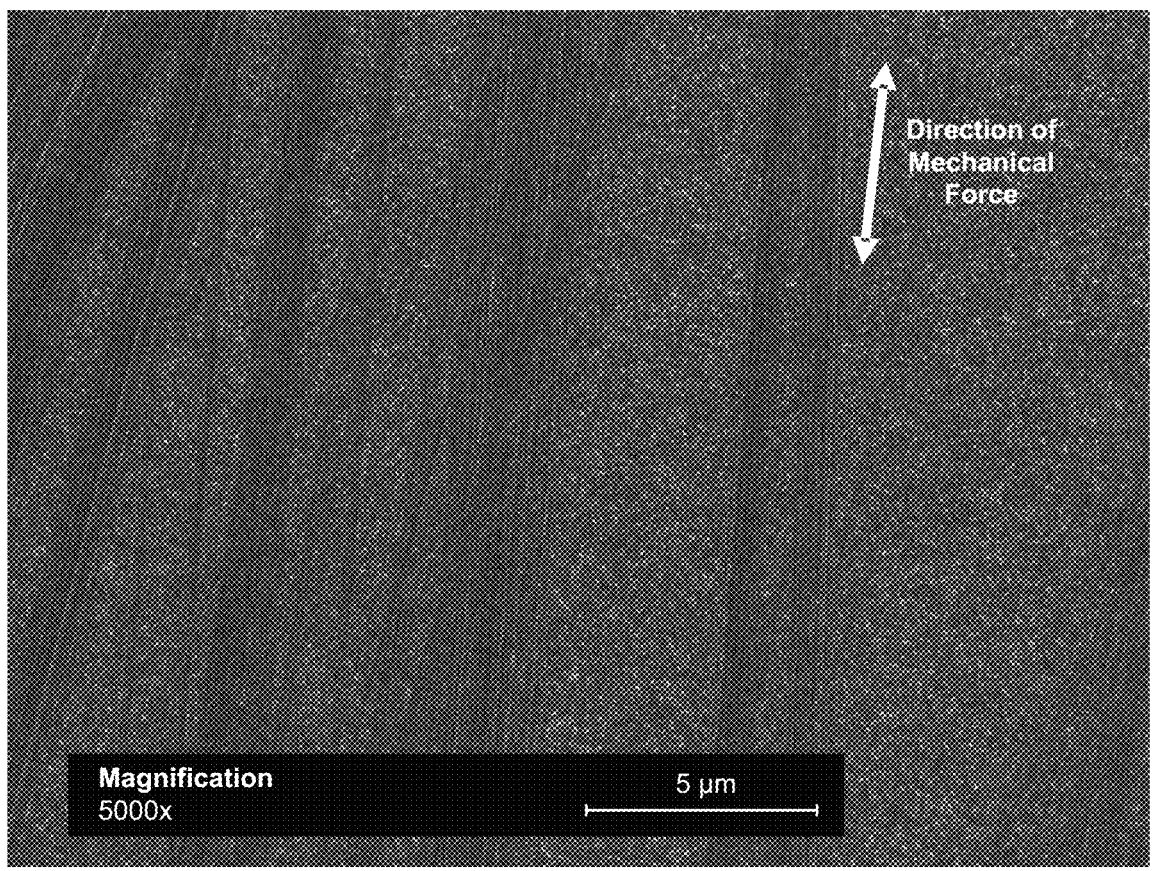
FIGS. 20A-20C are SEM images (at different magnifications) of an exemplary nanotube fabric layer comprising regions of nanotube elements rendered into a partially ordered arrangement after fifteen rubbing passes over a TEFLON or polytetrafluoroethylene film.
Figure 20B:
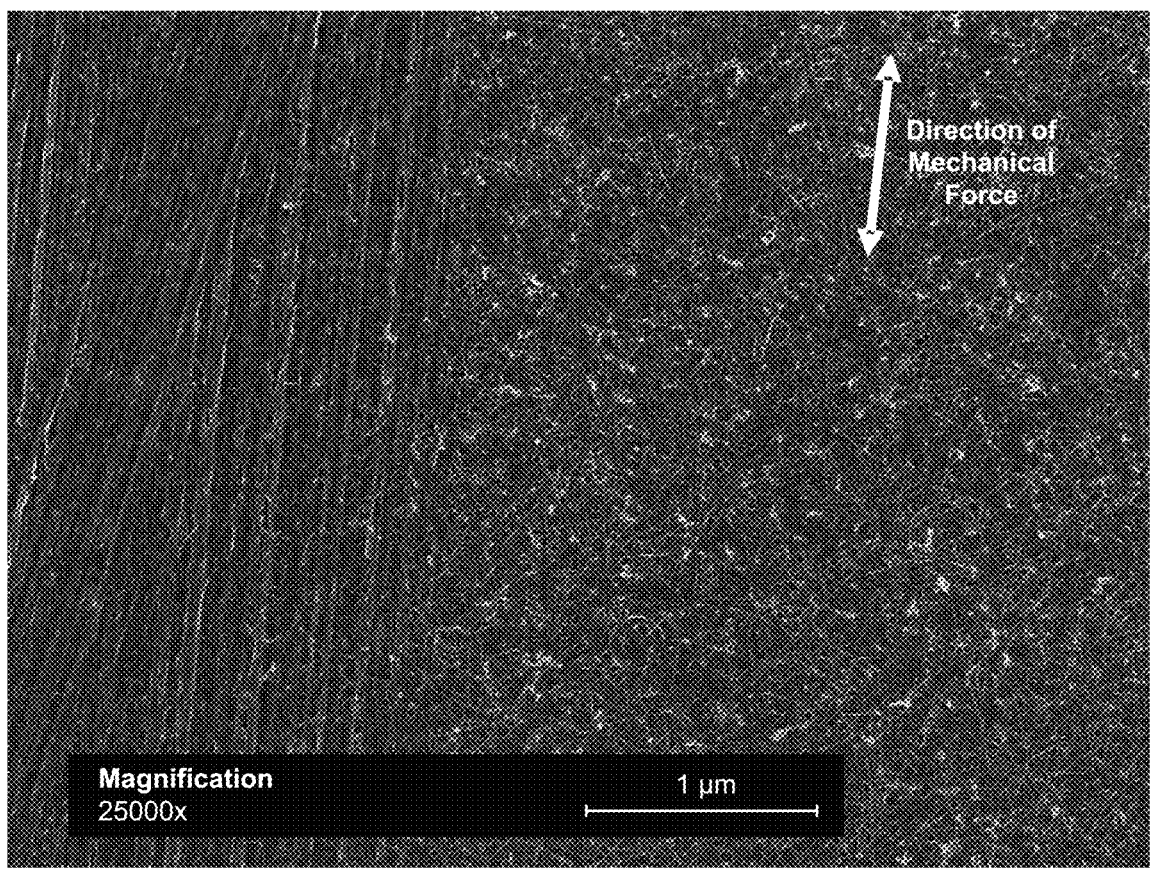
Figure 20C:
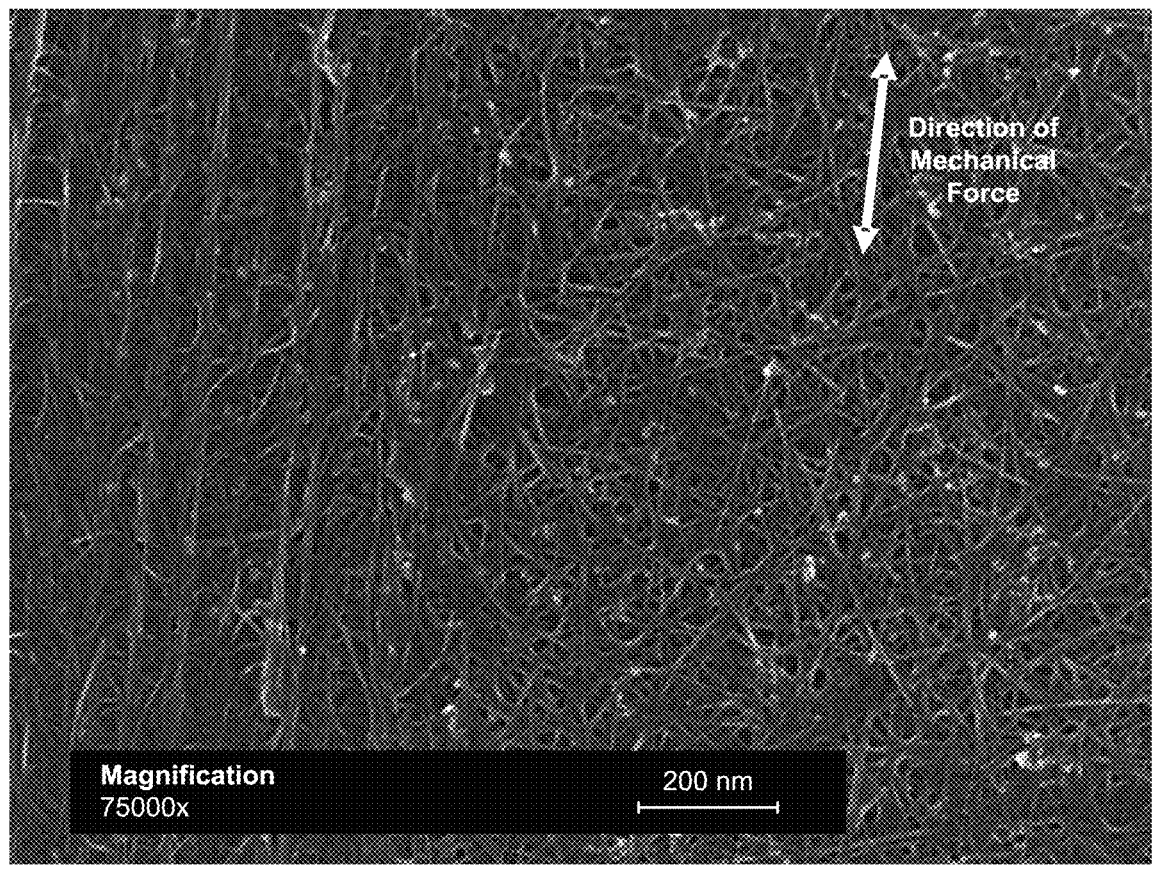

FIGS. 20A-20C are SEM images of an exemplary nanotube fabric layer at different magnifications (2001, 2002, and 2003 respectively) first formed via three spin coating operations of a purified nanotube application solution (as described above) and then rendered into an ordered network of nanotube elements through the application of a directional rubbing force along the direction indicated within each SEM image. The rubbing force was applied by placing the wafer facedown on a TEFLON or polytetrafluoroethylene sheet (such that the nanotube fabric layer was in direct contact with the TEFLON or polytetrafluoroethylene sheet), placing a 150 g weight on the reverse side (that is, the non-coated side) of the wafer, and sliding the wafer along the TEFLON or polytetrafluoroethylene sheet a distance of approximately five inches fifteen times. As is evident in FIG. 20A (the 5,000× magnification image), the nanotube fabric layer exhibited thin bands (on the order of 2 μm across) of ordered nanotubes resulting from the applied rubbing force.

EXAMPLE 3

Figure 21A:
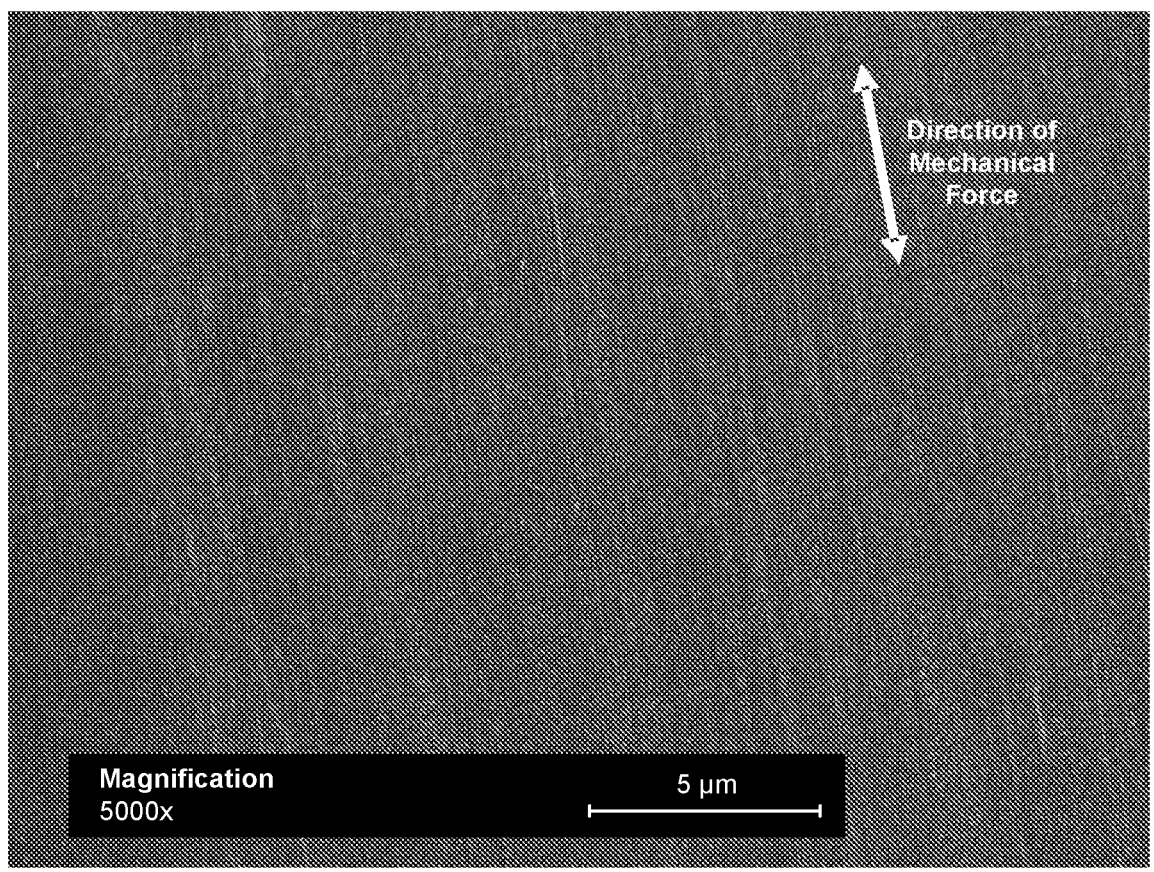
FIGS. 21A-21C are SEM images (at different magnifications) of an exemplary nanotube fabric layer comprising a network of nanotube elements rendered into an ordered arrangement after twenty five rubbing passes over a TEFLON or polytetrafluoroethylene film.
Figure 21B:
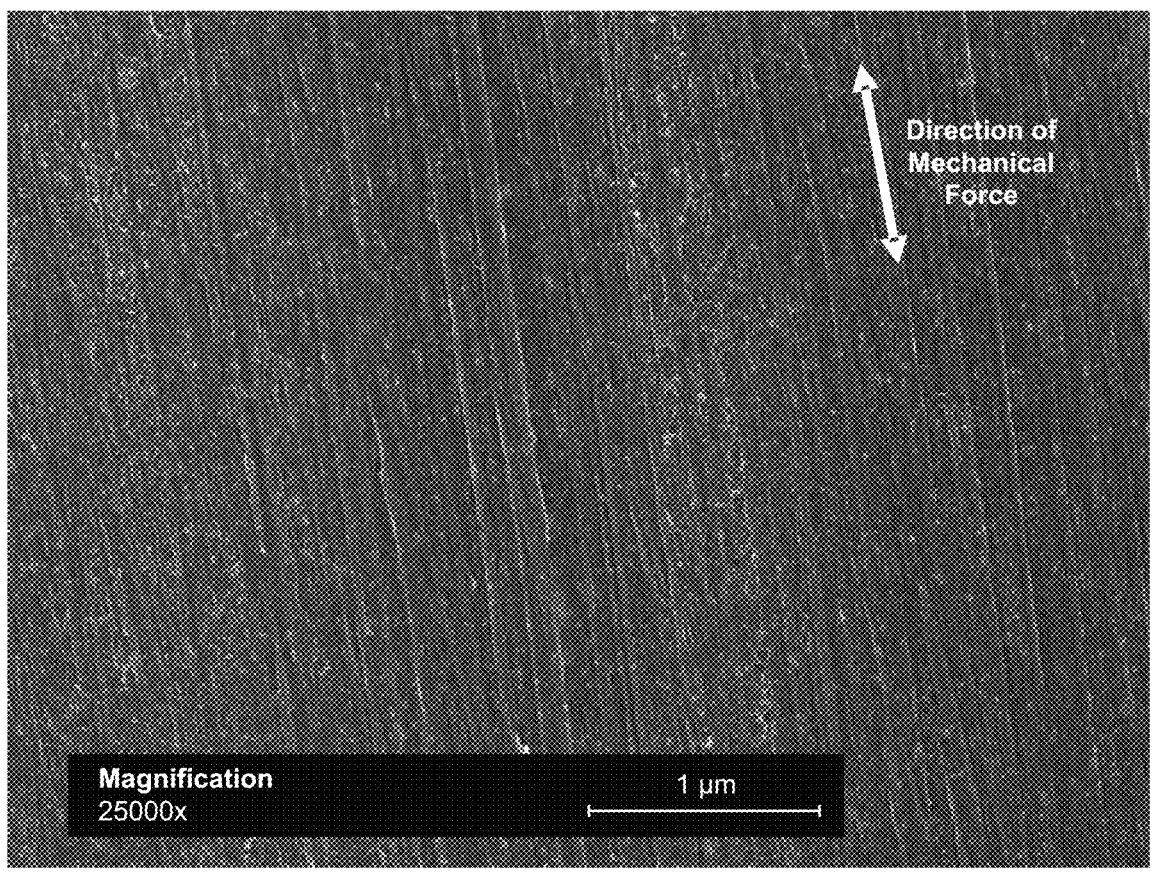
Figure 21C:
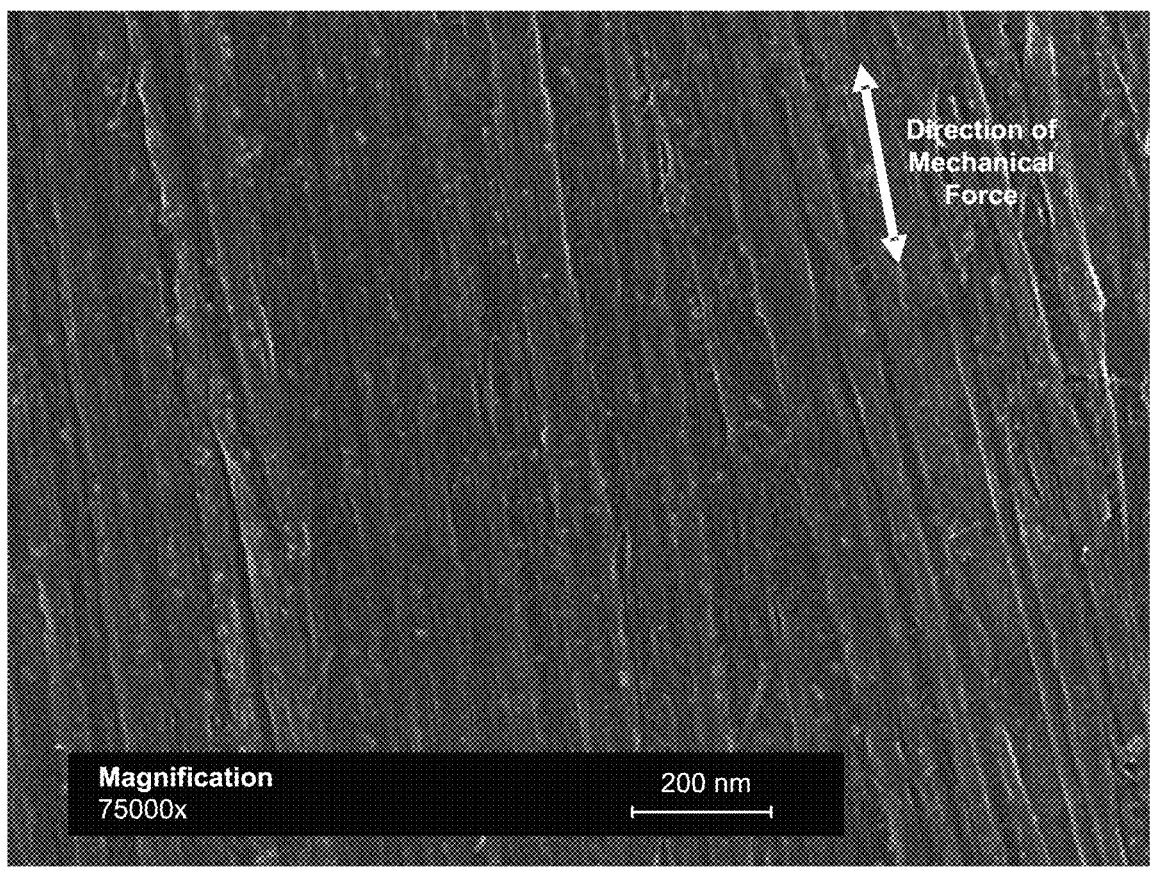

FIGS. 21A-21C are SEM images of an exemplary nanotube fabric layer at different magnifications (2101, 2102, and 2103 respectively) first formed via three spin coating operations of a purified nanotube application solution (as described above) and then rendered into an ordered network of nanotube elements through the application of a directional rubbing force along the direction indicated within each SEM image. The rubbing force was applied by placing the wafer facedown on a TEFLON or polytetrafluoroethylene sheet (such that the nanotube fabric layer was in direct contact with the TEFLON or polytetrafluoroethylene sheet), placing a 150 g weight on the reverse side (that is, the non-coated side) of the wafer, and sliding the wafer along the TEFLON or polytetrafluoroethylene sheet a distance of approximately five inches twenty-five times. As is evident in FIG. 21A (the 5,000× magnification image), the resulting nanotube fabric layer was rendered into an ordered state oriented along the direction of the applied rubbing force.

EXAMPLE 4

Figure 22A:
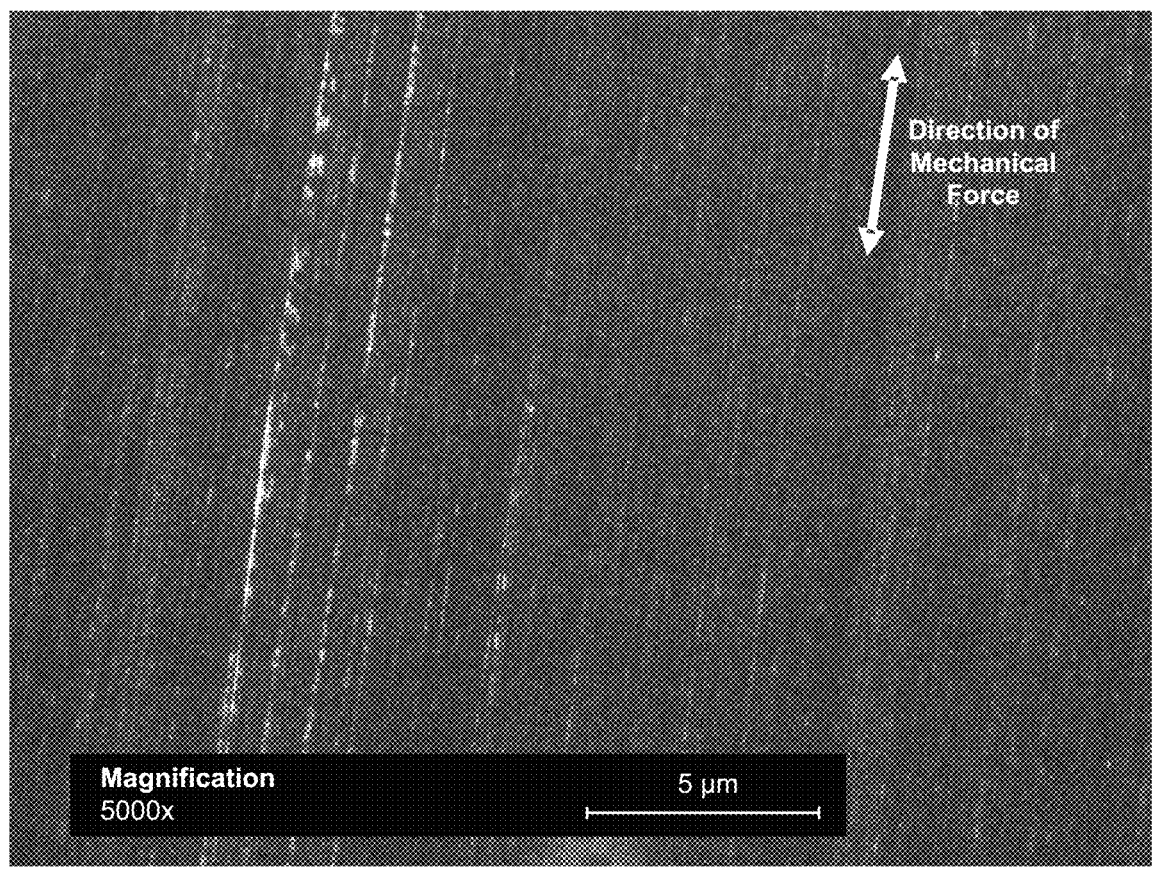
FIGS. 22A-22C are SEM images (at different magnifications) of an exemplary nanotube fabric layer comprising a network of nanotube elements rendered into an ordered arrangement after two hundred and fifty rubbing passes over a silicon wafer.
Figure 22B:
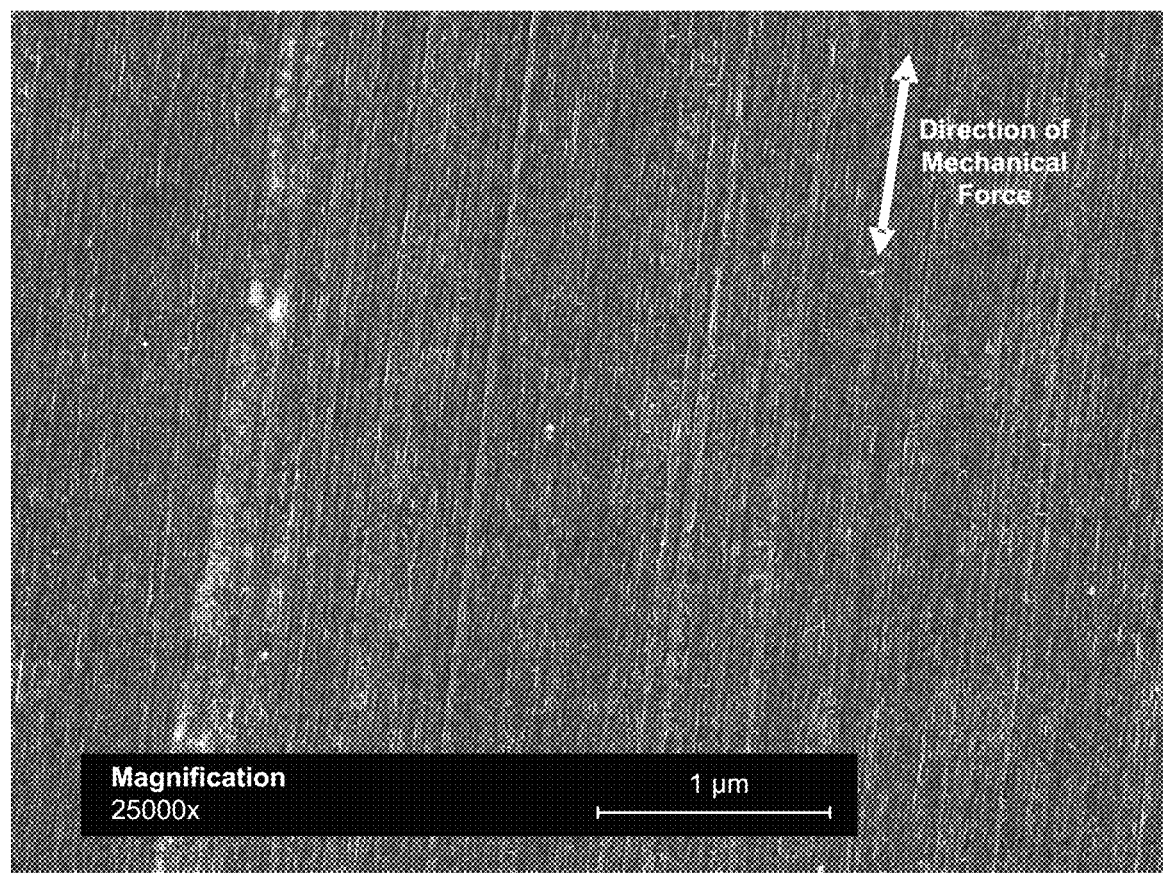
Figure 22C:
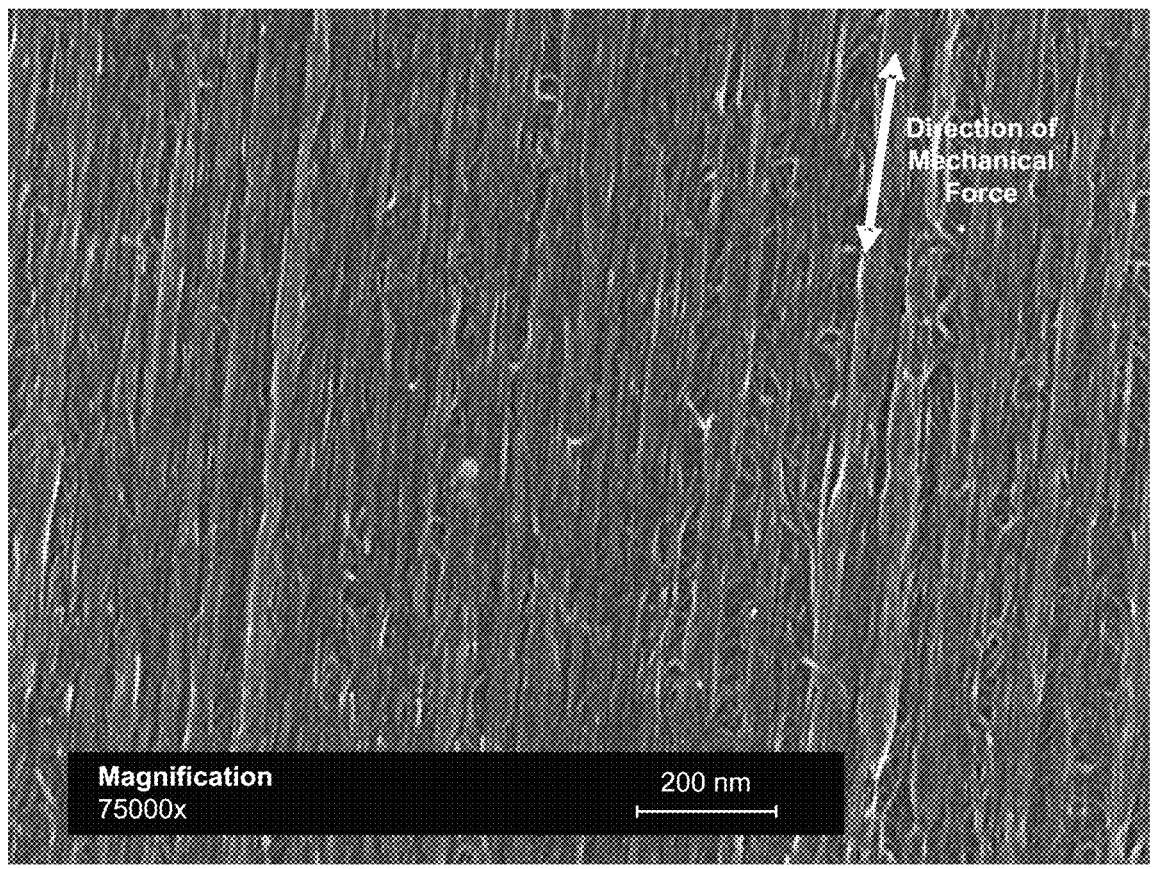

FIGS. 22A-22C are SEM images of an exemplary nanotube fabric layer at different magnifications (2201, 2202, and 2203 respectively) first formed via four spin coating operations of a purified nanotube application solution (as described above) and then rendered into an ordered network of nanotube elements through the application of a directional rubbing force along the direction indicated within each SEM image. The rubbing force was applied by placing the wafer facedown on a 300 mm silicon dioxide wafer (such that the nanotube fabric layer was in direct contact with the silicon dioxide wafer surface), placing a 150 g weight on the reverse side (that is, the non-coated side of the wafer), and sliding the wafer along silicon dioxide wafer a distance of approximately four inches 250 times. As is evident in FIG. 22A (the 5,000× magnification image), the resulting nanotube fabric layer was rendered into an ordered state oriented along the direction of the applied rubbing force.

EXAMPLE 5

FIGS. 23A-23C are SEM images of an exemplary nanotube fabric layer at different magnifications (2301, 2302, and 2303 respectively) first formed via three spin coating operations of a purified nanotube application solution (as described above) and then rendered into an ordered network of nanotube elements through the application of an arcing rubbing force along the direction indicated within each SEM image. The rubbing force was applied by passing a wool rubbing pad over the wafer in an arcing motion 100 times. The wool rubbing pad was not rotated as it was passed over the wafer. As is evident in FIG. 23A (the 10,000× magnification image), the resulting nanotube fabric layer was rendered into an ordered state oriented in a substantially linear direction substantially tangent to the initial angle of the applied arcing force. As evident in FIG. 23B (the 25,000× magnification image), despite the arcing direction of the applied rubbing force the nanotube elements were ordered in a generally linear orientation.

EXAMPLE 6

FIGS. 24A-24C are SEM images of an exemplary nanotube fabric layer at different magnifications (2401, 2402, and 2403 respectively) first formed via a single spin coating operation of a purified nanotube application solution (as described above) and then rendered into an ordered network of nanotube elements through the application of a linearly applied polishing force along the direction indicated within each SEM image. The polishing force was applied by passing a cylindrical velour roller over the wafer in a linear motion 50 times. The cylindrical velour roller was rotated at a speed of 60 rpm and passed over the wafer at a constant rate of approximately 0.4 inches per second for each pass. As is evident in FIG. 24C (the 75,000× magnification image), the resulting nanotube fabric layer was rendered into an ordered state oriented along the direction of the applied polishing force.

EXAMPLE 7

FIGS. 25A-25C are SEM images of an exemplary nanotube fabric layer at different magnifications (2501, 2502, and 2503 respectively) first formed via three spin coating operations of a purified nanotube application solution (as described above) and then rendered into an ordered network of nanotube elements through the application of a rotational polishing force along the direction indicated within each SEM image. The polishing force was applied by positioning a round wool polishing pad over the wafer and rotating the polishing pad at a rate of sixty rotations per minute for ninety seconds. As is evident in FIG. 25B (the 25,000× magnification image), the resulting nanotube fabric layer was rendered into several regions of ordered nanotube elements oriented in along several directions.

EXAMPLE 8

Figure 26A:
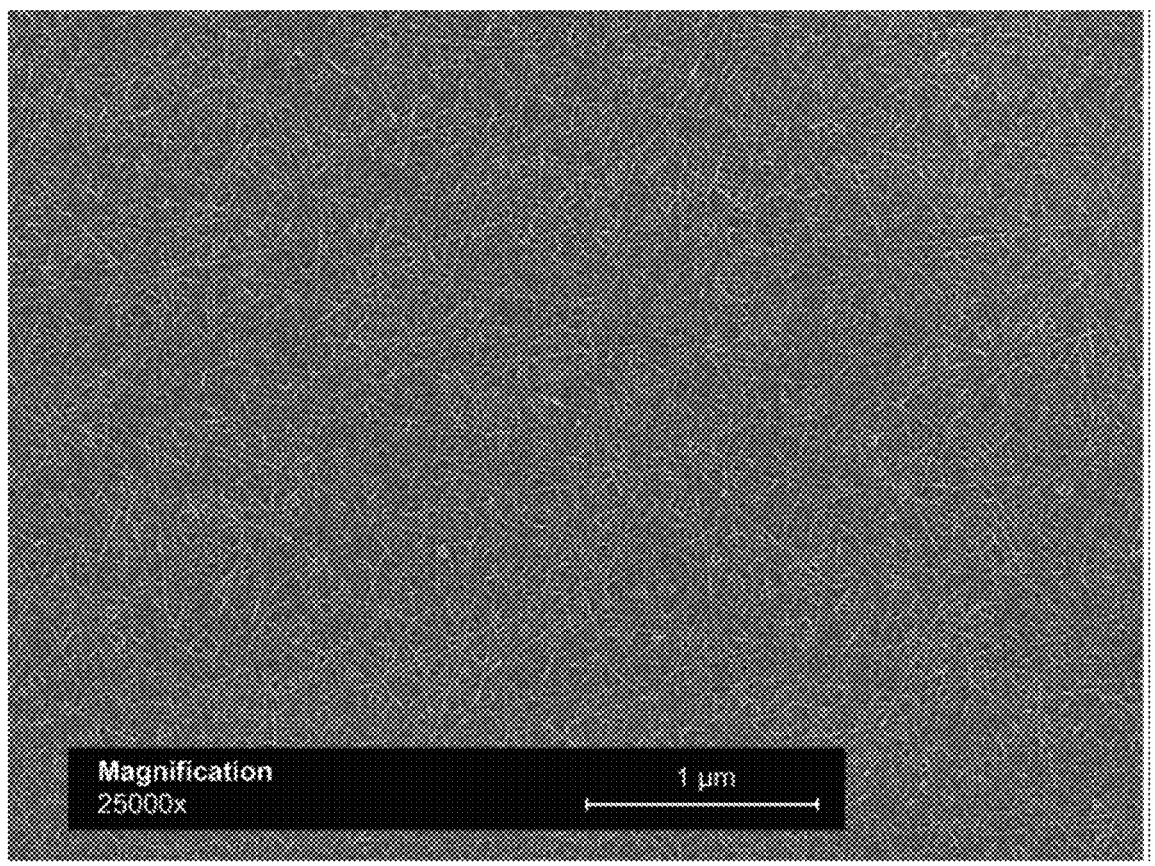
FIGS. 26A-26C are SEM images (at different magnifications) of an exemplary nanotube fabric layer comprising a network of unordered nanotube elements.
Figure 26B:
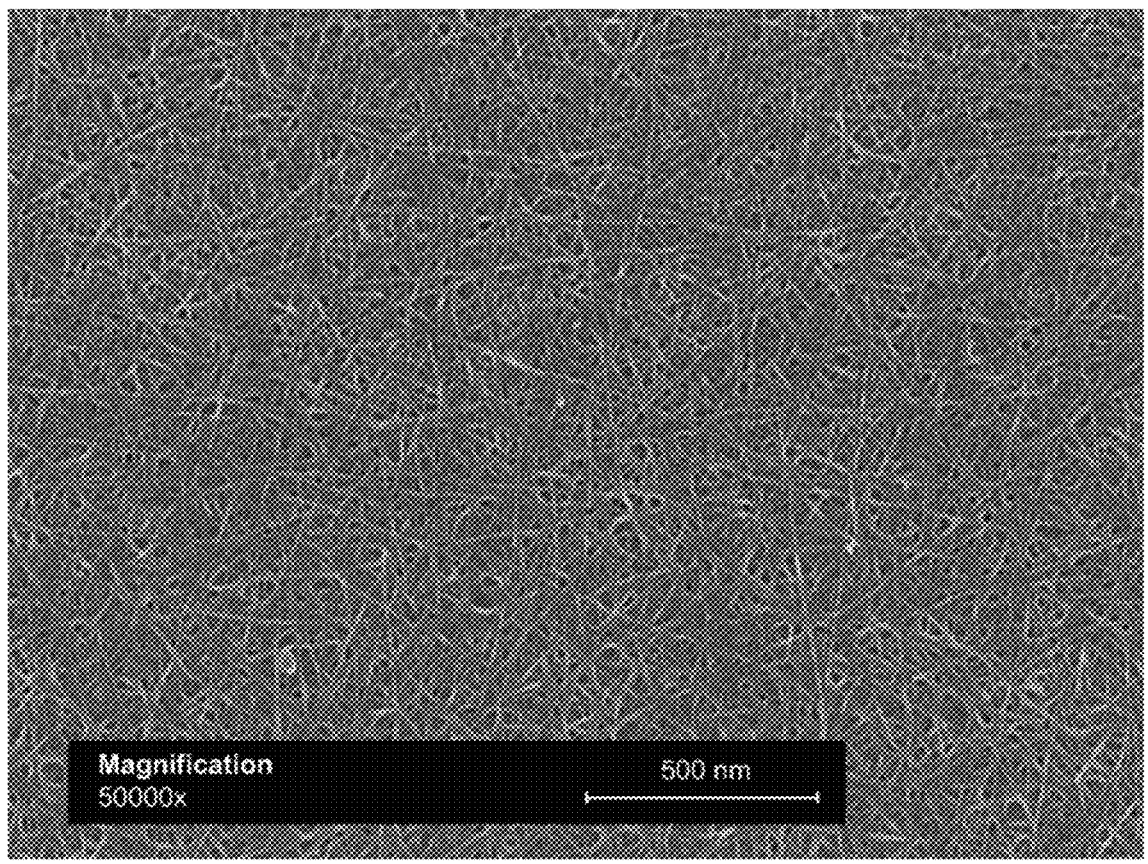
Figure 26C:
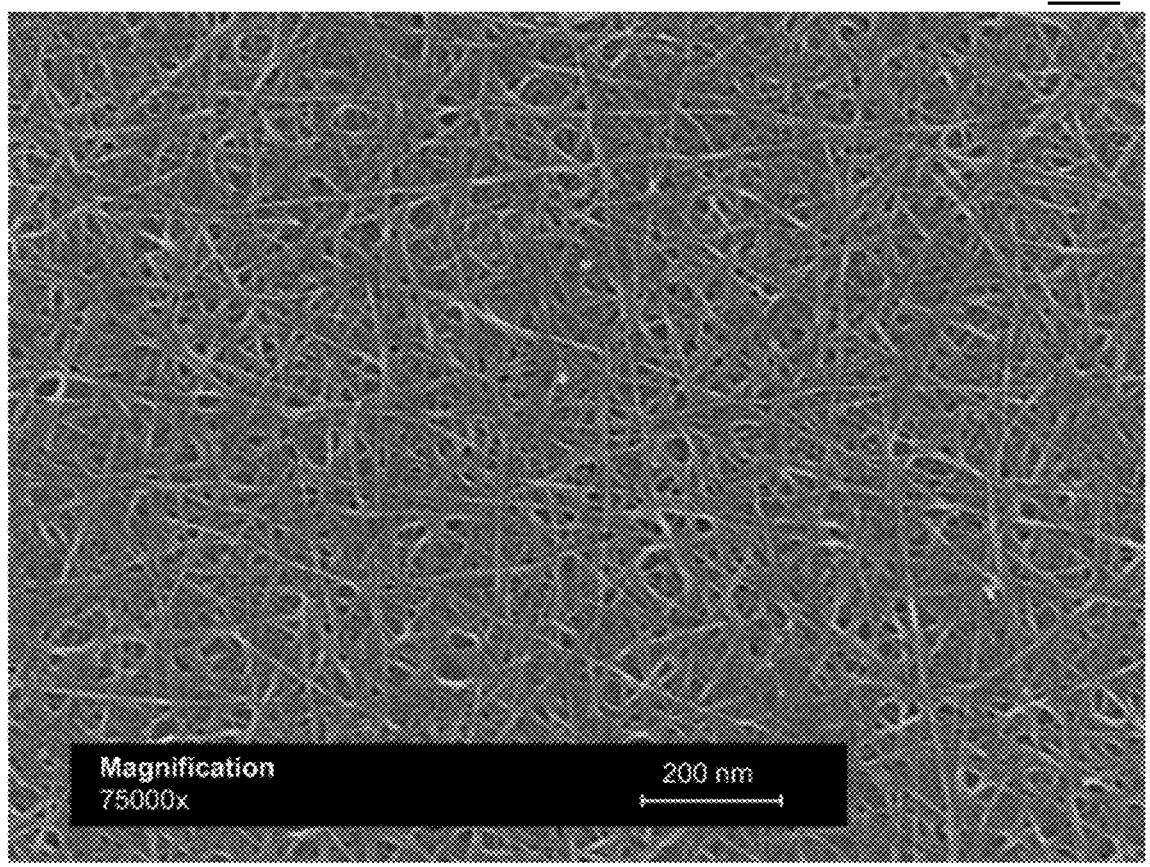
Figure 27A:
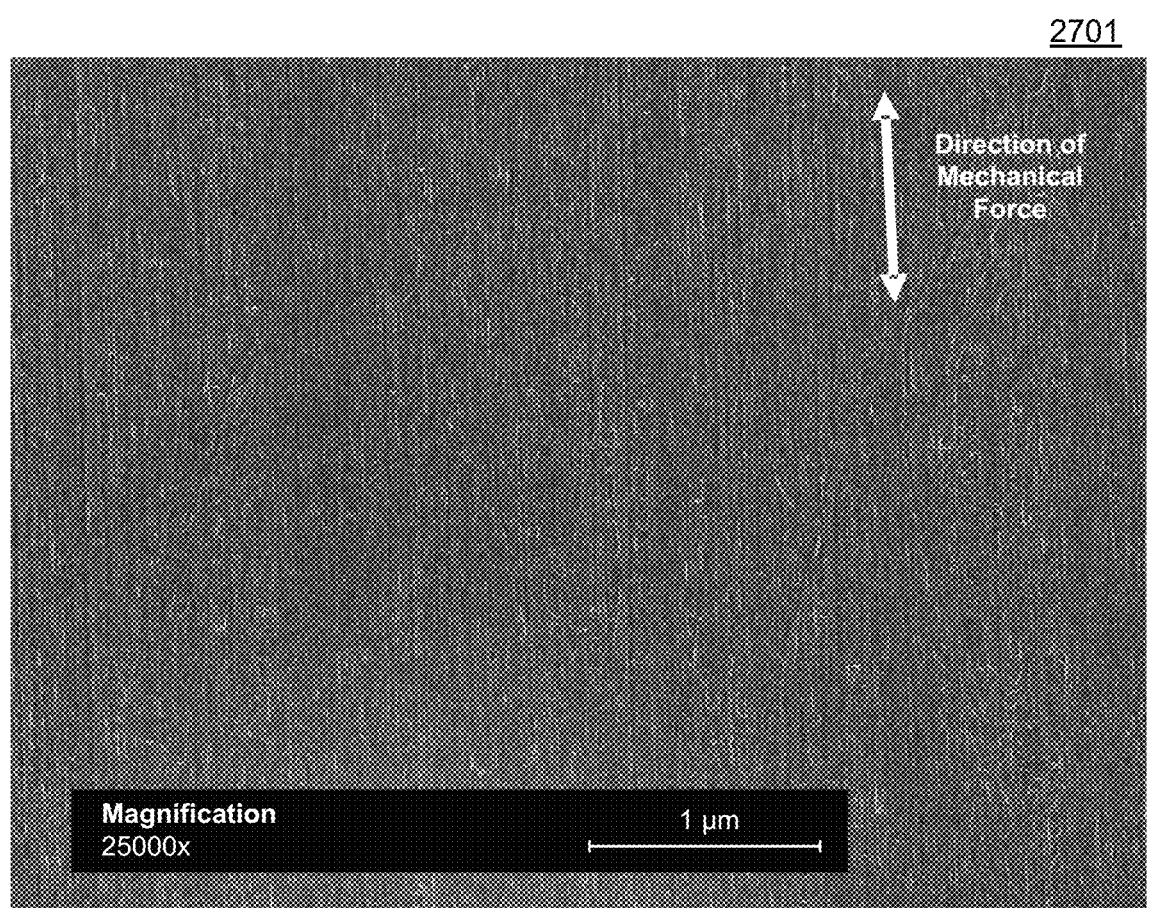
FIGS. 27A-27C are SEM images (at different magnifications) of the exemplary nanotube fabric layer of FIGS. 26A-26C after being rendered into a network of nanotube elements by sliding a weighted CMP pad along the length of the nanotube fabric layer 20 times.
Figure 27B:
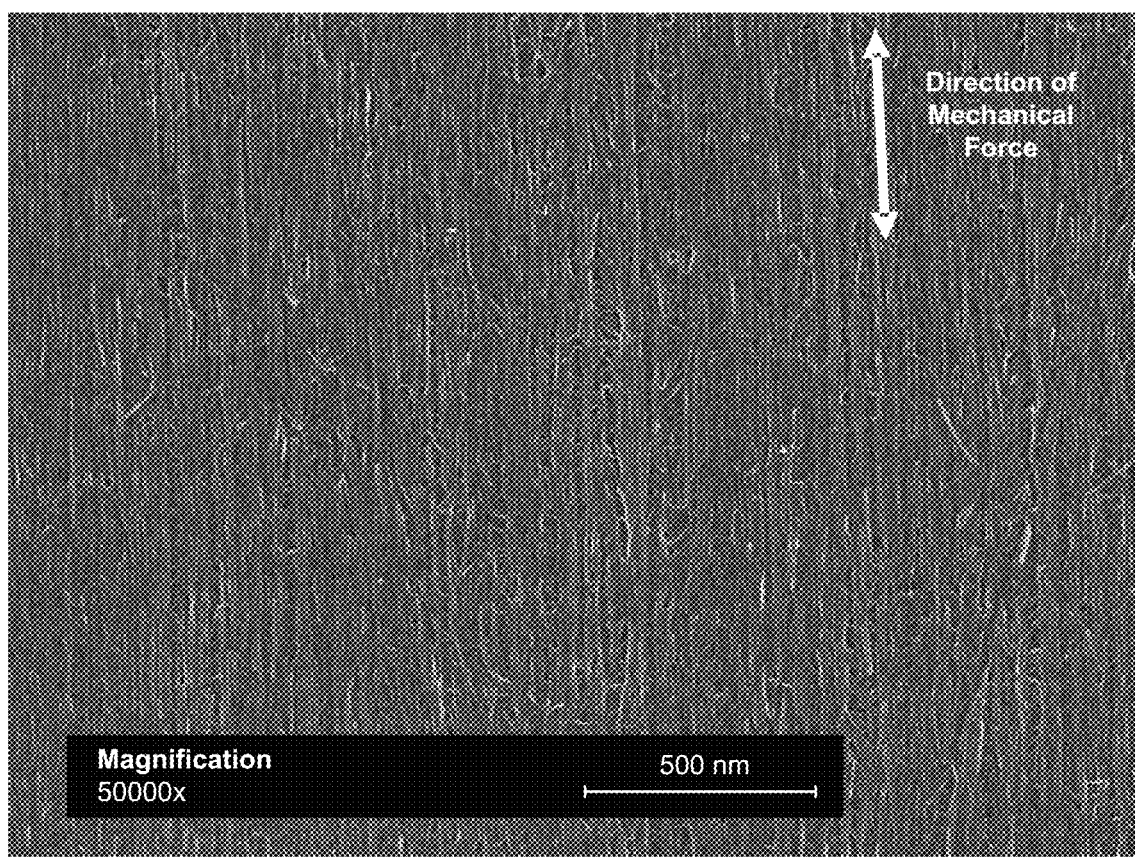
Figure 27C:
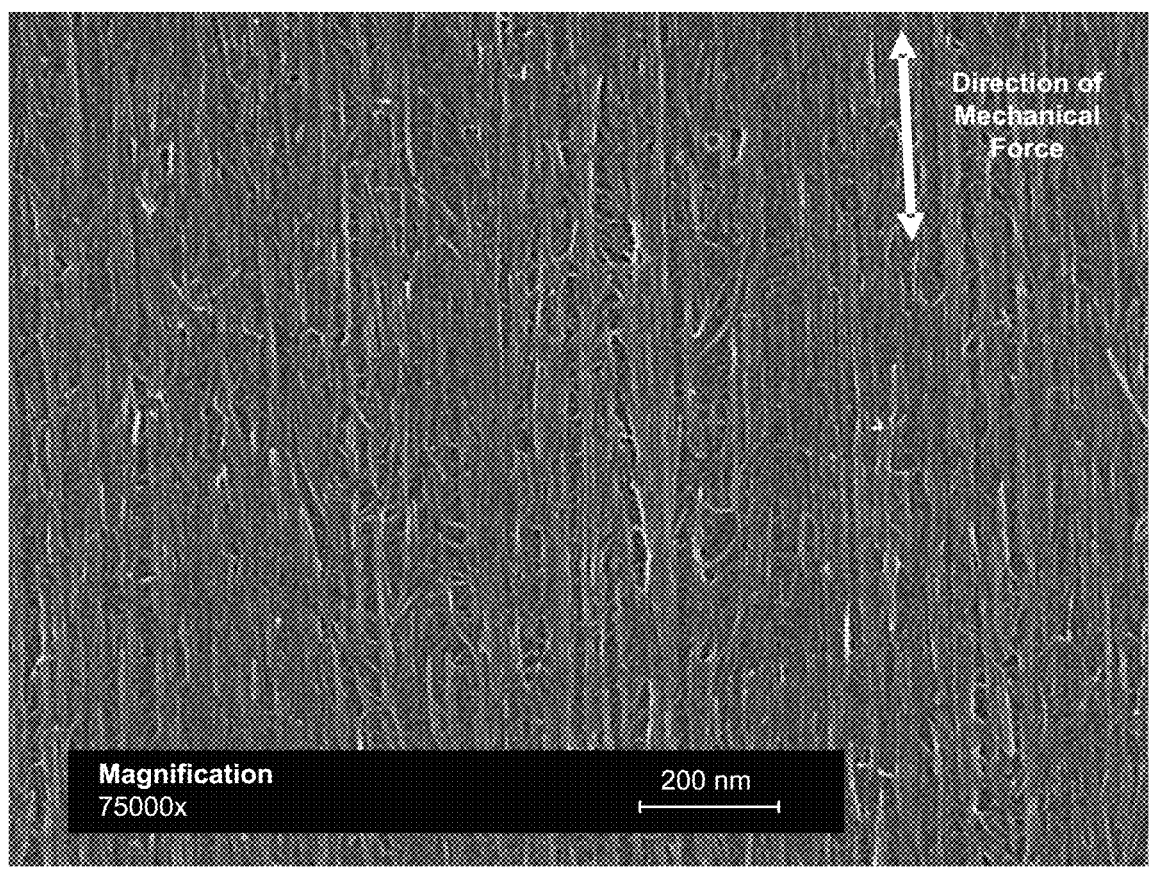

FIGS. 26A-26C are SEM images of an exemplary nanotube fabric layer at different magnifications (2601, 2602, and 2603 respectively) prior to being rendered into an ordered state by the methods of the present disclosure. The nanotube fabric layer depicted in FIGS. 26A-26C was formed via four spin coating operations of a purified nanotube application solution (as described above) over a Si wafer. The deposited nanotube fabric layer was then rendered into an ordered network of nanotube elements through the application of a linear rubbing force. The linear rubbing force was applied by sliding a weighted CMP pad (approximately 75 g) along the length of the nanotube fabric layer 20 times. FIGS. 27A-27B are SEM images of the same nanotube fabric layer depicted in FIGS. 26A-26C after this linear rubbing force was applied along the direction indicated in FIGS. 27A-27C. As is evident in FIG. 27C (the 75,000× magnification image), the resulting nanotube fabric layer was rendered into an ordered network of nanotube elements oriented in direction of the applied force.

EXAMPLE 9

Figure 28A:
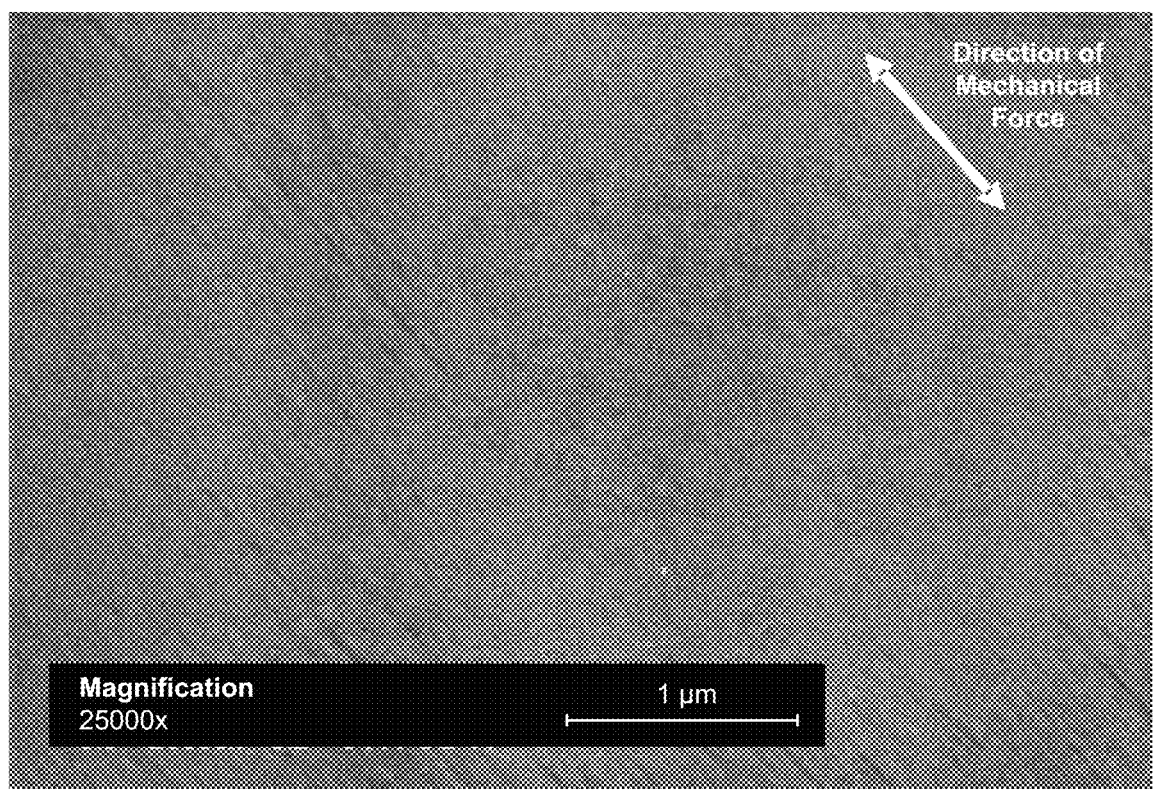
FIGS. 28A-28D are SEM images (at different magnifications) detailing the rendering of an exemplary nanotube fabric layer into an ordered state via a cryokinetic impingement operation.
Figure 28B:
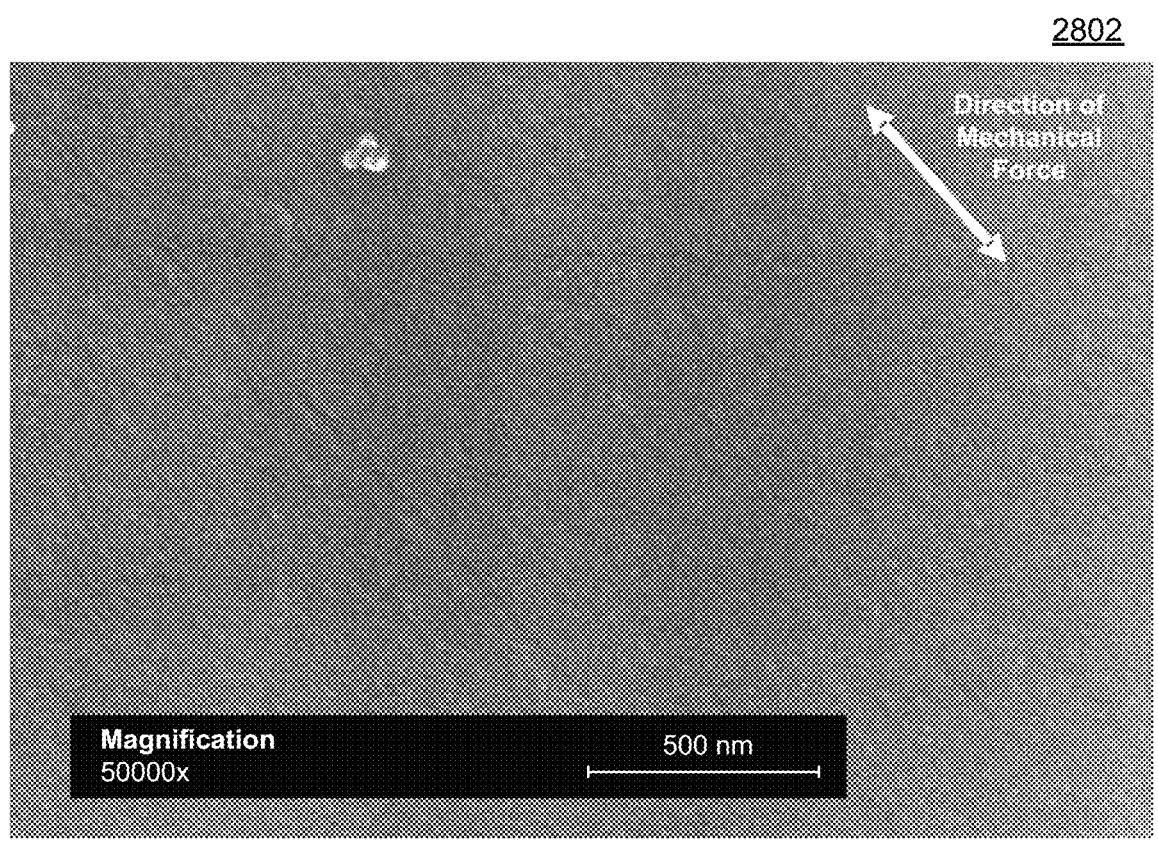
Figure 28C:
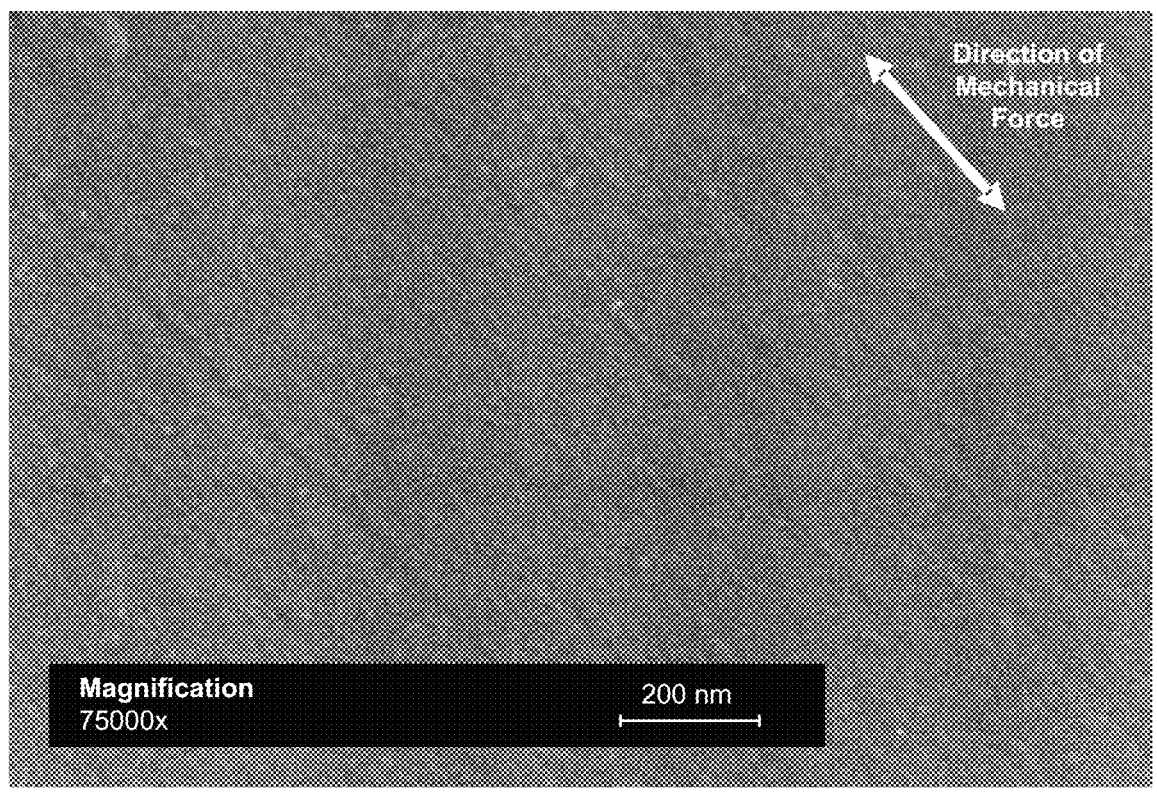
Figure 28D:
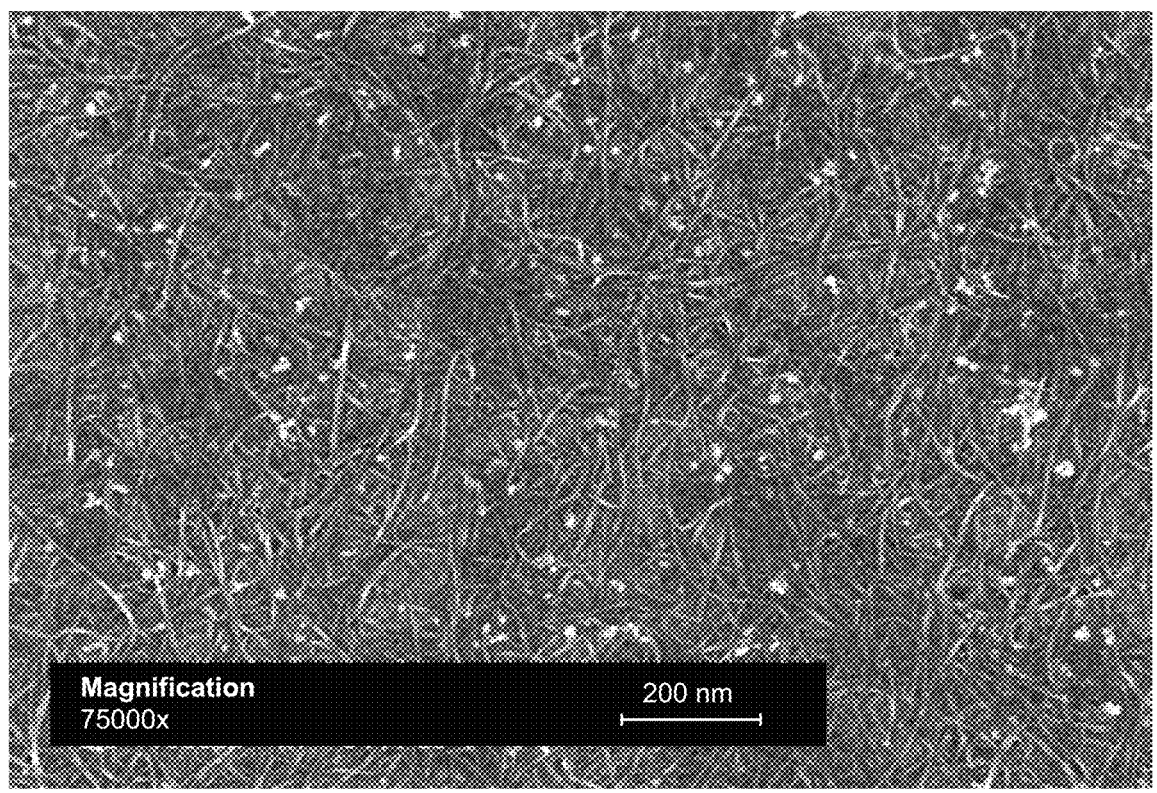

FIGS. 28A-28C are SEM images of an exemplary nanotube fabric layer at different magnifications (2801, 2802, and 2803 respectively) first formed via three spin coating operations of a purified nanotube application solution (as described above) and then rendered into an ordered network of nanotube elements through the application of cryokinetic impingement operation along the direction indicated within each SEM image. FIG. 28D is an SEM image 2804 of the formed nanotube fabric layer prior to the application of the cryokinetic impingement operation illustrating the substantially unordered state of the nanotube fabric layer prior to the application of the polishing force. Once the nanotube fabric layer was formed on the silicon substrate, a protective plastic layer (Saran wrap, based upon polyvinylidene chloride) was positioned over the fabric layer. Then a cryokinetic impingement gun (a commercial dry ice cleaning system available from Va-Tran System, Inc.) was used to spray frozen pellets of carbon dioxide for ten passes. Each pass included sweeping the spray across the wafer surface (protected by the plastic layer) for ten seconds. Between each pass, the protective plastic layer was given time to defrost (on the order of thirty seconds). As is evident in FIG. 28C (the 75,000× magnification image), the resulting nanotube fabric layer was rendered into an ordered state oriented along the direction of the applied cryokinetic impingement force.

EXAMPLE 10

Figure 29A:
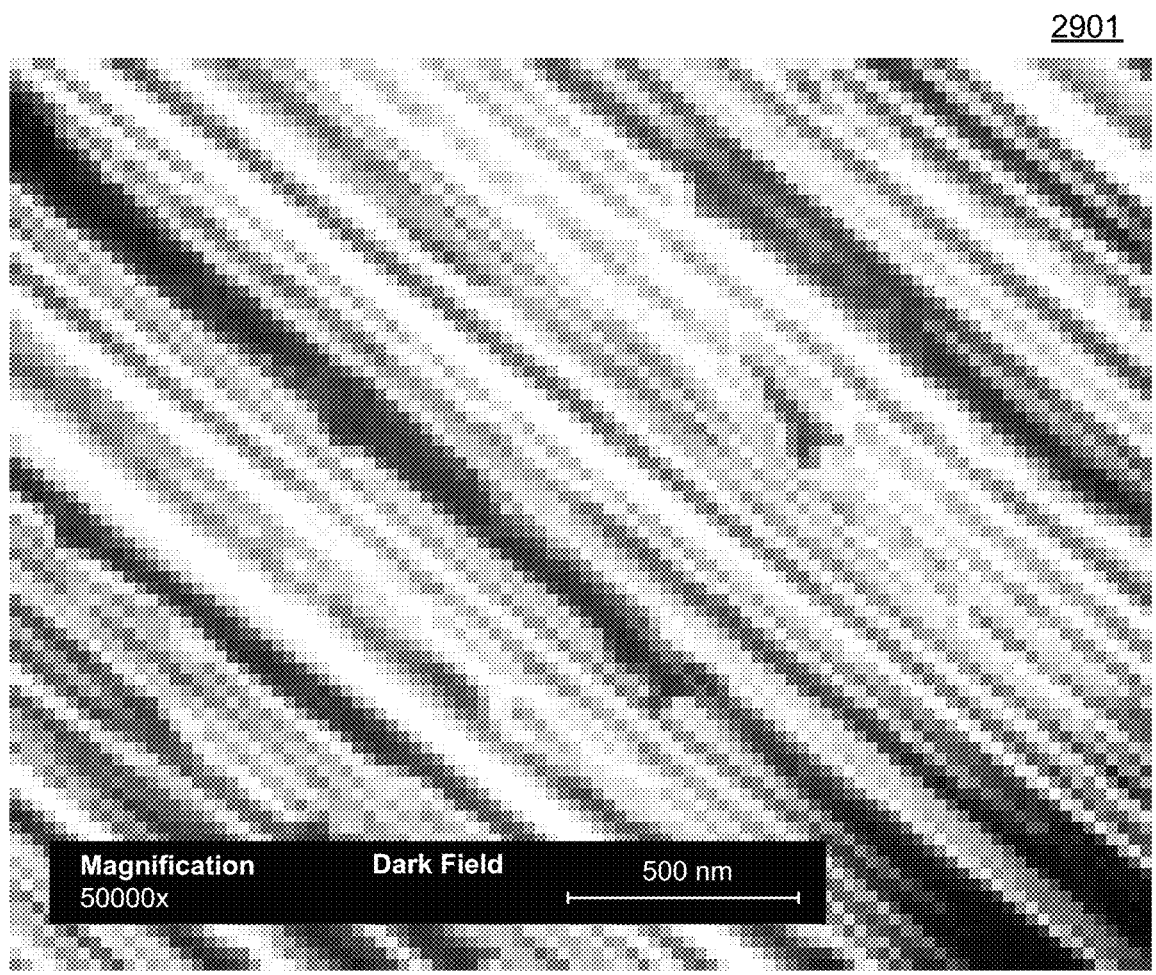
FIGS. 29A-29C are SEM images detailing the rendering of an exemplary nanotube fabric layer deposited over a 1018 low carbon steel substrate into an ordered state via a rubbing operation.
Figure 29B:
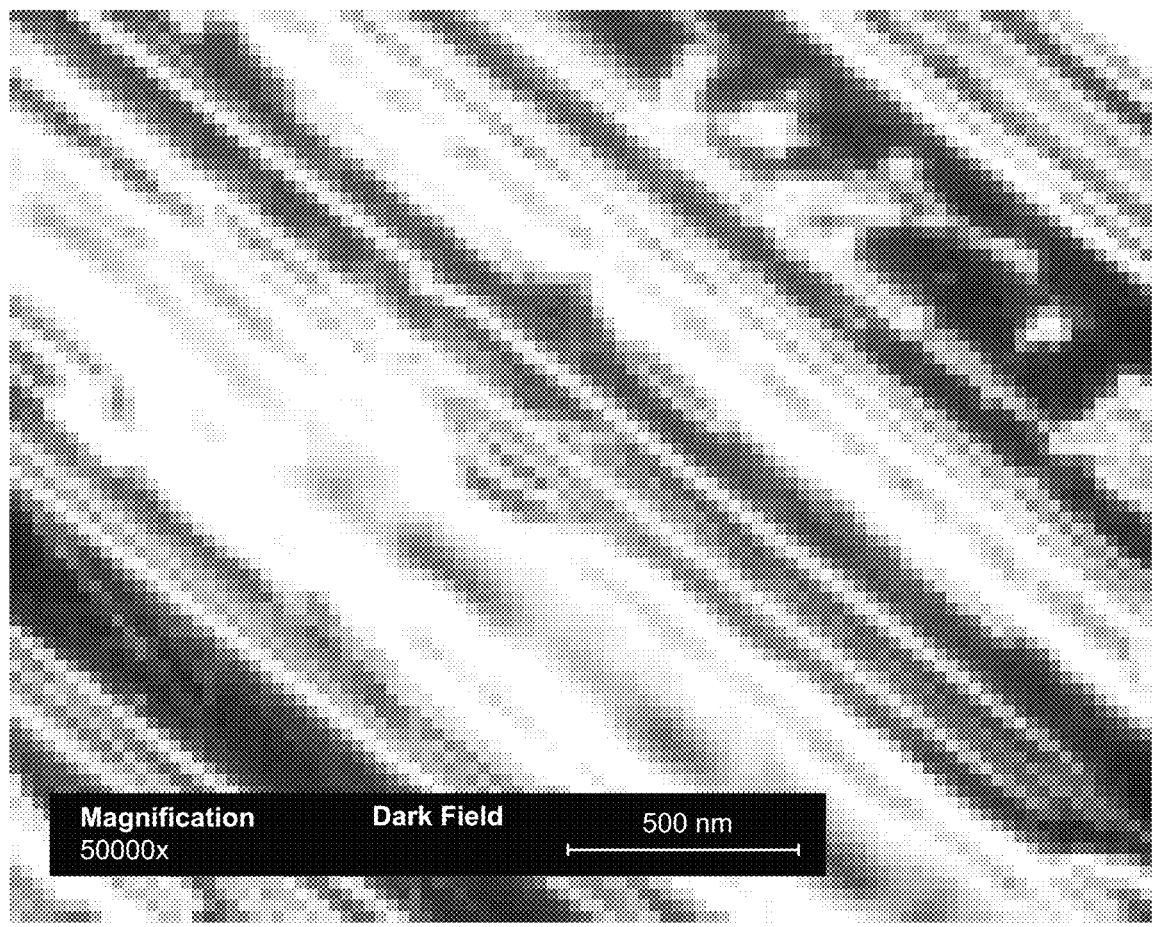
Figure 29C:
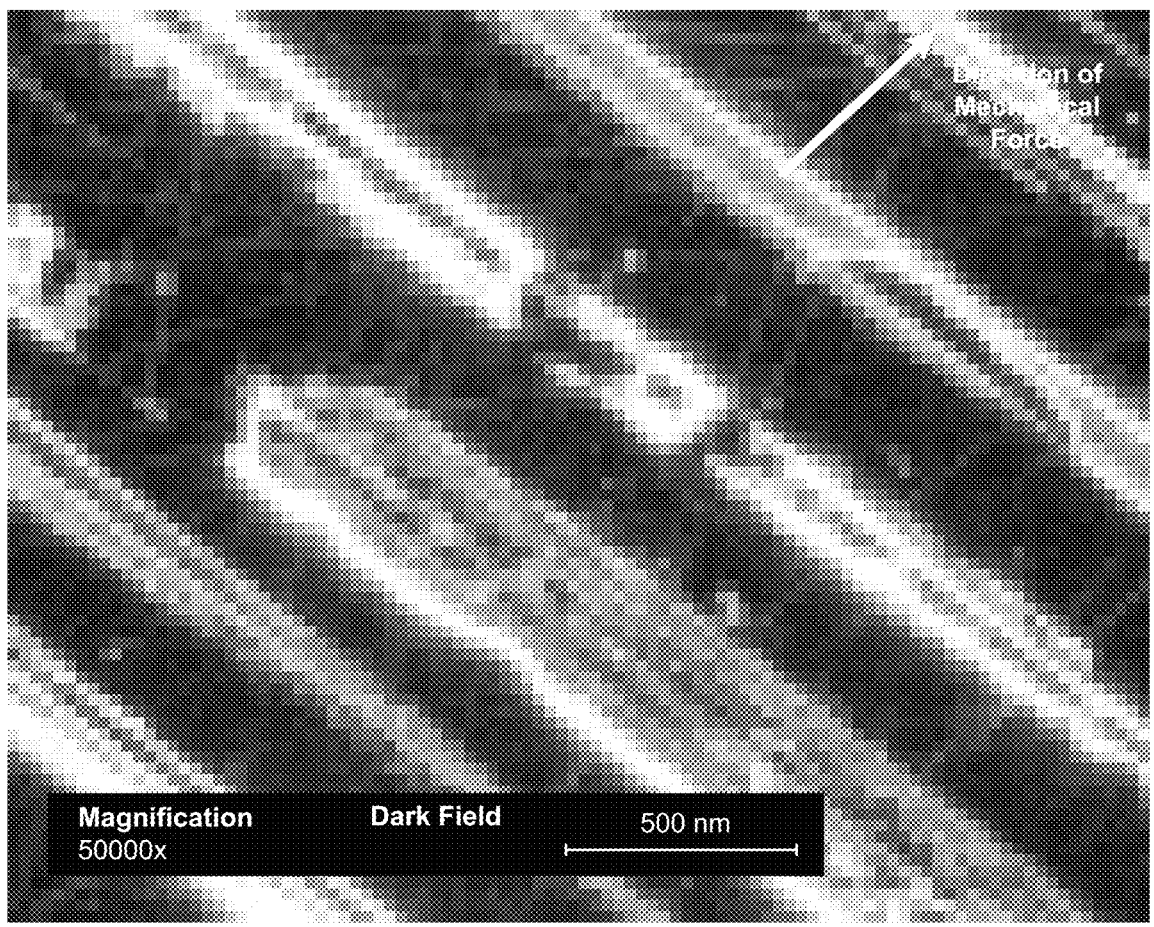

FIGS. 29A-29C are SEM images depicting the formation and subsequent ordering of an exemplary nanotube fabric layer formed over a 1018 low carbon steel substrate. FIG. 29A is an SEM image 2901 of the steel substrate prior to the deposition of the nanotube fabric layer. FIG. 29B is an SEM image 2902 of the exemplary nanotube fabric layer (in a substantially unordered state) formed via three spin coating operations of a purified nanotube application solution (as described above). FIG. 29C is an SEM image 2903 of the exemplary nanotube fabric layer after being rendered into an ordered network of nanotube elements through the application of a directional rubbing force along the direction indicated within SEM image 2903. Machining grooves along the surface of the steel substrate are visible in all three SEM images (2901, 2902, and 2903) running orthogonal to the indicated direction of the applied rubbing force (shown in SEM image 2903). The rubbing force was applied by placing the wafer face down on a rayon polishing pad (that is, placing the wafer such that the nanotube fabric layer was positioned in direct physical contact with the rayon polishing pad) and sliding the wafer approximately six to eight inches along the surface of the pad fifty times. The rayon polishing pad used within this example was a South Bay Technology, Inc. p/PRF12A-10 "rayon-fine polishing cloth." As is evident in FIG. 29C, the resulting nanotube fabric layer was rendered into an ordered state oriented along the direction of the applied rubbing force.

EXAMPLE 11

Figure 30A:
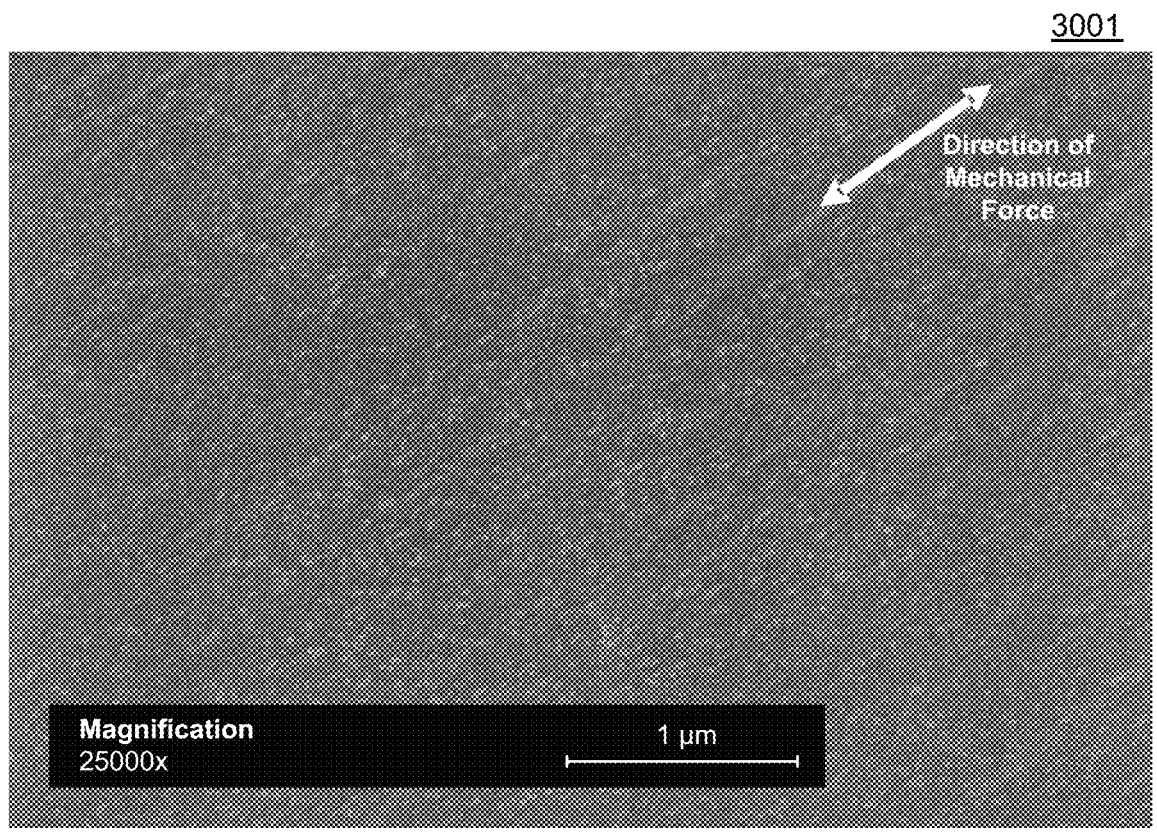
FIGS. 30A-30D are SEM images (at different magnifications) detailing the rendering of an exemplary nanotube fabric layer into an ordered state via piezoelectric rubbing operation.
Figure 30B:
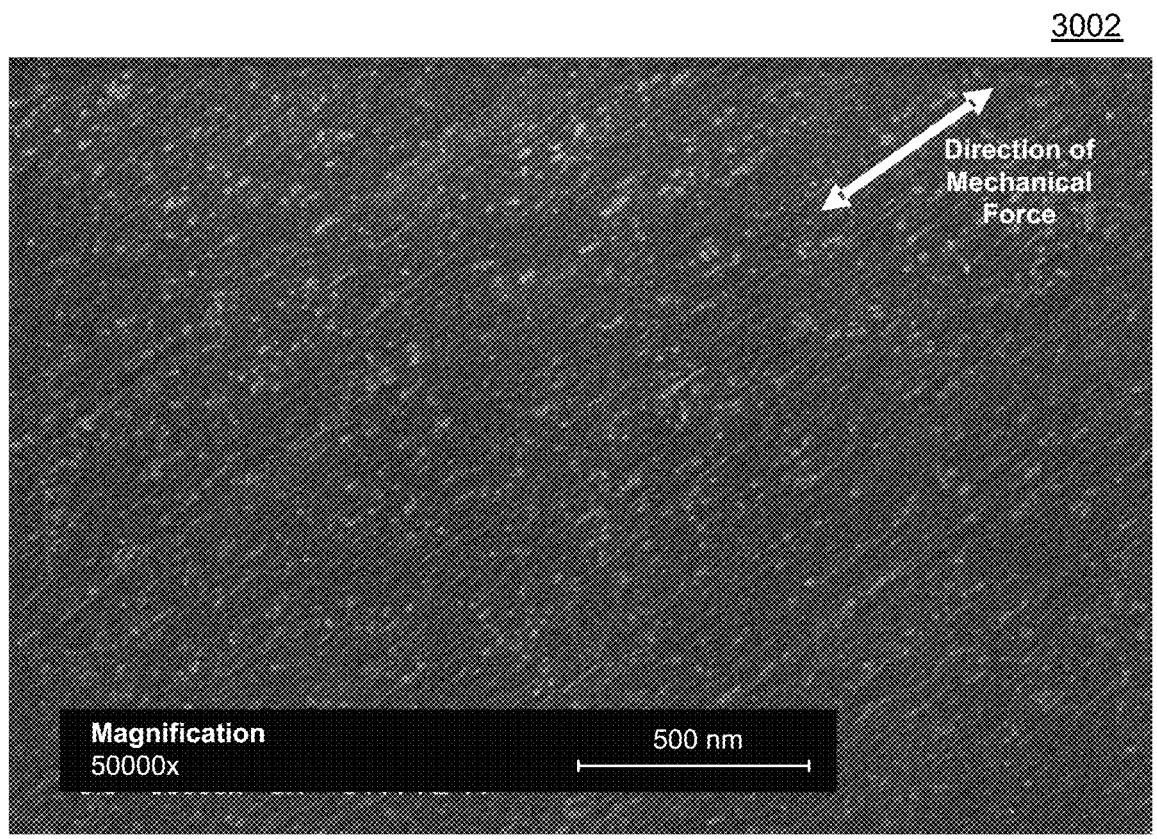
Figure 30C:
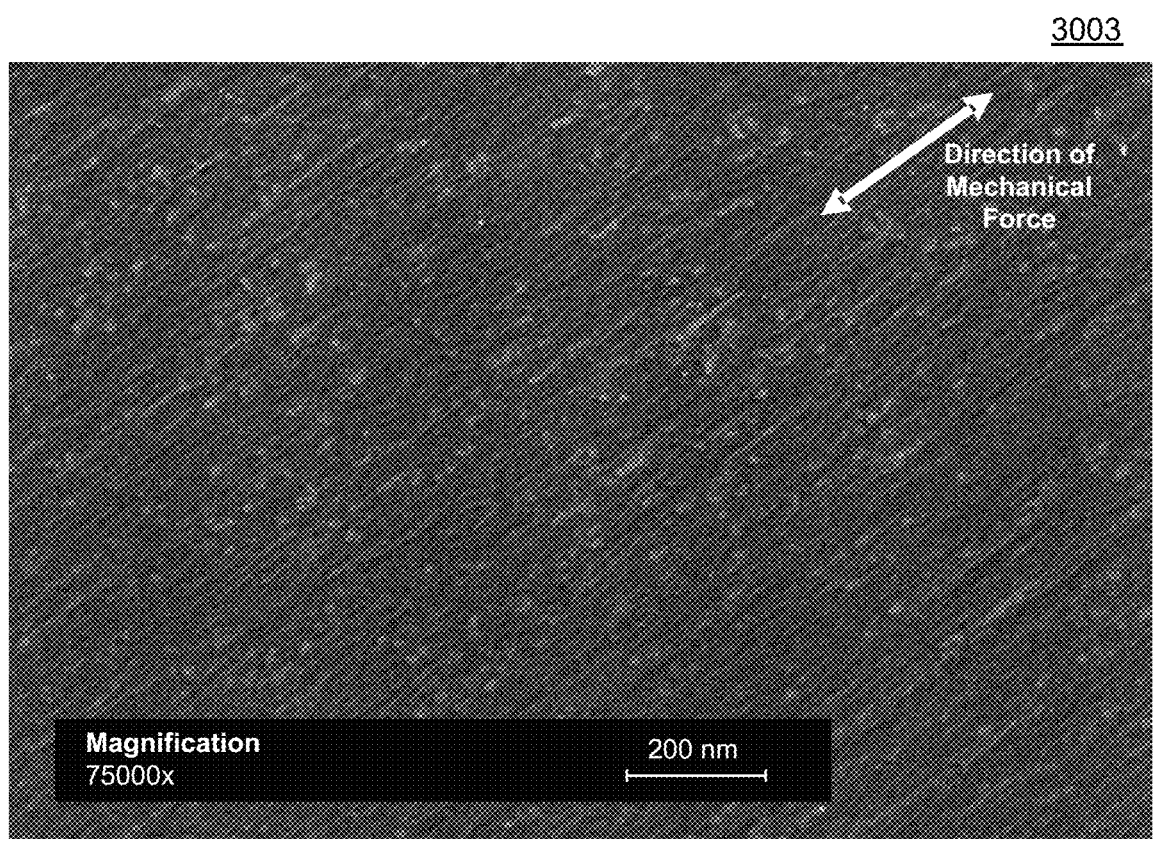
Figure 30D:
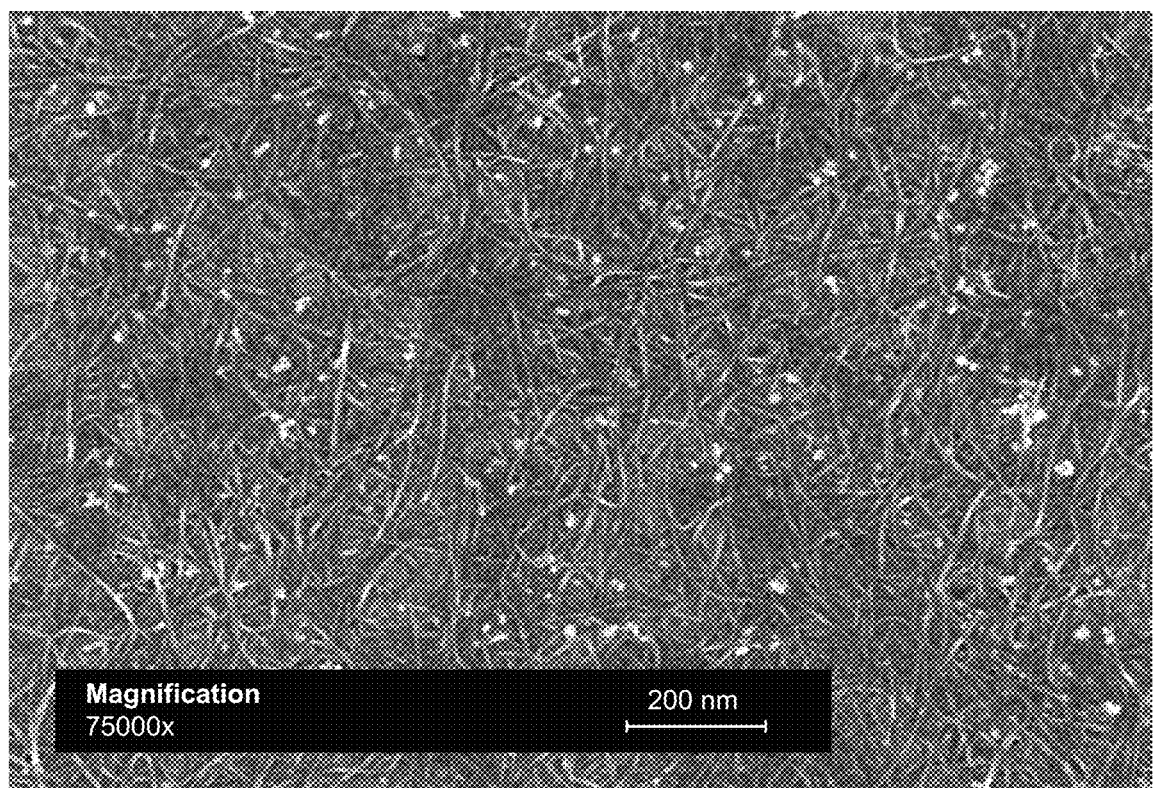

FIGS. 30A-30C are SEM images of an exemplary nanotube fabric layer at different magnifications (3001, 3002, and 3003 respectively) first formed via three spin coating operations of a purified nanotube application solution (as described above) and then rendered into an ordered network of nanotube elements through the application of piezoelectric generated rubbing force along the direction indicated within each SEM image. FIG. 30D is an SEM image 3004 of the formed nanotube fabric layer prior to the application of the piezoelectric generated rubbing force illustrating the substantially unordered state of the nanotube fabric layer prior to the application of the rubbing force. Once the nanotube fabric layer was formed on the silicon substrate, a protective plastic layer (Saran wrap, based upon polyvinylidene chloride) was positioned over the fabric layer. Then a y-poled piezoelectric crystal element was placed over the plastic layer such that the element covered substantially the entire nanotube fabric layer. A 1.25 pound weight was then place over the piezoelectric crystal element (using a layer of PTFE film to provide electrical isolation between the weight and the piezoelectric crystal) such as to maintain sufficient pressure between the crystal element and the nanotube fabric layer. The piezoelectric crystal element was then driven by a piezo amplifier at 11 kHz, 10 V (peak to peak) for 2.5 hours. The direction indicated in SEM images 2901, 2902, and 2903 is representative of the axis of vibration of the piezoelectric crystal element. As is evident in FIG. 30C (the 75,000× magnification image), the resulting nanotube fabric layer was rendered into an ordered state oriented along the direction of vibration.

EXAMPLE 12

Figure 31A:
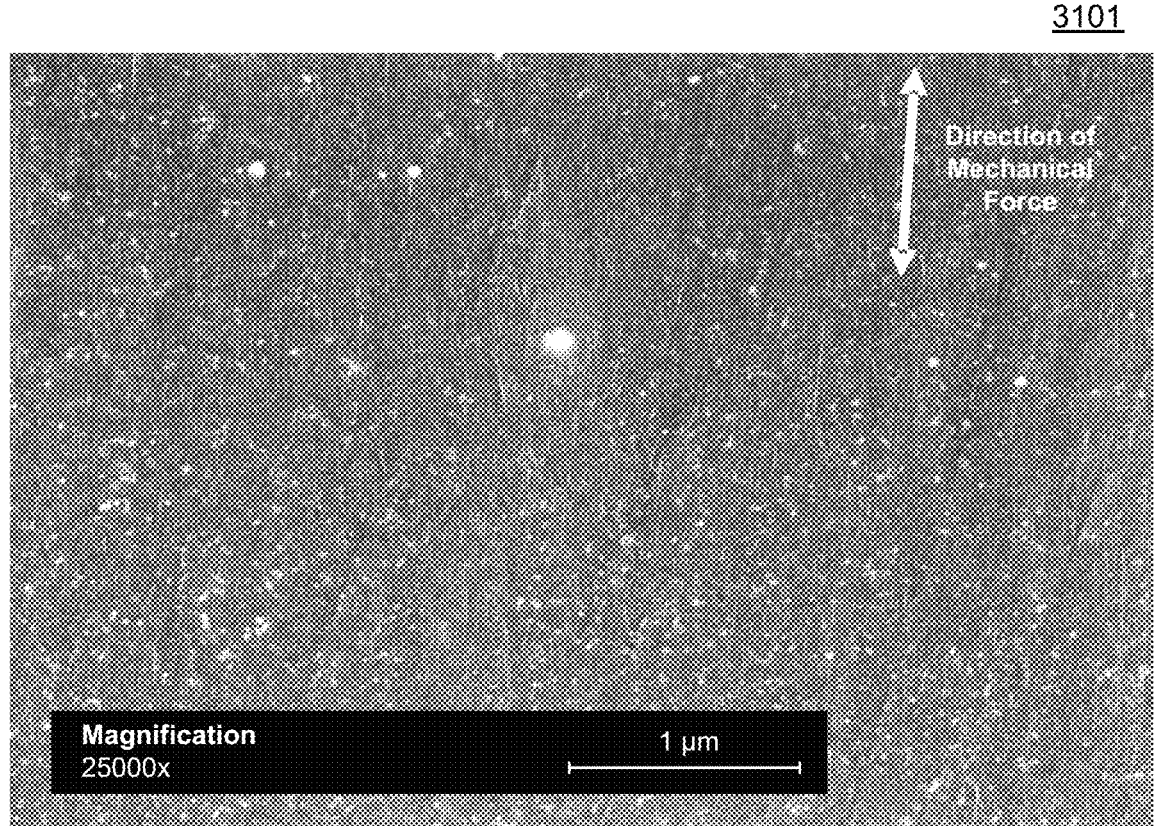
FIGS. 31A-31C are SEM images (at different magnifications) detailing the rendering of an exemplary nanotube fabric layer deposited over a polyethylene terephthalate (PET) substrate into an ordered state via a rubbing operation.
Figure 31B:
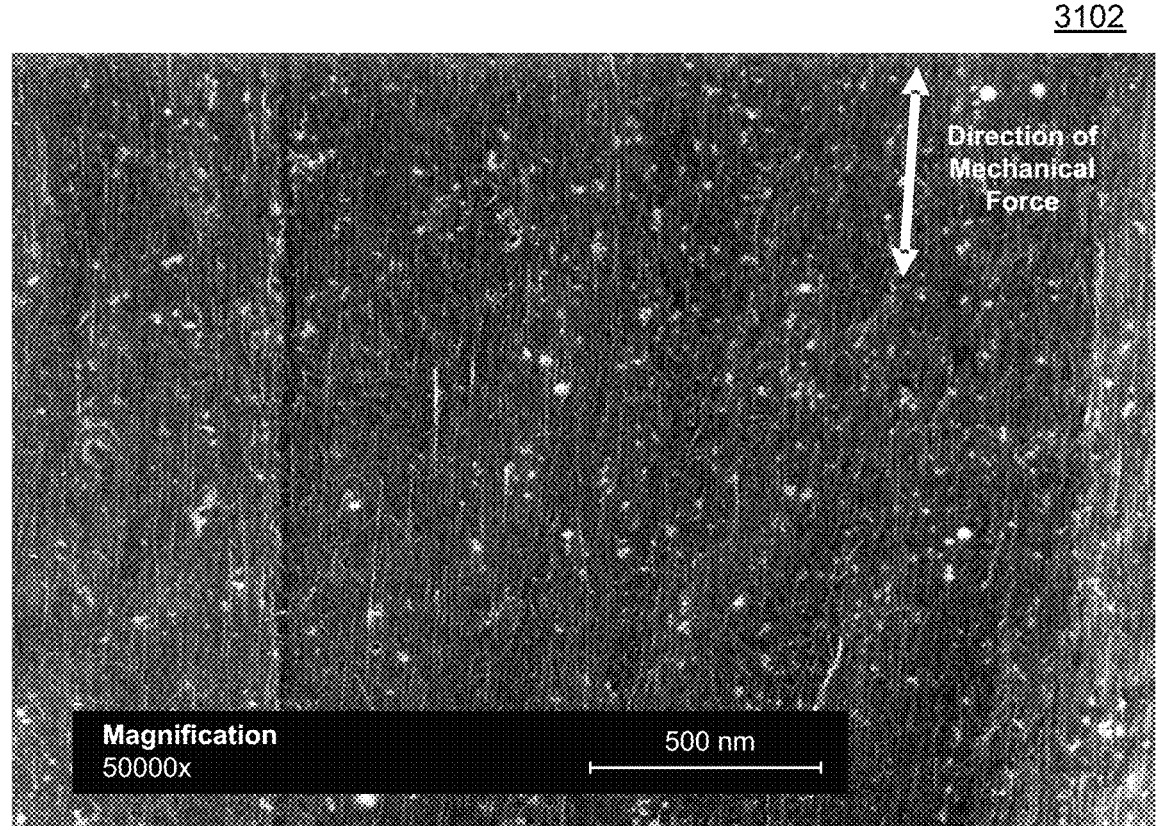
Figure 31C:
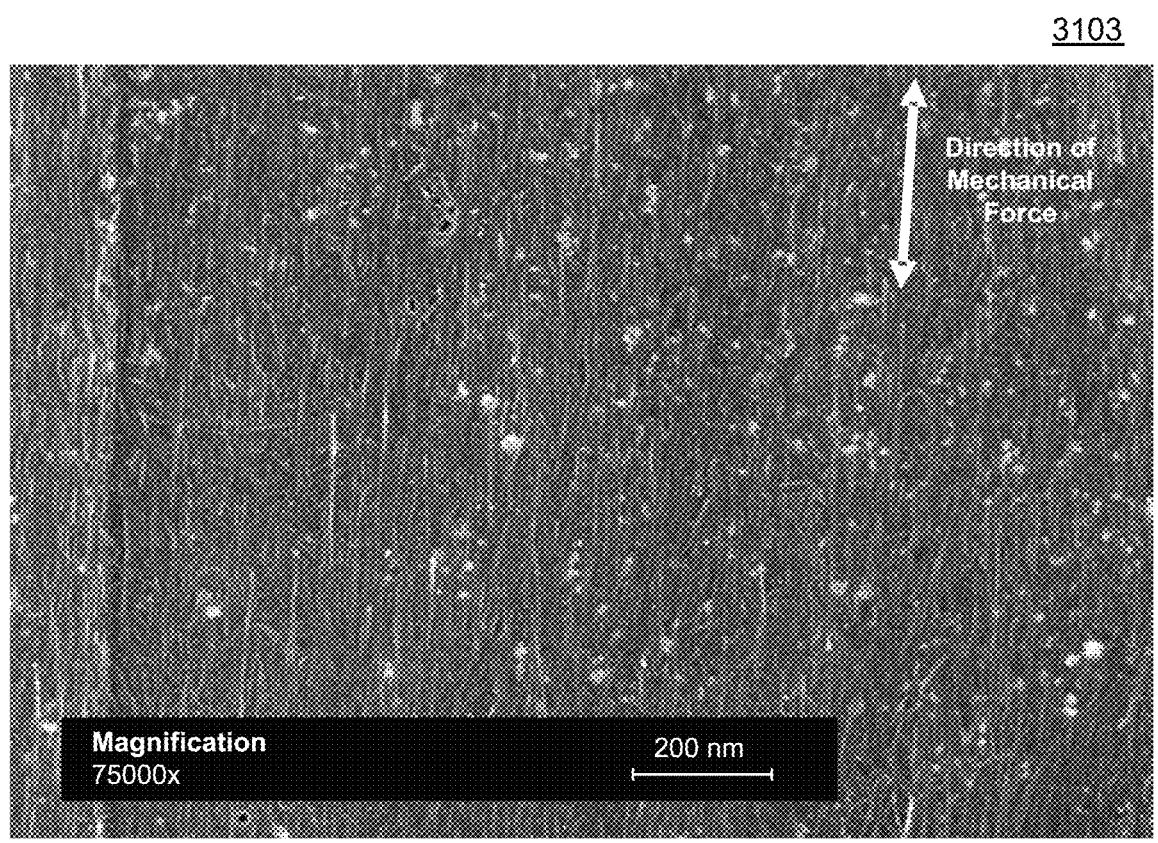

FIGS. 31A-31C are SEM images at different magnifications (3101, 3102, and 3103 respectively) of an exemplary nanotube fabric layer formed over a polyethylene terephthalate (PET) substrate and rendered into an ordered network of nanotube elements through the application of a directional rubbing force along the direction indicated within each SEM image. The rubbing force was applied by placing the wafer face down on a rayon polishing pad (that is, placing the wafer such that the nanotube fabric layer was positioned in direct physical contact with the rayon polishing pad) and sliding the wafer approximately six to eight inches along the surface of the pad fifty times. The rayon polishing pad used within this example was a South Bay Technology, Inc. p/PRF12A-10 "rayon-fine polishing cloth." As is evident in FIG. 31C (the 75,000× magnification image), the resulting nanotube fabric layer was rendered into an ordered state oriented along the direction of the applied rubbing force.

EXAMPLE 13

Figure 32A:
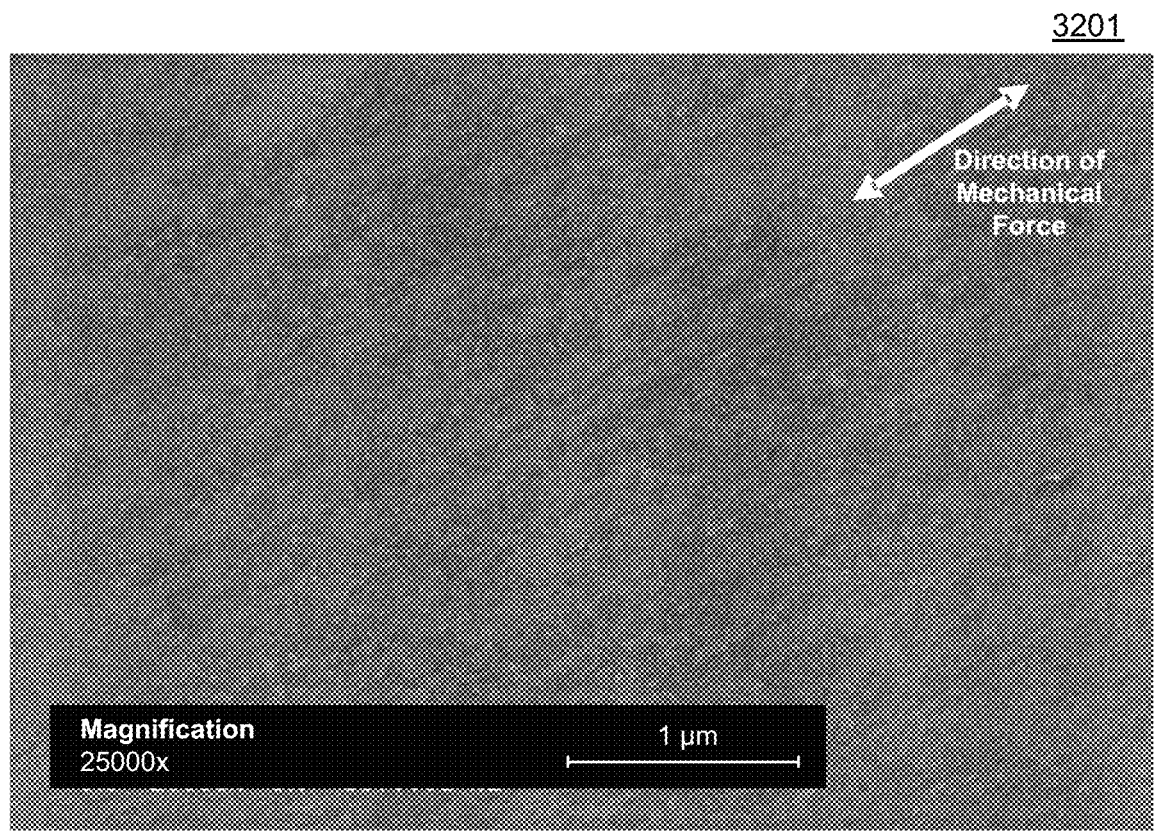
FIGS. 32A-32D are SEM images (at different magnifications) detailing the rendering of an exemplary nanotube fabric layer into an ordered state via a high pressure air flow polishing operation.
Figure 32B:
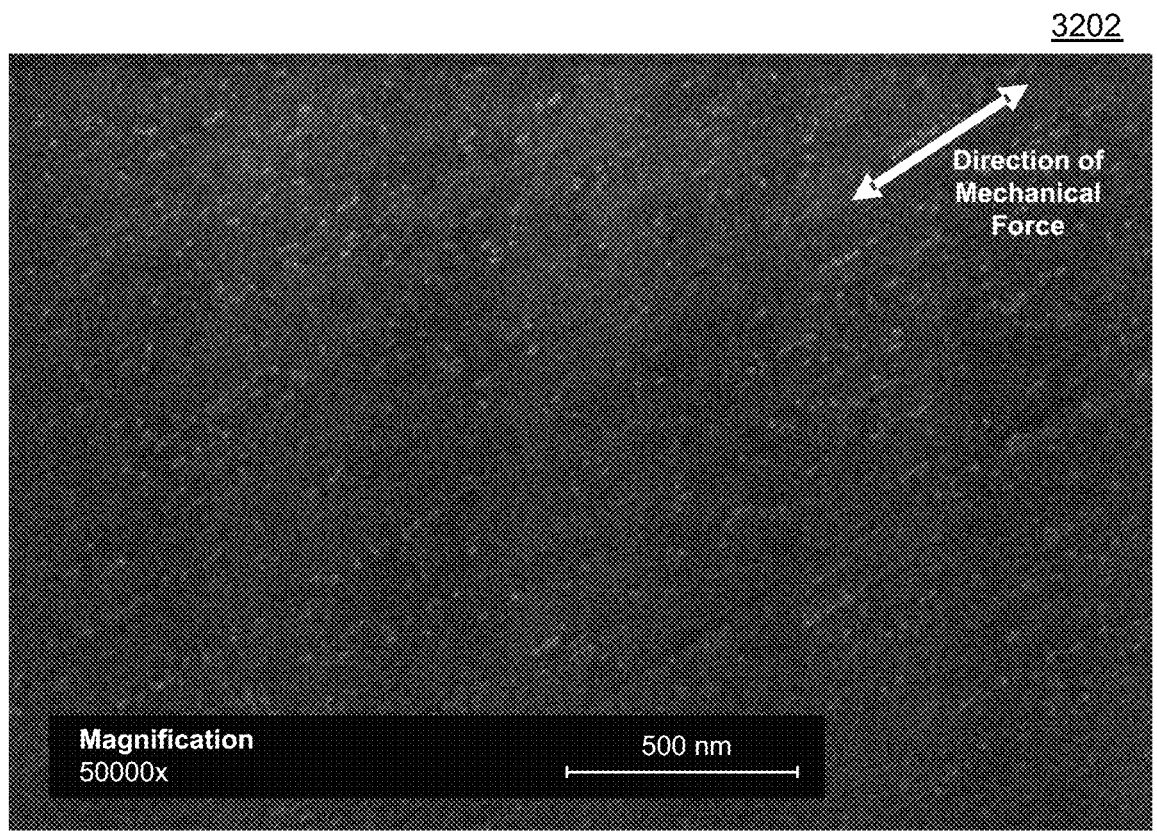
Figure 32C:
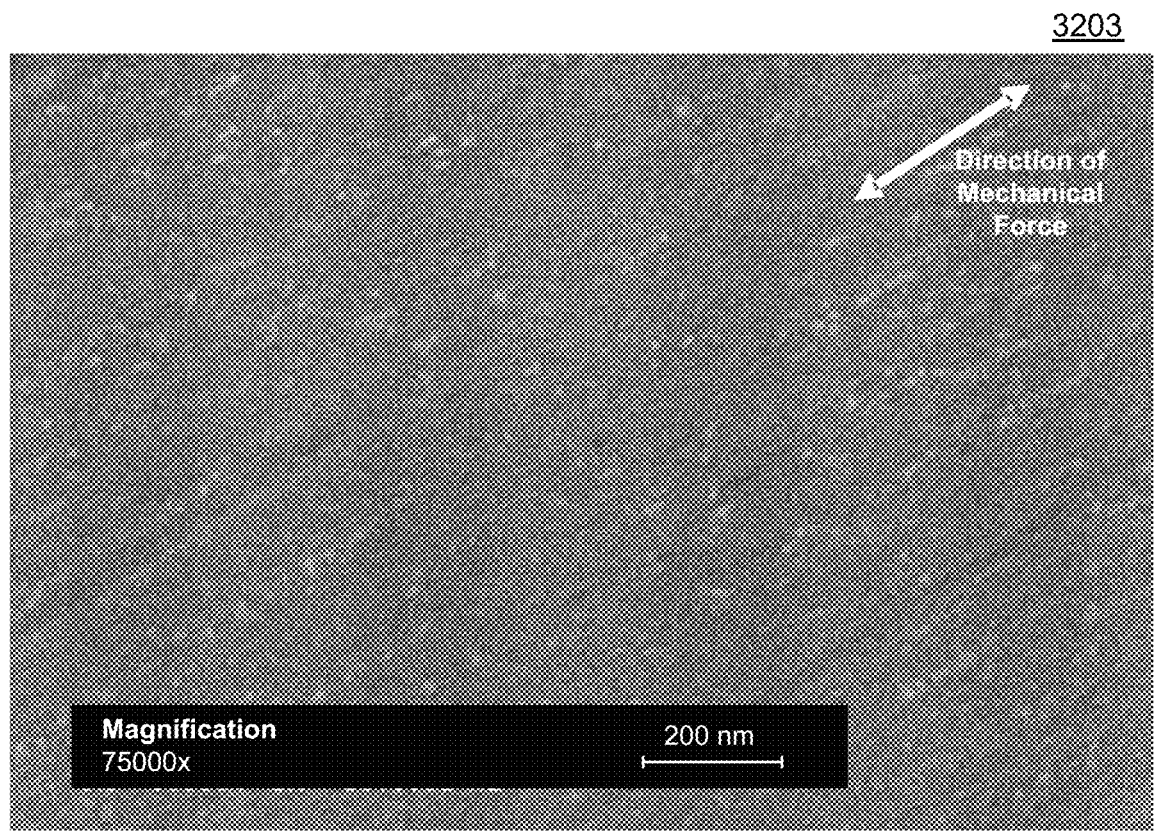
Figure 32D:
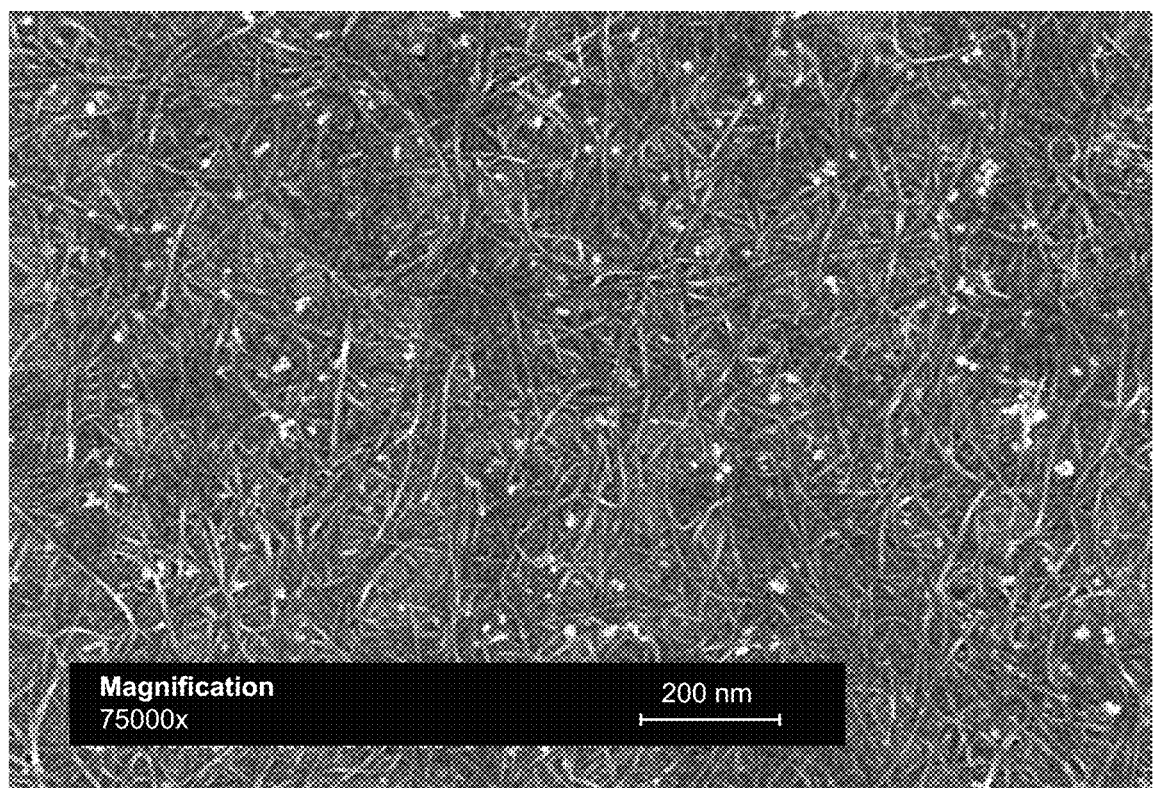

FIGS. 32A-32C are SEM images of an exemplary nanotube fabric layer at different magnifications (3201, 3202, and 3203 respectively) first formed via three spin coating operations of a purified nanotube application solution (as described above) and then rendered into an ordered network of nanotube elements through the application of high pressure air flow polishing operation along the direction indicated within each SEM image. FIG. 32D is an SEM image 3204 of the formed nanotube fabric layer prior to the application of the high pressure air flow polishing operation illustrating the substantially unordered state of the nanotube fabric layer prior to the application of the polishing force. Once the nanotube fabric layer was formed on the silicon substrate, a protective plastic layer (Saran wrap, based upon polyvinylidene chloride) was positioned over the fabric layer. Then an air gun (a commercial precision safety air gun available from Exair, model number 1410SS fitted with a "nano supper air" nozzle, model number 1110SS) was used to flow nitrogen gas (N2) at 100 psi over the nanotube fabric layer for twelve sweeps. Each sweep included moving the air gun across the wafer surface (protected by the plastic layer) in a "zig zag" pattern for approximately ten seconds. As is evident in FIG. 32C (the 75,000× magnification image), the resulting nanotube fabric layer was rendered into an ordered state oriented along the direction of the air flow.

EXAMPLE 14

Figure 33A:
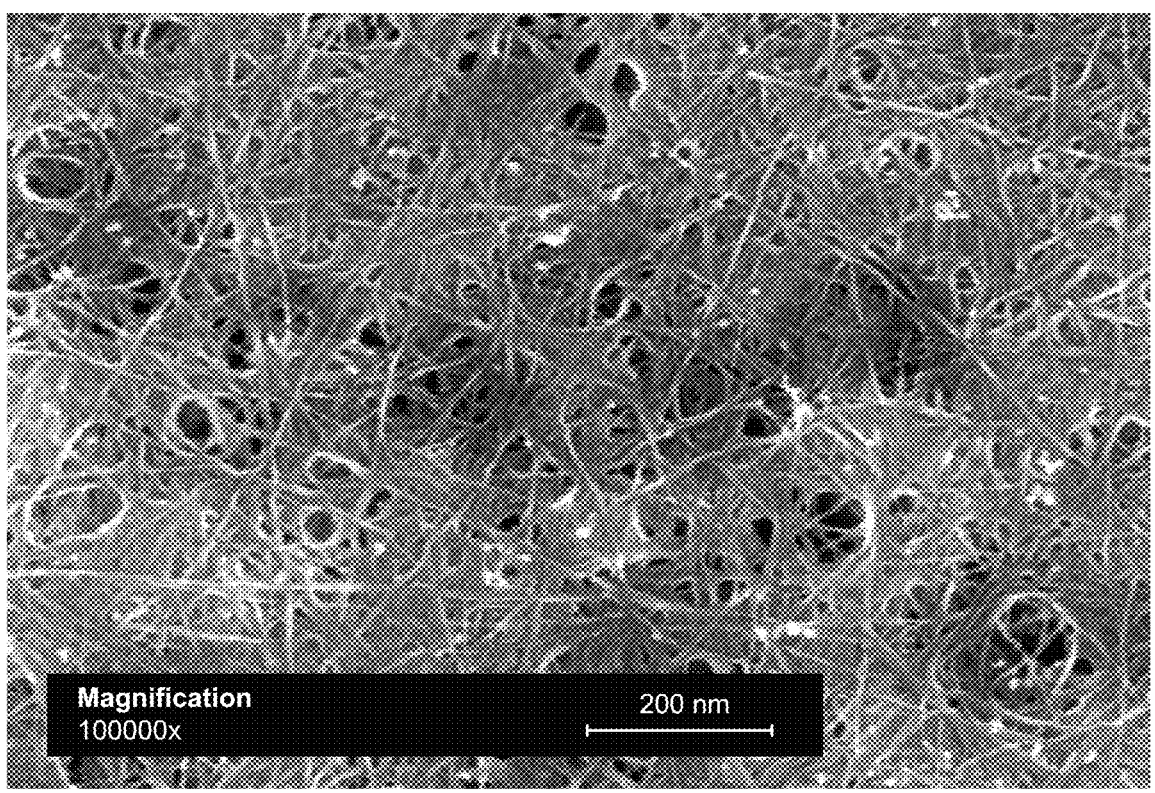
FIGS. 33A-33B are SEM images detailing the rendering of an exemplary nanotube fabric layer deposited over a 2024 aluminum alloy substrate into an ordered state via a rubbing operation.
Figure 33B:
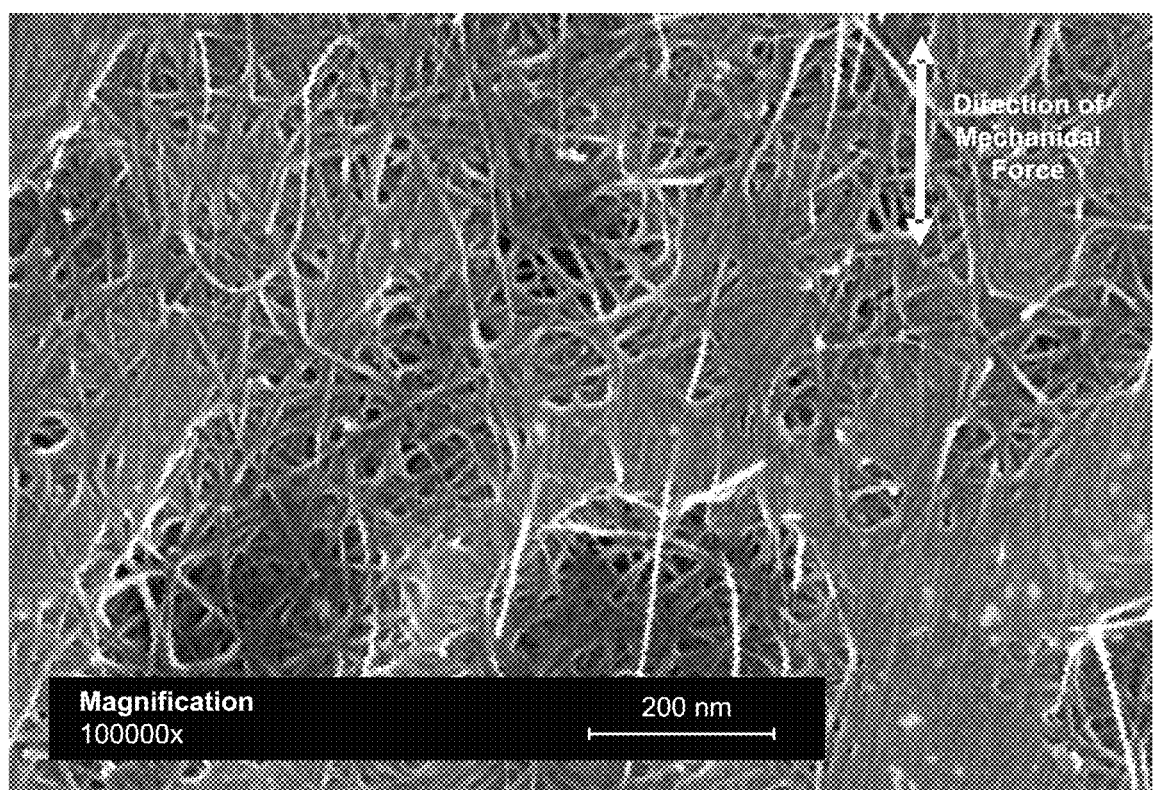

FIGS. 33A-33B are SEM images depicting the ordering of an exemplary nanotube fabric layer formed over a 2024 aluminum alloy substrate. FIG. 33A is an SEM image 3301 of an exemplary nanotube fabric layer (in a substantially unordered state) formed via three spin coating operations of a purified nanotube application solution (as described above). FIG. 33B is an SEM image 3302 of the exemplary nanotube fabric layer after being rendered into an ordered network of nanotube elements through the application of a directional rubbing force along the direction indicated within SEM image 3302. The rubbing force was applied by placing the wafer face down on a rayon polishing pad (that is, placing the wafer such that the nanotube fabric layer was positioned in direct physical contact with the rayon polishing pad) and sliding the wafer approximately six to eight inches along the surface of the pad fifty times. The rayon polishing pad used within this example was a South Bay Technology, Inc. p/PRF12A-10 "rayon-fine polishing cloth." As is evident in FIG. 33B, the resulting nanotube fabric layer was rendered into an ordered state oriented along the direction of the applied rubbing force.

It should be noted that the surface of the 2024 aluminum alloy substrate shows large pores in the aluminum oxide surface coating where the nanotube elements within the nanotube fabric layer are recessed from the surface. The nanotube elements within these pore regions show little evidence of alignment whereas the nanotube elements on the surface (that is, those nanotube elements not within the pores) of the denser aluminum oxide surface shows a very high degree of alignment. This suggests that contact with the fabric was an important aspect in aligning this sample.

EXAMPLE 15

Figure 34A:
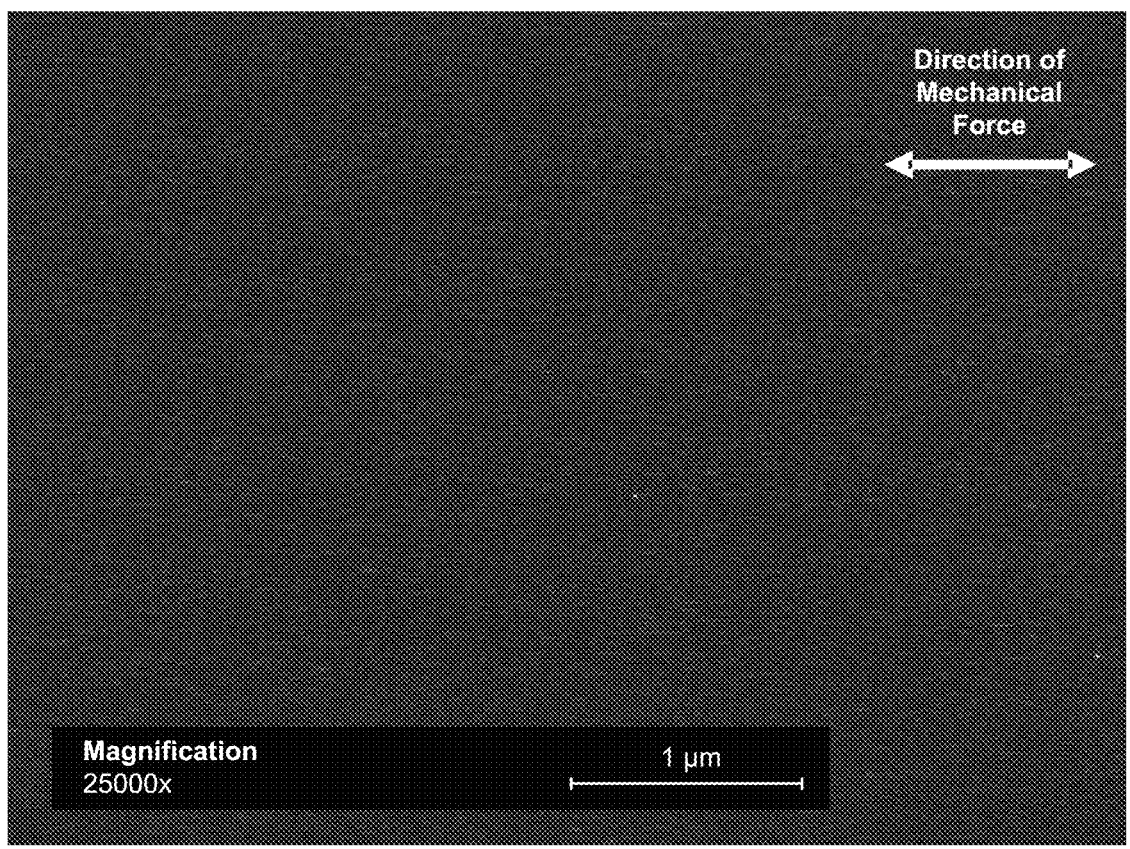
FIGS. 34A-34C are SEM images detailing the rendering of an exemplary nanotube fabric layer deposited over a titanium nitride (TiN) substrate into an ordered state via a rubbing operation performed using a chemical mechanical polishing (CMP) machine.
Figure 34B:
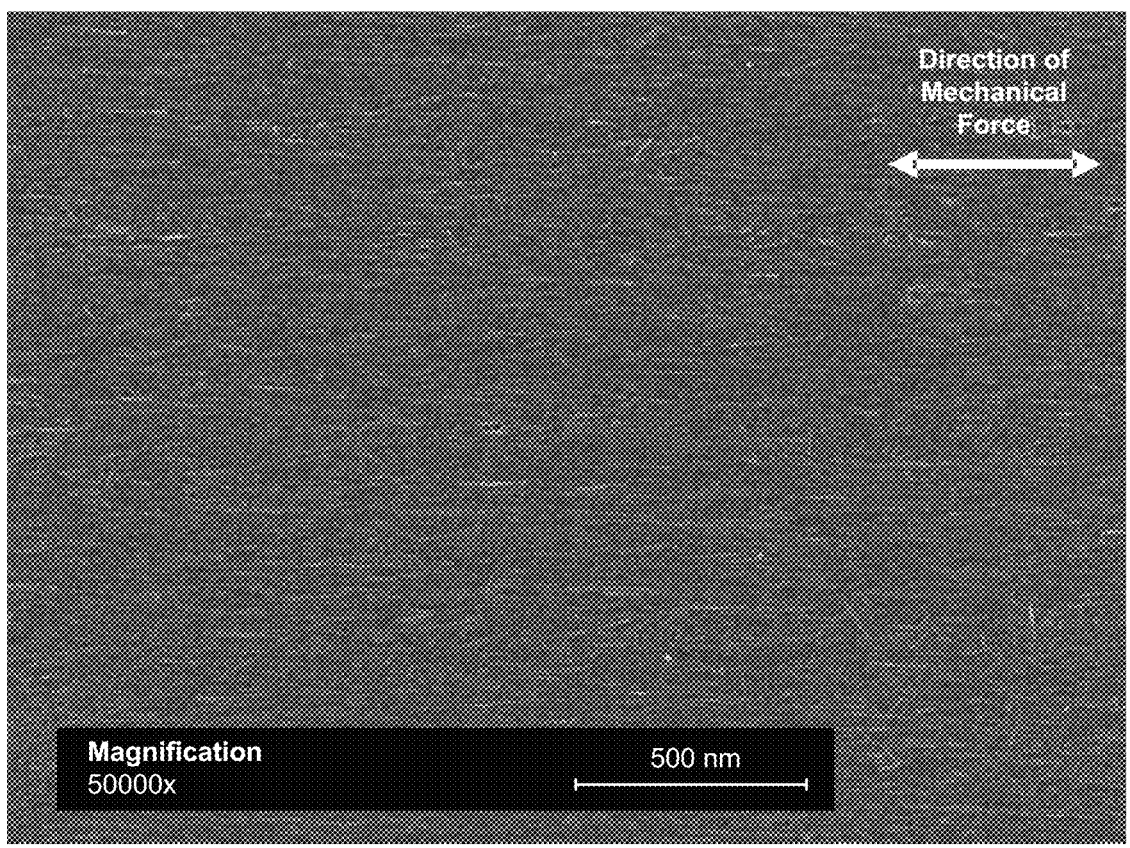
Figure 34C:
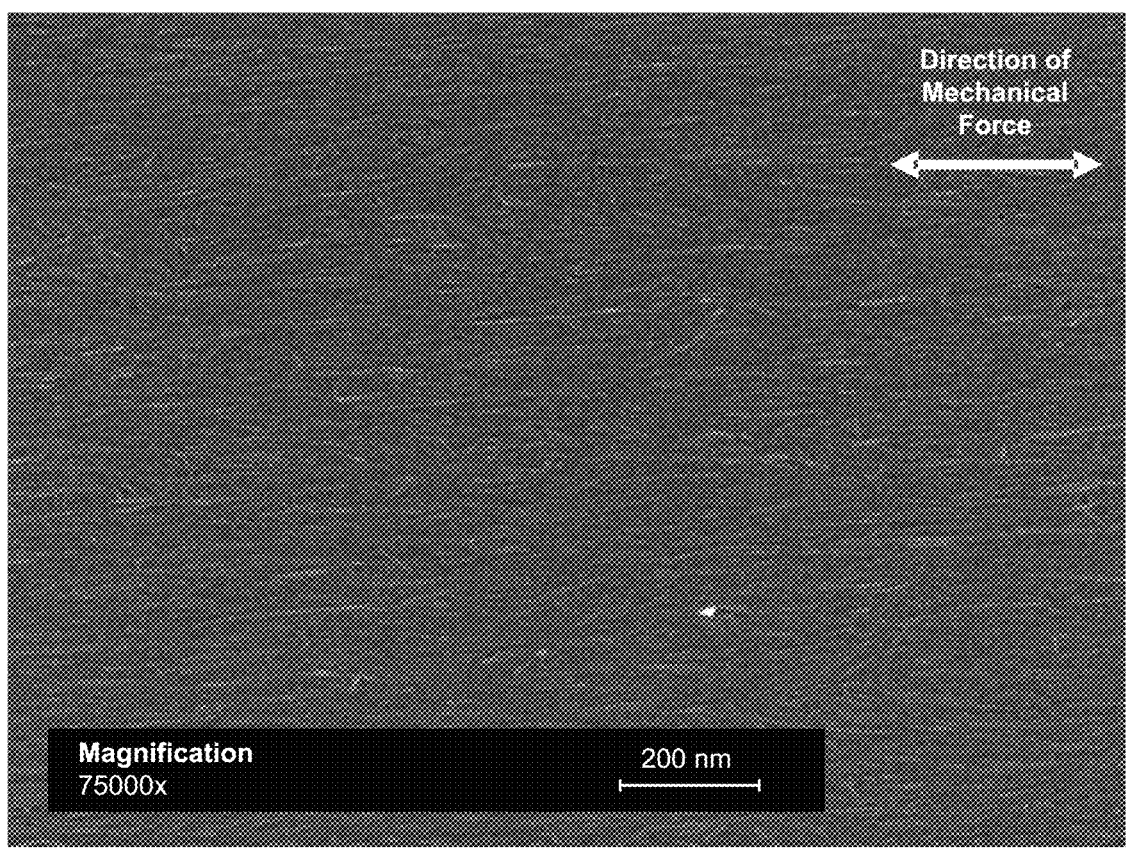

FIGS. 34A-34C are SEM images of an exemplary nanotube fabric layer at different magnifications (3401, 3402, and 3403 respectively) first formed via five spin coating operations of a purified nanotube application solution (as described above) and then rendered into an ordered network of nanotube elements through the application of a directional rubbing force along the direction indicated within each SEM image. The rubbing force was applied by placing the wafer facedown on a 20" ROHM HAAS SPM3100 CMP pad (such that the nanotube fabric layer was in direct contact with the cmp pad surface). Prior to the start of the rubbing operation, the wafer—loaded into the head of a CMP machine—was sprayed with deionized water to provide a lubricating medium at the interface between the nanotube fabric layer on the wafer surface and the CMP pad. The CMP head passed the wafer back and forth over the CMP pad in a maximum stroke length of 1.6 inches at a rate of ten strokes/minute for five minutes. The CMP pad was not rotated as the wafer was rubbed across its surface. As is evident in FIG. 34C (the 75,000× magnification image), the nanotube fabric layer was rendered into an ordered state oriented along the direction of the applied rubbing force.

EXAMPLE 16

Figure 35:
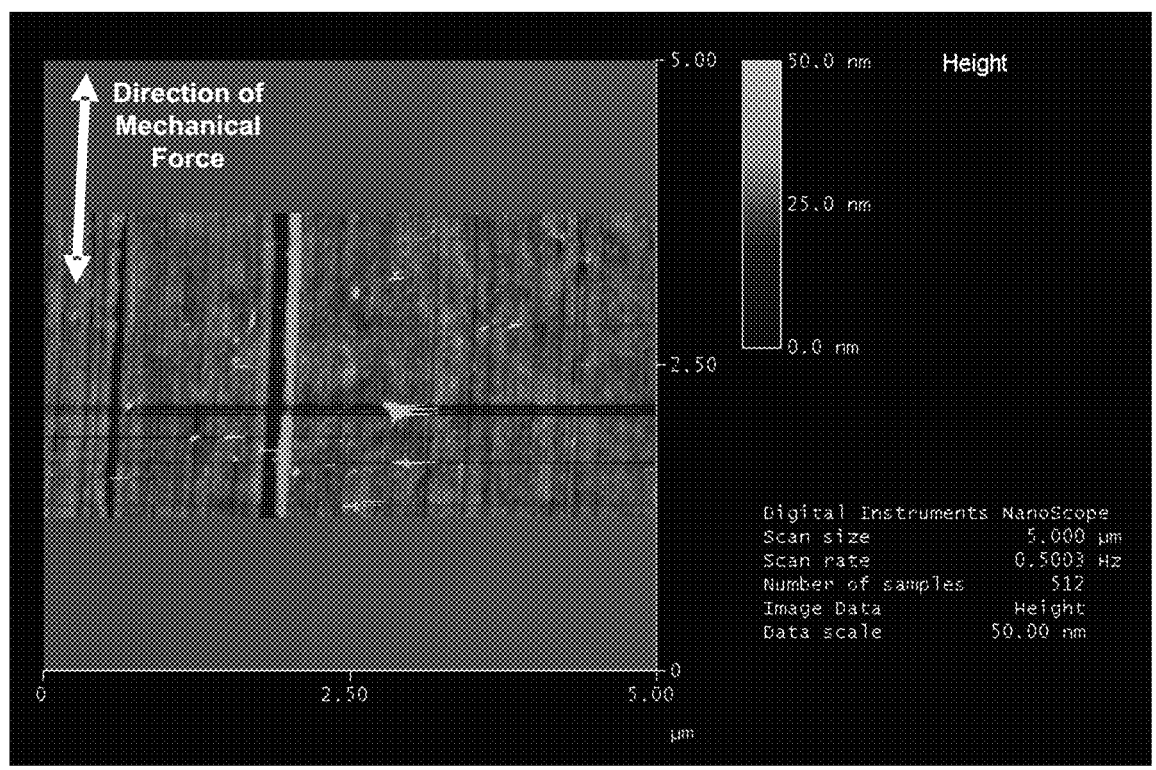
FIG. 35 is an AFM image detailing the rendering of an exemplary nanotube fabric layer into an ordered state via the use of an electronically controlled linear actuator to provide a rubbing force with a stroke length of 1 mm.

FIG. 35 is an AFM image 3501 of an exemplary nanotube fabric layer first formed via three spin coating operations of a purified nanotube application solution (as described above) and then rendered into an ordered network of nanotube elements through the application of a rubbing force via an electronically controlled linear actuator. Within the present example, a Newton linear actuator (model no. CMA 12CCCL) was driven with a Newport universal motion controller driver (model no. ESP 300) to translate a silicon wafer back and forth over the surface of the exemplary nanotube fabric layer. Both the actuator and the motion controller driver are available from Newport Corporation of Irvine, Calif., and the use of such equipment is well known to those skilled in the art. The silicon wafer was translated a distance of 1 mm with each stroke for a total of one hundred iterations. The assembly also provided a downward force (that is a force pressing the silicon rubbing surface against the nanotube fabric layer) of 38 g. As is evident in FIG. 35, the nanotube fabric layer was rendered into an ordered state oriented along the direction of the applied rubbing force.

EXAMPLE 17

Figure 36:
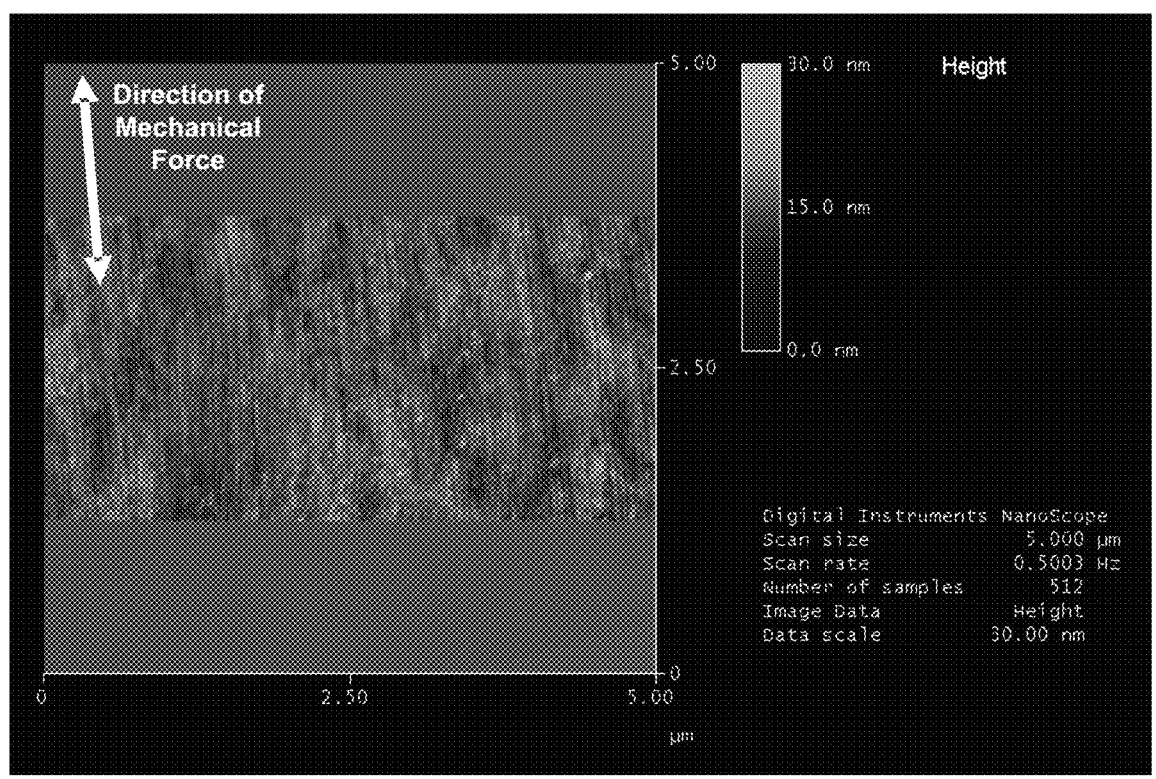
FIG. 36 is an AFM image detailing the rendering of an exemplary nanotube fabric layer into an ordered state via the use of an electronically controlled linear actuator to provide a rubbing force with a stroke length of 0.1 mm.

FIG. 36 is an AFM image 3601 of an exemplary nanotube fabric layer first formed via three spin coating operations of a purified nanotube application solution (as described above) and then rendered into an ordered network of nanotube elements through the application of a rubbing force via an electronically controlled linear actuator. Within the present example, a Newton linear actuator (model no. CMA 12CCCL) was driven with a Newport universal motion controller driver (model no. ESP 300) to translate a silicon wafer back and forth over the surface of the exemplary nanotube fabric layer. Both the actuator and the motion controller driver are available from Newport Corporation of Irvine, Calif., and the use of such equipment is well known to those skilled in the art. The silicon wafer was translated a distance of 0.1 mm with each stroke for a total of one thousand iterations. The assembly also provided a downward force (that is a force pressing the silicon rubbing surface against the nanotube fabric layer) of 42 g. As is evident in FIG. 36, the nanotube fabric layer was rendered into an ordered state oriented along the direction of the applied rubbing force.

EXAMPLE 18

Figure 37:
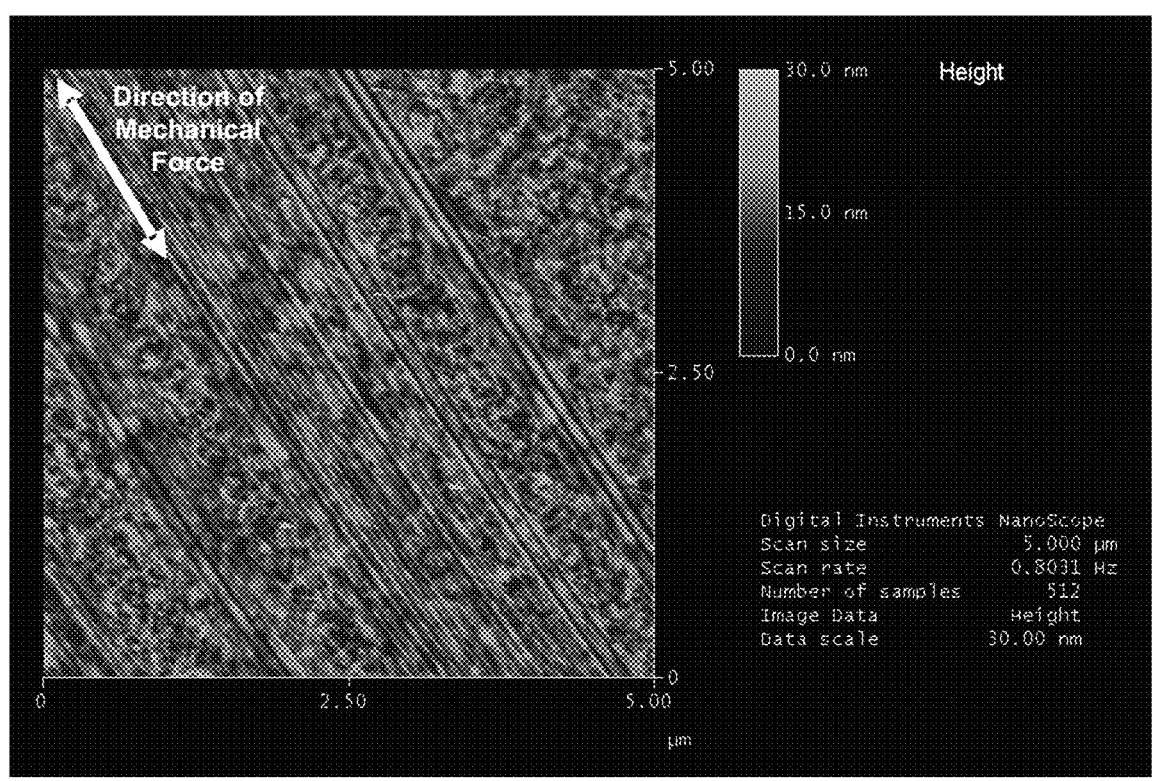
FIG. 37 is an AFM image detailing the rendering of an exemplary nanotube fabric layer into an ordered state via the use of an electronically controlled linear actuator to provide a rubbing force with a stroke length of 0.05 mm.

FIG. 37 is an AFM image 3701 of an exemplary nanotube fabric layer first formed via three spin coating operations of a purified nanotube application solution (as described above) and then rendered into an ordered network of nanotube elements through the application of a rubbing force via an electronically controlled linear actuator. Within the present example, a Newton linear actuator (model no. CMA 12CCCL) was driven with a Newport universal motion controller driver (model no. ESP 300) to translate a silicon wafer back and forth over the surface of the exemplary nanotube fabric layer. Both the actuator and the motion controller driver are available from Newport Corporation of Irvine, Calif., and the use of such equipment is well known to those skilled in the art. The silicon wafer was translated a distance of 0.05 mm with each stroke for a total of one thousand iterations. The assembly also provided a downward force (that is a force pressing the silicon rubbing surface against the nanotube fabric layer) of 80 g. As is evident in FIG. 37, the nanotube fabric layer was rendered into an ordered state oriented along the direction of the applied rubbing force.

EXAMPLE 19

Figure 38:
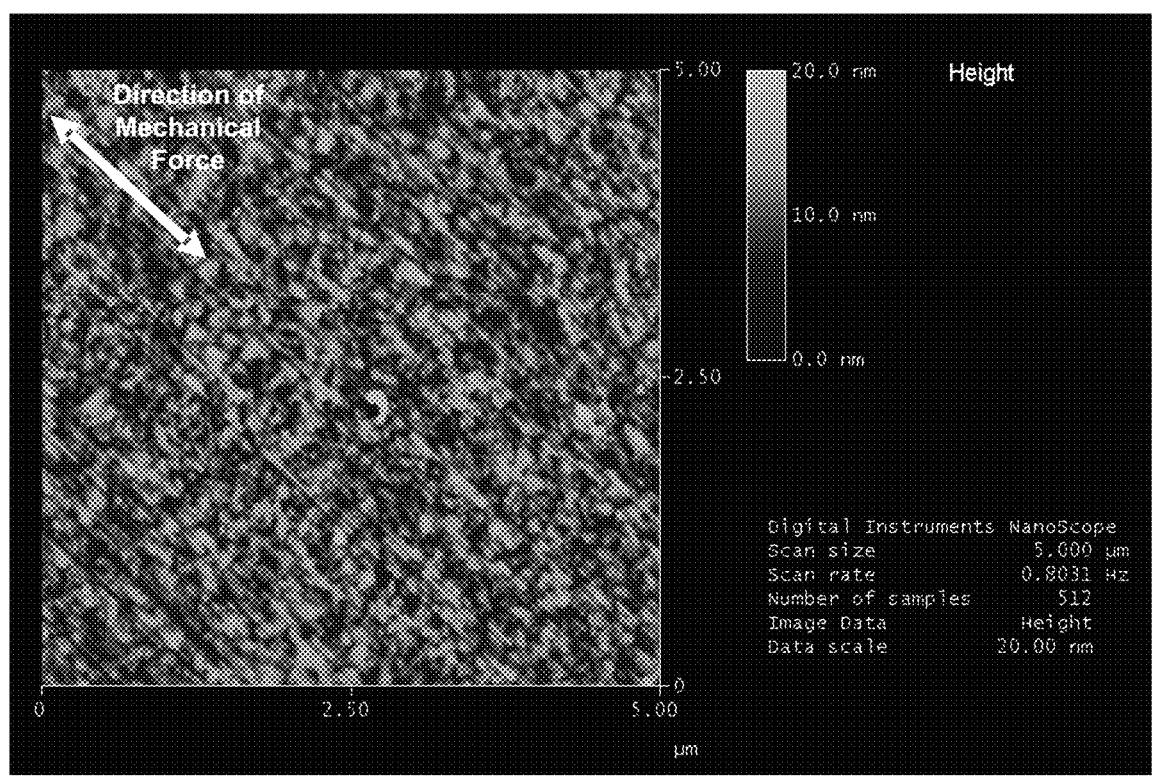
FIG. 38 is an AFM image detailing the rendering of an exemplary nanotube fabric layer into an ordered state via the use of an electronically controlled linear actuator to provide a rubbing force with a stroke length of 0.01 mm.

FIG. 38 is an AFM image 3801 of an exemplary nanotube fabric layer first formed via three spin coating operations of a purified nanotube application solution (as described above) and then rendered into an ordered network of nanotube elements through the application of a rubbing force via an electronically controlled linear actuator. Within the present example, a Newton linear actuator (model no. CMA 12CCCL) was driven with a Newport universal motion controller driver (model no. ESP 300) to translate a silicon wafer back and forth over the surface of the exemplary nanotube fabric layer. Both the actuator and the motion controller driver are available from Newport Corporation of Irvine, Calif., and the use of such equipment is well known to those skilled in the art. The silicon wafer was translated a distance of 0.01 mm with each stroke for a total of one thousand iterations. The assembly also provided a downward force (that is a force pressing the silicon rubbing surface against the nanotube fabric layer) of 28 g. As is evident in FIG. 38, the nanotube fabric layer was rendered into an ordered state oriented along the direction of the applied rubbing force.

EXAMPLE 20

Figure 39A:
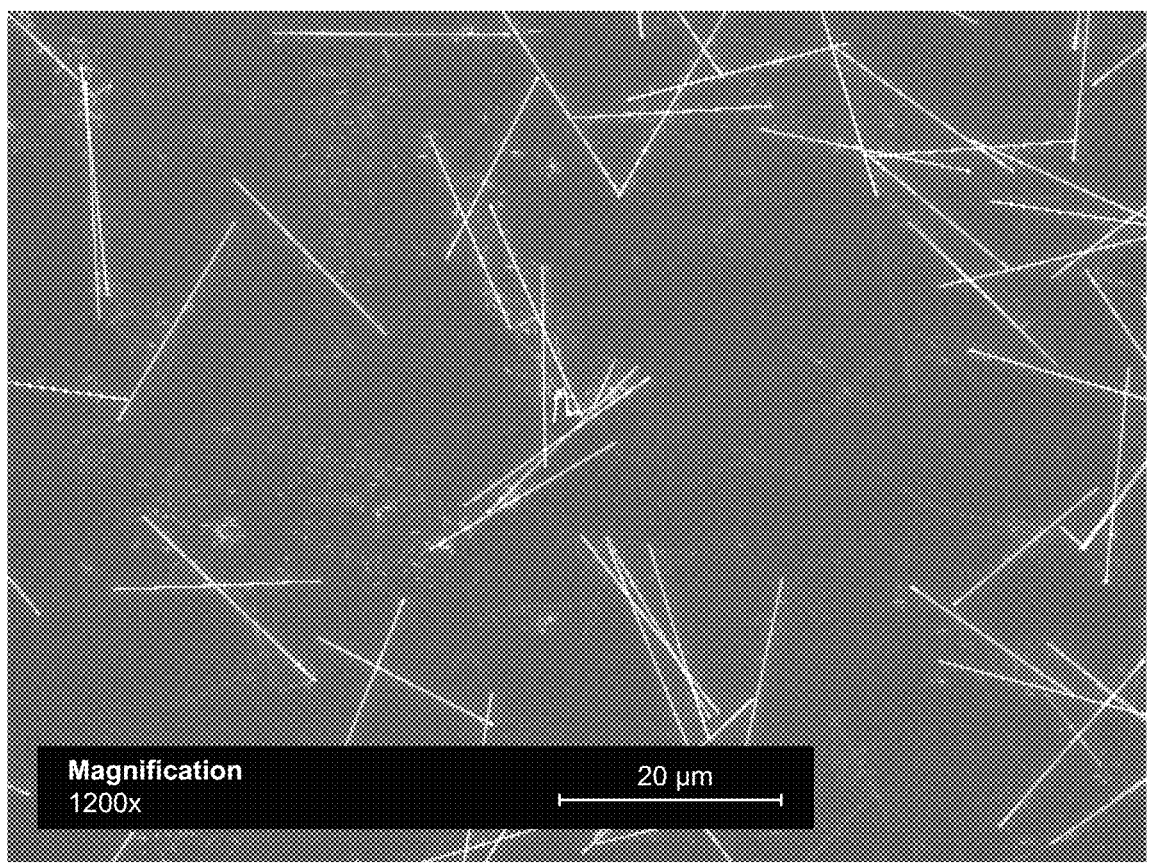
FIGS. 39A-39D are SEM images detailing the rendering of an exemplary nanotube fabric layer coated with a layer of silicon nanowires into an ordered state via the use of a rayon rubbing pad.
Figure 39B:
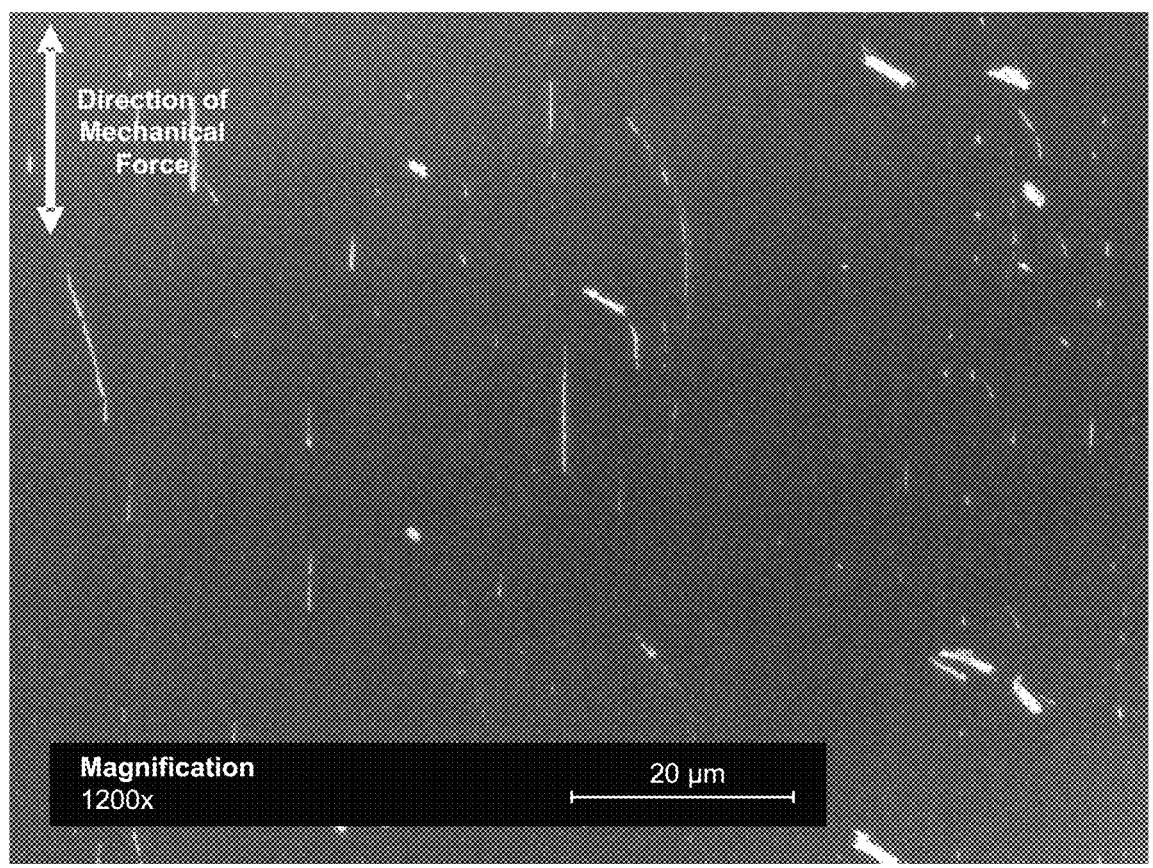
Figure 39C:
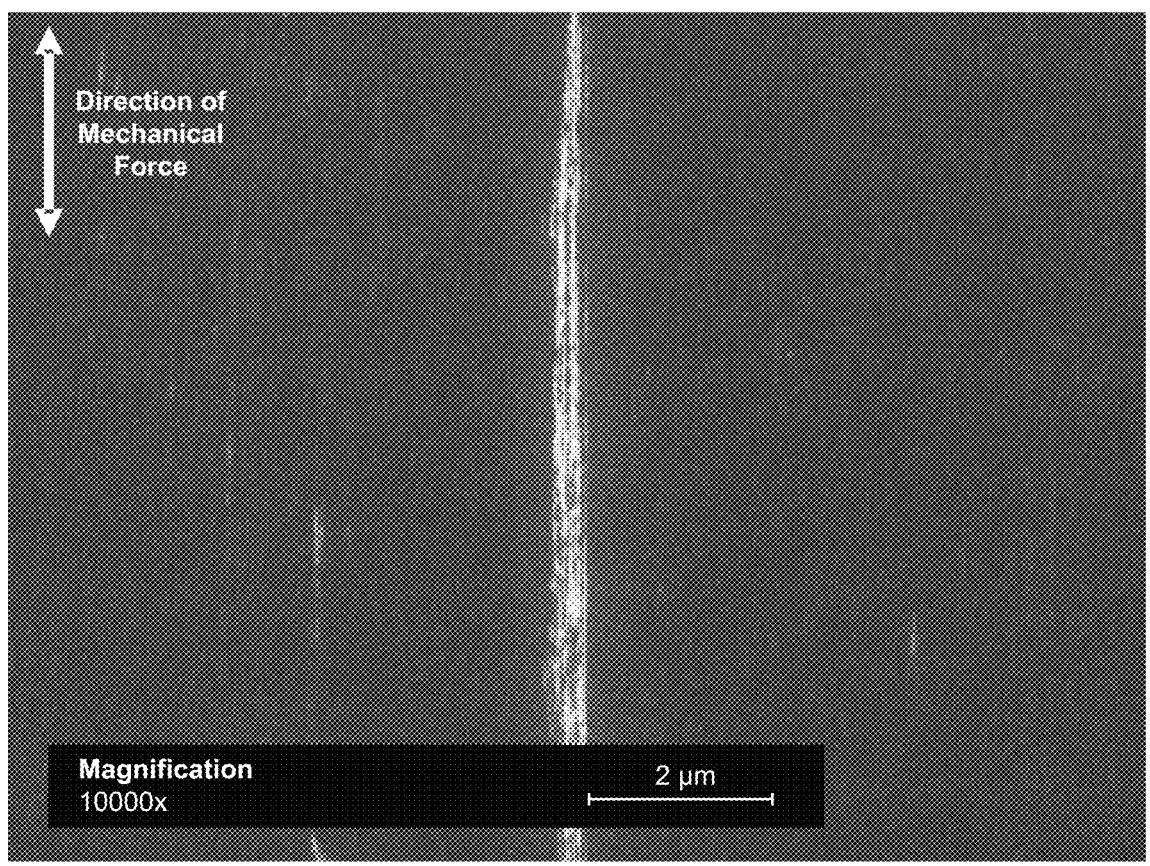
Figure 39D:
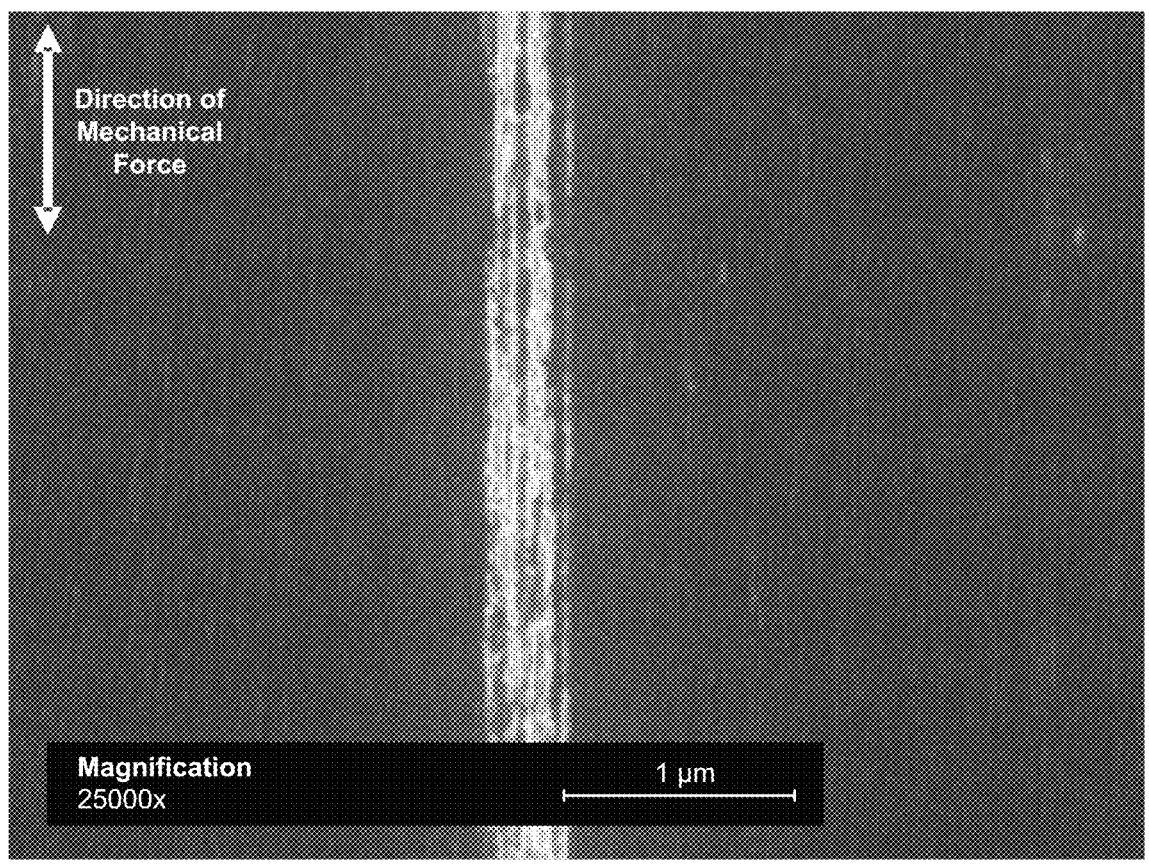

FIGS. 39A-39D are SEM images depicting the formation and subsequent ordering of an exemplary nanotube fabric layer along with an exemplary layer of silicon nanowires. FIG. 39A is an SEM image 3901 of an exemplary nanotube fabric layer first formed via three spin coating operations of a purified nanotube application solution over a silicon wafer (as described above) and then coated with a layer of silicon nanowires. Specifically, monodispersed silicon nanowires (available from Sigma-Aldrich, Inc of St. Louis, Mo., model no. 730866) were applied dropwise to the formed nanotube fabric layer. Thirty drops were applied, with each drop being allowed to air dry before the subsequent drop was applied. After all thirty drops had been applied, the silicon wafer (now coated with the nanotube fabric layer and the layer of silicon nanowires) was baked at 300° C. for two minutes. FIGS. 39B-39D are SEM images of the exemplary nanotube fabric and silicon nanowire layer at different magnifications (3902, 3904, and 3904 respectively) after being rendered into an ordered network of nanotube elements through the application of a directional rubbing force. The rubbing force was applied by placing the wafer face down on a rayon polishing pad (that is, placing the wafer such that the nanotube fabric and silicon nanowire layer was positioned in direct physical contact with the rayon polishing pad) and sliding the wafer approximately four inches along the surface of the pad thirty times. The rayon polishing pad used within this example was a South Bay Technology, Inc. p/PRF12A-10 "rayon-fine polishing cloth." As is evident in FIG. 39C (the 10,000× magnification image), both the nanotube fabric layer and the silicon nanowires were rendered into an ordered state oriented along the direction of the applied rubbing force. The present example demonstrates the generality of the methods of the present disclosure for use in ordering high aspect ratio nanoscopic structures (including, but not limited to, nanotubes and nanowires).

We have described multiple techniques to minimize or substantially eliminate gaps and voids within a nanotube fabric. The techniques also can be said to control the positioning of the nanotubes within the fabric, to control the positions of gaps within the nanotube fabric, and to control the concentration of the nanotubes within the fabric. For example, these techniques can provide low porosity, high density fabrics. Further, the techniques can be described as controlling the gaps of nanotubes within the nanotube fabric. Thus, we have disclosed techniques to create devices sized to and smaller than the current lithography limits (for example, less than or equal to about 20 nm). Low porosity, high density fabrics also can be created by, for example, filling gaps in the nanotube film with additional nanotube elements.

Further, we have described a plurality of methods and apparatus for translating a directional force over a nanotube fabric layer. The selection and use of one or more of these methods in an ordering operation should, in most applications of the methods of the present disclosure, be limited only to such methods and apparatus which do not damage or otherwise ablate the nanotubes within the nanotube fabric layer being operated on.

Further, it should be understood to one of skill in the art that the ordered nanotube fabrics produced by the methods disclosed herein can be used in any device, article or process where a thin, strong, durable film is required for a certain function. For example, the methods of the present disclosure are useful for any application using nanotube fabrics wherein the concentration of the nanotube elements within the fabric or the number or size of gaps within the fabric are required to fit within a preselected tolerance.

Further, the ordered nanotube fabrics produced by the methods disclosed herein possess a range of properties that make them ideal in a variety of applications. These properties include, among others, hydrophobicity, durability, high tensile strength, broad electromagnetic absorbance, high electrical and thermal conduction, low coefficient of friction, directionality, impermeability, and chemical tunability. It will be apparent to those skilled in the art where such properties, or combination of properties, are ideal for a particular application.

Figure 40:
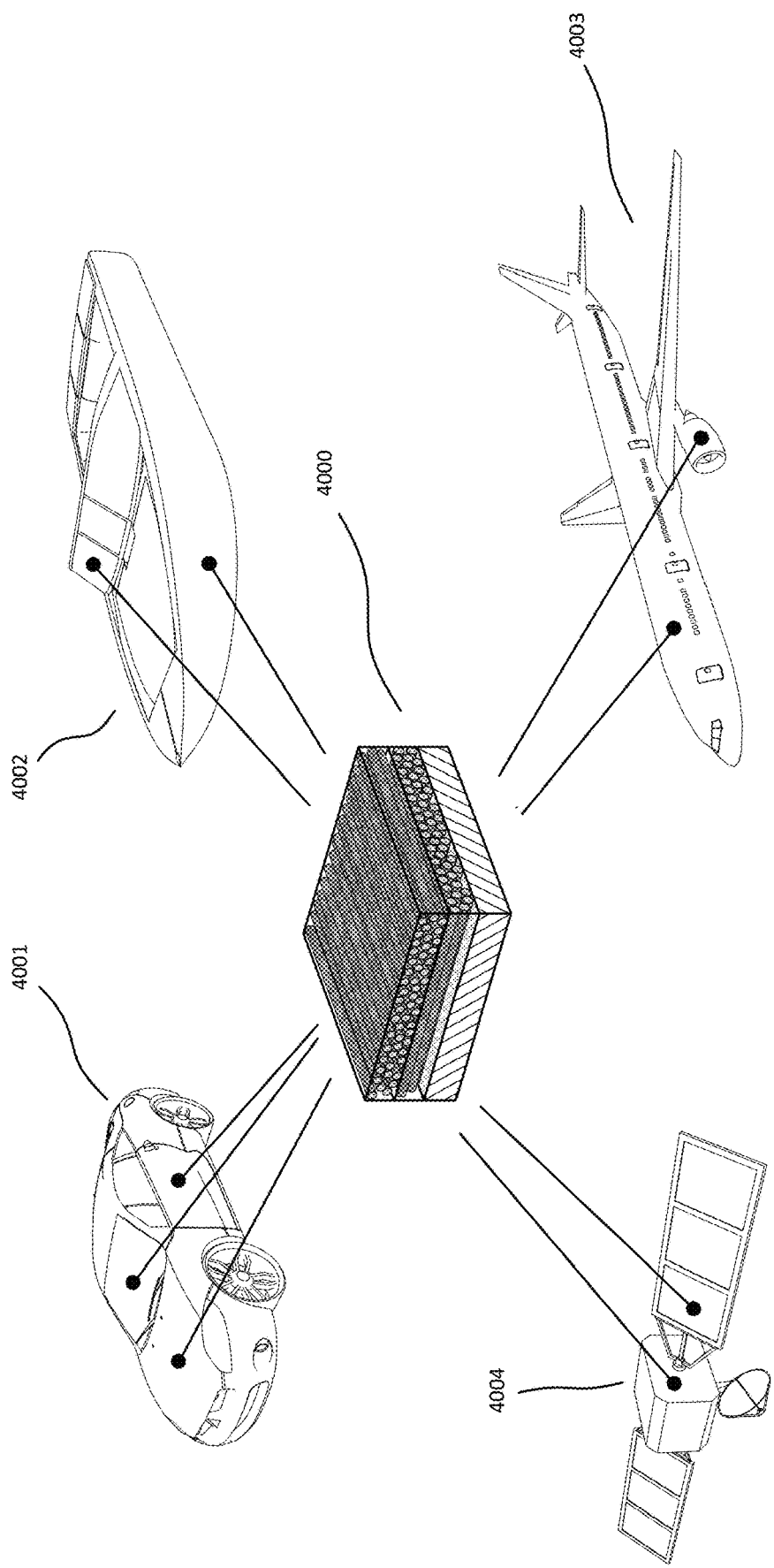
FIG. 40 is a depiction of the applications of ordered nanotube fabrics.

FIG. 40 depicts an ordered nanotube fabric 4000 employed in a range of applications in land 4001, sea 4002, air 4003 and space 4004 vehicles which will be described in further detail below. In these examples, an ordered nanotube fabric can provide a thin, durable coating that possesses the aforementioned properties, such as hydrophobicity, low friction and EM absorbance.

Ordered Nanotube Fabrics for High-Strength Applications

The ordered nanotube fabrics produced by the methods disclosed herein can be used in a variety of applications to take advantage of their mechanical, electromagnetic and chemical properties. These ordered fabrics possess improved density, tensile strength, durability and toughness over unordered fabrics, making them ideal in absorbing high stresses. Additionally, while a single ordered nanotube fabric layer or a thin multi-layer nanotube fabric may be substantially tough and flexible, alternating layers of ordered fabrics arranged in a fabric stack may render the fabric substantially rigid. This phenomenon could be used, for instance, to produce lightweight armor plating with a tailored flexibility and advanced functionality (including radar attenuation, thermal masking, laser absorption and ablation), or enable the use of nanotube fabrics as a structural material for rigid applications such as boat hulls, aircraft fuselages, spacecraft, sports equipment and land vehicles. As used herein, a "nanotube fabric stack" or "stack" may refer to a material comprising multiple ordered nanotube fabric layers, each arranged individually along a selected direction.

Figure 41:
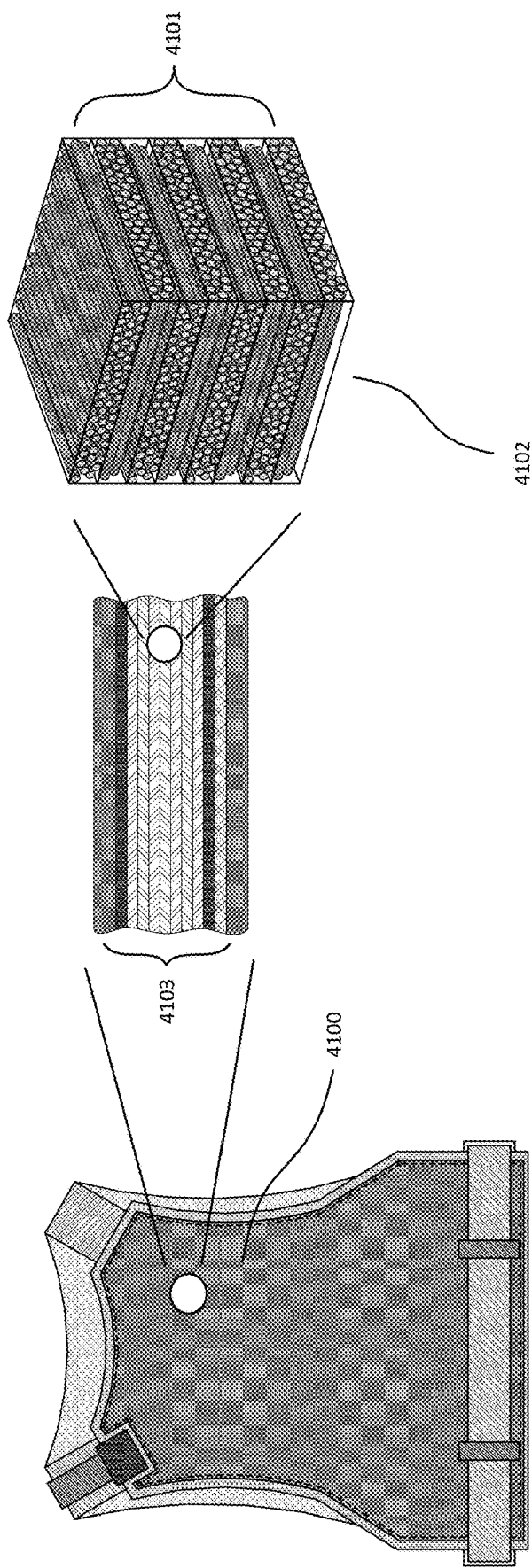
FIG. 41 is a depiction of a nanotube body armor using multiple layers of ordered nanotube fabric.

FIG. 41 depicts an exemplary nanotube body armor 4100, comprising multiple layers of ordered nanotube fabric 4101 assembled in a fabric stack 4102. Each individual nanotube fabric layer within fabric 4101 stack may be arranged orthogonally to adjacent layers, as shown in FIG. 41, or may be ordered at a selected angle with respect to adjacent fabric layers. These ordered nanotube fabric layers may comprise substantially only nanotubes, or may also include crosslinking agents, polymers and nanoscopic particles, which may be either present before or added after rendering the nanotube fabric into an ordered state according to the methods of the present disclosure. Such additives may provide improved mechanical or electrical properties including fracture toughness and tensile strength. Multiple fabric stacks 4103 may be employed with or without intervening material layers, wherein each stack may possess a different ordering pattern to achieve desired mechanical properties. One or multiple nanotube fabric stacks may be employed exclusively, or in combination with traditional armor materials, such as Kevlar, steel, or ceramic plates. When used in such an application, a nanotube fabric stack may provide lightweight protection from kinetic and electromagnetic penetration.

Further, a nanotube body armor which comprises multiple nanotube fabric stacks may possess advanced functionality, including thermal masking and laser absorption and ablation. That is, one or multiple nanotube fabric stacks within the armor may be designed to dissipate kinetic energy from a projectile, thereby providing protective functionality, while additional stacks may be designed to absorb thermal radiation (thereby masking the wearer from thermal imaging) or absorb specific wavelengths of light (including in the microwave range), as will be described later.

Figure 42:
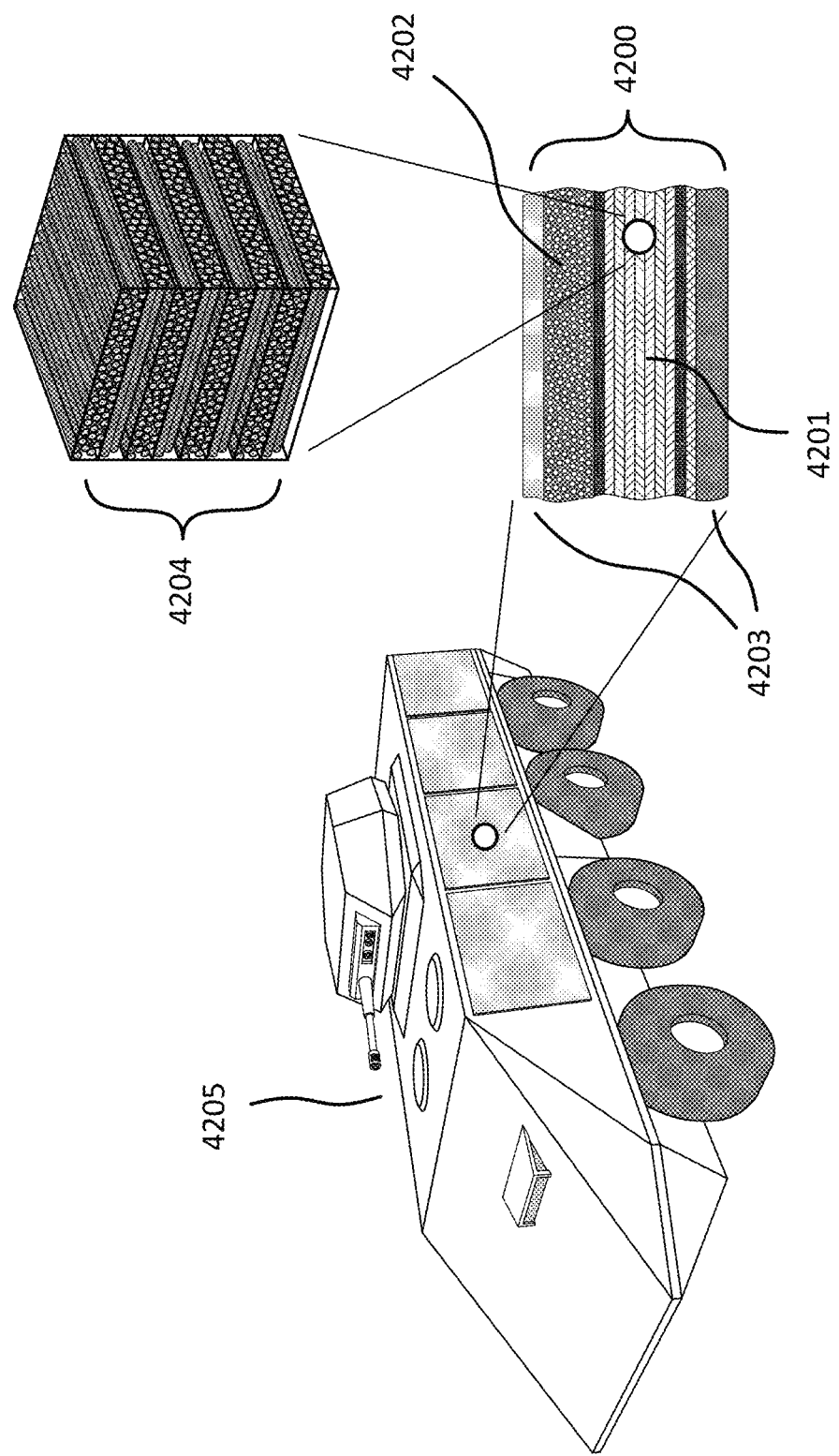
FIG. 42 is a depiction of a composite armor plate using an ordered nanotube fabric stack.

FIG. 42 shows a composite armor plate 4200 comprising at least one ordered nanotube fabric stack 4201. Composite armor plates utilize multiple material layers to optimize the deflection of kinetic ordinance, the absorption and dissipation of kinetic energy, and resistance to shaped charge penetration. Typically, composite armor comprises a layer of a hard ceramic 4202 such as boron nitride, silicon carbide, alumina, aluminum nitride or titanium boride between layers of steel 4203. The high hardness of the ceramic material can shatter kinetic ordinance, significantly reducing the chance of penetration. The high hardness also makes the ceramic brittle, leading to fracture upon impact which reduces its ability to absorb multiple attacks. For this reason, the ceramic material is typically employed in the form of tiles or pellets suspended in a matrix, so that the failure of a single ceramic element does not affect the overall integrity of the armor plate. This brittle fracture, however, also provides protection from shaped charge penetration, as the cracks formed as a result of impact propagate randomly between defects. This can disrupt the geometry of the molten jet produced by a shaped charge and minimize its effectiveness.

In such applications, one or multiple nanotube fabric stacks may provide a lightweight compliment to existing composite armors. As discussed previously with respect to the body armor of FIG. 41, a nanotube fabric stack may be produced by combining multiple layers of ordered nanotube fabric 4204 according to the methods of the present disclosure. These ordered nanotube fabric layers may comprise substantially only nanotubes, or may also include crosslinking agents, polymers and nanoscopic particles, which may be either present before or added after rendering the nanotube fabric into an ordered state according to the methods of the present disclosure. Such additives may provide improved mechanical or electrical properties including fracture toughness and tensile strength. Multiple fabric stacks may be employed with or without intervening material layers, wherein each stack may possess a different ordering pattern and additives to achieve desired properties. When used in such an application, a nanotube fabric stack may provide lightweight protection from kinetic, shaped charge, and electromagnetic penetration for vehicles 4205 and structures.

Without being bound by theory, the high thermal and electrical conductivity of ordered nanotube fabric layers may improve heat dissipation across an armor plate and thus provide a degree of electromagnetic and thermal shielding. Additionally, carbon nanotube fabrics retain their mechanical properties at high temperature without degradation, unlike Kevlar for instance. Multiple nanotube fabric stacks may be engineered to fill certain roles within a composite armor plate. For example, one stack may be assembled with alternating orthogonal nanotube fabric layers to resist kinetic penetration while another stack may be assembled with a patterned structure designed to absorb certain wavelengths of light, and still another may be designed to quickly dissipate thermal energy. Additives such as crosslinking agents, polymers and nanoscopic particles may improve the performance of an ordered nanotube stack in certain applications. As will be described in further detail later, an ordered nanotube fabric coating on the external surface of a composite armor plate may provide benefits such as hydrophobicity, corrosion resistance, radar attenuation and low coefficient of friction, which may be particularly ideal for applications such as boat hulls and aircraft fuselages. In this way, a composite armor plate may be constructed with one or multiple specialized ordered nanotube fabric stacks to provide protection from a variety of threats.

While described with respect to armor plating applications, substantially rigid nanotube fabric stacks, such as 4204 in FIG. 42, may be used in a variety of applications wherein a substantially strong, rigid and lightweight material is desired, in addition to the other properties described herein. As mentioned previously and will be discussed in more detail later, these applications may include boat hulls, aircraft fuselages, spacecraft, sports equipment and components for land vehicles, as well as packaging material (e.g.

for boxes, bags, wrappers, and bottles) and structural components of electronics (e.g. computer cases, smartphone cases, and server housing). Further applications may take advantage of the flexibility of single-layer or thin multi-layer ordered nanotube fabrics, such as flexible displays and packaging. Other applications of both rigid and flexible ordered nanotube fabric stacks may be apparent to the skilled in the art.

Ordered Nanotube Fabrics for Electromagnetic Applications

The ordered nanotube fabrics produced by the methods of the present disclosure may interact with electromagnetic (EM) fields and radiation in a variety of ways which may prove useful in certain applications. For instance, an ordered nanotube fabric may be used as a polarizing filter.

Figure 43A:
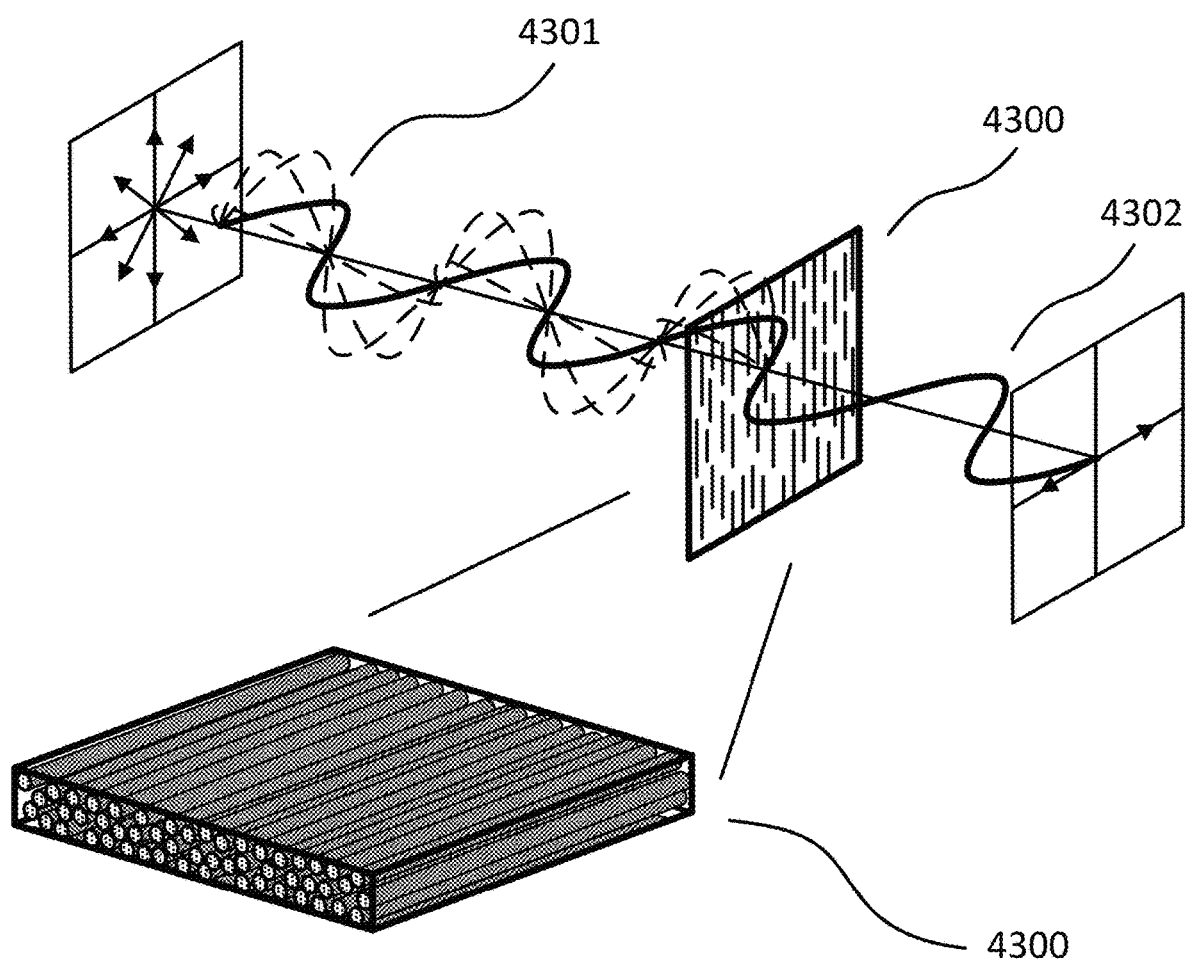
FIG. 43A is an illustration of the polarization of light passing through an ordered nanotube fabric.
Figure 43B:
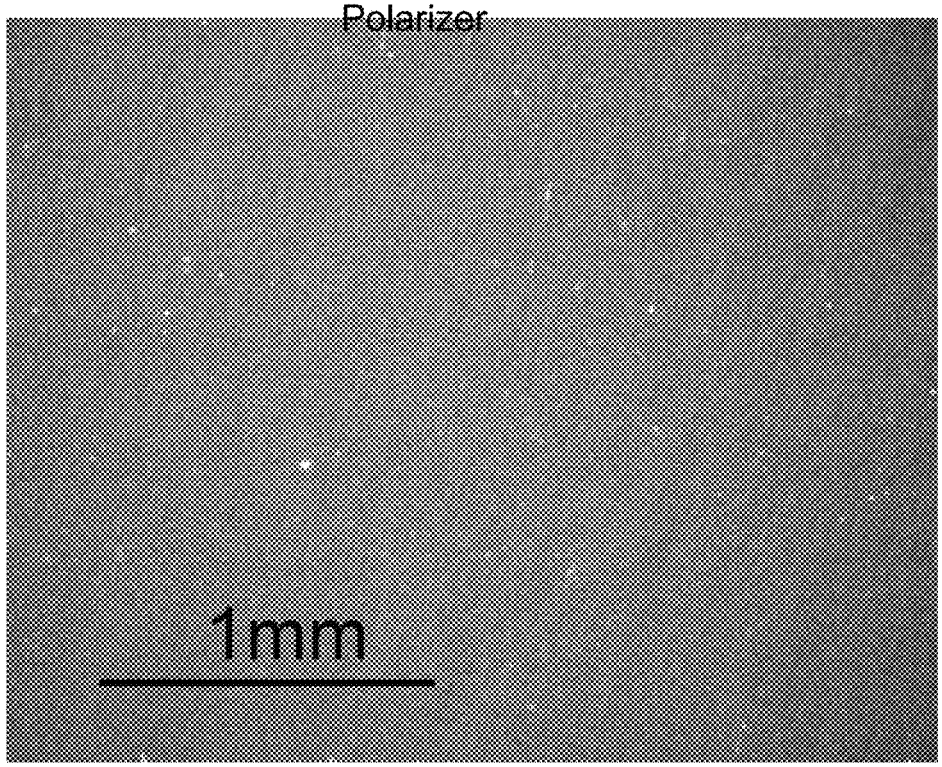
FIG. 43B is an image of light reflected from an ordered nanotube fabric without a polarizing filter.
Figure 43C:
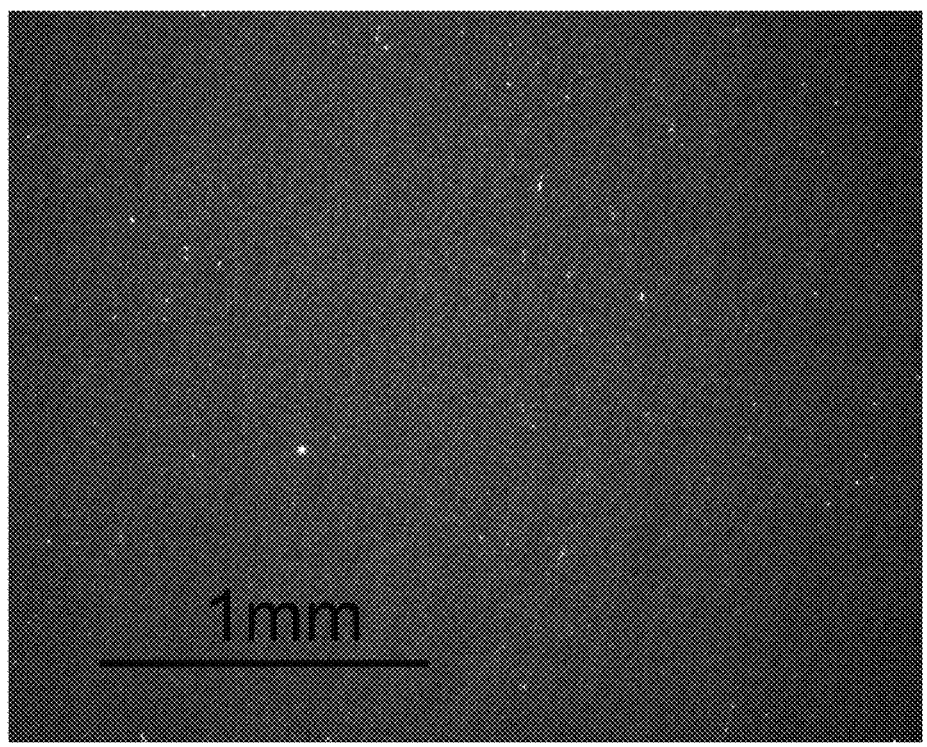
FIG. 43C is an image of light reflected from an ordered nanotube fabric with a polarizing filter.

FIG. 43A illustrates the polarization of light passing through an ordered nanotube fabric 4300. Generally, an incident, unpolarized light wave 4301 may be polarized along a plane perpendicular to the ordering direction when passing through an ordered nanotube fabric 4300. The transmitted wave 4302 may be substantially fully polarized, or may be only partially polarized along the plane perpendicular to the direction of ordering. Comparison of the intensity of light reflected from an ordered nanotube fabric, shown in FIG. 43B, and the intensity of light reflected when passed through a polarizing filter, shown in FIG. 43C, demonstrates the partial polarization of light incident on an ordered nanotube fabric. The thickness of the ordered nanotube fabric layer 4300 may affect the degree of polarization as well as the intensity of transmitted light. Thus, a thicker fabric may substantially polarize incident light while also reducing the intensity of transmitted wave 4302. Correspondingly a thinner fabric may only polarize an incident light wave 4301 to a small degree, but may transmit the wave at a higher intensity. The polarizability of ordered nanotube fabric layer 4300 may be a function of the wavelength of incident light 4301. In certain applications, ordered nanotube fabric layer 4300 may comprise substantially only nanotubes, or may additionally comprise polymers, binders or nanoscopic particles. The addition of these components may affect the polarizability and transmittance of the ordered nanotube fabric at certain wavelengths.

Figure 44:
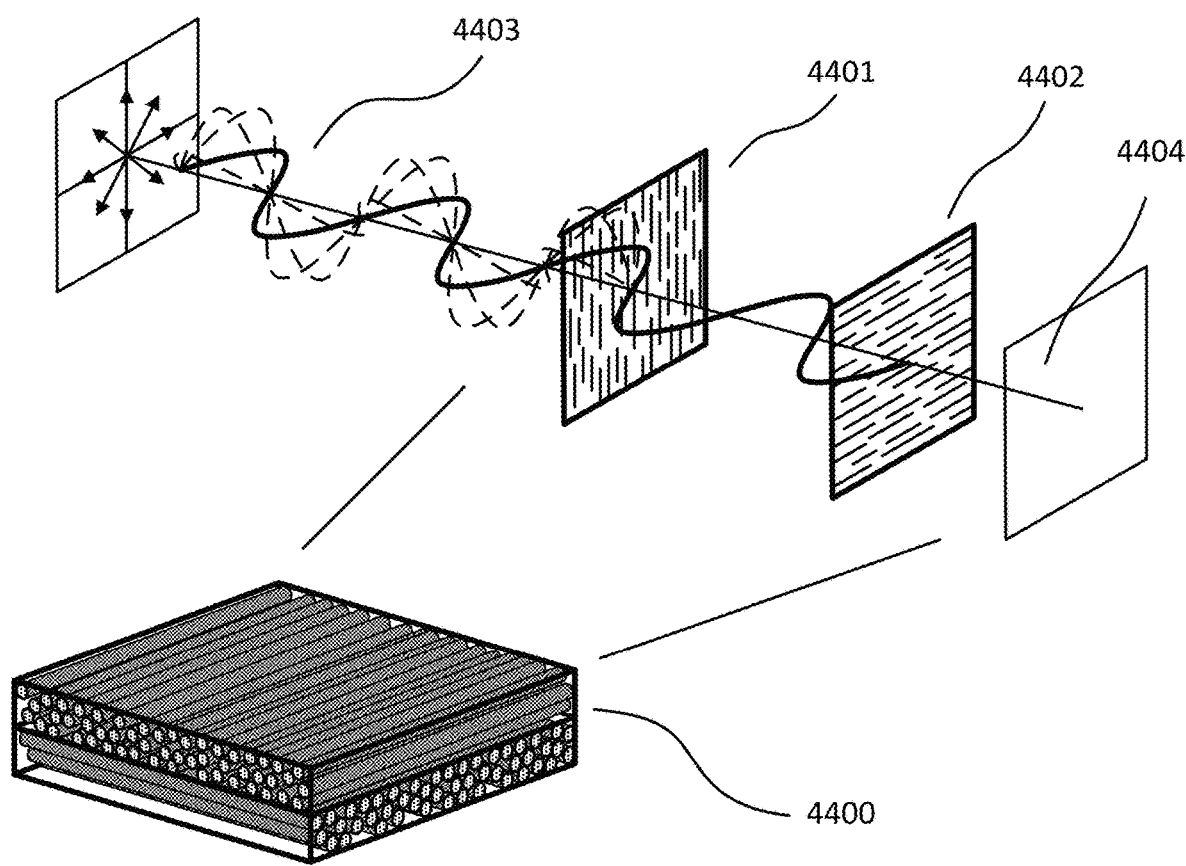
FIG. 44 is an illustration of the attenuation of an incident light wave on a stack of two ordered nanotube fabric layers, wherein the layers are arranged orthogonally relative to each other.

Multiple ordered nanotube fabric layers may be assembled in a stack to tune both the transmittance and polarization of an incident light wave. As illustrated in FIG. 44, a nanotube fabric stack 4400 may formed from two nanotube fabric layers 4401 and 4402 of selected thickness, ordered orthogonally to each other. Incident light waves 4403 may be substantially polarized by the first layer 4401 and subsequently absorbed by the second ordered layer 4402. A plurality of layers may be stacked and ordered orthogonally, or at selected angles relative to adjacent layers. In this way, one or multiple nanotube fabric layers ordered substantially in a single direction may be used to produce a thin, durable polarizing filter or coating as shown in FIG. 43A, while multiple ordered fabric layers arranged at selected angles may be used to produce a thin, highly absorbent material layer as shown in FIG. 44. In particular, the methods taught herein may be ideal for large scale production of such absorbent layers and polarizing filters. As will be described in more detail below, in certain applications an ordered nanotube fabric layer or stack tailored for EM absorbance may be produced directly on a surface of arbitrary shape according to the methods of the present disclosure.

As a result of their EM absorbent behavior, the ordered nanotube fabrics produced by the methods disclosed herein may be used as a radiation absorbing material (RAM). The broad electromagnetic absorption spectrum and mechanical properties of nanotubes makes them ideal in applications where a thin, conformal and highly durable RAM coating is desired, for instance, as a stealth coating for military vehicles and aircraft.

Figure 45:
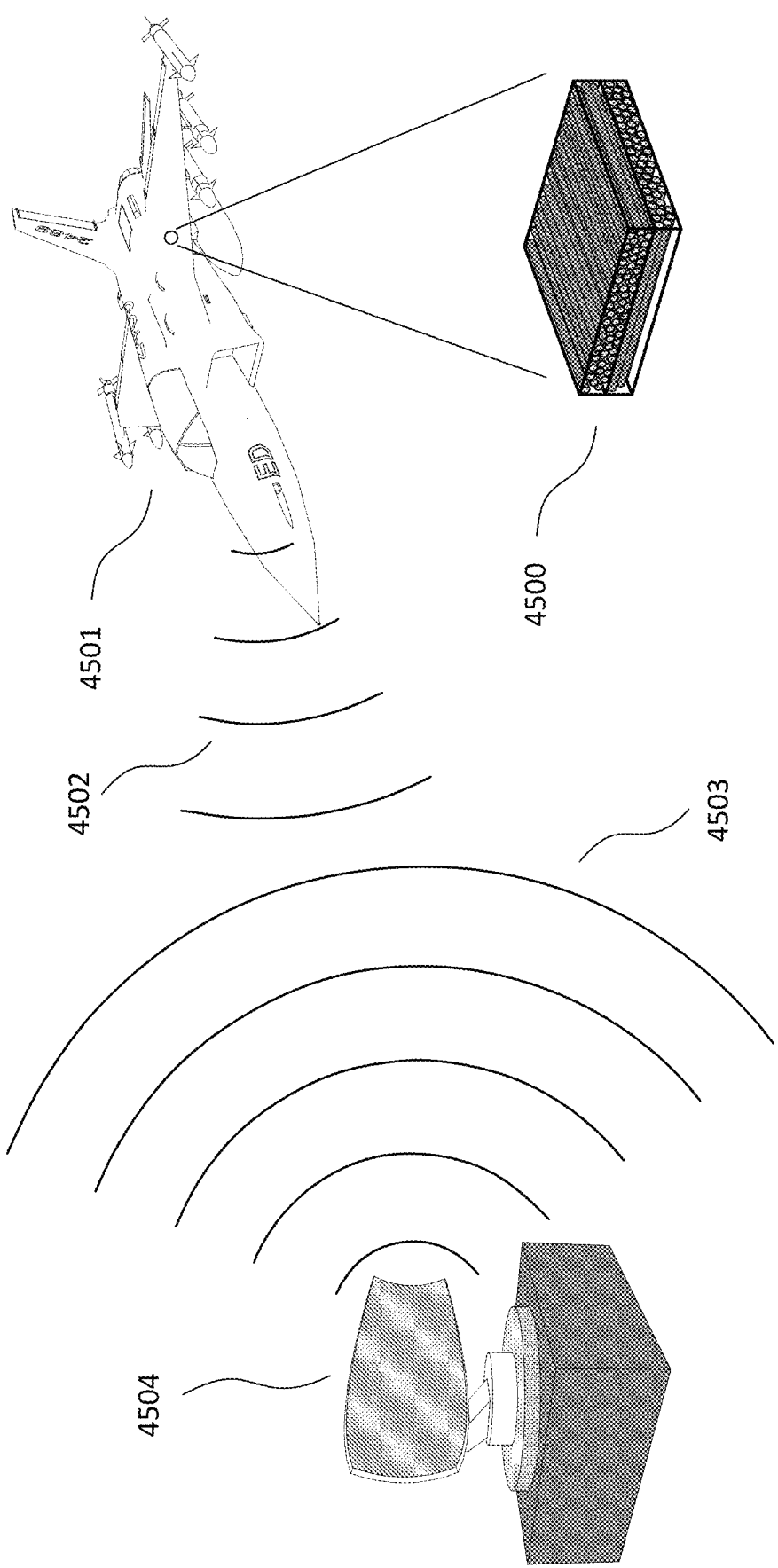
FIG. 45 is an illustration of an ordered nanotube fabric stack applied to the surface of a fighter jet.

FIG. 45 depicts an ordered nanotube fabric stack 4500, similar to that illustrated in FIG. 44, applied to the surface of a fighter jet 4501. Ordered nanotube fabric stack 4500 may comprise multiple nanotube fabric layers ordered along different directions to improve the optical density of the fabric stack. Since each ordered layer may polarize transmitted light to some degree, nanotube fabric layers arranged orthogonally or at a selected angle relative to each other may improve the optical absorbance of stack 4500. The thickness of individual layers, the number of layers, and orientation of individual layers in fabric stack 4500 may be selected to achieve a desired absorbance at certain wavelengths. Additionally, each individual layer may be selectively doped with photoactive particles, electron donors, or electron acceptors to engineer the photoactivity of the coating. When an object, such as fighter jet 4501, is coated with ordered nanotube fabric stack 4500, the intensity of a reflected light wave 4502 may be significantly diminished from the incident light wave 4503, which may be, for instance, a microwave emitted from radar installation 4504. This may result in a significantly reduced radar signature. In this way, a highly durable EM-absorbent coating may be produced which is ideal for stealth applications, or any applications where such a tunable EM-absorbent coating would be desirable. These applications may include, for instance, stealth coatings for aircraft, watercraft and land vehicles, an infrared-absorbing coating for clothing and body armor, and radiation shielding for satellites, electronics, and reactors.

For example, an aircraft, such as fighter jet 4500, or airliner 4004 in FIG. 40, may be coated with a nanotube solution to form a nanotube fabric layer. This nanotube solution may comprise substantially only nanotubes dispersed in a solvent, or may additionally comprise additives such as surfactants, binders, polymers and photoactive particles. The nanotube fabric layer may then be ordered according to the methods of the present disclosure to improve its durability and density by, for instance, brushing the surface, polishing the surface, or blasting the surface with abrasives, polymer beads, or cryogenic particles (such as dry ice). Finally, the ordered nanotube fabric layer may be annealed to relieve internal stresses in the ordered fabric. This process may be repeated to form multiple layers of nanotube fabric, either of the same or differing composition, and ordered either in substantially the same direction, in an alternating orthogonal pattern, or at selected angles to adjacent layers. In this way, a stack of ordered nanotube layers may be produced on an arbitrary surface which conforms to the underlying material layer and provides a tailored EM absorbance.

The ordered nanotube fabrics produced by the methods disclosed herein may also be useful as a conductive layer. The extremely high electrical conductivity along the length of carbon nanotubes may be employed to realize highly conductive interconnects for circuit board applications. Additionally, when used in this manner, nanotubes may have a substantial resistance to electromigration unlike traditional metallic interconnects such as gold, silver, or copper which may enable the production of smaller scale electronic devices.

FIGS. 46A-D depict exemplary circuit interconnects formed with an ordered nanotube fabric disposed between two electrodes. As will be discussed below with reference to FIGS. 47A-C, the methods of the present disclosure may be ideal for the production of such ordered nanotube fabric interconnects, enabling large scale production of nanotube fabric-based circuitry. Additionally, a circuit formed in this way may be adjustable. That is, an ordered nanotube fabric interconnect between two electrodes may be rearranged by the methods of the present disclosure in order to break the connection, or to form a connection between two previously disconnected electrodes.

Figure 46A:
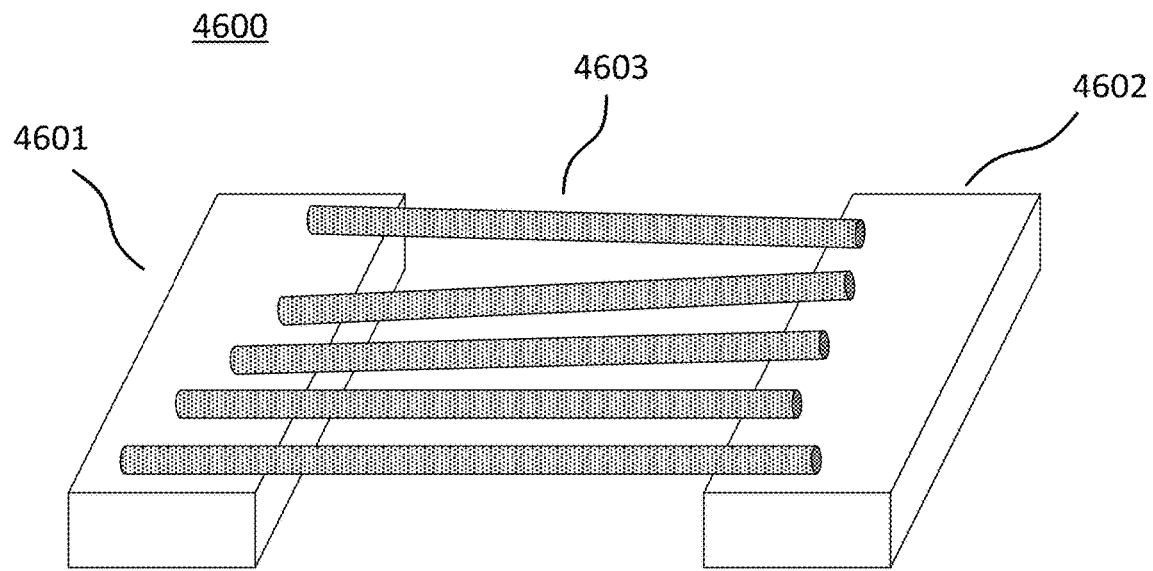
FIG. 46A is an illustration of a circuit interconnect formed by an ordered nanotube fabric layer, wherein the distance between electrodes is smaller than the average length of the nanotubes.

FIG. 46A shows a single-nanotube interconnect 4600 wherein the spacing between electrodes 4601 and 4602 is smaller than the average length of the nanotubes 4603 in the ordered fabric layer. The nanotube fabric layer may be comprised of substantially only nanotubes, or may additionally comprise polymers, organic molecules or nanoscopic particles. Without being bound by theory, conduction along a single nanotube may exhibit ballistic transport, leading to nearly or substantially zero resistance. While electron transport between the nanotube and the contact may introduce resistance, the overall resistance experienced between the electrodes may be substantially small. Additionally, as described previously, interconnect 4600 may be substantially resistant to electromigration. In this way, a low resistance interconnect may be established between two electrodes.

Figure 46B:
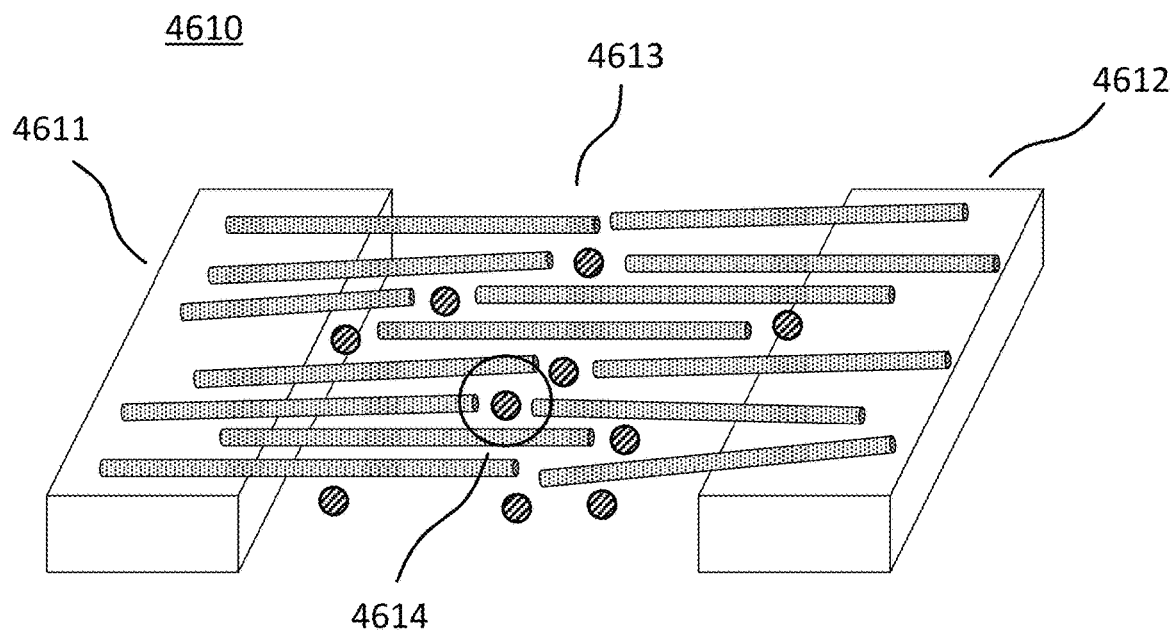
FIG. 46B is an illustration of a circuit interconnect formed by an ordered nanotube fabric layer with conductive additives, wherein the distance between electrodes is larger than the average length of the nanotubes.

FIG. 46B shows an ordered nanotube fabric interconnect 4610 wherein the spacing between electrodes 4611 and 4612 is larger than the average length of the nanotubes 4613 in the ordered fabric layer. While individual nanotubes may exhibit ballistic conduction along their length, transport across gaps between nanotubes, as well as between nanotubes and the contacts, may substantially increase the effective resistance experienced between the electrodes. Thus, to improve the conduction between nanotubes, the ordered nanotube fabric layer may additionally comprise conductive additives 4614, such as conductive polymers, cross-linking agents and particles.

Figure 46C:
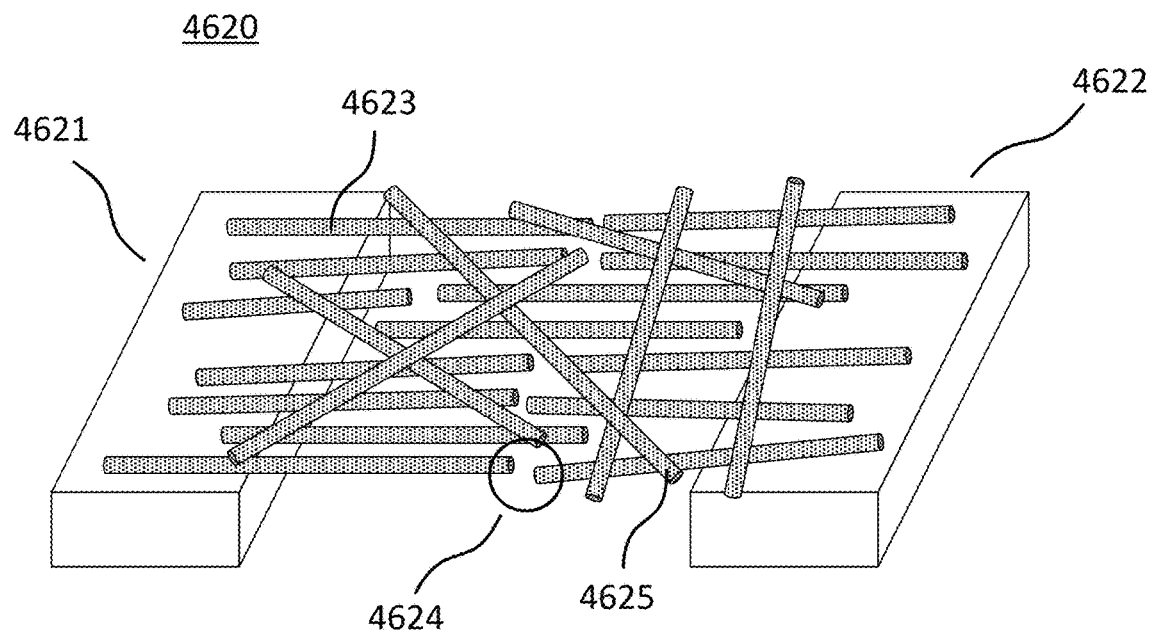
FIG. 46C is an illustration of a circuit interconnect formed by a two-layer nanotube fabric, wherein the bottom layer is ordered in the direction of the interconnect and the top layer is unordered.

FIG. 46C shows an ordered nanotube fabric interconnect 4620 wherein the spacing between electrodes 4621 and 4622 is larger than the average length of the nanotubes 4623 in the ordered fabric layer. Ordered nanotube interconnect 4620 overcomes the low conductivity across gaps 4624 between ordered nanotubes 4623 through the addition of an unordered nanotube fabric layer 4625 over the ordered nanotube layer 4623. Unordered nanotube fabric layer 4625 provides highly conductive pathways between the channel nanotubes 4623, significantly improving the conductivity between electrodes 4621 and 4622. Thus, a highly conductive interconnect may be formed between two electrodes by the methods of the present disclosure, even when the electrode spacing is greater than the length of the individual nanotubes within the ordered fabric layer.

Figure 46D:
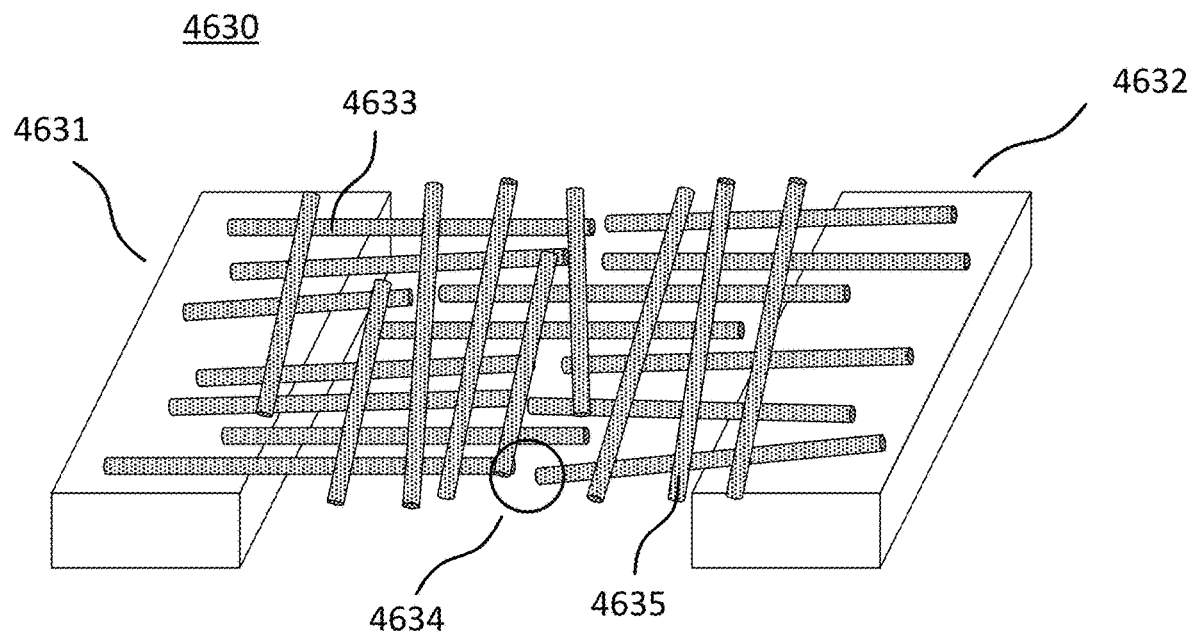
FIG. 46D is an illustration of a circuit interconnect formed by a two-layer nanotube fabric, wherein the bottom layer is ordered in the direction of the interconnect and the top layer is ordered along a perpendicular direction.

Similarly, FIG. 46D depicts an ordered nanotube fabric interconnect 4630 formed between electrodes 4631 and 4632 when the spacing between the electrodes is greater than the average length of nanotubes 4633. In this case, low conductivity across gaps 4634 is overcome by the addition of a second ordered nanotube fabric layer 4635 disposed over ordered nanotubes 4633. This second ordered nanotube fabric layer may be arranged orthogonally with respect to nanotubes 4633, or may be arranged at a selected angle relative to nanotubes 4633. The addition of this second nanotube fabric layer provides highly conductive pathways between nanotubes 4633 which may significantly reduce the resistance between the electrodes. In this way, the methods of the present disclosure may be used to produce a highly conductive interconnect between electrodes.

Figure 47A:
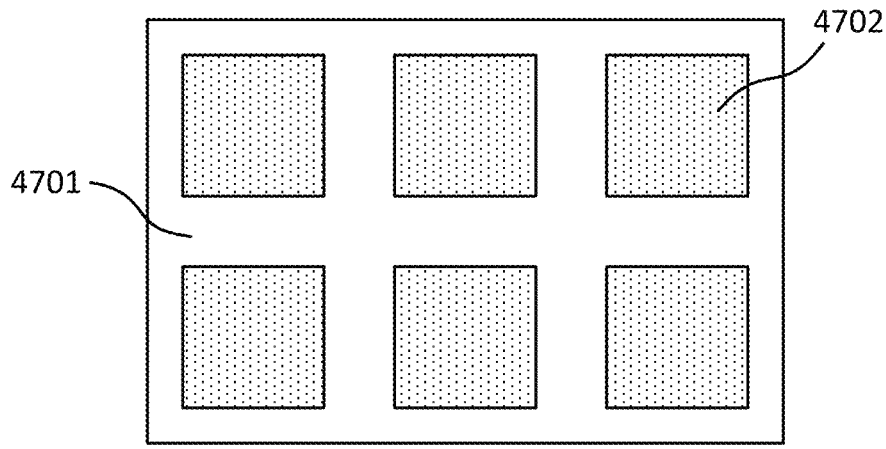
FIG. 47A depicts a circuit board with a multitude of electrodes on a substrate.
Figure 47B:
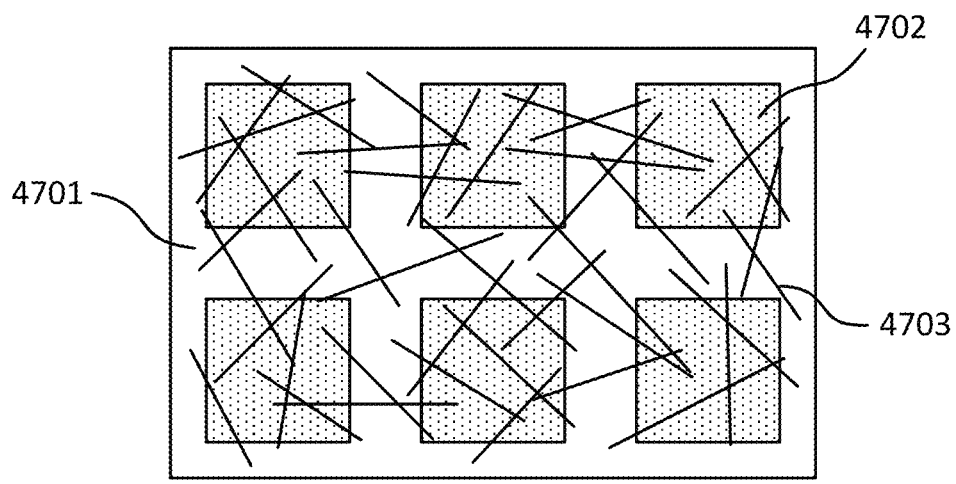
FIG. 47B depicts the deposition of a layer of nanotubes onto the surface of a circuit board to form an unordered nanotube fabric layer.
Figure 47C:
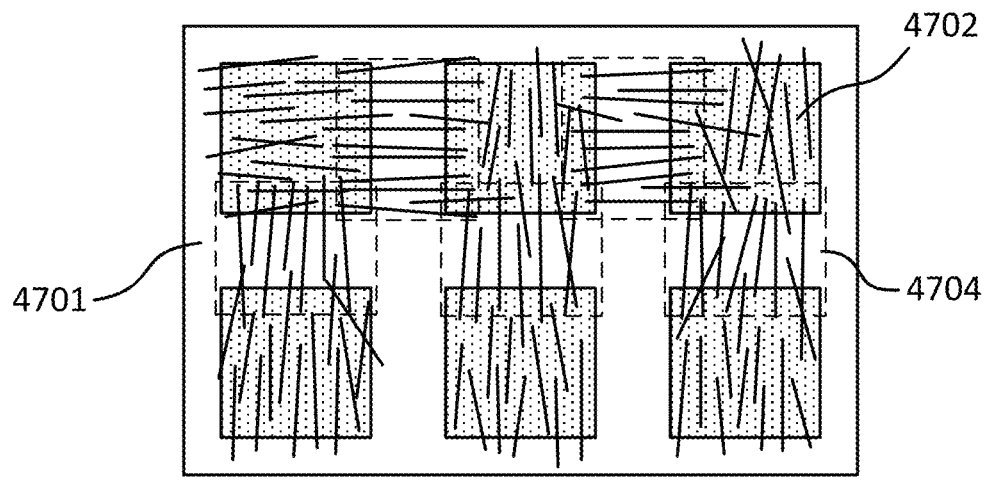
FIG. 47C depicts the selective ordering of an unordered nanotube fabric layer to form ordered regions between selected electrodes.

FIGS. 47A-C demonstrate the production of ordered nanotube fabric interconnects between electrodes on a circuit board using the methods of the present disclosure. Although illustrated using single-nanotube interconnects, such as shown in FIG. 46A, the methods may similarly be employed to form a variety of ordered nanotube fabric interconnects, including those shown in FIGS. 46B-D.

In a first step, shown in FIG. 47A, a circuit board 4700 is provided, comprising a multitude of electrodes 4701 on substrate 4702. Next, a layer of nanotubes 4703 is deposited over the surface to form an unordered nanotube fabric layer, as shown in FIG. 45B. Finally, the unordered nanotube fabric may be selectively arranged to form ordered regions 4704 between selected electrodes according to the methods disclosed herein, as depicted in FIG. 45C. Ordered regions 4704 form conductive channels between selected electrodes. Due to the small scale of circuit interconnects, the use of piezoelectrics, as described previously, may be ideal for the arrangement of nanotube layer 4703. Piezoelectric material may be patterned on a surface to form a template corresponding to a desired interconnect pattern. When placed in contact with nanotube layer 4703 and activated, the piezoelectric material may impart the desired ordering pattern onto nanotube layer 4703 in a highly scalable and reproducible way. Optionally, unwanted regions of nanotube fabric may be removed by, for instance, etching between the electrodes. In this way, the methods of the present disclosure may be used to form the interconnects on a circuit board, or, more generally, to provide an electrical connection between desired regions using an ordered nanotube fabric layer.

Ordered Nanotube Fabrics for Hydrophobic Applications

The ordered nanotube fabrics produced by the methods of the present disclosure possess a high degree of hydrophobicity, and may be superhydrophobic. In combination with their high mechanical durability, thermal and chemical stability, and variety of application methods, these ordered nanotube fabrics are well suited for use as hydrophobic coatings.

Figure 48A:
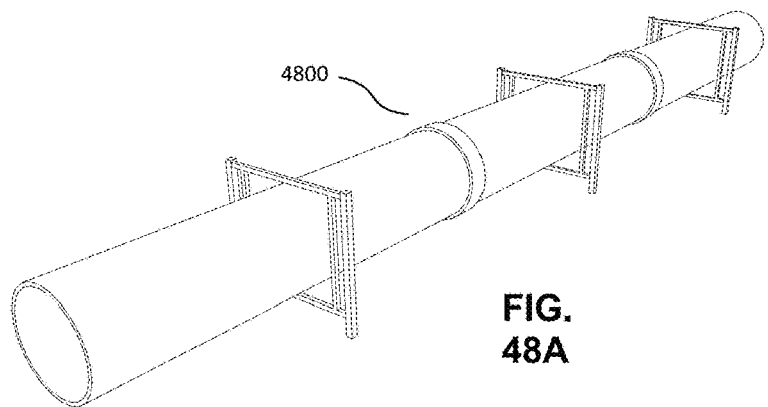
FIG. 48A depicts a pipeline.

FIG. 48A-D depicts the use of an ordered nanotube fabric to improve the flow rate of liquid through pipeline 4800, shown in FIG. 48A. The hydrophobicity of an ordered nanotube fabric may reduce the drag experienced between a liquid flowing through a pipe and the walls of the pipe. Traditional superhydrophobic materials rely on the entrapment of air bubbles in micro-patterned surface features. These air bubbles provide a low friction surface on which a liquid may flow. When subjected to a continuous flow of liquid, however, these air bubbles may dissolve and the material loses its super-hydrophobicity and any beneficial effect on liquid flow rate and energy consumption.

Without being bound by theory, an ordered nanotube fabric may provide superhydrophobicity without requiring the presence of air pockets. In such cases, the surface of the nanotubes themselves may provide the superhydrophobicity as a result of their surface modification and nanoscopic patterning. In this way, an ordered nanotube fabric layer may provide a coating which remains superhydrophobic while in sustained contact with a liquid.

As shown in FIG. 48A-D, such a coating may be used to reduce frictional energy loss during fluid transport through fluid control mechanisms. This may increase the maximum flow rate—particularly for non-Newtonian, shear-thickening fluids—reduce energy consumption for pumps, and reduce the possibility of blockages and build-up on pipe surfaces. Additionally, an ordered nanotube fabric layer may protect an underlying material, such as a pipe wall, from corrosion while also preventing the leeching of metals into the liquid.

It should be noted that for the purposes of the present disclosure, a fluid control mechanism refers to a device used to contain, control and direct the flow of a fluid, such as pipes, pipelines, valves, pumps, channels and storage vessels.

Figure 48B:
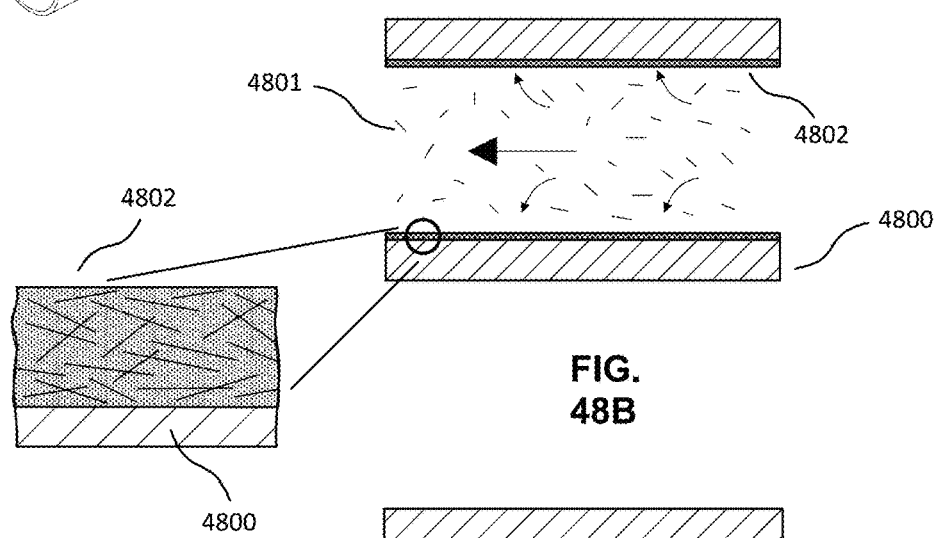
FIG. 48B illustrates the formation of an unordered nanotube fabric layer on the interior of a pipe by flowing a nanotube solution through the pipe.
Figure 48C:
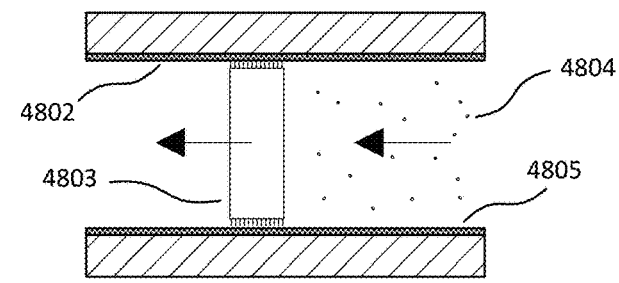
FIG. 48C illustrates a method of rendering an unordered nanotube fabric coating on the interior of a pipe into an ordered nanotube fabric layer.
Figure 48D:
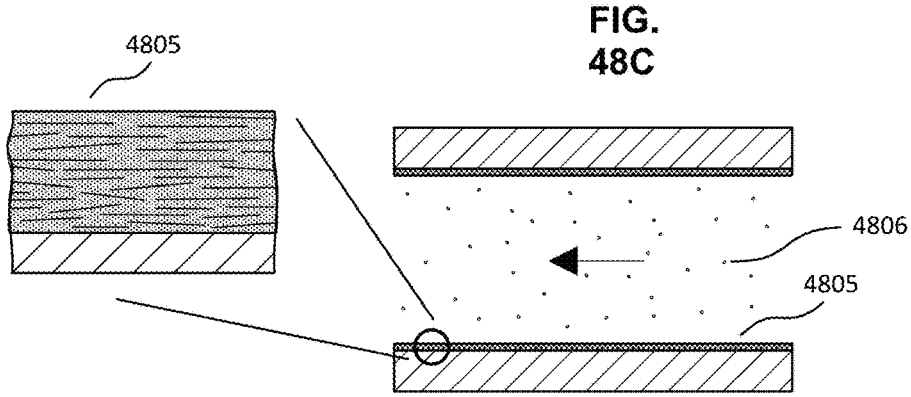
FIG. 48D illustrates the flow of a fluid through a pipe coated with a layer of ordered nanotube fabric.

FIG. 48B-D shows an exemplary method for the application of an ordered nanotube fabric layer to the interior of a pipe. In a first step, illustrated in FIG. 48B, a nanotube solution 4801 is flowed through pipe 4800. This nanotube solution may be composed primarily of nanotubes dispersed in a solvent, or may also include additives such as binders to improve adhesion to the pipe walls and cohesion of the nanotubes within the fabric. The nanotubes may be selectively functionalized in order to provide a phobicity to a particular liquid, and solubility in a particular solvent. Thus, to coat a water pipe may require nanotubes functionalized with non-polar groups dispersed in a non-polar solvent, while an oil pipeline may require nanotubes functionalized with polar functional groups dispersed in an aqueous solution. Nanotube solution 4801 may be flowed through pipe 4800 for a selected period of time to develop an unordered nanotube fabric layer 4802 of a desired thickness.

In a second step, illustrated in FIG. 48C, unordered nanotube fabric 4802 on the interior of pipe 4800 may be ordered according to the methods of the present disclosure. Particles, such as polystyrene beads, may mixed with a liquid and flowed through the pipe, ordering the nanotube fabric as they collide with the surface of the coating in a similar manner to that discussed in FIGS. 12A and 12B. In this case, a substantially laminar flow of the particle mixture may provide improved ordering performance and homogeneity through the pipe. Without being bound by theory, the presence of turbulence may produce regions of misalignment or substantially no alignment with respect to the direction of fluid flow. In another example, an ordering apparatus 4803, such as a brush or plug, may be pushed through the pipe by a pressurized liquid or gas 4804. Friction between ordering apparatus 4803 and the nanotube fabric coating 4802 provides the directional force to render nanotube fabric 4802 into an ordered nanotube fabric 4805, similar to directional force 130 in FIG. 1. The selected ordering method may be employed multiple times, substantially ordering the nanotube fabric coating on the interior of the pipe in the direction of fluid flow.

In a third step, ordered fabric 4805 may be annealed to relieve internal stresses produced by the ordering process. This may be achieved by heating the pipe, for instance, with a heat gun, blowtorch or air dryer, or flowing a high temperature gas through the pipe. After annealing, ordered nanotube fabric 4805 is stabilized and may be considered ready for use, for instance, to improve the flow rate of liquid 4806. In this way, a single layer of ordered nanotube fabric may be produced on the interior of a pipe. Steps 1-3 may be repeated multiple times if a thicker nanotube fabric layer is desired.

As described previously, such ordered nanotube fabrics may possess a high degree of hydrophobicity, durability and chemical stability, and retain their hydrophobic characteristics in sustained contact with a liquid. Additionally, the nanotubes may be engineered to improve performance with a particular liquid by selected functionalization of the nanotube surfaces to increase the contact angle and inhibit reactions with a particular liquid. When used in the manner detailed above, these features allow for a durable hydrophobic coating on the interior of fluid transport pipes. However, these features may also prove useful in a wide range of hydrophobic coating applications.

An ordered nanotube fabric may be produced on a surface of arbitrary shape and composition according to the methods of the present disclosure. Examples of applications for such coatings, as depicted in FIG. 40, include the windows, mirrors and body panels of land vehicles 4001, watercraft 4002, planes 4003, cookware, roofing, metal structures, outdoor equipment, machinery, bicycles, umbrellas, rain jackets, tents, headwear, and footwear. These ordered nanotube fabrics may improve the liquid impermeability, corrosion resistance and durability of an underlying material and may be applied using a variety of methods. For instance, when applied to an aircraft fuselage, such as commercial aircraft 4003, a nanotube fabric coating may provide a substantially hydrophobic surface which may prevent the accumulation of water and ice. Such a coating may reduce the need for de-icing, saving significant time and expense for cold weather air travel while additionally improving safety.

Figure 49:
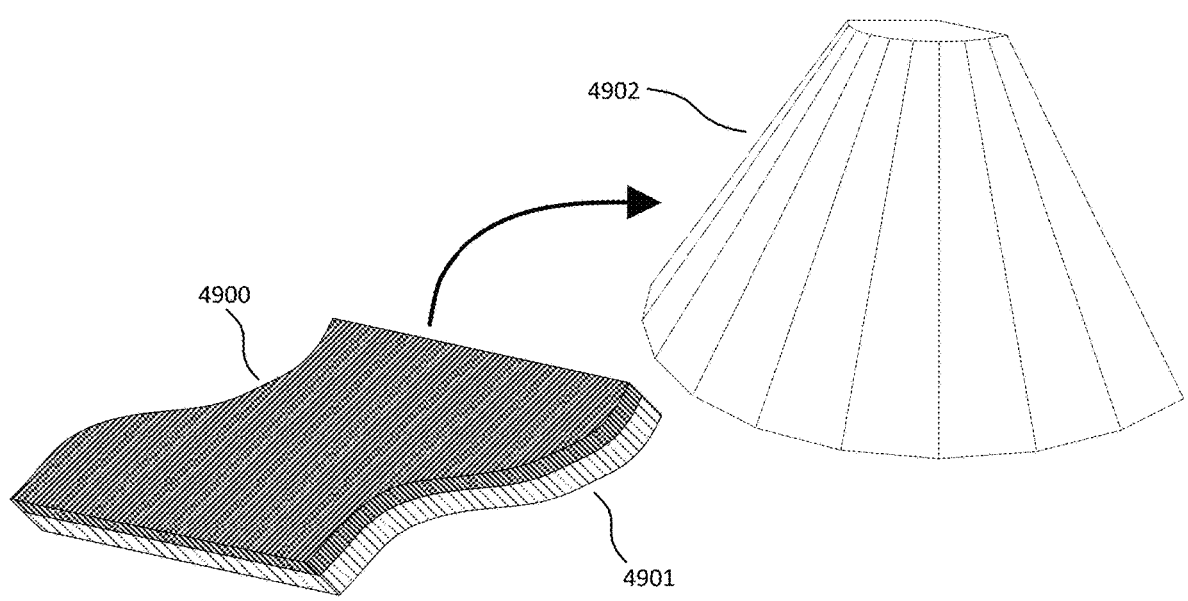
FIG. 49 illustrates the application of a conformal substrate coated with an ordered nanotube fabric layer onto a surface of arbitrary shape and composition.

As shown in FIG. 49, an ordered nanotube fabric 4900 may be produced on a conformal substrate 4901, such as cellophane, according to the methods of the present disclosure. The coated substrate may subsequently be applied to a desired surface 4902 of arbitrary shape and composition. In certain applications, the ordered nanotube fabric 4900 may be transferred to surface 4902 simply by the application of pressure, which may allow the conformal substrate 4901 to be peeled off, leaving ordered nanotube fabric 4900 on surface 4902. In other applications, substrate 4901 may be removed from ordered nanotube fabric 4900 by volatilization, melting or chemical dissolution. Once substrate 4901 is removed, surface 4902 remains coated uniformly with ordered nanotube fabric 4900.

Figure 50A:
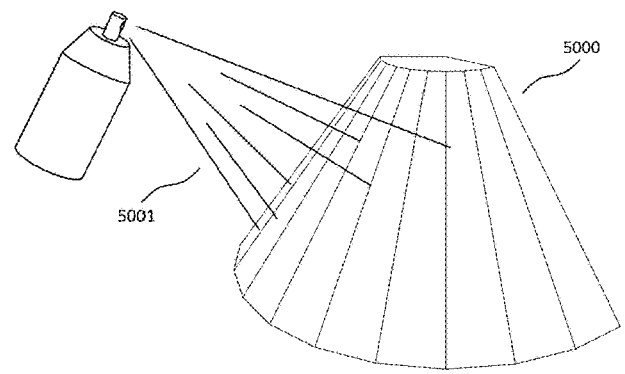
FIG. 50A depicts the deposition of a nanotube solution onto a surface of arbitrary shape and composition by an aerosol spray to form an unordered nanotube fabric layer.
Figure 50B:
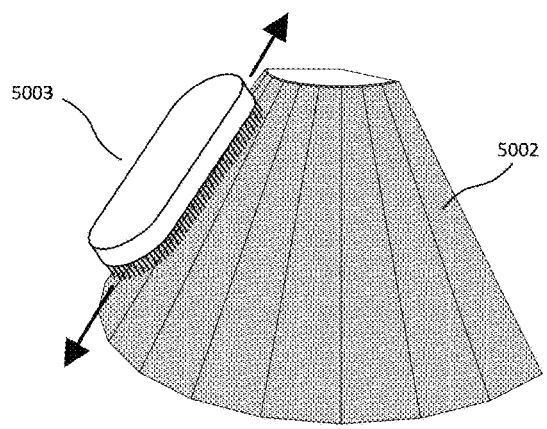
FIG. 50B illustrates a method of rendering an unordered nanotube fabric layer deposited on an arbitrary surface into an ordered nanotube fabric layer.
Figure 50C:
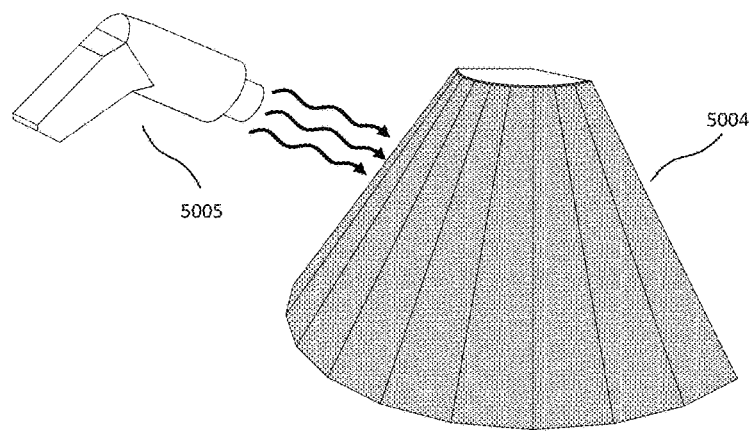
FIG. 50C depicts the step of annealing an ordered nanotube fabric.

In a second example, shown in FIG. 50A-C, an ordered nanotube fabric may be produced directly on a desired surface 5000 of arbitrary shape and composition according to the methods of the present disclosure. In a first step, illustrated in FIG. 50A, a nanotube fabric may be deposited on surface 5000 with a variety of methods, including an aerosol spray 5001, a liquid spray, dip coating and brushing. Next, unordered nanotube fabric 5002 may be ordered according to the methods of the present disclosure. This may be accomplished, for example, by brushing the fabric surface with a brush or roller 5003, as depicted in FIG. 50B, polishing the fabric surface with a rotary polisher, or blasting the surface with abrasives, polymer beads or cryogenic particles (such as dry ice). In this way, surface 5000 of arbitrary shape and composition may be provided with a durable and hydrophobic coating. Surface 5000 may be, for instance, the fuselage of an aircraft, a car body, the exterior of a structure, a metal beam, or a jacket.

In certain applications, a third step of annealing, shown in FIG. 50C, may be required to prepare the ordered nanotube fabric for use. In this step, heat is applied to ordered fabric 5004 to substantially reduce or eliminate internal shear stress produced by the ordering process. In certain applications, this may be accomplished by heating the surface with a heat gun 5005, a furnace, heat lamp, or any desired method to provide sufficient heat to ordered fabric layer 5004. This additional step of annealing may greatly improve the durability of ordered nanotube fabric 5004.

In certain applications, an ordered nanotube fabric may possess improved hydrophobicity compared to an unordered nanotube fabric. The difference in hydrophobicity may permit the use of a nanotube fabric layer to produce a channeled surface. That is, a surface with defined channels along which a liquid may preferentially flow. This property may be of use in microfluidics in order to direct the flow of liquids.

Figure 51A:
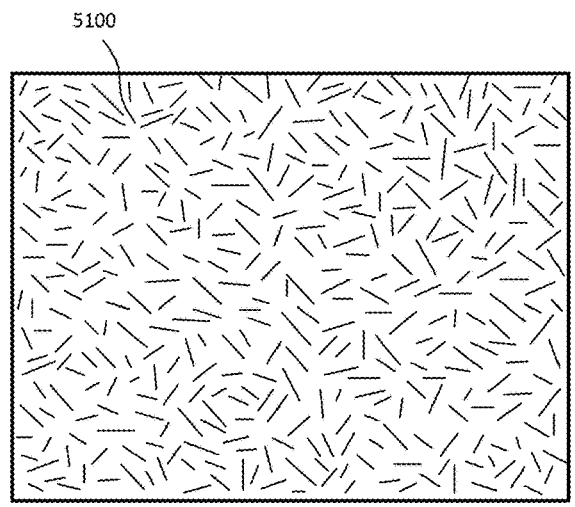
FIG. 51A depicts the deposition of an unordered nanotube fabric on a substrate for use as a channeled surface.
Figure 51B:
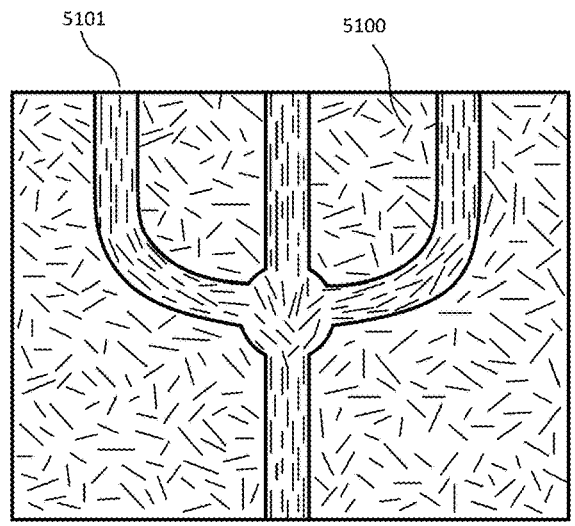
FIG. 51B demonstrates the formation of ordered channels by the selective ordering of an unordered nanotube fabric layer.
Figure 51C:
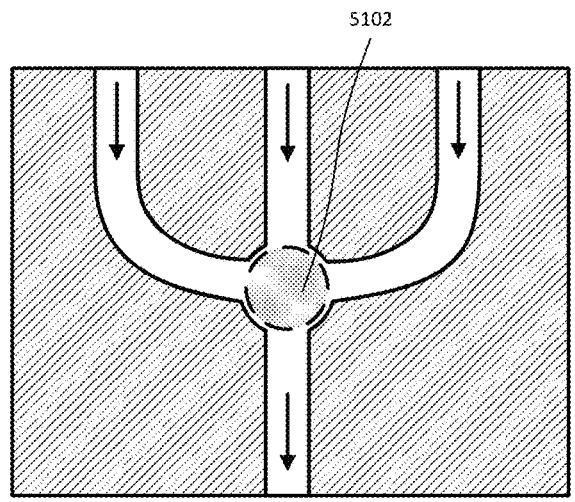
FIG. 51C demonstrates the use of a channeled surface to control the flow of a fluid.

FIGS. 51A-C depict a channeled surface using a nanotube fabric layer. First, an unordered nanotube fabric 5100 is deposited on a substrate, as shown in FIG. 51A. This unordered nanotube fabric 5100 may comprise substantially only nanotubes, or may additionally comprise additives such as polymers, binders or nanoscopic particles. The nanotubes comprising the unordered fabric layer 5100 may be functionalized to achieve a desired phobicity to certain liquids. In a second step, ordered channels 5101 are defined along the surface of unordered nanotube fabric 5100 according to the methods of the present disclosure, rendering the surface into the state shown in FIG. 51B. For instance, ordered channels 5101 may be defined by brushing, polishing, or blasting with abrasives, polymer beads or cryogenic particles along a selected path. In certain applications, the surface may then be annealed using a heat gun, furnace, hot plate, or any suitable method for heating the fabric to sufficient temperature. The difference in hydrophobicity between ordered channels 5101 and unordered nanotube fabric 5100 may constrain the flow of a fluid to the ordered channels. As depicted in FIG. 51C, such a channeled surface may be used in microfluidic applications to direct liquids along desired paths. Regions along these paths may be modified through the addition of selected particles to adjust the flow rate of certain liquids, react with certain liquids, or to catalyze a particular reaction. This may be useful, for instance, to form DNA chips, sensors, micro-reactors (5102) and biochips.

Ordered Nanotube Fabrics for Low Friction Applications

As mentioned previously, the ordered nanotube fabrics produced by the methods disclosed herein may provide a low friction surface which may be ideal in a variety of applications where a low friction, thin and durable surface coating is required. Such applications may include, for instance, non-stick cookware, snow sport and watersport coatings, and mechanical coatings.

Figure 52:
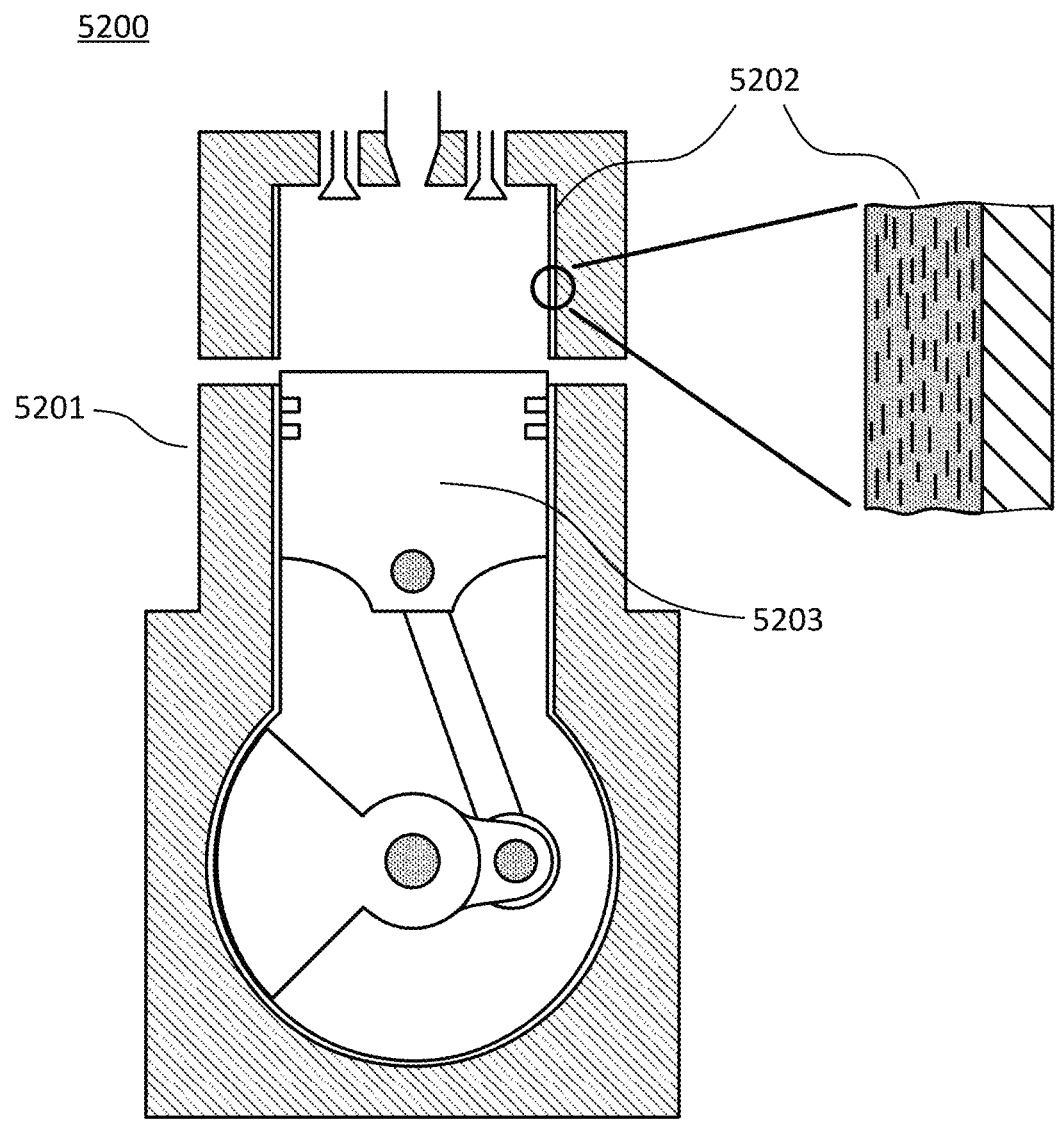
FIG. 52 depicts the engine block of an internal combustion engine coated with a layer of ordered nanotube fabric.

In particular, the combination of high-temperature stability and low friction of ordered nanotube fabrics makes them well-suited for use in engines and turbines. FIG. 52 depicts the engine block 5200 of an internal combustion engine, in which the combustion chamber 5201 has been coated with an ordered nanotube fabric 5202. The presence of nanotube fabric layer 5202 may reduce the friction between piston 5203 and the walls of combustion chamber 5201, improving efficiency and reducing wear. Although depicted using the piston of an internal combustion engine for ease of explanation, ordered nanotube fabrics may be ideal in all manner of engines, including, for instance, jet turbines, electric motors and generators, as well as high-temperature mechanical parts including pistons, shafts, and cylinders. In these applications, an ordered nanotube fabric may provide improved energy efficiency, fuel economy, wear resistance, reduced lubrication requirements, and higher maximum operating rpm.

An ordered nanotube fabric may be produced on the contacting surfaces of mechanical components by applying a nanotube solution to the desired surfaces. This nanotube solution may be in the form of an aerosol spray or liquid solution, and may comprise substantially only nanotubes and solvent, or may additionally include additives such as surfactants, binders, lubricants and cross-linking agents. Once dried, the unordered fabric may be rendered into an ordered nanotube fabric simply through operation of the device. Thus, for instance, if an unordered nanotube fabric is applied to the internal wall of combustion chamber 5201, as depicted in FIG. 52, the motion of the piston itself may be sufficient to provide the directional force to render the unordered coating into an ordered state. Alternatively, the unordered nanotube fabric may be arranged according to other methods of the present disclosure, for instance, by brushing or polishing the surface, or blasting the surface with abrasives, polymer beads, or cryogenic particles (such as dry ice). This process may be repeated multiple times, building up a nanotube fabric layer of a desired thickness. In certain applications it may be desirable to anneal the ordered fabric by heating the coated surface in order to reduce internal stresses in the ordered nanotube fabric.

Ordered nanotube fabrics may also be useful in mechanical applications which may not involve high temperatures, such as bearings, gears, shafts, rotors, and joints, and electro-mechanical applications, such as servos, solenoids and other moving elements within microelectromechanical systems (MEMS). In many of these applications, friction between the moving parts may provide the force necessary to render an unordered nanotube fabric into an ordered state. In such applications, an unordered nanotube fabric may be deposited on the desired surfaces, and operation of the device will order the fabric in the direction of motion. Alternatively, the unordered nanotube fabric may be arranged according to other methods of the present disclosure, such as brushing or polishing the surface, or blasting the surface with abrasives, polymer beads, or cryogenic particles (such as dry ice). In this way, a low friction, high-temperature coating may be produced on a surface of arbitrary shape, size and composition.

Figure 53:
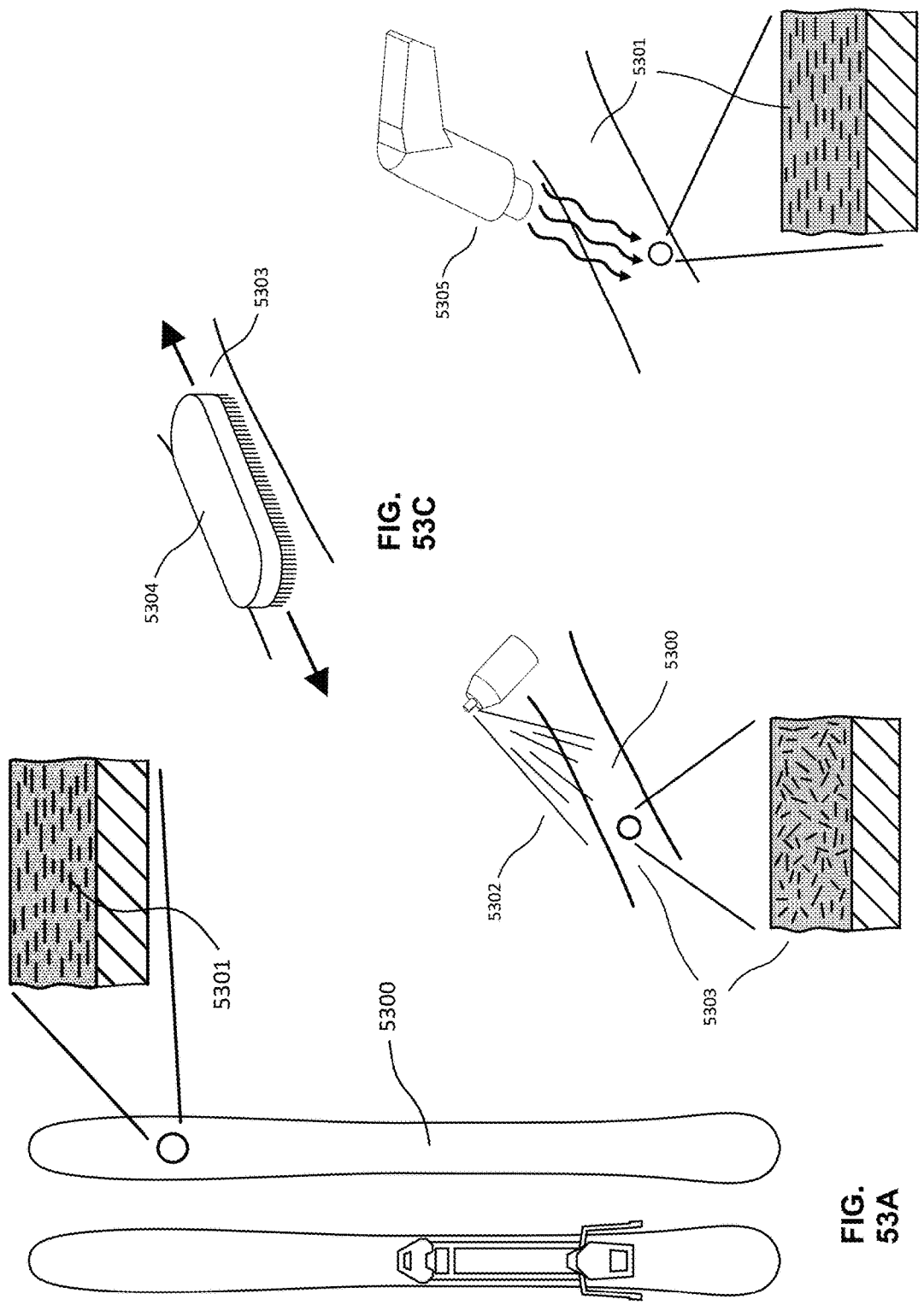
FIG. 53A depicts skis coated with a layer of ordered nanotube fabric.
FIG. 53B depicts the application of a nanotube solution onto the surface of a ski to form an unordered nanotube fabric layer.
FIG. 53C illustrates a method of rendering an unordered nanotube fabric deposited on the surface of a ski into an ordered fabric layer.
FIG. 53D illustrates the annealing of an ordered nanotube fabric layer on the surface of a ski.

Ordered nanotube fabrics may also be beneficial in transportation and sporting applications to reduce friction between a moving object and a stationary surface. FIG. 53A-D demonstrates the use of an ordered nanotube fabric coating 5301 on skis 5300 to reduce friction between the contact surface of the ski and a material such as snow or water. The fabric coating 5301 may be applied to the contact surface in a multitude of ways. FIGS. 53B-D illustrate an exemplary application method utilizing an aerosol nanotube spray 5302 to deposit a layer of unordered nanotube fabric 5303. While depicted using an aerosol spray for ease of explanation, unordered nanotube fabric 5303 may be deposited by any method, such as brushing or spraying a liquid nanotube solution. Unordered nanotube fabric 5303 may comprise substantially only nanotubes, or may additionally comprise additives including surfactants, binders, polymers, and particles. Once applied to the surface of skis 5300, nanotube fabric 5303 may be rendered into ordered nanotube fabric 5301 according to the methods of the present disclosure, such as by brushing the surface with a brush 5304 or roller (as shown in FIG. 53), polishing the surface, or blasting the surface with abrasives, polymer beads or cryogenic particles (such as dry ice). Finally, in some applications, ordered nanotube fabric 5301 may be annealed to relieve internal stress. This may be accomplished by heating fabric 5301 using an appropriate method, such as a heat gun 5305, furnace, hot plate, or heat lamp. This process may be repeated multiple times in order to develop an ordered nanotube fabric coating of a desired thickness.

In this way, a low friction, durable coating may be produced on a surface of arbitrary shape, size and composition. Although depicted using snow skis for ease of explanation, the coatings described above may be well-suited for use with all manner of snow sport equipment, including, for instance, downhill skis, cross-country skis, snowboards, snowmobiles, sleds, sledges, and bobsleighs. Further, the coatings described above may also be well-suited for use with all manner of watersport equipment, including, for instance, water skis, wakeboards, wake surfing boards, surf boards, inflatable tubes, jet skis, and the hulls of watercraft.

Figure 54:
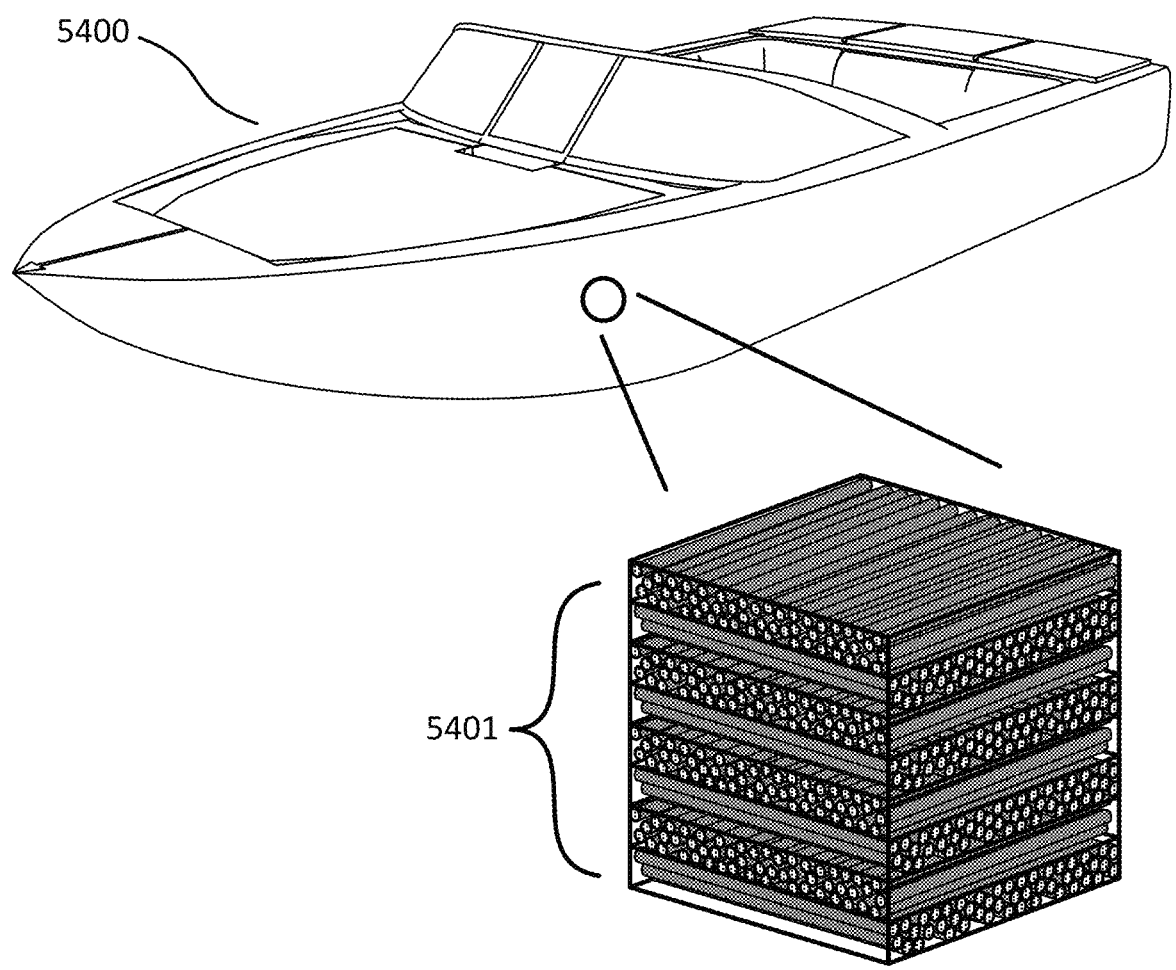
FIG. 54 depicts a watercraft with a carbon nanotube-based hull.

The low friction, low weight, hydrophobicity and strength of an ordered nanotube fabric may also be advantageous for the production or coating of watercraft hulls. FIG. 54 depicts a watercraft 5400 possessing a carbon nanotube-based hull. Similar to the armor plating of FIGS. 41 and 42, a stack of layers of nanotube fabric 5401 ordered orthogonally or at selected angles relative to adjacent layers may be used to produce a lightweight, high-strength material. These layers 5401 may be comprised of substantially only nanotubes, or may include other components such as polymers, nanoscopic particles, cross-linking agents, or other additives to achieve desired mechanical properties. When used as a hull, the hydrophobicity, light weight and low friction of such a material may substantially reduce drag on a watercraft, while additionally reducing the weight and draft. This may increase energy efficiency, fuel economy, harbor accessibility (due to shallower draft) and maximum speed of a watercraft. Additionally, this material may substantially increase the lifespan of the hull by preventing corrosion and reducing the buildup of biological organisms on the surface, including algae and barnacles. When used in such a manner a carbon nanotube coating may not affect harbor ecosystems, unlike the toxic chemicals leeched from traditional ablative and non-ablative anti-fouling paints.

Alternatively, a watercraft with a hull made of a traditional material such as fiberglass or steel may be coated with a layer of nanotube fabric to achieve many of the same effects, according to the methods demonstrated in FIGS. 49 and 50A-50C. A traditional watercraft hull may be coated with an unordered nanotube fabric layer by applying nanotubes in the form of an aerosol spray or a liquid solution. The unordered nanotube fabric layer may then be rendered into an ordered state according to the methods of the present disclosure, for instance, by brushing the surface, polishing the surface, or blasting with abrasives, polymer beads, or cryogenic particles (such as dry ice). This process may be repeated multiple times to build up an ordered nanotube fabric layer or stack of nanotube fabric layers of a desired thickness and orientation. When coated in such a way, the hull of a watercraft may take advantage of the properties of an ordered nanotube fabric, including hydrophobicity, durability, low friction and corrosion resistance. This may substantially improve the energy efficiency, fuel economy, maximum speed, and lifetime of a watercraft. Additionally, a nanotube fabric stack applied to a hull may be designed so as to behave as a radiation absorbing material, as described previously with reference to FIGS. 44 and 45. When used in such a manner, a watercraft may take advantage of both the hydrophobicity and EM absorbance of a nanotube fabric coating to improve performance and reduce radar cross-section.

Ordered Nanotube Fabrics for Membrane Applications

As discussed previously herein, an ordered nanotube fabric possesses tunable chemical behavior dependent on the functionalization of the nanotube surfaces, as well as a high density. These properties may be ideal for the production of impermeable and semi-permeable membranes.

Figure 55:
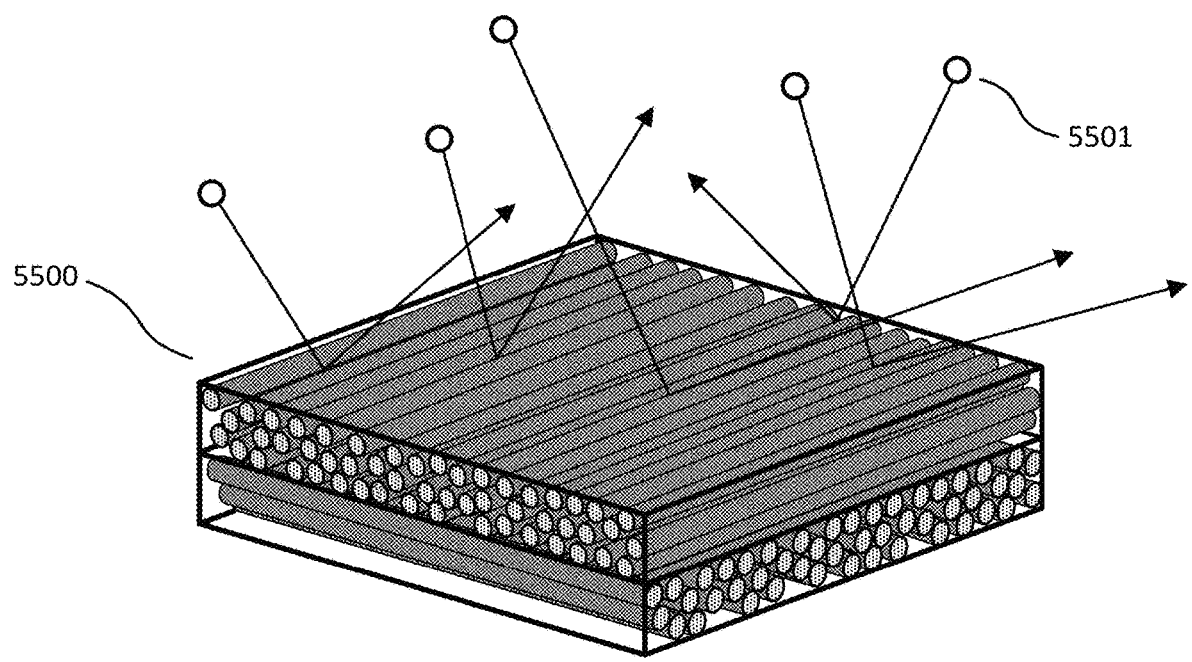
FIG. 55 depicts an ordered nanotube fabric used as an impermeable membrane.

FIG. 55 illustrates the use of an ordered nanotube fabric 5500 as an impermeable membrane. Although depicted using a stack of two orthogonally arranged fabric layers, any ordered nanotube fabric may be sufficient. For instance, ordered nanotube fabric 5500 may be a single layer of nanotubes ordered in a single direction, or may be a stack of layers arranged at selected angles relative to adjacent layers. Ordered nanotube fabric 5500 presents a dense material surface which may be substantially impermeable to species 5501 such as gases, molecules, polymers, microorganisms and nanoscopic particles.

Such an impermeable membrane may be used, for instance, to form a low-density material. First, a scaffold in the desired shape may be dip coated in a nanotube solution to form an unordered nanotube fabric layer. Next, the scaffold may be fully or partially volatilized, dissolved or otherwise removed from the unordered fabric to produce a hollow three-dimensional shape. Prior or subsequent to this removal step, the unordered fabric may be rendered into an ordered fabric according to the methods of the present disclosure in order to substantially reduce the porosity of the fabric and render it impermeable to liquids and gases. Gas may either be evacuated from the hollow shape, or the shape may be produced under vacuum, so that the interior space of the shape is substantially devoid of gas, or may be at least partially filled with a low-density gas such as helium. In this state, the hollow shell of ordered nanotube fabric may have a density lower than atmosphere. These shells may be placed in shipping containers, boxes, vehicles, watercraft, and aircraft to reduce their weight, or used to form lighter-than-air aircrafts such as balloons, high-altitude balloons, dirigibles, or airships. In such applications, the nanotube fabric shell may be unsupported, or may include additional structural support to maintain its shape and prevent collapse under pressure.

Alternatively, ordered nanotube fabric 5500 may be substantially thin or have a selected porosity. In this case, ordered nanotube fabric 5500 may present a semi-permeable material layer. Selective functionalization of the nanotubes within the fabric layer may allow engineering of the permeability of the ordered nanotube fabric 5500 to selected species. Thus, for instance, the addition of hydroxl or other polar groups to the nanotube surfaces may prohibit the passage of lipids and other non-polar molecules through the membrane, while allowing the passage of polar molecules such as water. Further, the methods of the present disclosure provide a means to control the porosity of a nanotube fabric, allowing species smaller than the pore size to permeate the membrane. The combination of size selection based on pore size and chemical selection based on functionalization may make nanotube membranes ideal for applications including bio-filters, liquid and gas filtration, chromatography, breathable hydrophobic coatings, semi-permeable membranes, and cross-flow filtration membranes.

Figure 56A:
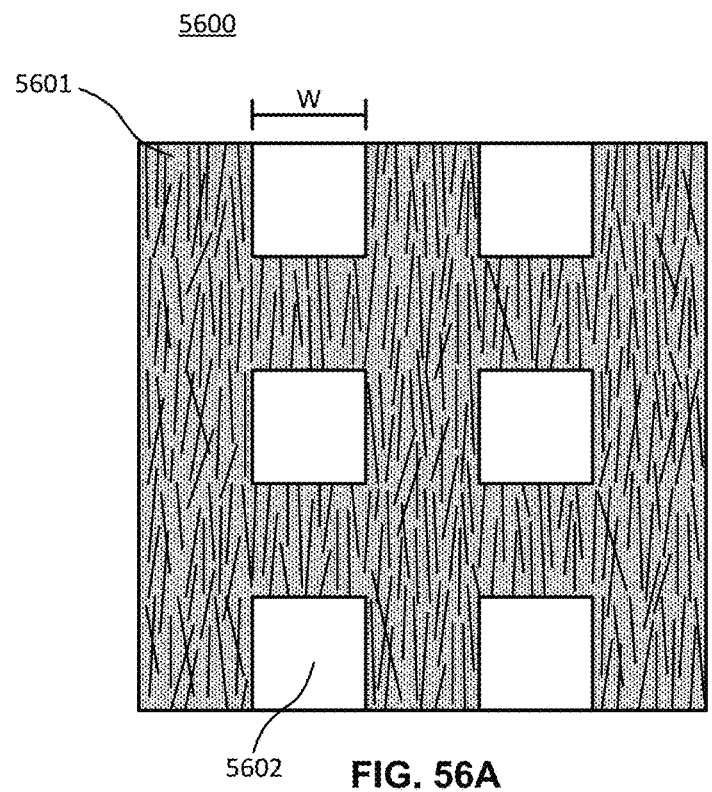
FIG. 56A depicts a porous membrane produced by forming pores in an ordered nanotube fabric layer.
Figure 56B:
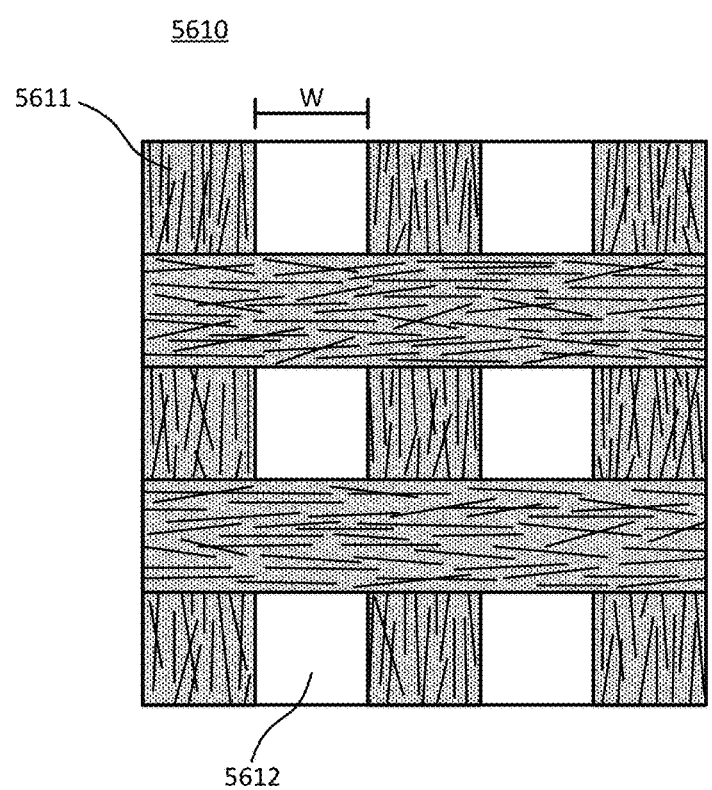
FIG. 56B depicts a membrane produced by forming an ordered nanotube fabric layer over a patterned substrate.

FIGS. 56A and 56B depict the use of an ordered nanotube fabric to form a porous membrane 5600 and 5610, respectively, with a selected pore size of W. While nanotube fabric layers 5601 and 5611 may be substantially impermeable, pores 5602 and 5612 allow the passage of particles smaller than the pore size W though the membrane. FIG. 56A shows a porous membrane 5600 produced by etching or otherwise forming pores 5602 in ordered nanotube fabric 5601. This fabric may comprise a single nanotube fabric arranged in a single direction, or a stack of nanotube fabric layers arranged at selected angles relative to adjacent layers, according to the methods of the present disclosure. In this case, selected regions of nanotube fabric layer 5601 are removed to form pores 5602 by, for instance, etching. Similarly, FIG. 56B shows a porous membrane 5610 produced by forming an ordered nanotube fabric layer 5611 over a patterned substrate, as will be discussed in further detail below. In this case, an arbitrarily patterned substrate may be provided with a feature size of W. An unordered nanotube layer deposited on the patterned substrate may then be rendered into a highly dense ordered nanotube fabric layer by ordering along one or multiple directions, according to the methods of the present disclosure. Finally, nanotube fabric layer 5611 may be removed from the substrate, or the substrate may be dissolved or volatilized to separate the membrane. In this way, a porous membrane may be produced using the methods of the present disclosure.

Figure 57A:
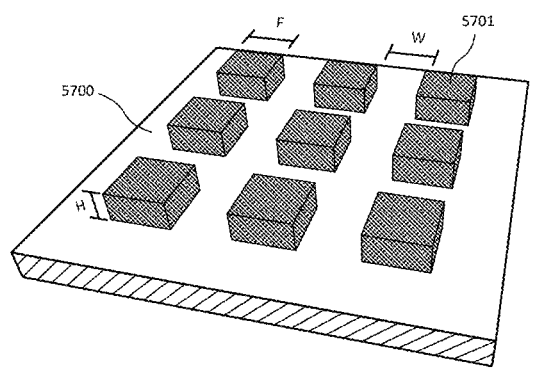
FIG. 57A depicts a substrate with surface features.
Figure 57B:
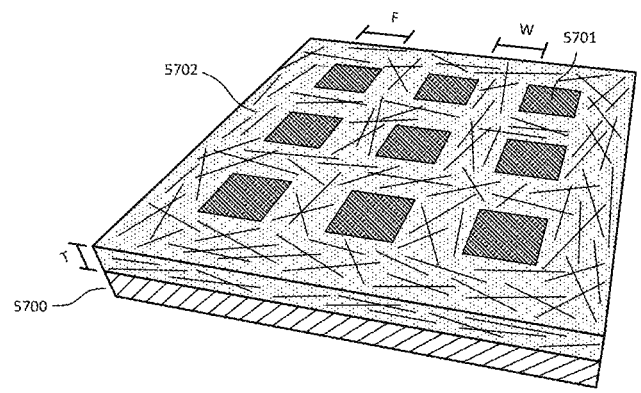
FIG. 57B illustrates the formation of an unordered nanotube fabric layer over a substrate with surface features by the deposition of a nanotube solution.

FIGS. 57A-E illustrate an exemplary method for the production of a porous membrane as depicted in FIG. 56B using an ordered nanotube fabric. In a first step, shown in FIG. 57A, a substrate 5700 is provided with surface features 5701. Surface features 5701 may be substantially regular, that is, have a repeating pattern defined by feature size F, height H, and distance between features W which in some applications may be substantially equal. Next, as shown in FIG. 57B, an unordered nanotube fabric 5702 of thickness T may be deposited over substrate 5700 and surface features 5701. In some applications, the thickness T of nanotube layer 5702 may be smaller than the height H of surface features 5701, or thickness T may be larger than height H. In the latter case an additional step is required to reduce the thickness of nanotube layer 5702 to expose the surface features 5701. Unordered nanotube fabric layer 5702 may comprise substantially only nanotubes, or may additionally comprise additives including surfactants, binders, polymers, organic molecules and nanoscopic particles. The nanotubes within unordered nanotube fabric 5702 may be selectively functionalized to achieve a desired chemical behavior. For instance, to produce a hydrophobic semi-permeable membrane, the nanotubes within unordered fabric layer 5702 may be functionalized with polar functional groups.

Figure 57C:
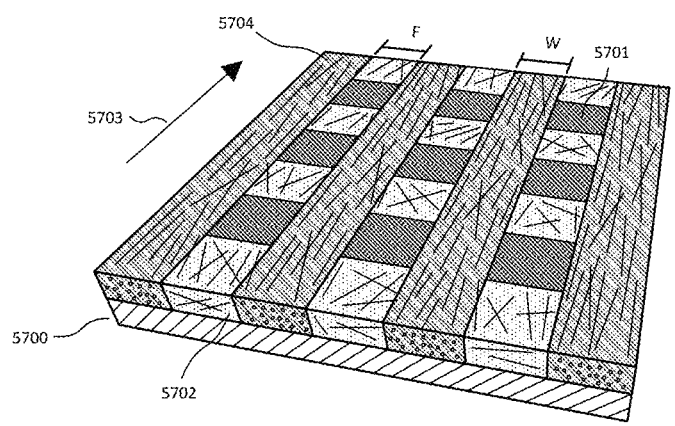
FIG. 57C illustrates the arrangement of a first region of an unordered nanotube fabric deposited over a substrate with surface features along a first direction.
Figure 57D:
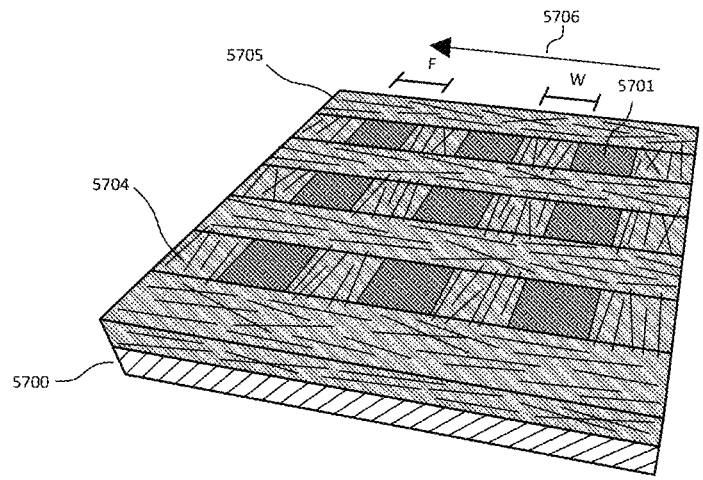
FIG. 57D illustrates the arrangement of second region of an unordered nanotube fabric deposited over a substrate with surface features along a second direction.

In a third step, depicted in FIG. 57C, unordered nanotube layer 5702 is partially or substantially completely arranged in a first direction 5703 according to the methods of the present disclosure, forming ordered nanotube fabric 5704. Surface features 5701 may inhibit arrangement of unordered nanotube layer 5702 in some regions, and in some applications a second ordering step may be required, as shown in FIG. 57D. In these applications, the methods of the present disclosure may be used to arrange the remaining unordered nanotube fabric 5702 along a second direction 5706, forming ordered nanotube fabric layer 5705. In some cases, certain regions of ordered nanotube fabric layer 5704 may be substantially rearranged along second direction 5706, while other regions remain substantially arranged in first direction 5703. Although depicted using two ordering step along orthogonal directions 5703 and 5706 for ease of explanation, any number of ordering steps may be employed along any number of selected directions. It will be apparent to those skilled in the art that the geometry of surface features 2701 may dictate the optimal ordering procedure. Some applications may require only a single ordering step along a single direction, others may require a plurality of ordering steps in a plurality of directions.

Figure 57E:
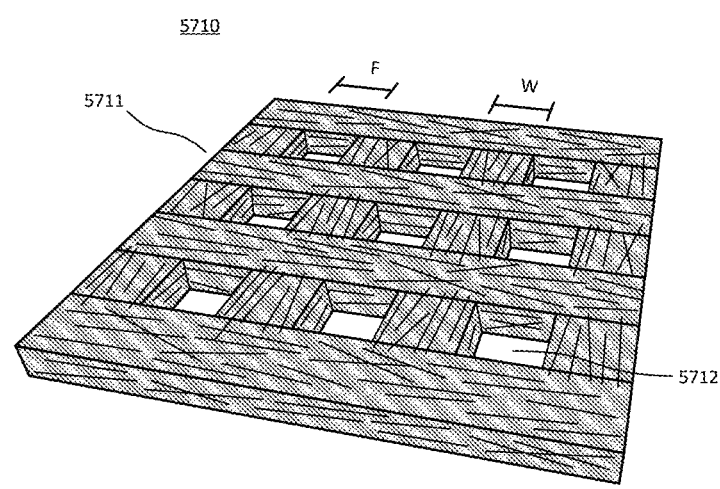
FIG. 57E illustrates removal of a porous membrane from a substrate.

FIG. 57E depicts a final step wherein porous membrane 5710 is removed from substrate 5700. Porous membrane 5710 comprises nanotube matrix 5711 and pores 5712, the dimensions of which are determined by the geometry of surface features 5701. In some applications, nanotube matrix 5711 may be directly removed from substrate 5700, in others, substrate 5700 and surface features 5701 may be removed by volatilization or chemical dissolution. Some applications may additionally require an annealing step to relieve internal stress within nanotube matrix 5711, which may be performed either before or after the separation of nanotube matrix 5711 from substrate 5700. In this way, a porous membrane 5710 may be produced with a well-defined pore size F and a selected chemical behavior using the ordered nanotube fabrics of the present disclosure.

A porous membrane as described above may be useful in many applications where a tightly controlled pore size is necessary. Further, the ability to tune the chemical behavior of the nanotube fabric may also permit filtering based on chemistry as well as size. These applications may include, for instance, chromatography, bio-filters, liquid and gas purification filters, breathable hydrophobic coatings, semi-permeable membranes and cross-flow filtration membranes.

Ordered Nanotube Fabrics for Directional Substrates

The ordered nanotube fabrics produced by the methods of the present disclosure provide highly dense and directional surfaces which may be useful as a substrate for self-assembly. In particular, the ability to selectively arrange regions of a nanotube fabric along a single or multiple directions may permit the creation of multiple regions for self-assembly on a single substrate surface.

Figure 58A:
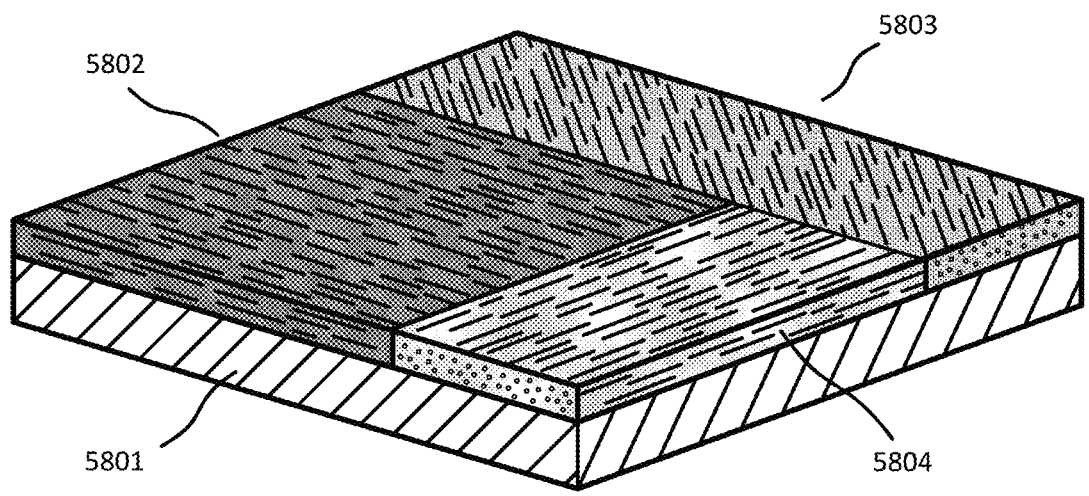
FIG. 58A illustrates a nanotube fabric layer deposited on a substrate with three ordered regions.
Figure 58B:
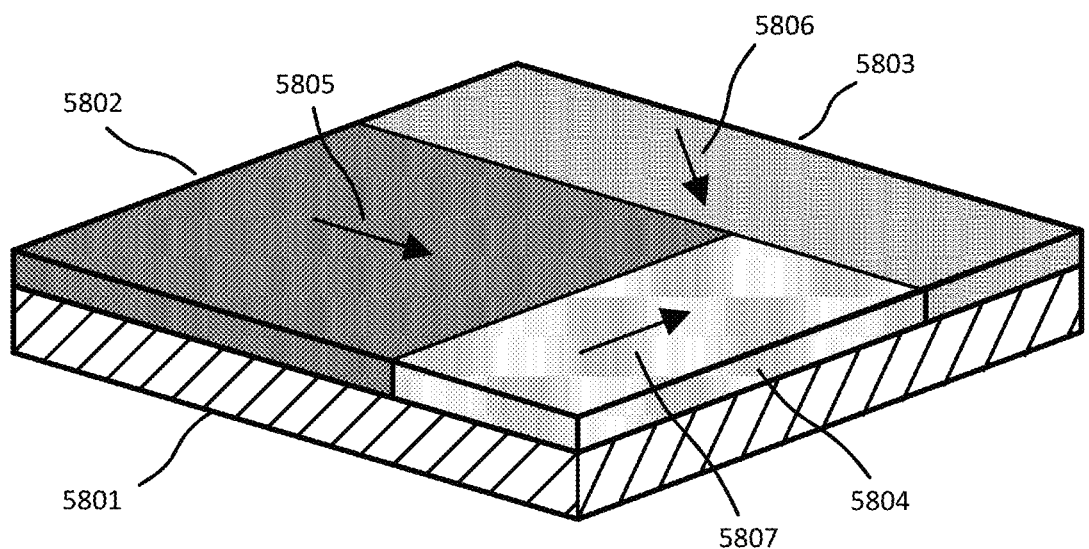
FIG. 58B illustrates the ordering directions of a nanotube fabric layer containing three ordered regions.

FIGS. 58A shows a nanotube fabric 5800 deposited on substrate 5801 which has been arranged into three ordered regions 5802, 5803, and 5804 according to the methods of the present disclosure. Nanotubes within each of these regions may be substantially ordered along a selected direction, as illustrated in FIG. 58B wherein ordered regions 5802, 5803, and 5804 are arranged along directions 5805, 5806, and 5807, respectively. When nanotube fabric 5800 is used as a substrate for the growth of a material layer, the directionality of each region may be imparted to the grown layer by self-assembly. This may be useful, for instance, in biological systems, protein sorting, liquid-crystal poling, sensors, and electronics.

Although the present invention has been described in relation to particular embodiments thereof, many other variations and modifications and other uses will become apparent to those skilled in the art. It is preferred, therefore, that the present invention not be limited by the specific disclosure herein, but rather be defined by the appended claims; and that these claims will encompass modifications of and improvements to what has been described.

What is claimed is:

1. A nanotube fabric for microfluidics, comprising:
   a nanotube fabric comprising a plurality of nanotube elements;
   wherein said nanotube fabric comprises at least one region of substantially un-ordered nanotubes and at least one region of substantially ordered nanotubes;
   wherein said at least one region of substantially ordered nanotubes is rendered into said ordered state according to a selected pattern;
   wherein said selected pattern of ordered nanotubes are oriented in a selected direction corresponding to a desired path for a liquid to flow and said selected pattern defines at least one path for a liquid to flow along said selected direction.

2. The nanotube fabric of claim 1 wherein the width of said at least one path is on the order of 50-100 μm.

3. The nanotube fabric of claim 1 wherein the width of said at least one path is on the order of 10-50 μm.

4. The nanotube fabric of claim 1 wherein the width of said at least one path is on the order of 1-10 μm.

5. The nanotube fabric of claim 1 wherein the width of said at least one path is on the order of 0.1-1 μm.

6. The nanotube fabric of claim 1 wherein said nanotube fabric additionally comprises at least one additive, said additive including surfactants, binders, nanoscopic particles, polymers, dopants, organic molecules and inorganic molecules.

7. The nanotube fabric of claim 6 wherein at least one of said additives is chemically reactive.

8. The nanotube fabric of claim 6 wherein at least one of said additives is photosensitive.

9. The nanotube fabric of claim 6 wherein at least one of said at least one additives is applied to a selected region of said nanotube fabric.

10. The nanotube fabric of claim 1 wherein the hydrophobicity of said at least one region of substantially ordered nanotubes is selected to provide a particular flow rate for a selected liquid.

11. The nanotube fabric of claim 1 wherein said selected pattern comprises at least one microfluidic component, including a micro-reactor, channel, sensor, size-exclusion channel, and tortuous path.

12. The nanotube fabric of claim 11 wherein said selected pattern is the outline of said microfluidic component.

13. The nanotube fabric of claim 1 wherein the pattern of said at least one region of substantially ordered nanotubes is capable of being altered.

14. The nanotube fabric of claim 13 wherein said alteration changes the direction of at least one of said at least one path.

15. The nanotube fabric of claim 13 wherein said alteration produces a new path for liquid to flow.

* * * * *